(12) United States Patent
Toguchi et al.

(10) Patent No.: US 6,747,287 B1
(45) Date of Patent: Jun. 8, 2004

(54) ORGANIC THIN FILM TRANSISTOR

(75) Inventors: Satoru Toguchi, Tokyo (JP); Atsushi Oda, Tokyo (JP); Hitoshi Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 47 days.

(21) Appl. No.: 10/272,962

(22) Filed: Oct. 17, 2002

(30) Foreign Application Priority Data

Oct. 18, 2001 (JP) .................................... 2001-320342

(51) Int. Cl.$^7$ .................... H01L 35/24; H01L 21/00; H01L 51/40
(52) U.S. Cl. .................... 257/40; 438/99; 438/57; 438/82; 438/96; 438/97
(58) Field of Search ............... 438/99, 57, 82, 438/96, 97; 257/40

(56) References Cited

U.S. PATENT DOCUMENTS

| | | | | |
|---|---|---|---|---|
| 4,214,916 A | * | 7/1980 | Felsher et al. | 136/255 |
| 5,152,805 A | * | 10/1992 | Geddes et al. | 29/25.02 |
| 5,536,573 A | * | 7/1996 | Rubner et al. | 428/378 |
| 5,969,376 A | * | 10/1999 | Bao | 257/40 |
| 6,150,191 A | * | 11/2000 | Bao | 438/99 |
| 6,310,360 B1 | * | 10/2001 | Forrest et al. | 257/40 |
| 6,316,098 B1 | * | 11/2001 | Yitzchaik et al. | 428/339 |
| 6,326,640 B1 | * | 12/2001 | Shi et al. | 257/40 |
| 6,335,539 B1 | * | 1/2002 | Dimitrakopoulos et al. | 257/40 |
| 6,413,658 B1 | * | 7/2002 | Araki | 428/690 |
| 6,528,816 B1 | * | 3/2003 | Jackson et al. | 257/40 |
| 6,559,473 B1 | * | 5/2003 | Yu et al. | 257/40 |
| 6,569,707 B2 | * | 5/2003 | Dimitrakopoulos et al. | 438/99 |
| 6,621,098 B1 | * | 9/2003 | Jackson et al. | 257/40 |
| 2002/0038867 A1 | * | 4/2002 | Kobori et al. | 257/40 |
| 2002/0057398 A1 | * | 5/2002 | Ogawa | 349/61 |

FOREIGN PATENT DOCUMENTS

| | | |
|---|---|---|
| EP | 0 921 579 A2 | 6/1999 |
| EP | 1 041 653 A2 | 10/2000 |
| JP | 5-55568 | 3/1993 |
| JP | 8-228034 | 9/1996 |
| JP | 8-228035 | 9/1996 |
| JP | 9-232589 | 9/1997 |
| JP | 10-125924 | 5/1998 |
| JP | 10-190001 | 7/1998 |
| JP | 2000-174277 | 6/2000 |
| JP | 2001-94107 | 4/2001 |

OTHER PUBLICATIONS

Electrical Properties of Polyacetylene/polysiloxane Interface, F. Ebisawa et al., Journal of Applied Physics, vol. 54. pp. 3255–3259 (1983).

(List continued on next page.)

*Primary Examiner*—John F. Niebling
*Assistant Examiner*—Stanetta Isaac
(74) *Attorney, Agent, or Firm*—Scully, Scott, Murphy & Presser

(57) ABSTRACT

An organic thin film transistor includes: an organic thin film which includes a compound represented by the following general formula [A]:

$$X\text{---}[\text{---}N\ Ar^1 Ar^2]_n \quad [A]$$

where each of $Ar^1$ and $Ar^2$ is selected independently from unsubstituted or substituted aromatic hydrocarbon groups having 6 to 20 carbon atoms and from unsubstituted or substituted aromatic heterocyclic groups having 6 to 20 carbon atoms; and X is selected from unsubstituted or substituted condensed aromatic hydrocarbon groups having 6 to 34 carbon atoms, and the condensed aromatic hydrocarbon groups are monovalent, divalent, trivalent or tetravalent groups; and n is the natural number in the range of 1–4.

21 Claims, 3 Drawing Sheets

OTHER PUBLICATIONS

Field–Effect Mobility of Poly(3–hexylthiophene), A. Assadi et al., Journal of Applied Physics, vol. 53, pp. 195–197 (1988).

Field–Effect Transistors Bases On Intrinsic Molecular Semiconductors, G. Guillaud, et al., Chemical Physics Letters, vol. 167, pp. 503–506 (1990).

All–Organic Thin–Film Transistors Made of Alpha–Sexithienyl Semiconducting and Various Polymeric Insulating Layers, X. Peng et al., Applied Physics Letter, vol. 57, pp. 2013–2015 (1990).

Thin–Film Transistors Based On Alpha–Conjugated Oligomers, G. Horowitz et al., Synthetic Metals, vol. 41–43, pp. 1127–1130 (1991).

Junction Field–Effect Transistor Using Polythiopene as an Active Component, S. Miyauchi et al., Synthetic Metals, vol. 41–43, pp. 1155–1158 (1991).

Polythienylenevinylene Thin–Film Transistor with High Carrier Mobility, H. Fuchigami et al., Applied Physics Letters, vol. 63, pp. 1372–1374 (1993).

Polythiopene Field–Effect Transistor with Polypyrrole Worked as Source and Drain Electrodes, H. Koezuka et al., Applied Physics Letter, vol. 62, pp. 1794–1796 (1993).

All–Polymer Field–Effect Transistor Realized by Printing Techniques, F. Garnier et al, Science, vol. 265, pp. 1684–1686 (1994).

A Universal Relation Between Conductivity and Field–Effect Mobility in Doped Amorphous Organic Semiconductors, A.R. Brown, et al., Synthetic Metals vol. 68, 65–70 (1994).

Fabrication and Characterization of Field Effect Transistors of Layered Structure Consisting of TMTSF and TCNQ, T., Sumimoto et al., Synthetic Metals, vol. 86, pp. 2259–2260 (1997).

Organic Transistors: Two–Dimensional Transport and Improved Electrical Characteristics, A. Dodabalapur, et al., Science, vol. 268, p. 270–271 (1995).

Schottky Gate Static Induction Transistor Using Copper Phthalocyanine Films, Kazuhiro Kudo, et al., Thin Solid Films, vol. 331, pp. 51–54 (1998).

Organic Static Induction Transistor for Color Sensors, K. Kudo, et al., Synthetic Metals, vol. 102, pp. 900–903 (1999).

Organic Static Induction Transistor for Display Devices, K. Kudo, et al., Synthetic Metals, vol. 111, pp. 11–14 (2000).

* cited by examiner

ORGANIC THIN FILM TRANSISTOR

BACKGROUND OF THE INVENTION

1. Field of the Invention

The present invention relates to a semiconductor device having an organic semiconductor film, and more particularly to an organic thin film transistor having a high driving speed and a high ON/OFF ratio.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

The thin film transistor has widely been used as a switching device for a display such as a liquid crystal display. Conventional thin film transistors are made of amorphous or polycrystalline silicon. The formation of the silicon-based thin film transistor needs to use a chemical vapor deposition system which is extremely expensive. The increase in size of the display device including the thin film transistors causes a problem with the transistors causes a problem with the increase in manufacturing cost thereof. The process for depositing or forming the amorphous silicon layer or the polysilicon layer is carried out at an extremely high temperature. Due to this high temperature condition, available materials to the substrate are limited. For example, resin substrates, which are relatively light, are not available.

In order to have solved the above problem, there was proposed the organic thin film transistor using one or more organic materials instead of amorphous silicon or polysilicon. The organic thin film transistor may be formed by vacuum evaporation method or coating method. Those methods make it possible to realize the desired increase in size of the device without any increase in the cost. The temperature necessary in the process for forming the transistor may be relatively low. For those reasons, the organic thin film transistor would be advantageous in less limitation to the available materials, and receive a great deal of expectation for practice.

In recent years, a variety of organic thin film transistor has been reported, for example, by F. Ebisawa et al. in Journal of Applied Physics, vol. 54, p. 3255, 1983; by A. Assadi et al. in Applied Physics Letter, vol. 53, p. 195, 1988; by G. Guillaud et al. in Chemical Physics Letter, vol. 167, p. 503, 1990; by X. Peng et al. in Applied Physics Letter, vol. 57, p. 2013, 1990; by G. Horowitz et al. in Synthetic Metals, vol. 41–43, p. 1127, 1991; by S. Miyauchi et al. in Synthetic Metals, vol. 41–43, 1991; by H. Fuchigami et al. in Applied Physics Letters, vol. 63, p. 1372, 1993; by H. Koezuka et al. in Applied Physics Letter, vol. 62, p. 1794, 1993; by F. Garnier et al. in Science, vol. 265, p. 1684, 1994; by A. R. Brown in Synthetic Metals vol. 68, p. 65, 1994, by A. Dodabalapur et al. in Science vol. 268, p. 270, 1995; by T. Sumimoto et al. in Synthetic Metals vol. 86, p. 2259, 1997; by K. Kudo et al. in Thin Solid Films, vol. 331, p. 51, 1998; K. Kudo et al. Synthetic Metals, vol. 102, p. 900, 1999; and by K. Kudo et al. Synthetic Metals, vol. 111–112, p. 11, 2002.

It has also been known that polymers such as conjugated polymers or thiophenes are available solely or in the form of mixture with other one or more compounds for the organic compound layer in the thin film transistor, as disclosed in Japanese laid-open patent publications Nos. 8-228034, 8-228035, 9-232589, 10-125924, and 10-190001.

It has also been known that metal phthalocyanine compounds are available solely or in the form of mixture with other one or more compounds for the organic compound layer in the thin film transistor, as disclosed in Japanese laid-open patent publication No. 2000-174277.

It has also been known that condensed aromatic hydrocarbons such as pentacene are available solely or in the form of mixture with other one or more compounds for the organic compound layer in the thin film transistor, as disclosed in Japanese laid-open patent publications Nos. 5-55568 and 2001-94107.

Although the research and developments of the organic thin film transistors have been made, the known and conventional organic thin film transistors do not have the required or desired performances because the properties of the compounds used for the organic thin film do not satisfy the requirements. The known and conventional organic thin film transistors are lower in response speed than what is required in practice. The known and conventional organic thin film transistors do not have any practically sufficient ON/OFF ratio. The term "ON/OFF ratio" means a ratio of a source-drain current in ON-state of the transistor to a source-drain current in OFF-state of the transistor.

In the above circumstances, the development of a novel organic thin film transistor free from the above problems is desirable.

SUMMARY OF THE INVENTION

Accordingly, it is an object of the present invention to provide a novel organic thin film transistor free from the above problems.

It is a further object of the present invention to provide a novel organic thin film transistor which exhibits a desired high speed performance and has a high ON/OFF ratio.

The present invention provides an organic thin film transistor. The transistor includes: an organic thin film and first, second and third electrodes. The first and second electrodes are in contact with the organic thin film. The first and second electrodes are separated from each other. The third electrode is separated from the first and second electrodes. The third electrode receives an application of a control voltage which controls a current flowing from one of the first and second electrodes to the other. The organic thin film includes a compound represented by the following general formula [A]:

$$X \!-\!\!\left[-\!N\, Ar^1 Ar^2\right]_n \quad\quad\quad [A]$$

where each of $Ar^1$ and $Ar^2$ is selected independently from unsubstituted or substituted aromatic hydrocarbon groups having 6 to 20 carbon atoms and from unsubstituted or substituted aromatic heterocyclic groups having 6 to 20 carbon atoms; and X is selected from unsubstituted or substituted condensed aromatic hydrocarbon groups having 6 to 34 carbon atoms, and the condensed aromatic hydrocarbon groups are monovalent, divalent, trivalent or tetravalent groups; and n is the natural number in the range of 1–4.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTIONS OF THE PREFERRED EMBODIMENTS

Figure 1:
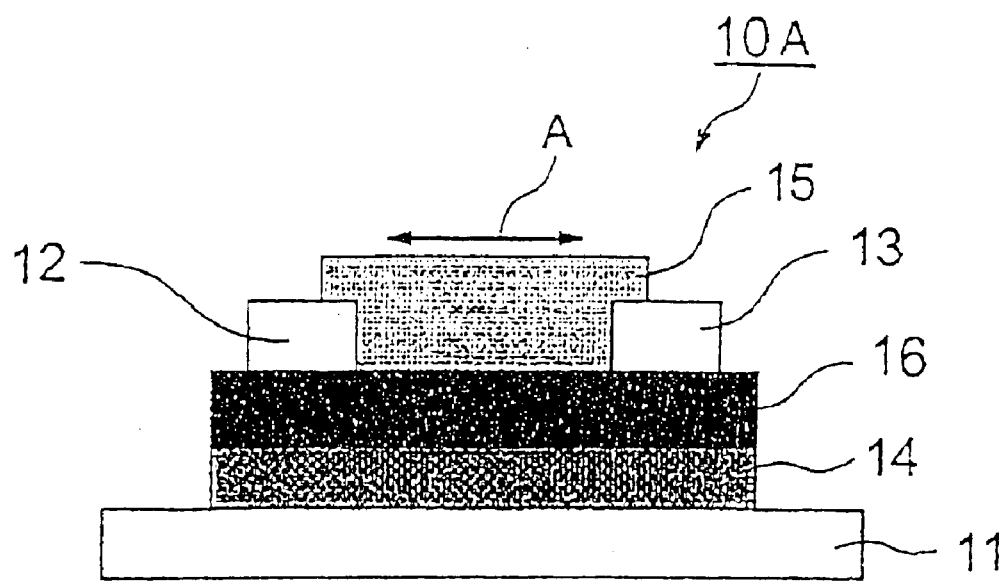
FIG. 1 is a fragmentary cross sectional elevation view of an organic thin film transistor in a first embodiment of the present invention.

The present inventors could find out the fact that the use of the specific aromatic amine compounds for the organic thin film in the organic thin film transistor allows great deals of improvements in response speed and in ON/OFF ratio of the organic thin film transistor.

The present inventors could also find out the further fact that not only the use of the specific aromatic amine compounds for the organic thin film in the organic thin film transistor but also the utilization of the specific transistor structure, where the moving direction of the carriers under the control substantially corresponds to a thickness direction of the organic thin film, allow further improvements in response speed and in ON/OFF ratio of the organic thin film transistor.

The present inventors could also find out the furthermore fact that introducing the donor dopant or acceptor dopant into interfaces of respective electrodes of the organic thin film transistor improves the carrier injection characteristic of the organic thin film transistor.

Accordingly, a primary aspect of the present invention is an organic thin film transistor. The transistor includes: an organic thin film and first, second and third electrodes. The first and second electrodes are in contact with the organic thin film. The first and second electrodes are separated from each other. The third electrode is separated from the first and second electrodes. The third electrode receives an application of a control voltage which controls a current flowing from one of the first and second electrodes to the other.

The organic thin film includes a compound represented by the following general formula [A]:

X—[—N Ar$^1$Ar$^2$]$_n$         [A]

where each of Ar$^1$ and Ar$^2$ is selected independently from unsubstituted or substituted aromatic hydrocarbon groups having 6 to 20 carbon atoms and from unsubstituted or substituted aromatic heterocyclic groups having 6 to 20 carbon atoms; and X is selected from unsubstituted or substituted condensed aromatic hydrocarbon groups having 6 to 34 carbon atoms, and the condensed aromatic hydrocarbon groups are monovalent, divalent, trivalent or tetravalent groups; and n is the natural number in the range of 1–4.

In one typical embodiment, the two substituent of Ar$^1$ and Ar$^2$ may be bonded in the form of ring.

In one typical embodiment, the organic thin film may consist of the above compound solely.

In another typical embodiment, the organic thin film may consist of a mixture including the above compound.

In one typical embodiment, the condensed aromatic hydrocarbon groups unsubstituted or substituted may optionally and advantageously be selected from naphthalene, biphenylene, perylene, pentacene, benzo[a]perylene, dibenzo[a,j]perylene, dibenzo[a,o]perylene, bisanthrene, terylene, and tetrabenzo[de,hi,op,st]pentacene, and n is 1 or 2. At least one of diarylamino groups represented by [—NAr$^1$Ar$^2$] may optionally and advantageously include a substituted or unsubstituted styryl group as a substituent of Ar$^1$. Further, the compound may optionally and advantageously include at least one cyclohexylidenemethine group as a substituent of Ar$^1$ and Ar$^2$. Further, at least one of diarylamino groups represented by [—NAr$^1$Ar$^2$] may optionally and advantageously include a substituted styryl group as a substituent of Ar$^1$, and the substituted styryl group may optionally and advantageously include a cyclohexylidenemethine group as a substituent thereof.

In one typical embodiment, the condensed aromatic hydrocarbon group may optionally and advantageously be triphenylene, and n is 1–3. At least one of diarylamino groups represented by [—NAr$^1$Ar$^2$] may optionally and advantageously include a substituted or unsubstituted styryl group as a substituent of Ar$^1$. Further, the compound may optionally and advantageously include at least one cyclohexylidenemethine group as a substituent of Ar$^1$ and Ar$^2$. Further, at least one of diarylamino groups represented by [—N Ar$^1$Ar$^2$] may also optionally and advantageously include a substituted styryl group as a substituent of Ar$^1$, and the substituted styryl group may optionally and advantageously include a cyclohexylidenemethine group as a substituent thereof.

In still another embodiment, the condensed aromatic hydrocarbon group may also be at least one of tetraphenylene and 9,9'-spirobifluorene, and n is 1–4. At least one of diarylamino groups represented by [—N Ar$^1$Ar$^2$] may optionally and advantageously include a substituted or unsubstituted styryl group as a substituent of Ar$^1$. Further, the compound may optionally and advantageously include at least one cyclohexylidenemethine group as a substituent of Ar$^1$ and Ar$^2$. Further, at least one of diarylamino groups represented by [—N Ar$^1$Ar$^2$] may optionally and advantageously include a substituted styryl group as a substituent of Ar$^1$, and the substituted styryl group includes a cyclohexylidenemethine group as a substituent thereof.

In one embodiment, a moving direction of carriers between the first and second electrodes substantially corresponds to a thickness direction of the organic thin film.

In another embodiment, a moving direction of carriers between the first and second electrodes is substantially parallel to an interface of the organic thin film.

In one preferable embodiment, one of donor dopants and acceptor dopants may optionally and advantageously be doped into at least one of interfaces of the organic thin film to the first, second and third electrodes. In one example, the donor dopants may optionally and advantageously be selected from metal elements and inorganic metal compounds. Also, the acceptor dopants may optionally and advantageously be selected from Lewis acids.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

A first embodiment according to the present invention will be described in detail with reference to the drawing. FIG. 1 is a fragmentary cross sectional elevation view of an organic thin film transistor in the first embodiment of the present invention. An organic thin film transistor 10A is a field effect transistor. The organic thin film transistor 10A is fabricated over a substrate 11. A gate electrode 14 is formed on the substrate 11. An insulating layer 16 is formed on the gate electrode 14. The insulating layer 16 serves as a gate insulating layer. Source and-drain electrodes 12 and 13 are formed on the insulating layer 16, wherein the source and drain electrodes 12 and 13 are separated from each other in a horizontal direction parallel to a surface of the substrate 11. The source and drain electrodes 12 and 13 are also separated from the gate electrode 14 by the insulating layer 16. An organic thin film 15 is formed on the insulating layer 16 and between the source and drain electrodes 12 and 13, wherein the organic thin film 15 is in contact with both the source and drain electrodes 12 and 13. The source and drain electrodes 12 and 13 are separated from each other by the organic thin film 15 in the horizontal direction parallel to the surface of the substrate 11.

A part of the organic thin film 15 between the source and drain electrodes 12 and 13 is a channel region for flowing a source-drain current between the source and drain electrodes 12 and 13. This source-drain current is controlled by a voltage applied to the gate electrode 14 for enabling the organic thin film transistor to exhibit ON/OFF operations. The source-drain current is realized by the move of free electrons and holes in a horizontal direction represented by arrow mark "A" in parallel to the interfaces of the organic thin film 15.

The organic thin film 15 of this embodiment comprises a compound having a molecular structure represented by the following general formula [A]:

[A]

where X is one selected from unsubstituted or substituted aromatic hydrocarbon groups having 6 to 34 carbon atoms. The aromatic hydrocarbon groups are monovalent, divalent, trivalent or tetravalent groups. Examples of the unsubstituted aromatic hydrocarbon groups include, but not limited to, benzene, naphthalene, anthracene, biphenylene, fluorene, phenanthlene, naphthacene, triphenylene, pyrene, dibenzo[cd,jk]pyrene, perylene, benzo[a]perylene, dibenzo[a,j]perylene, dibenzo[a,o]perylene, pentacene, tetrabenzo[de,hi,op,st]pentacene, tetraphenylene, terylene, bisanthrene, and 9,9'-spirobifluorene.

Examples of the substituent of the above-described aromatic hydrocarbon groups may include, but not limited to, halogen atoms, hydroxyl groups, substituted or unsubstituted amino groups, nitro groups, cyano groups, substituted or unsubstituted alkyl groups, substituted or unsubstituted alkenyl groups, substituted or unsubstituted cycloalkyl groups, substituted or unsubstituted alkoxyl groups, substituted or unsubstituted aromatic hydrocarbon groups, substituted or unsubstituted aromatic heterocyclic groups, substituted or unsubstituted aralkyl groups, substituted or unsubstituted aryloxy groups, substituted or unsubstituted alkoxycarbonyl groups, and carboxyl groups.

Each of $Ar^1$ and $Ar^2$ may be selected independently from unsubstituted or substituted aromatic hydrocarbon groups having 6 to 20 carbon atoms. Examples of unsubstituted aromatic hydrocarbon groups having 6 to 20 carbon atoms may include, but not limited to phenyl groups, naphthyl groups, anthryl groups, phenanthryl groups, pyrenyl groups, and perylenyl groups.

Examples of the substituent of the above-described aromatic hydrocarbon groups having 6 to 20 carbon atoms may include, but not limited to, halogen atoms, hydroxyl groups, substituted or unsubstituted amino groups, nitro groups, cyano groups, substituted or unsubstituted alkyl groups, substituted or unsubstituted alkenyl groups, substituted or unsubstituted cycloalkyl groups, substituted or unsubstituted alkoxyl groups, substituted or unsubstituted aromatic hydrocarbon groups, substituted or unsubstituted aromatic heterocyclic groups, substituted or unsubstituted aralkyl groups, substituted or unsubstituted aryloxy groups, substituted or unsubstituted alkoxycarbonyl groups, and carboxyl groups.

Typical examples of the halogen atoms may be fluorine, chlorine, bromine, and iodine. The above-mentioned substituted or unsubstituted amino group may be represented by the chemical formula of $—NX^1X^2$, wherein $X^1$ and $X^2$ may be the same as or different from each other. Typical Examples of $X^1$ and $X^2$ may include, but not limited to, a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,9-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the above-mentioned substituted or unsubstituted alkyl groups may include, but not limited to, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the above-mentioned substituted or unsubstituted alkenyl groups may include, but not limited to, vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, 3-phenyl-1-butenyl group, and cyclohexylidenemethine.

Examples of the above-mentioned substituted or unsubstituted cycloalkyl groups may include, but not limited to, cyclopropyl group, cyclobutyl group, cyclopentyl group, cyclohexyl group, and 4-methylcyclohexyl group.

The above-mentioned substituted or unsubstituted alkoxyl groups may be represented by the chemical formula of —OY. Examples of Y in the above-mentioned formula may include, but not limited to, methyl groups, ethyl group, propyl group, isopropyl groups, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the above-mentioned substituted or unsubstituted aromatic hydrocarbon groups may include, but not limited to, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphtacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the above-mentioned substituted or unsubstituted aromatic heterocyclic groups may include, but not limited to, 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,7-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazninyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-5-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4t-butyl-3-indolyl group.

Examples of the above-mentioned substituted or unsubstituted aralkyl groups may include, but not limited to, benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

The above-mentioned substituted or unsubstituted aryloxy groups may be represented by the chemical formula of —OZ. Examples of Z in the above-mentioned formula may include, but not limited to, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

The above-mentioned substituted or unsubstituted alkoxycarbonyl group may be represented by the chemical formula of —COOY$^2$. Examples of Y$^2$ in the above-mentioned formula may include, but not limited to, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

The substituent of each of Ar$^1$ and Ar$^2$ may include, but not limited to, substituted or unsubstituted styryl group. Examples of the substituted or unsubstituted styryl group may include, but not limited to, unsubstituted styryl groups, and unsubstituted 2,2-diphenylvinyl groups as well as substituted styryl groups, and substituted 2,2-diphenylvinyl groups, wherein the substituted styryl groups or 2,2-diphenylvinyl groups may have a variety of substituent. Examples of the substituent to the terminal phenyl group included in the substituted styryl groups or the substituted 2,2-diphenylvinyl groups may include, but not limited to, halogen atom, hydroxyl group, the above-mentioned substituted or unsubstituted amino group, nitro group, cyano group, the above-mentioned substituted or unsubstituted alkyl group, the above-mentioned substituted or unsubstituted alkenyl group, the above-mentioned substituted or unsubstituted cycloalkyl group, the above-mentioned substituted or unsubstituted alkoxyl group, the above-mentioned substituted or unsubstituted aromatic hydrocarbon group, the above-mentioned substituted or unsubstituted aromatic heterocyclic group, the above-mentioned substituted or unsubstituted aralkyl group, the above-mentioned substituted or unsubstituted aryloxy group, the above-mentioned substituted or unsubstituted alkoxycarbonyl group, and carboxyl group.

The available compounds for the organic thin film of the organic thin film transistor in accordance with the embodiments of the present invention may include, but not limited to, the following four hundreds twenty three typical examples represented by the structural formulas (1) to 423).

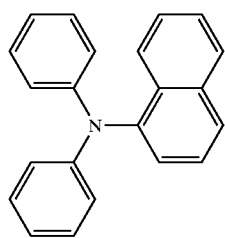
(1)
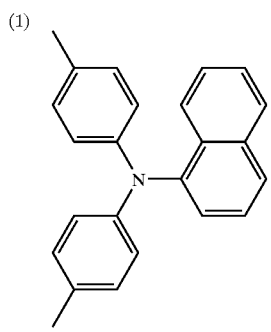
(2)
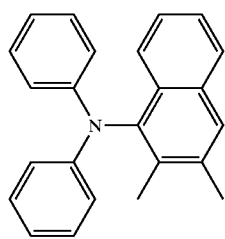
(3)
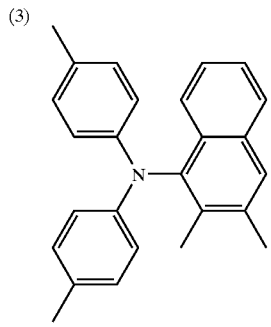
(4)
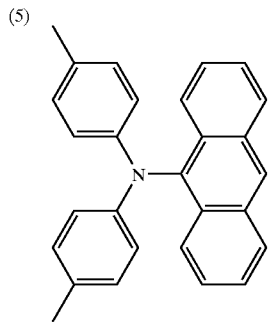
(5)
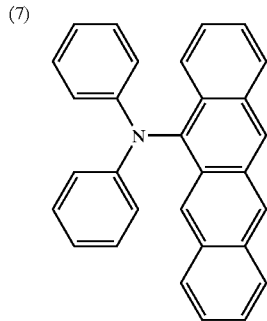
(6)
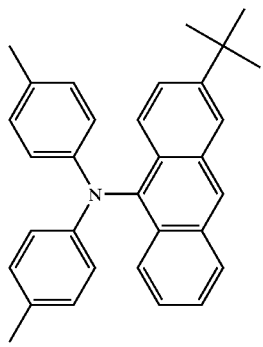
(7)
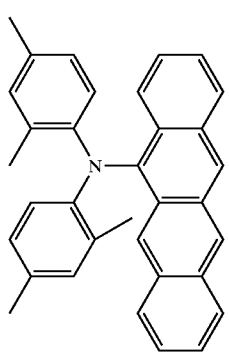
(8)
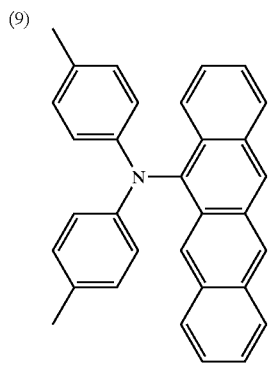
(9)
(10)

-continued
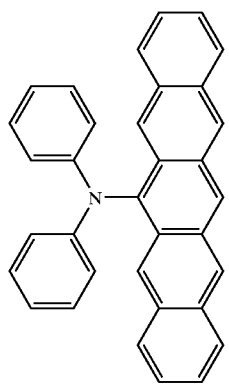
(11)
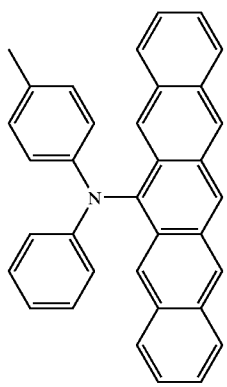
(12)
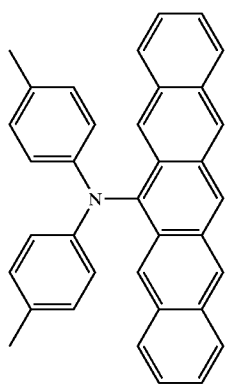
(13)
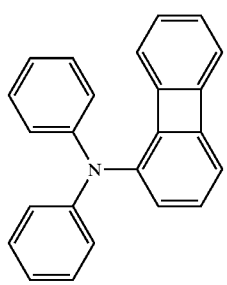
(14)
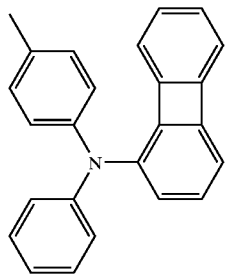
(15)
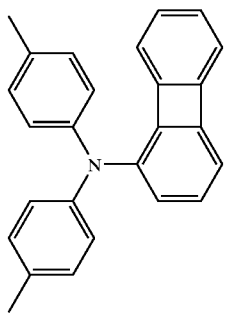
(16)
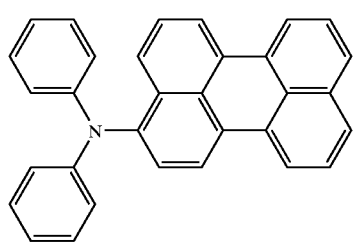
(17)
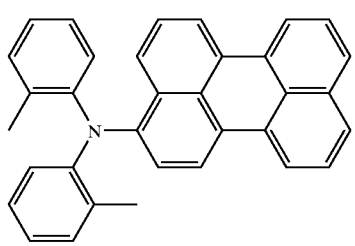
(18)
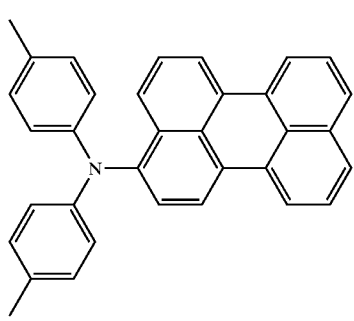
(19)
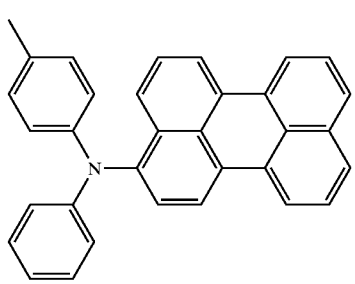
(20)

-continued
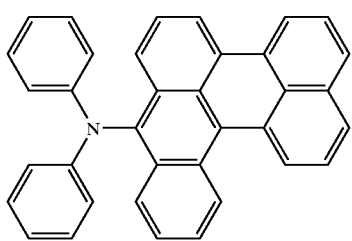
(21)
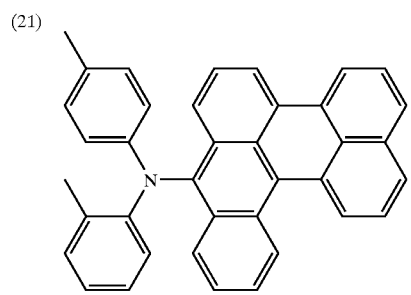
(22)
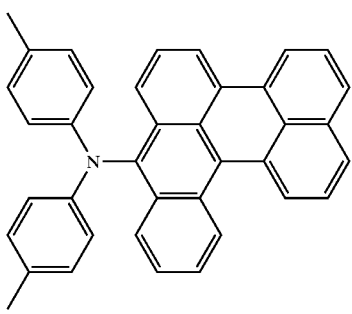
(23)
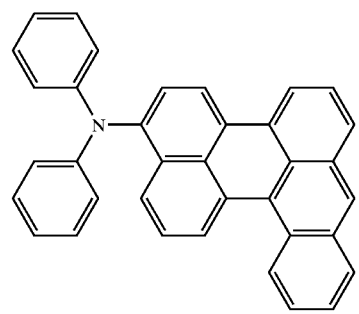
(24)
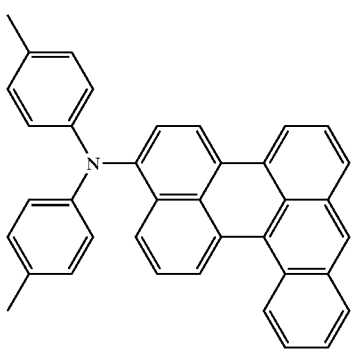
(25)
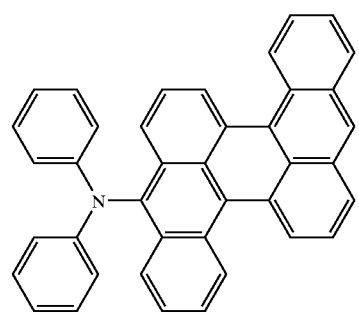
(26)
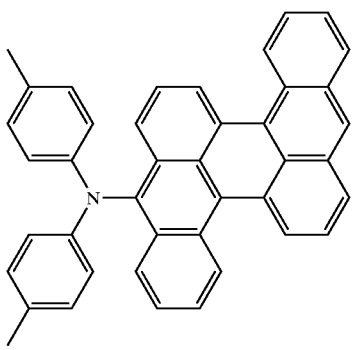
(27)
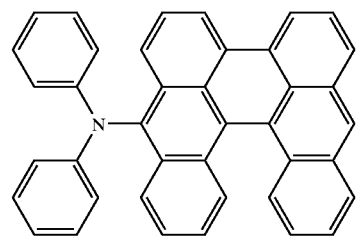
(28)
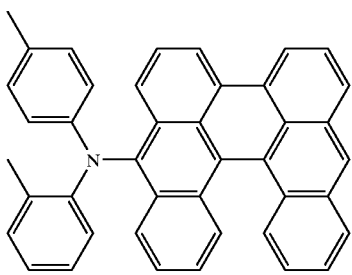
(29)
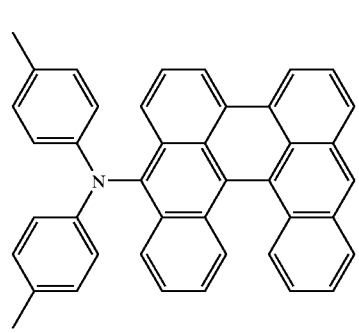
(30)

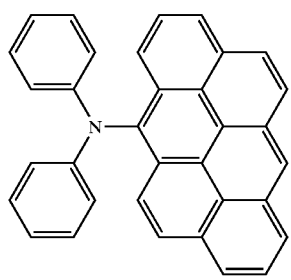
(31)
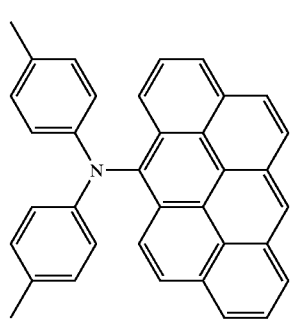
(32)
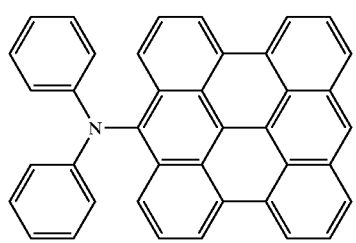
(33)
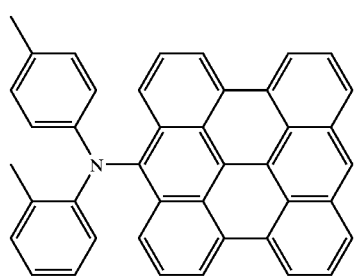
(34)
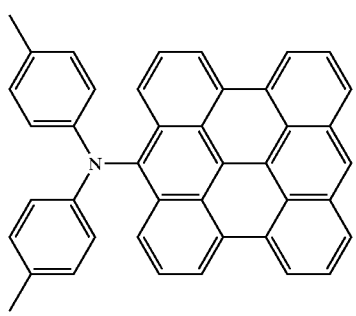
(35)
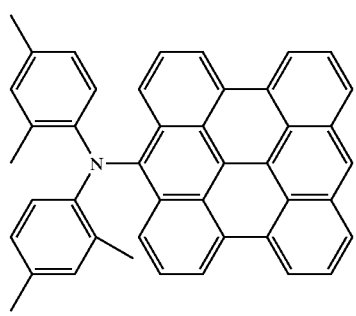
(36)
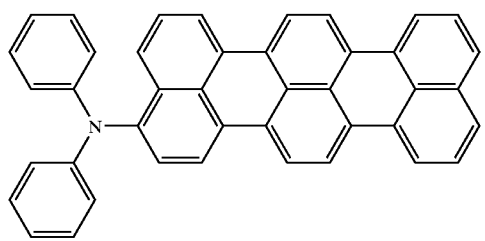
(37)
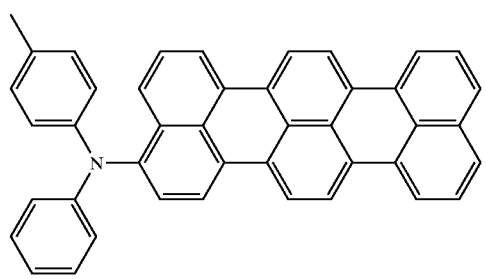
(38)
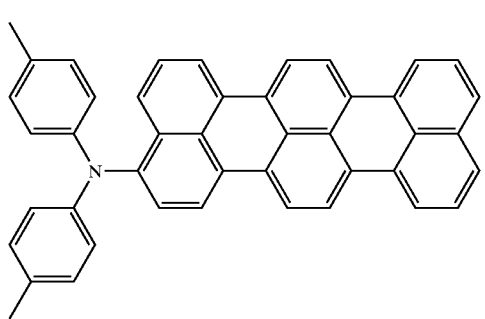
(39)
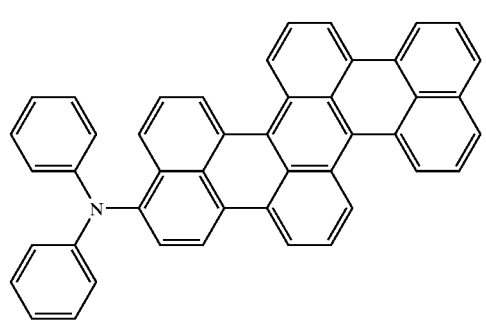
(40)

-continued
(41)
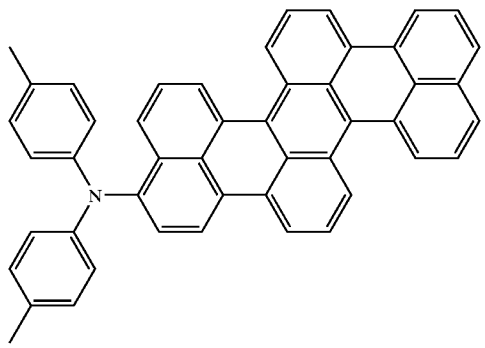
(42)
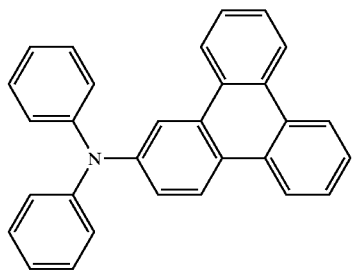
(43)
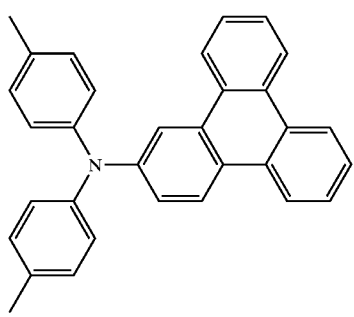
(44)
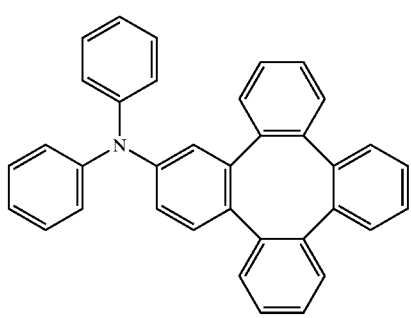
(45)
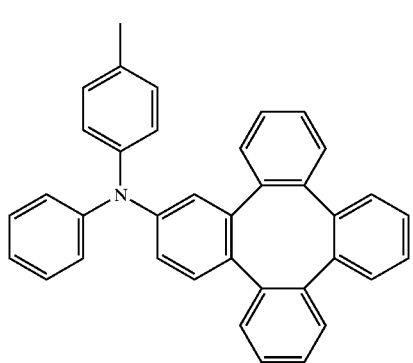
(46)
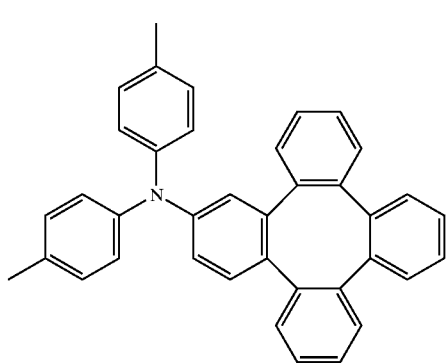
(47)
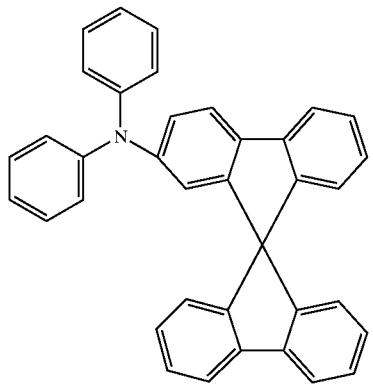
(48)
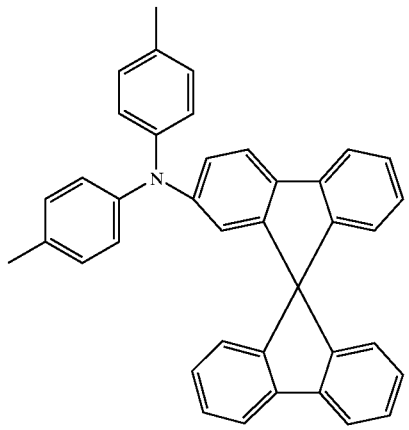

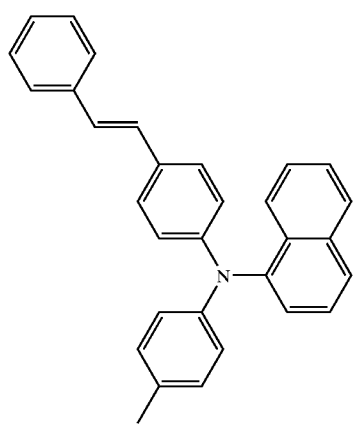
(49)
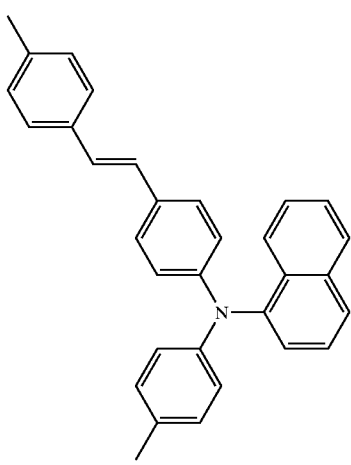
(50)
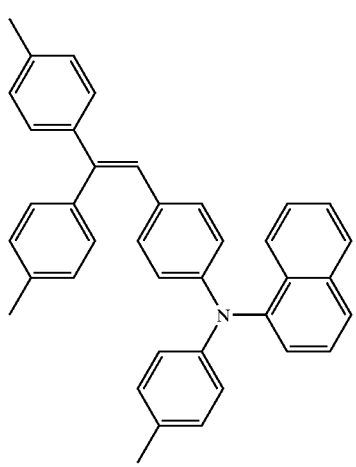
(51)
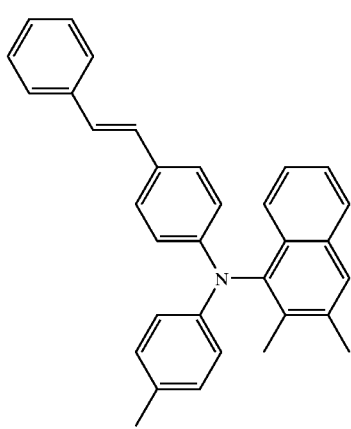
(52)
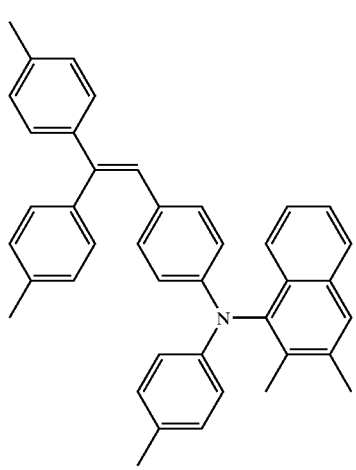
(53)
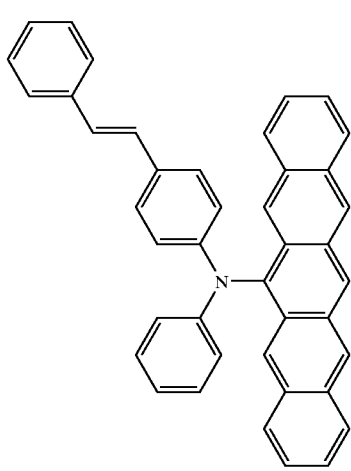
(54)

-continued
(55)
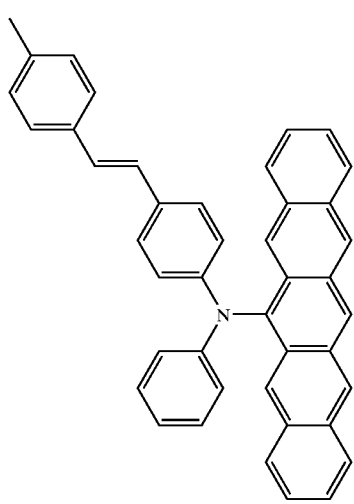
(56)
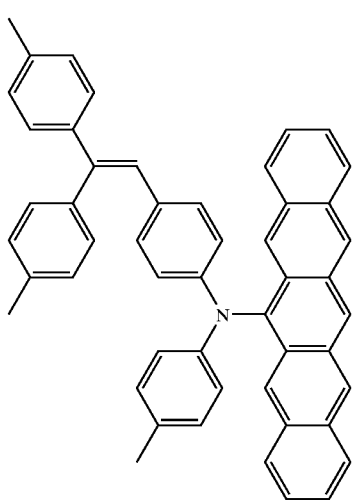
(57)
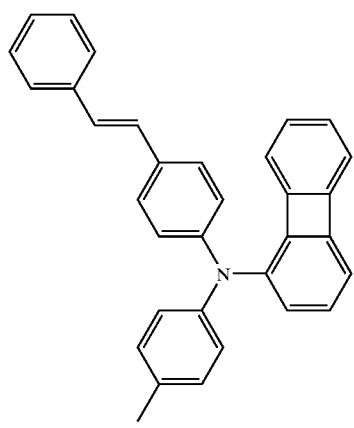
(58)
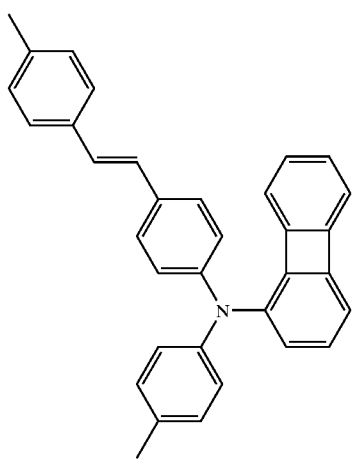
(59)
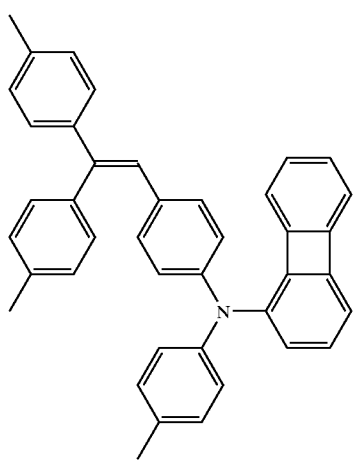
(60)
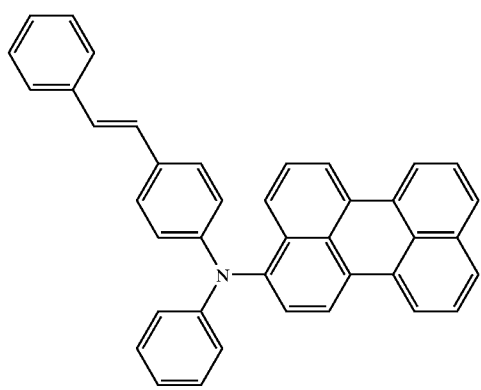

-continued
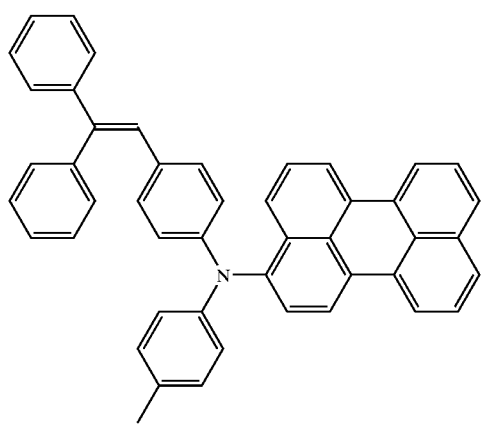
(61)
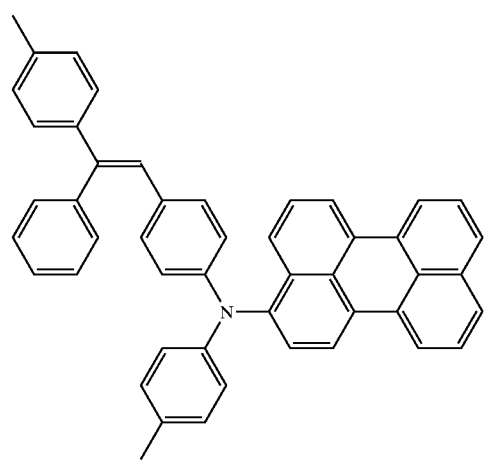
(62)
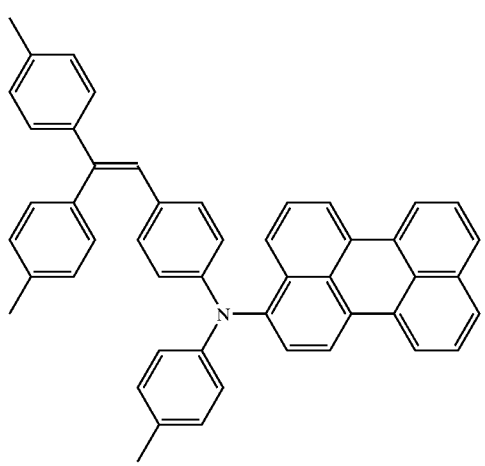
(63)
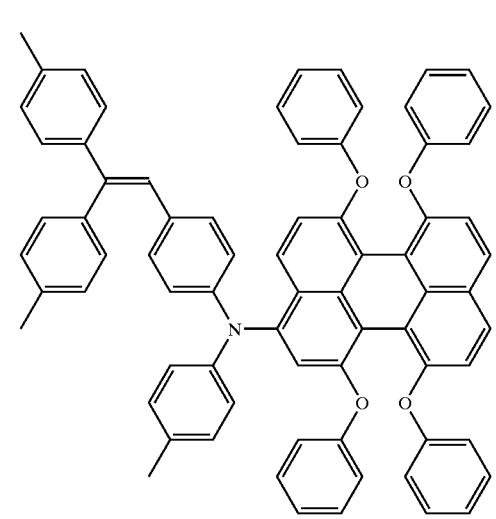
(64)
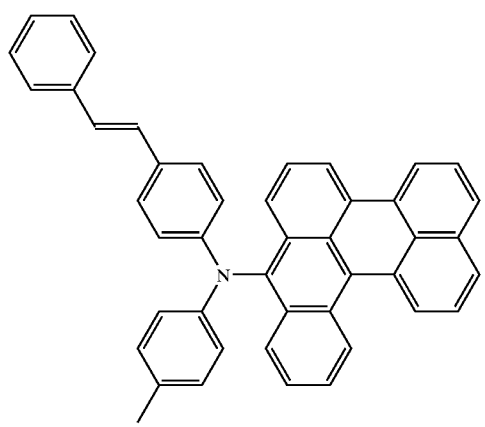
(65)
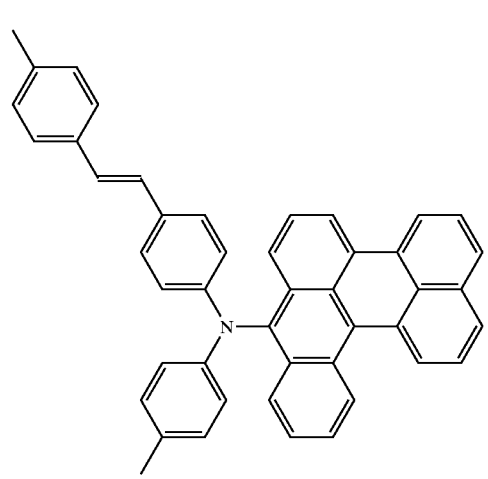
(66)

-continued
(67) 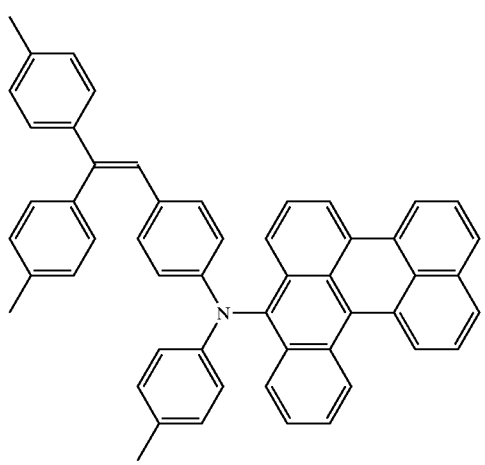
(68) 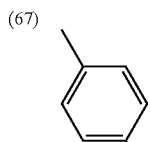
(69) 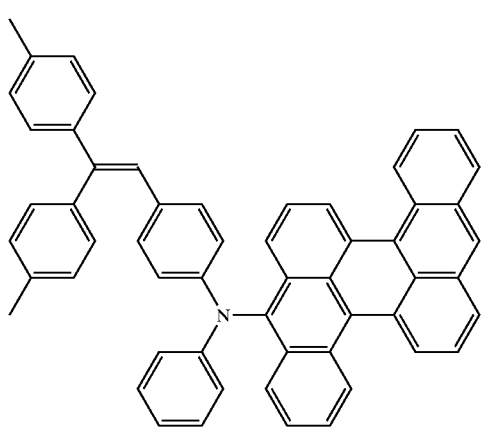
(70) 
(71) 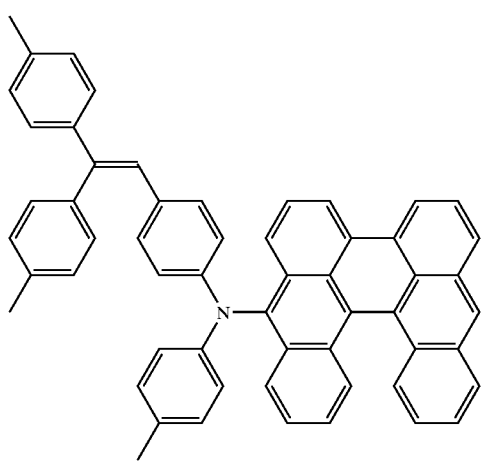
(72) 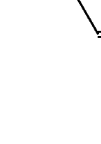

-continued
(73)
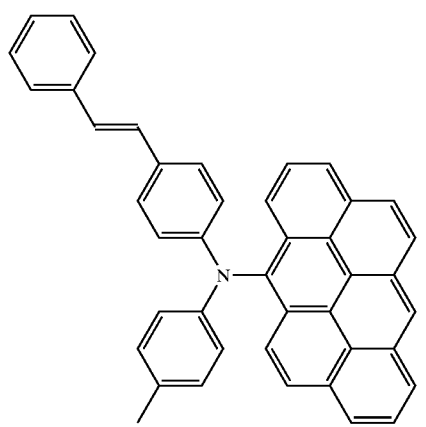
(74)
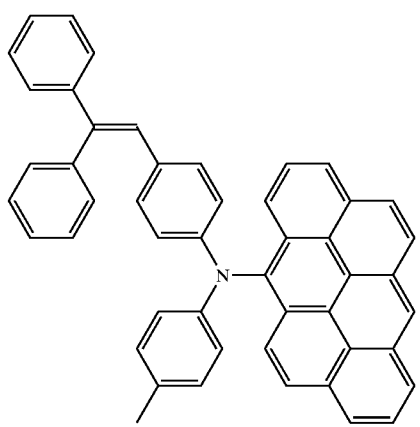
(75)
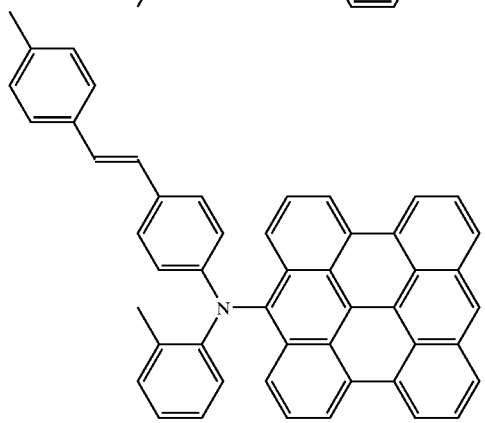
(76)
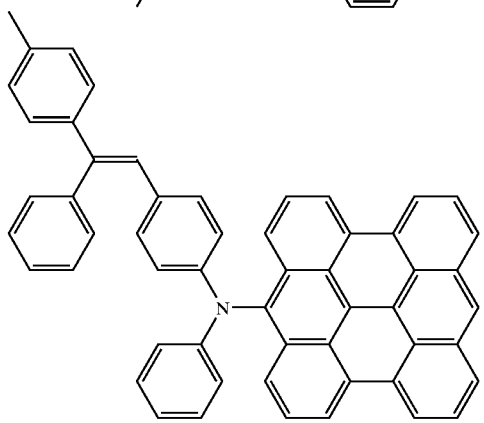
(77)
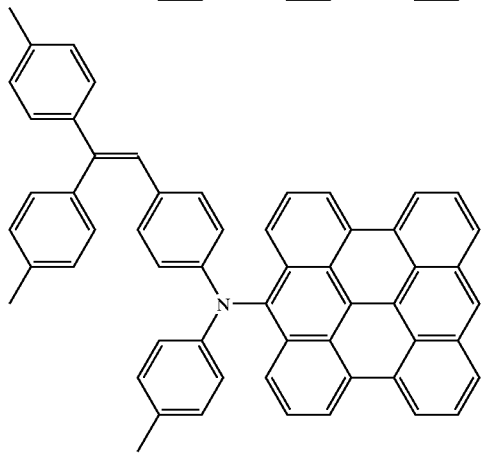
(78)
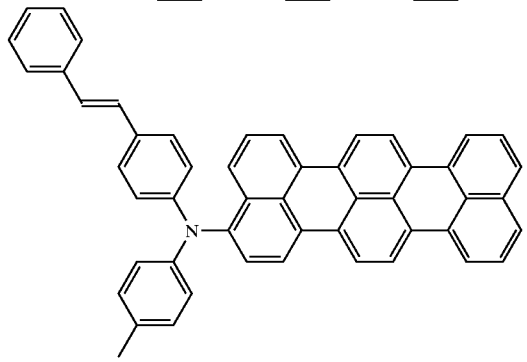
(79)
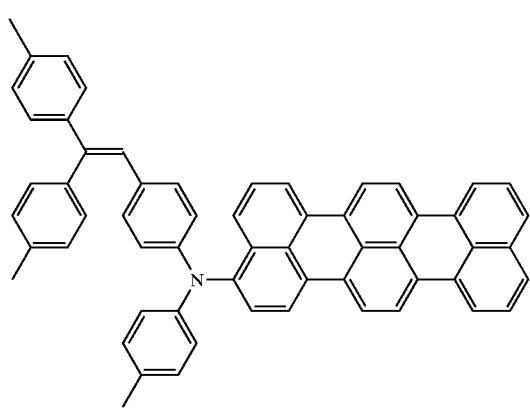
(80)
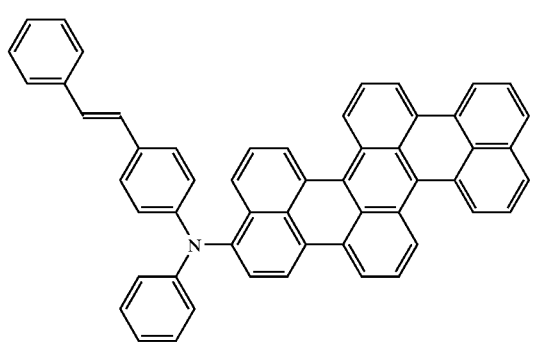

-continued
(81)
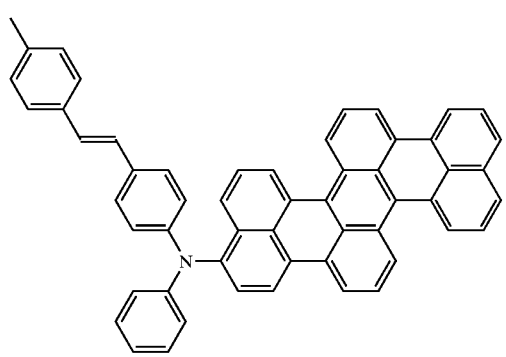
(82)
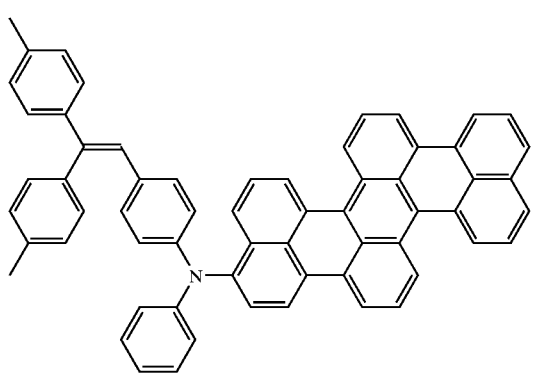
(83)
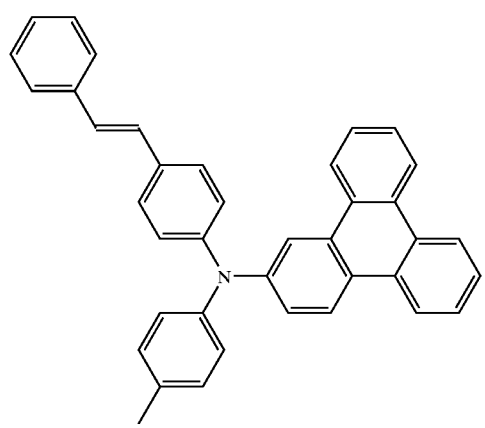
(84)
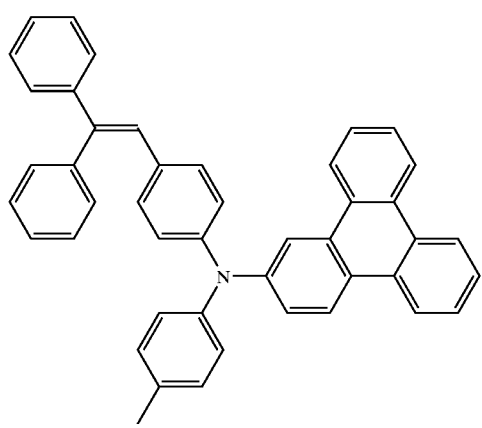
(85)
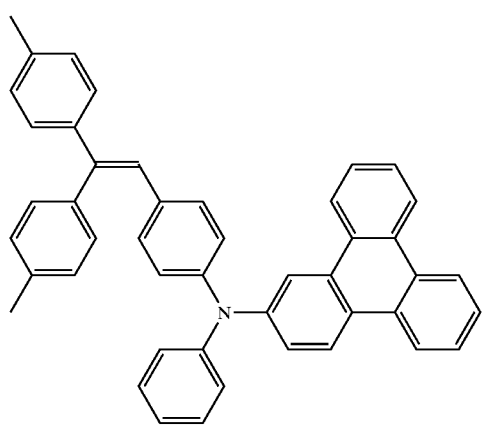
(86)
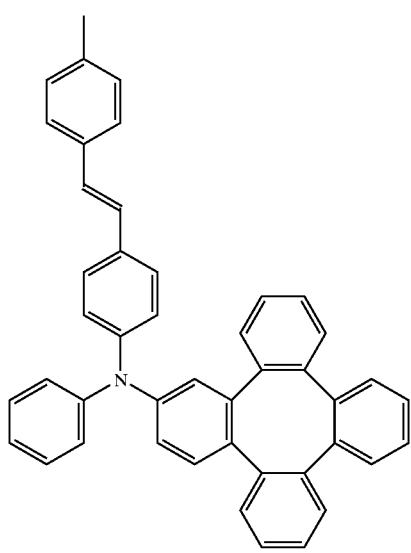

(87)
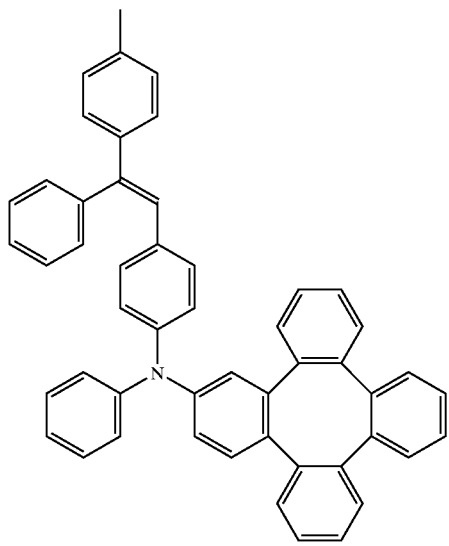
(88)
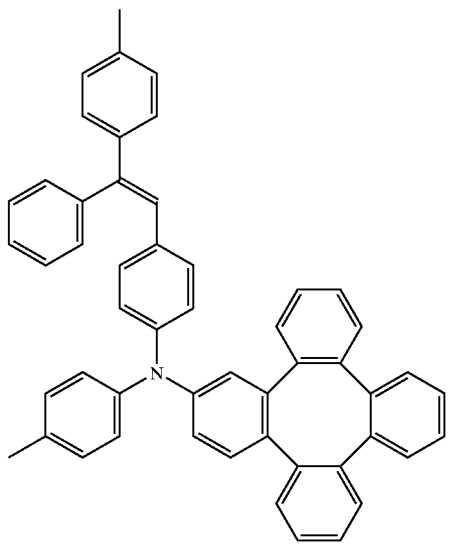
(89)
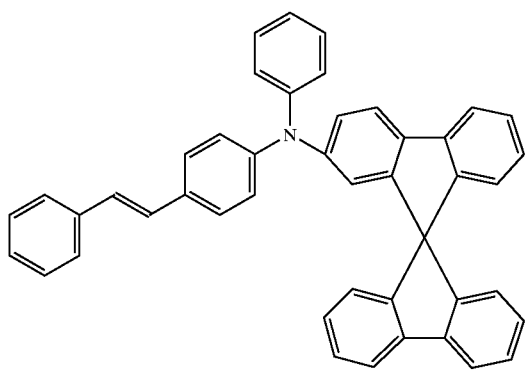
(90)
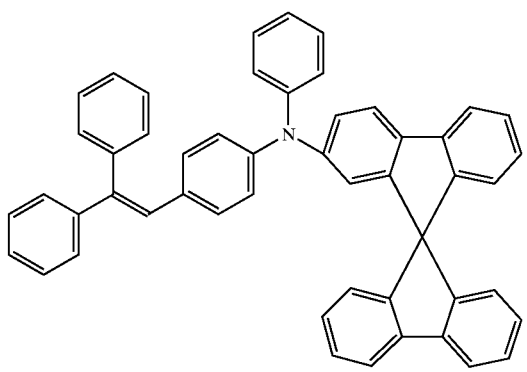
(91)
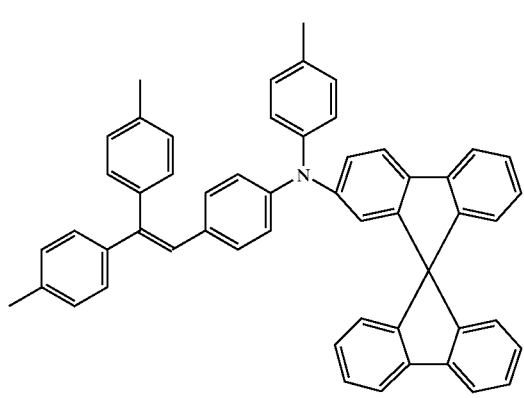
(92)
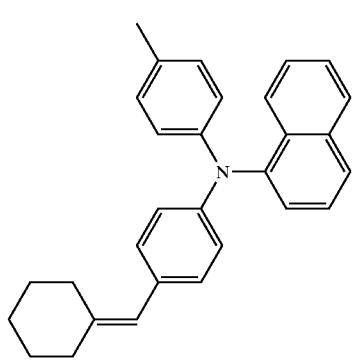

-continued
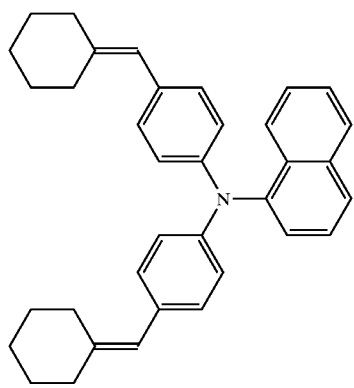
(93)
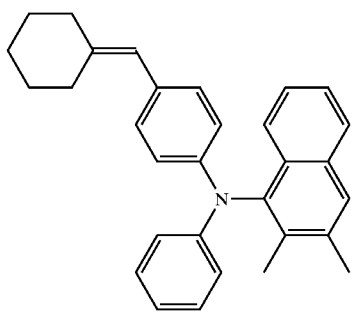
(94)
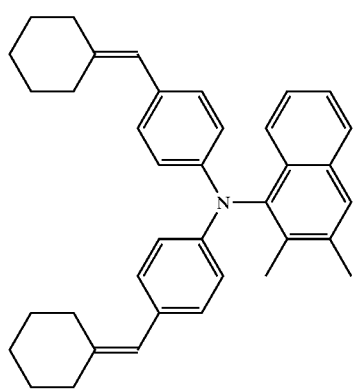
(95)
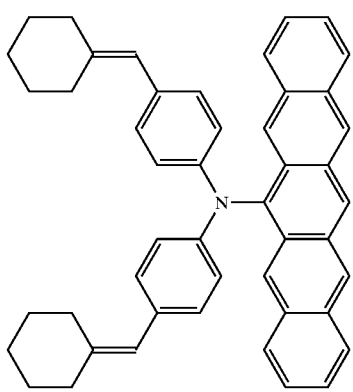
(96)
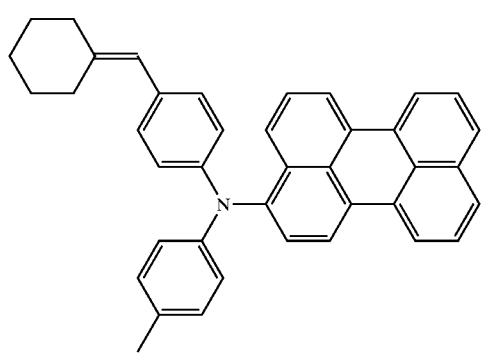
(97)
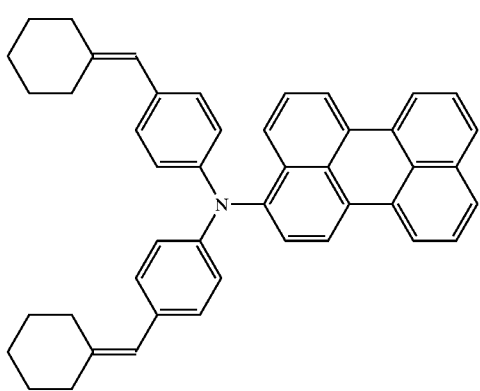
(98)
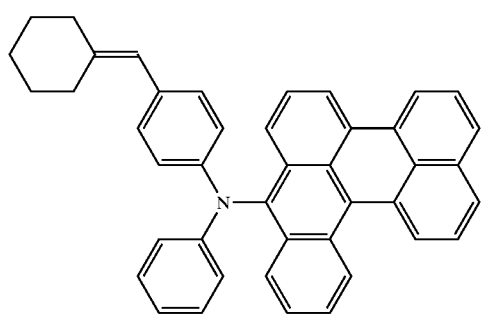
(99)
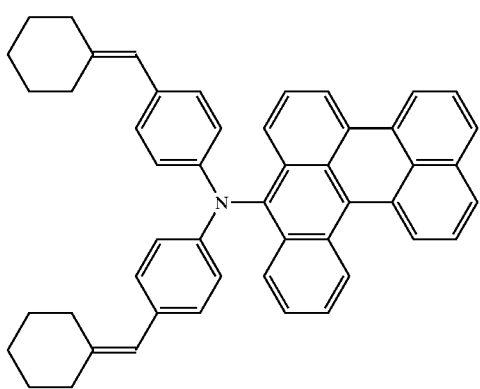
(100)

-continued
(101)
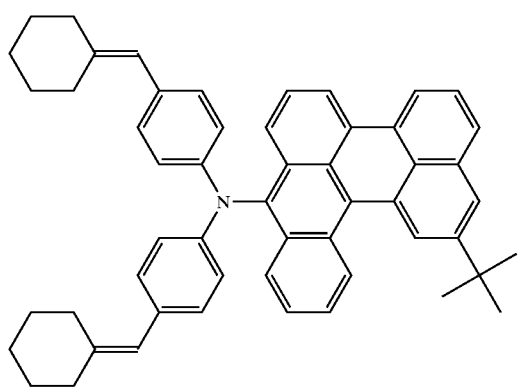
(102)
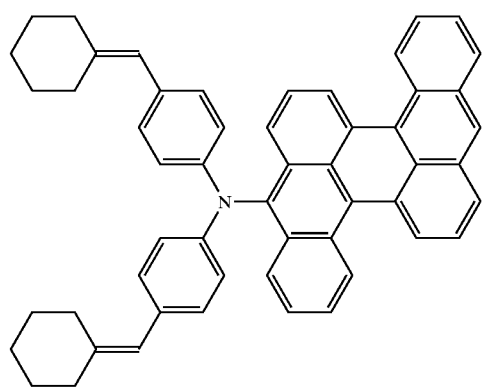
(103)
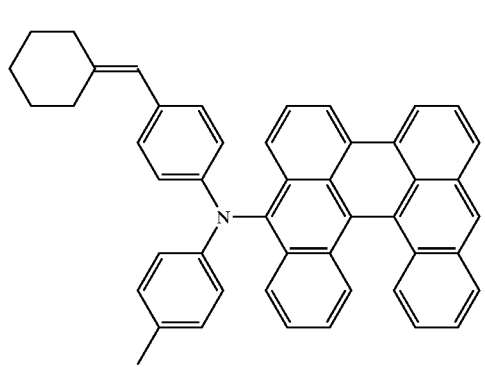
(104)
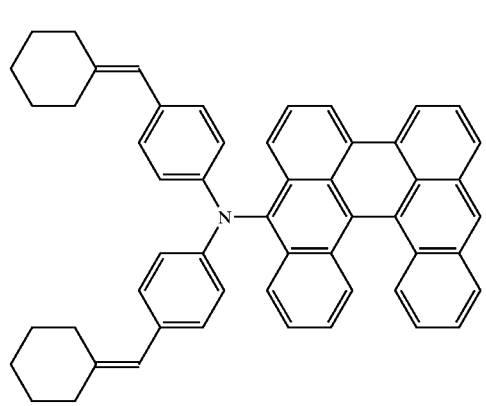
(105)
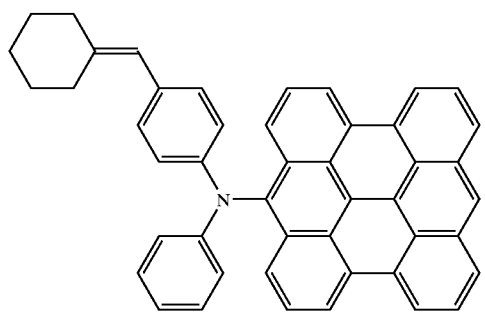
(106)
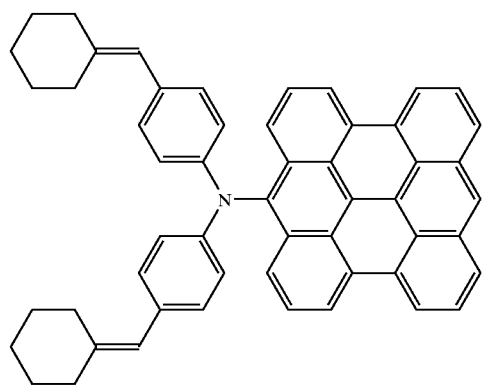
(107)
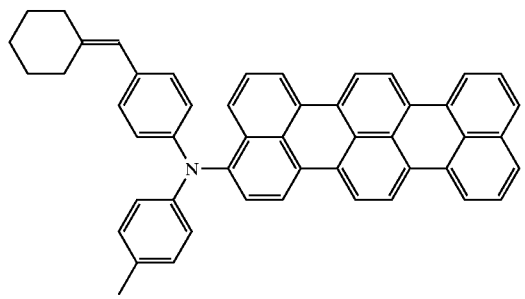
(108)
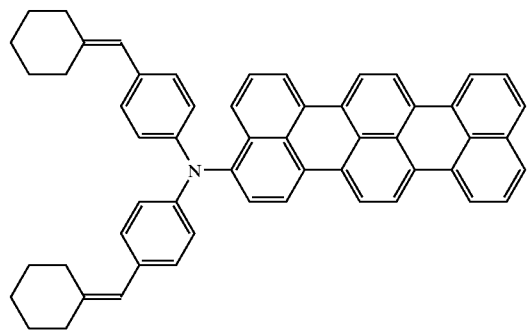

-continued
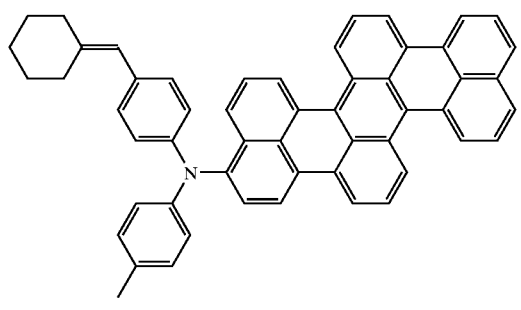
(109)
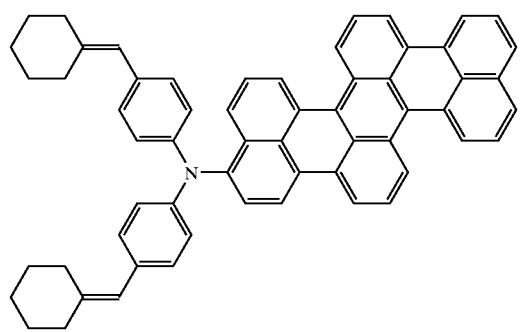
(110)
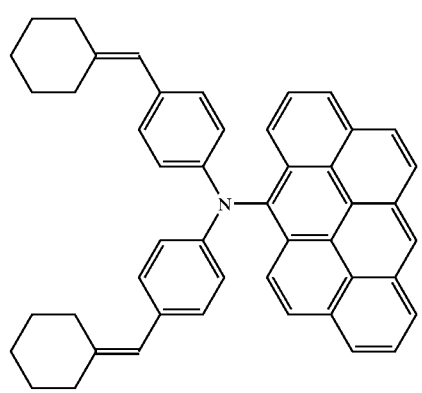
(111)
(112)
(113)
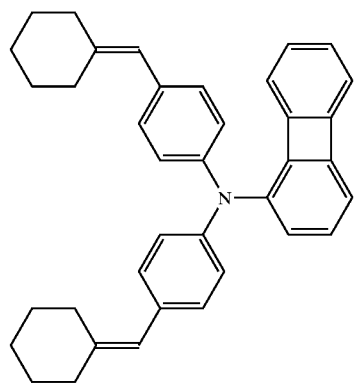
(114)
(115)
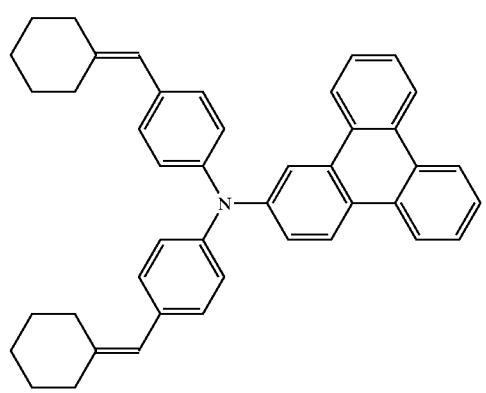
(116)

(117)
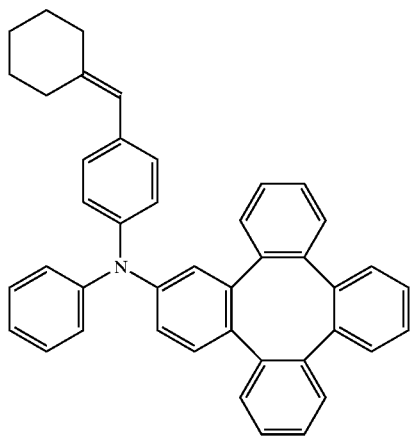
(118)
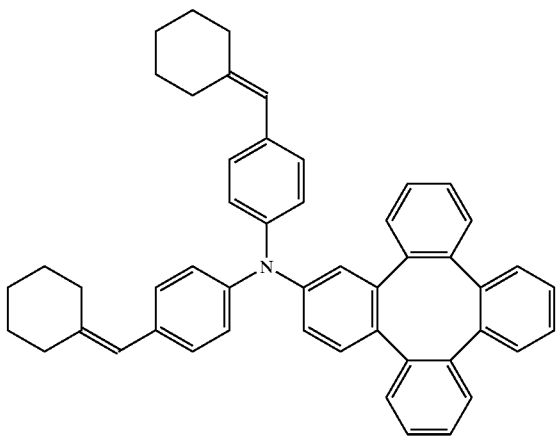
(119)
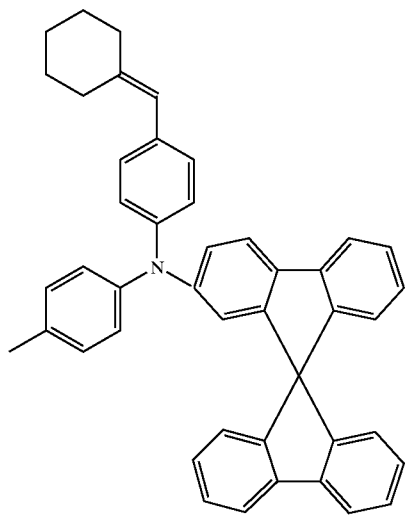
(120)
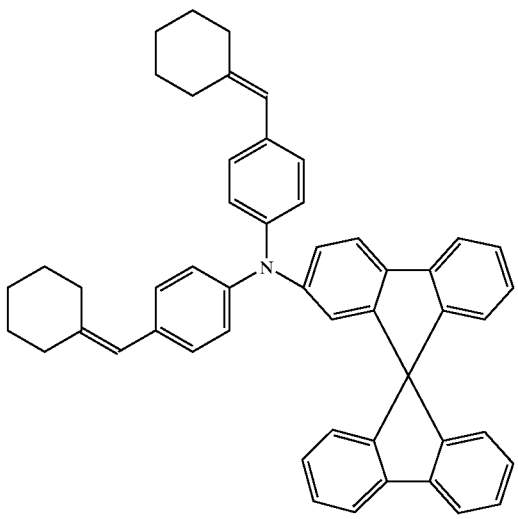
(121)
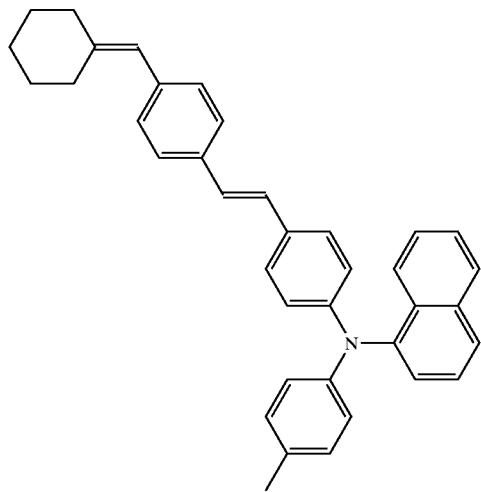
(122)
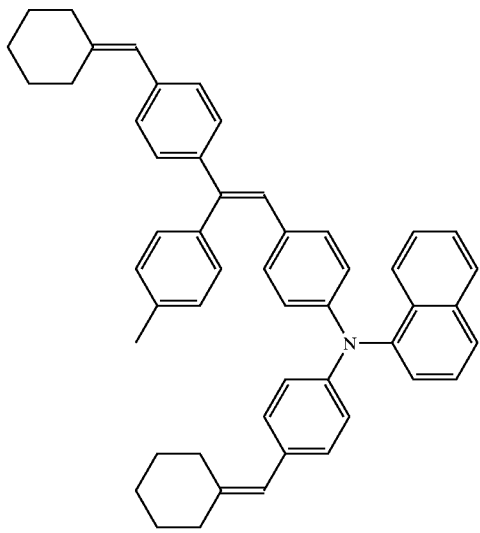

(123) 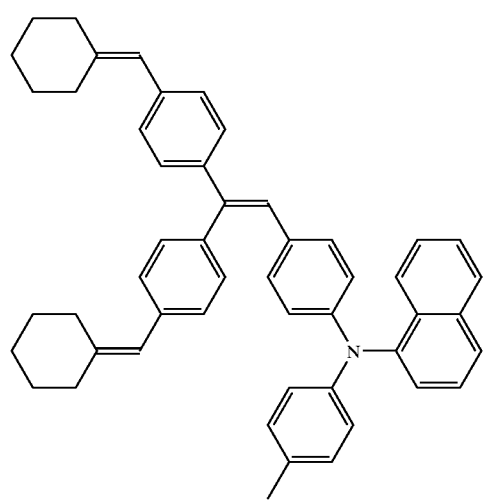
(124) 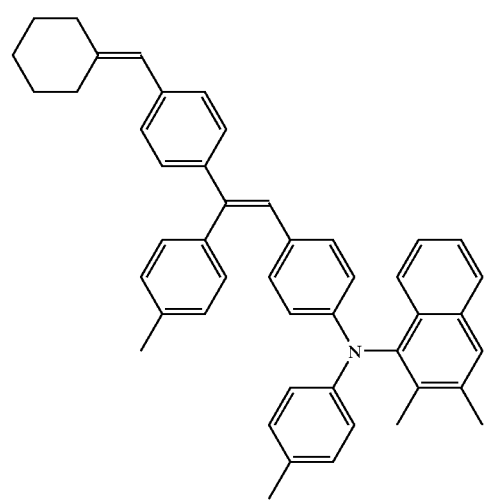
(125) 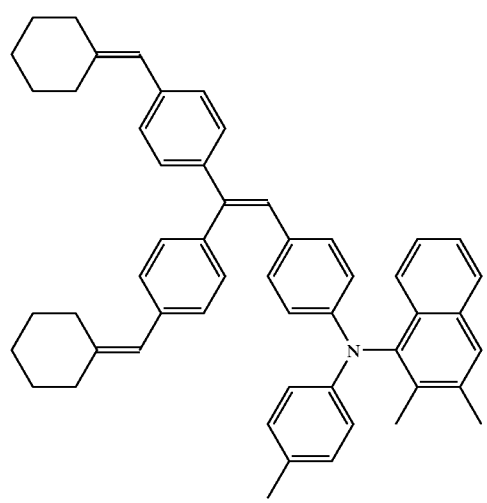
(126) 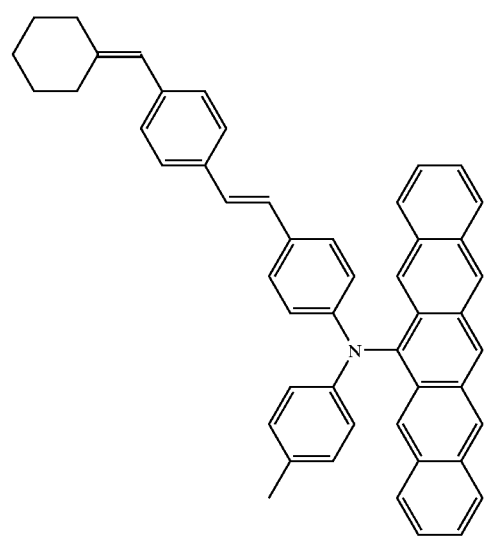
(127) 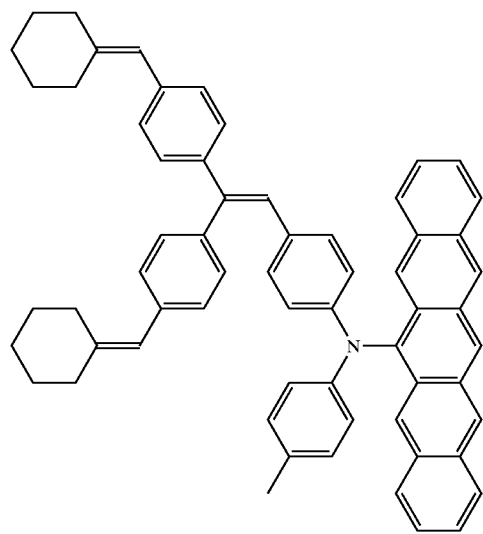
(128) 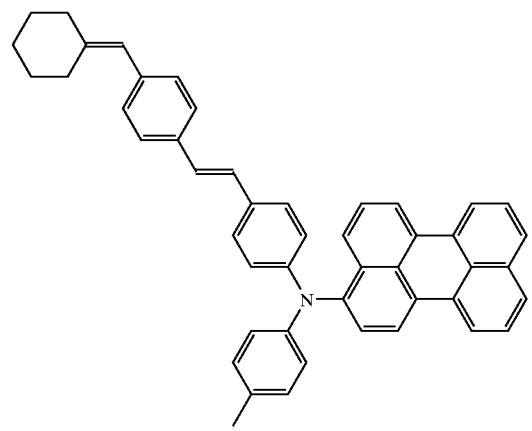

-continued
(129)
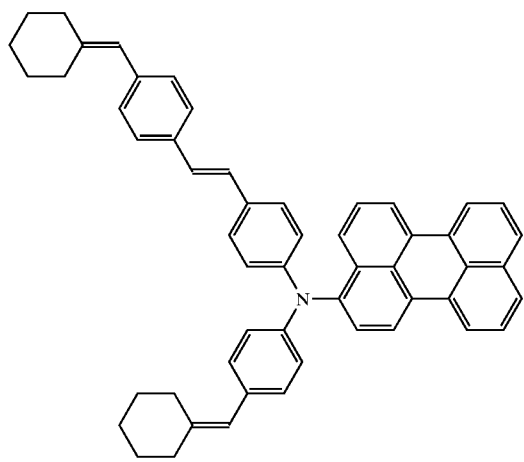
(130)
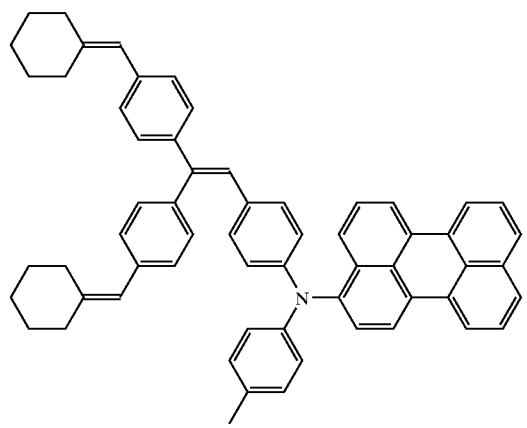
(131)
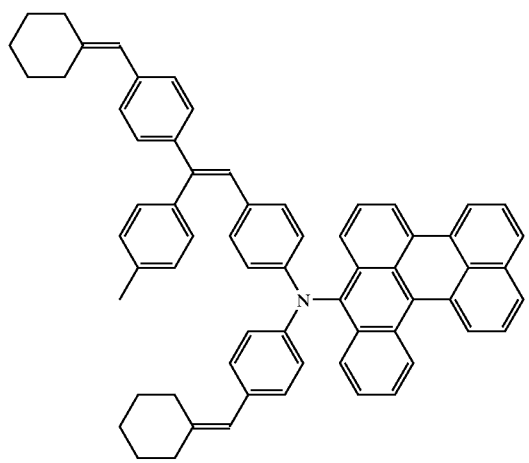
(132)
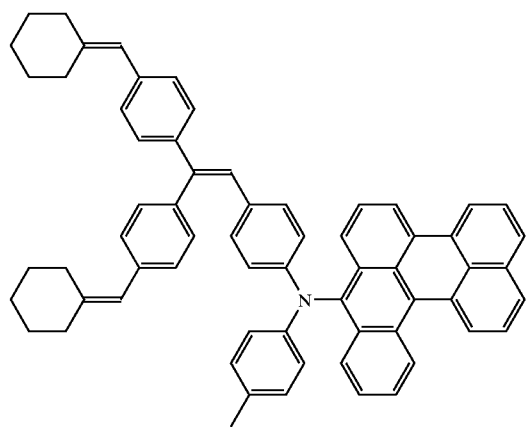
(133)
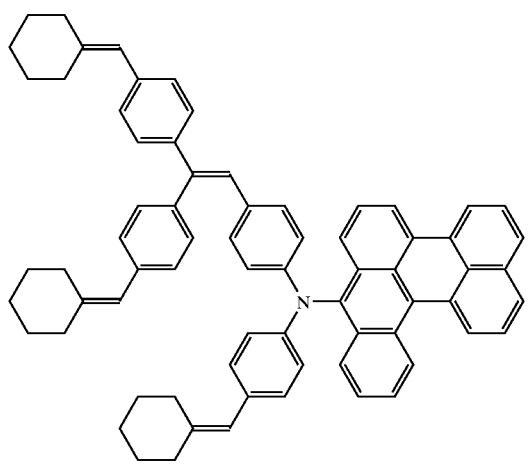
(134)
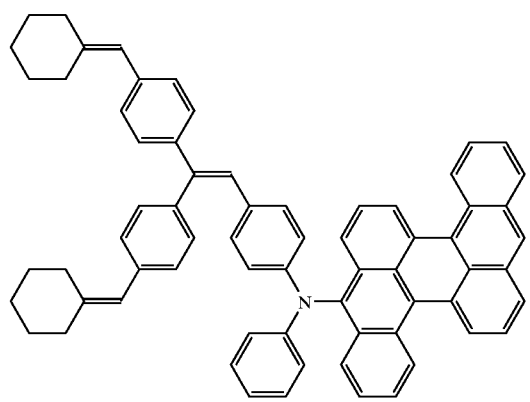

-continued
(135) (136)
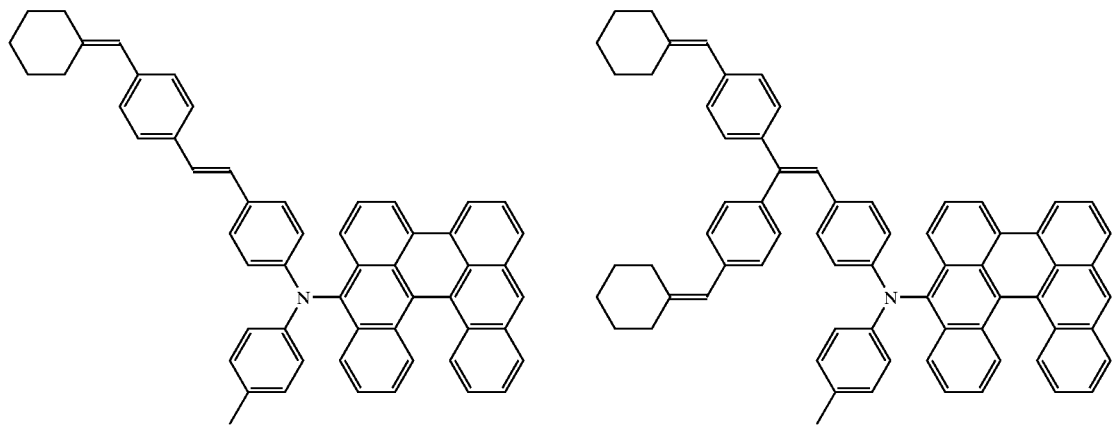
(137) (138)
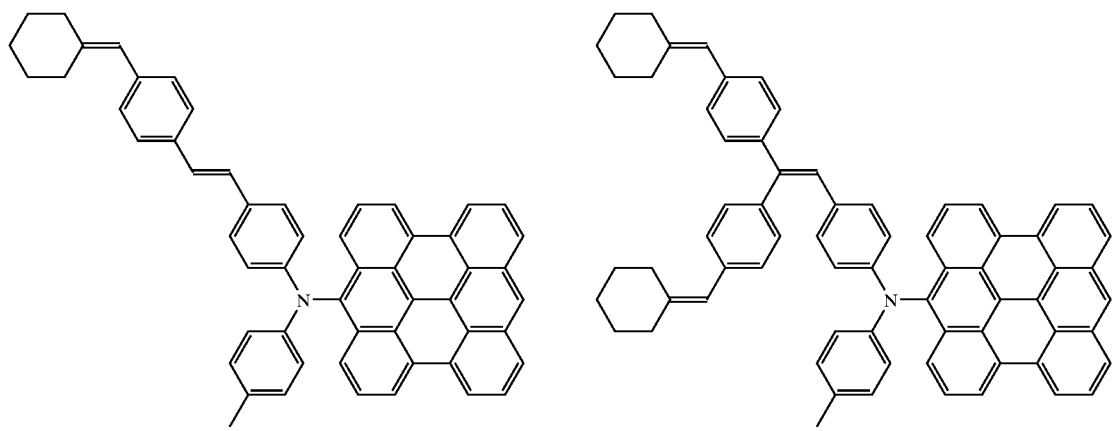
(139)
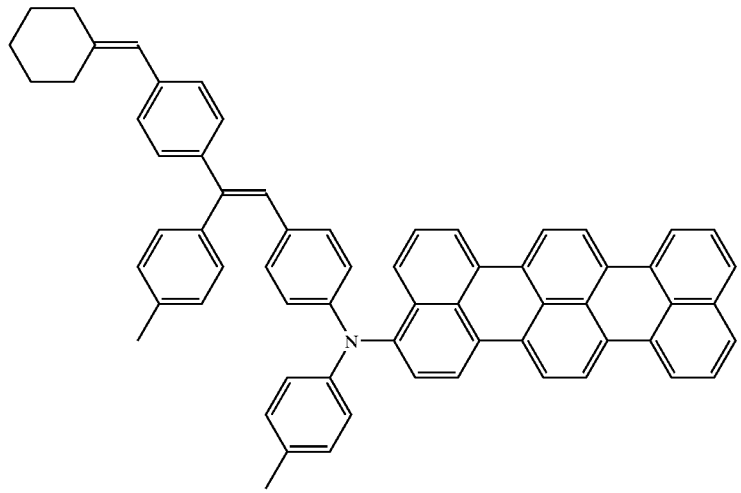

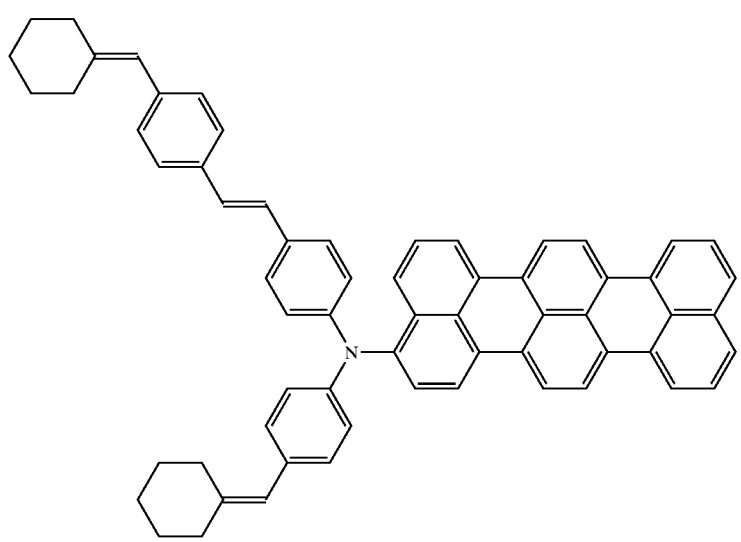
(140)
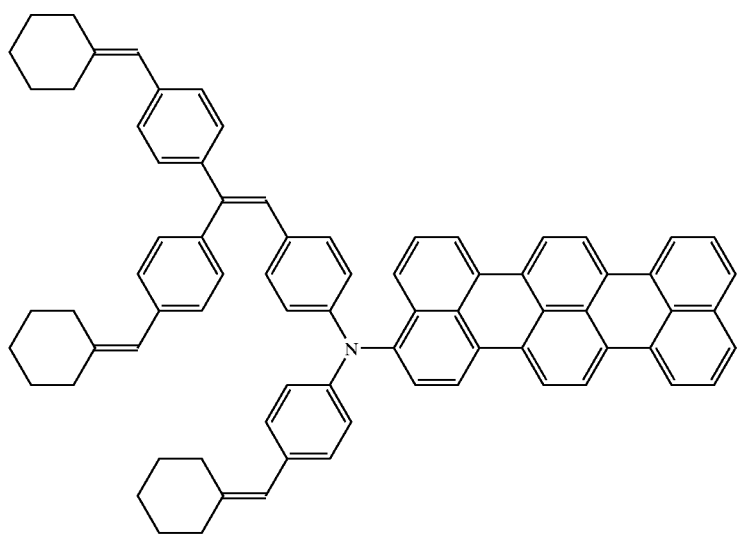
(141)
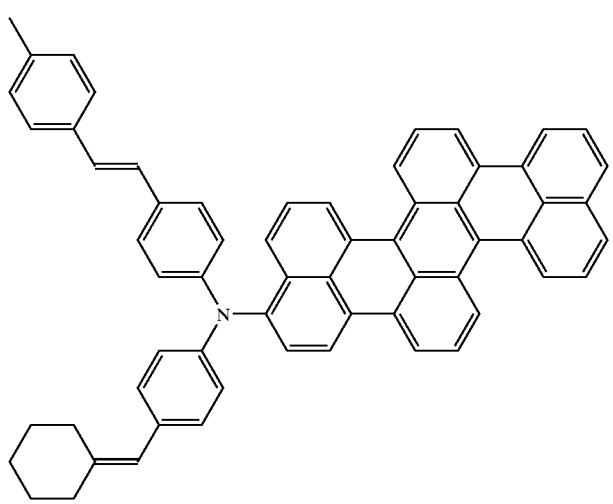
(142)

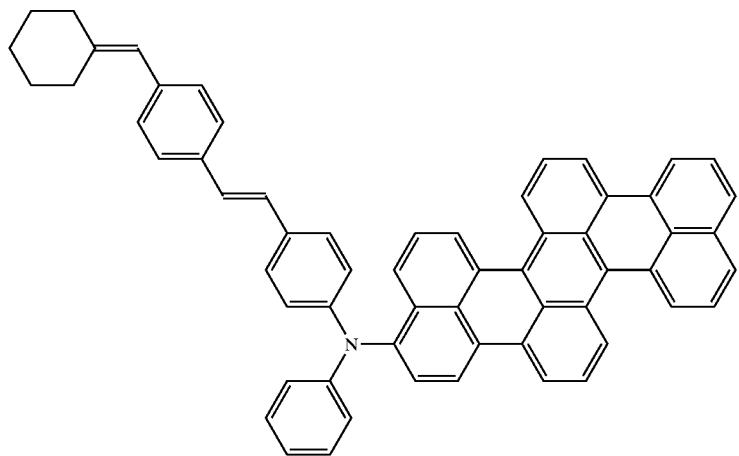
(143)
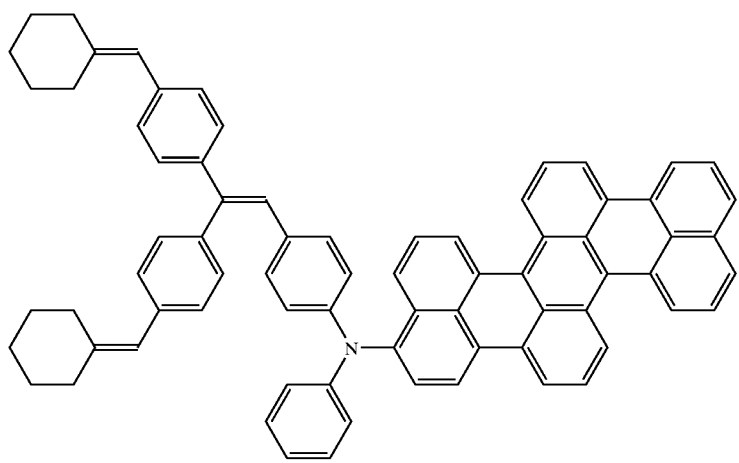
(144)
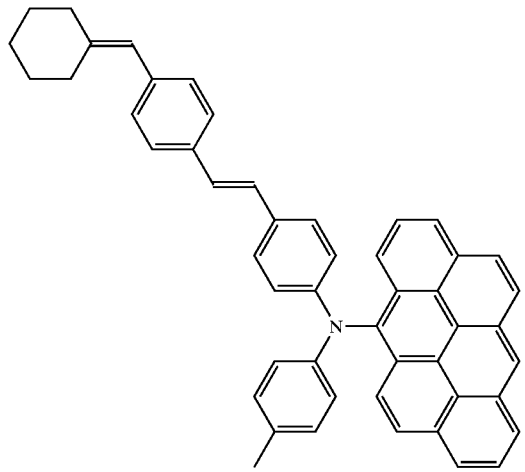
(145)
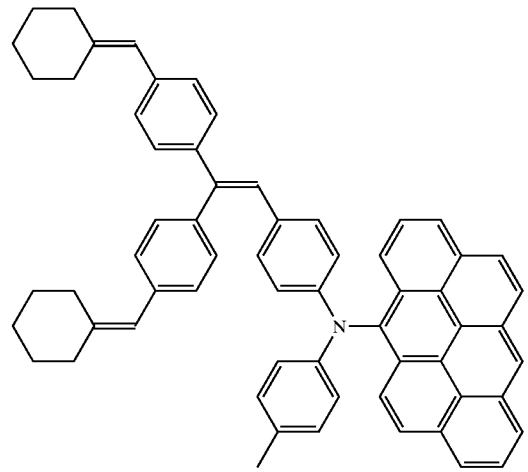
(146)

-continued
(147)
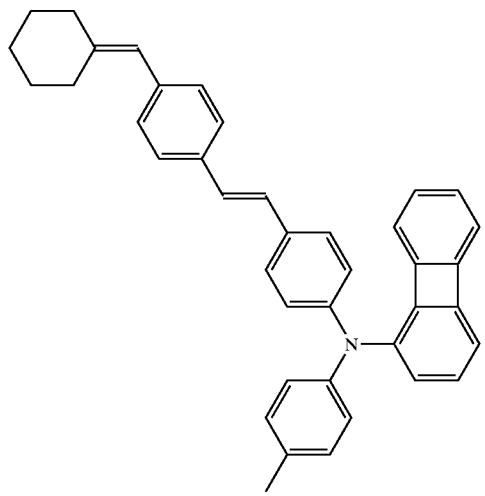
(148)
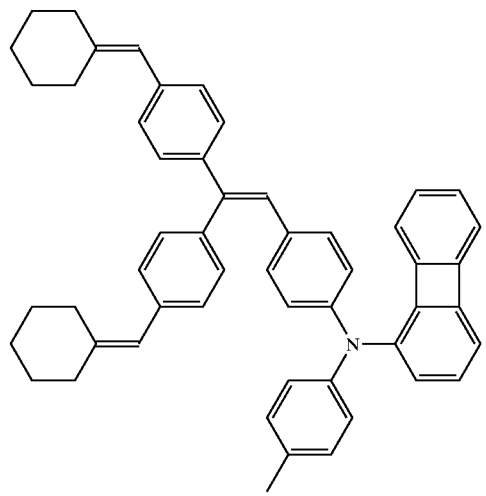
(149)
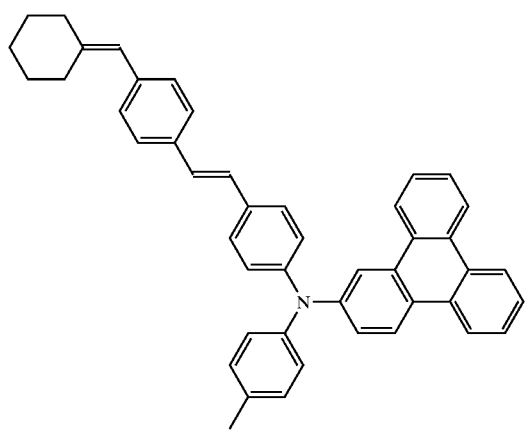
(150)
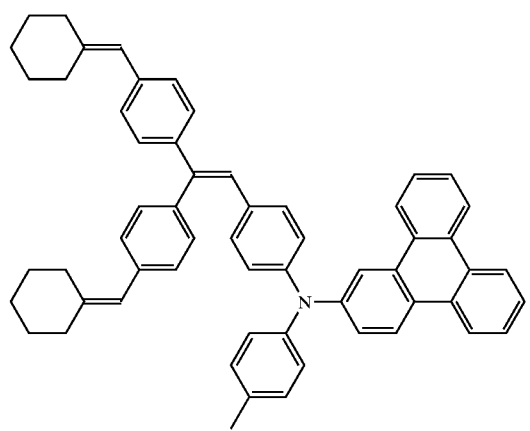
(151)
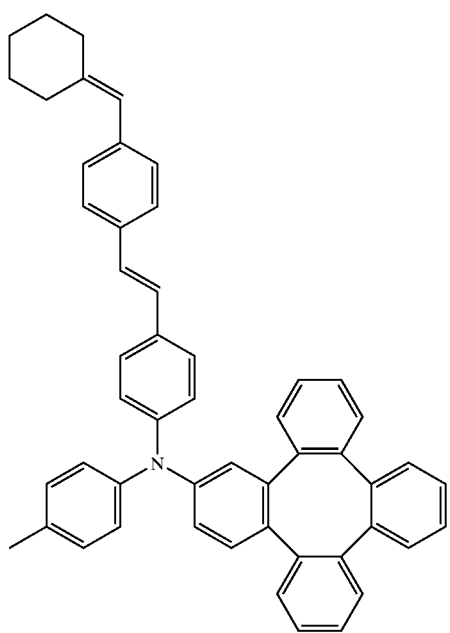
(152)
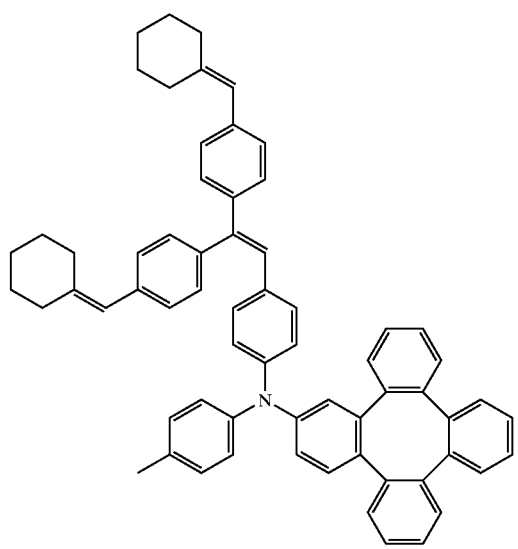

(153)
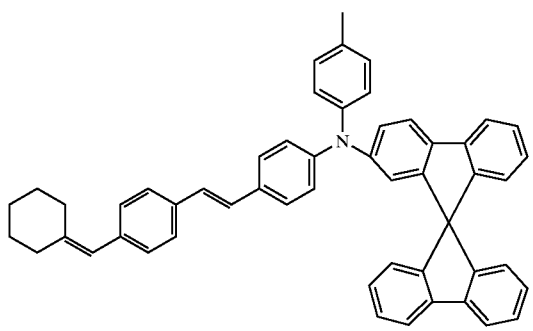
(154)
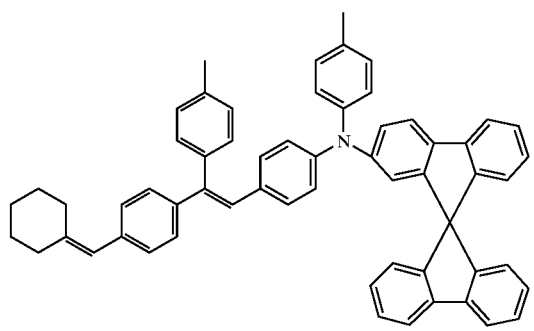
(155)
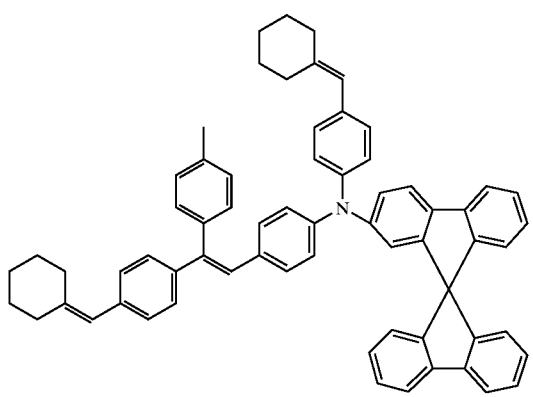
(156)
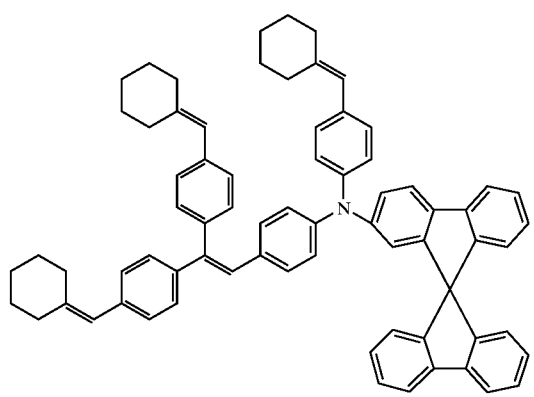
(157)
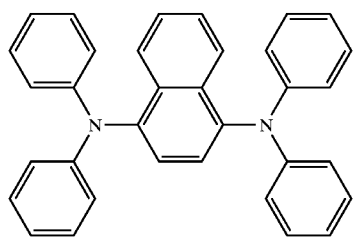
(158)
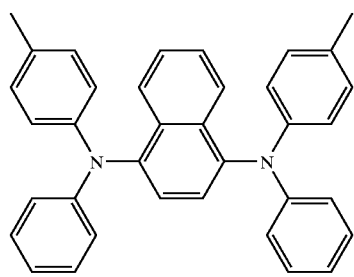
(159)
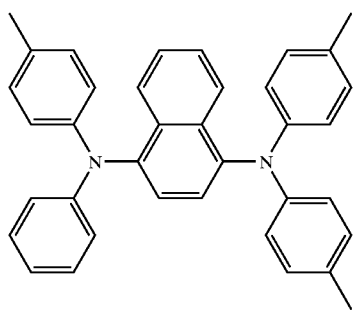
(160)
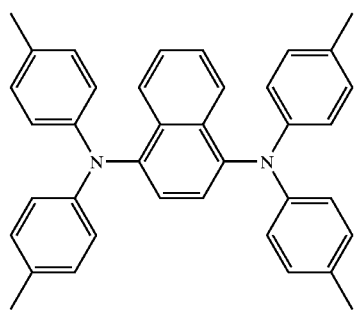

-continued
(163)
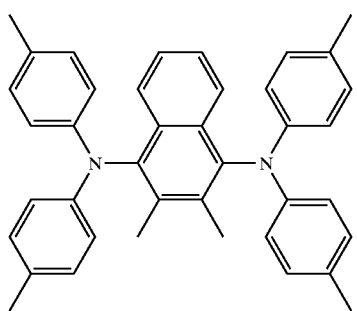
(164)
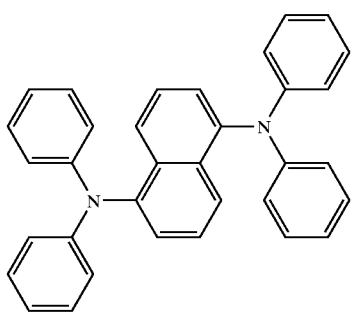
(165)
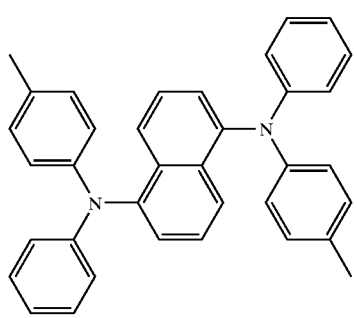
(166)
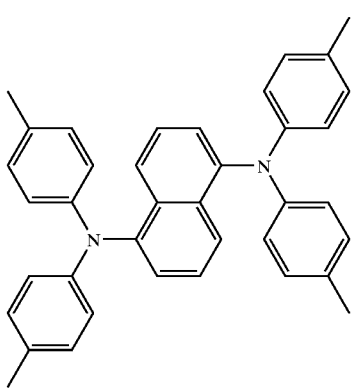
(167)
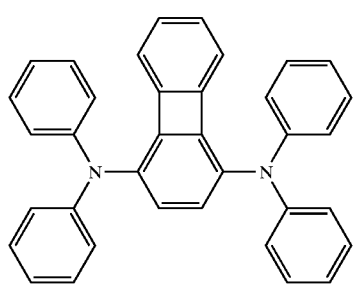
(168)
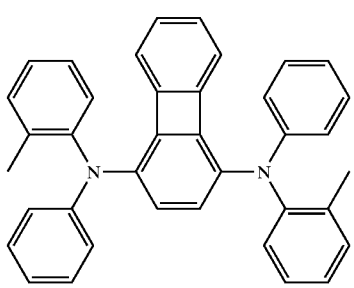
(169)
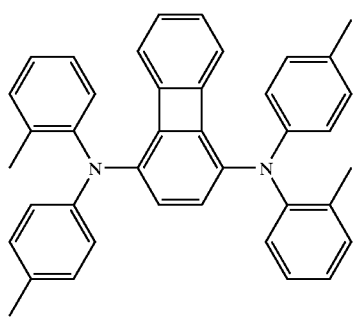
(170)
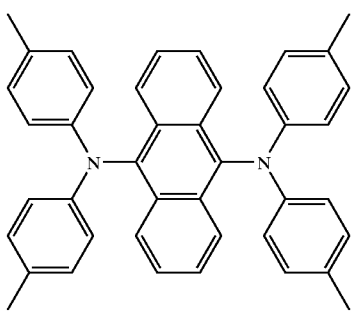
(171)
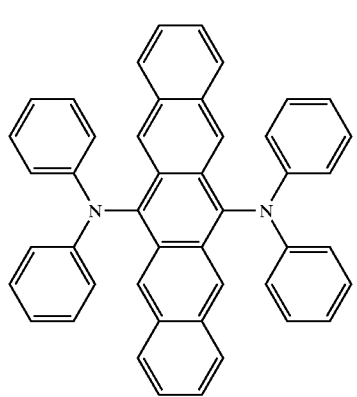
(172)
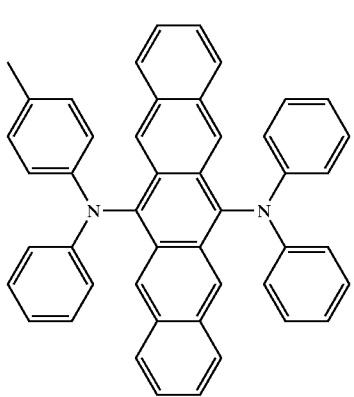

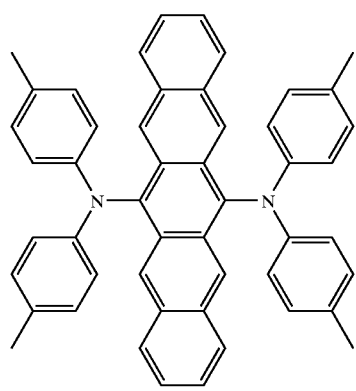 (173)
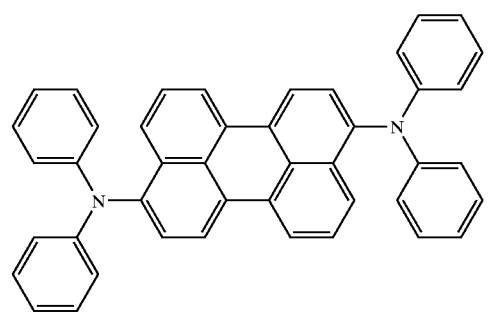 (174)
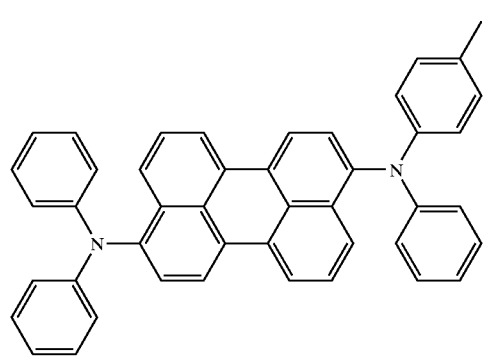 (175)
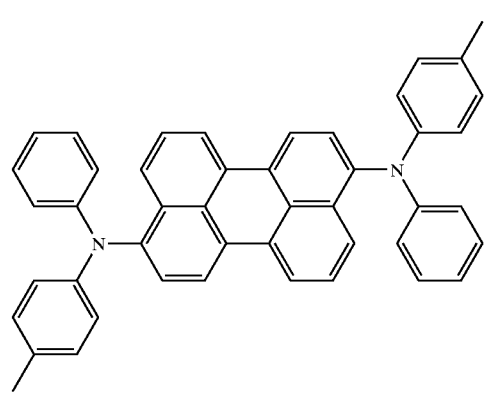 (176)
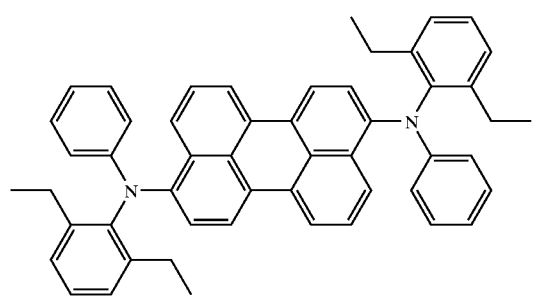 (177)
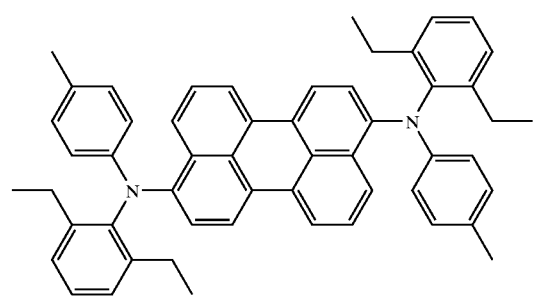 (178)
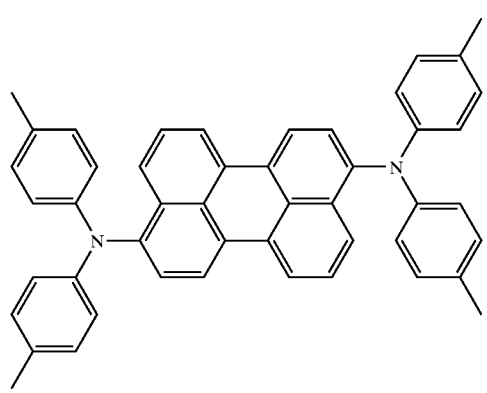 (179)
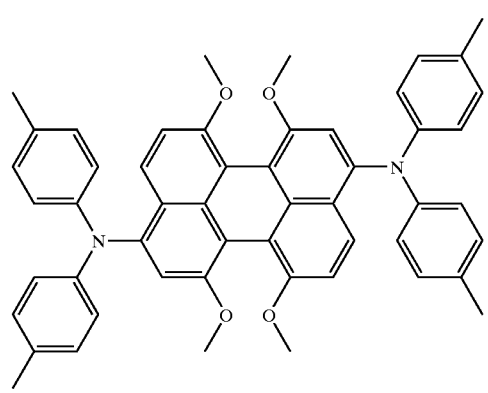 (180)

-continued
(181) 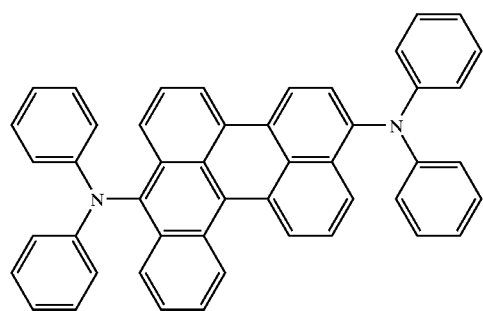
(182) 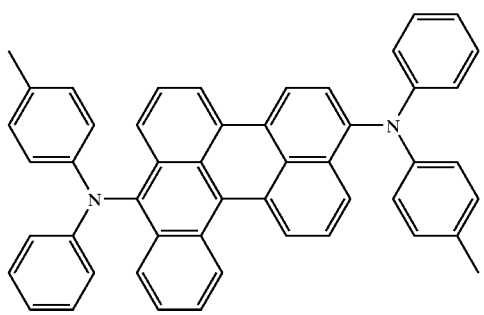
(183) 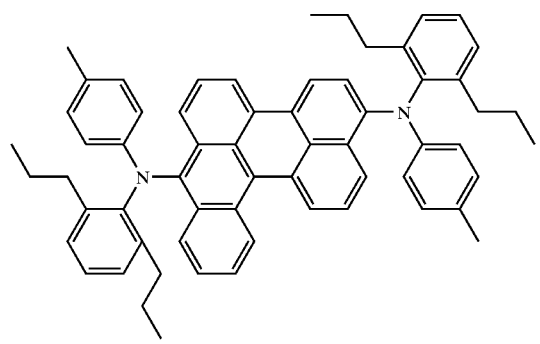
(184) 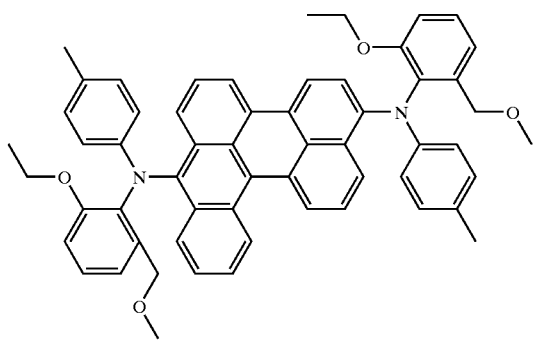
(185) 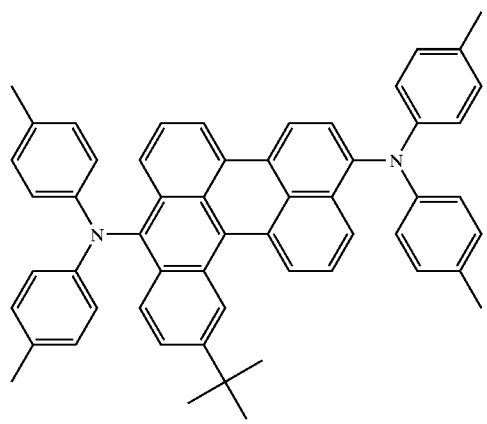
(186) 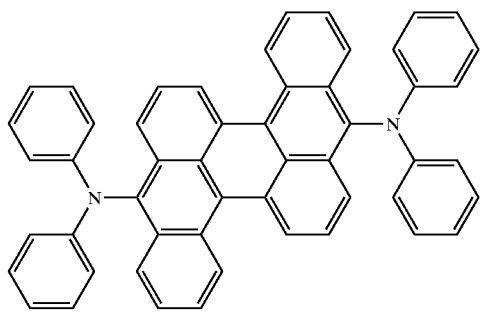
(187) 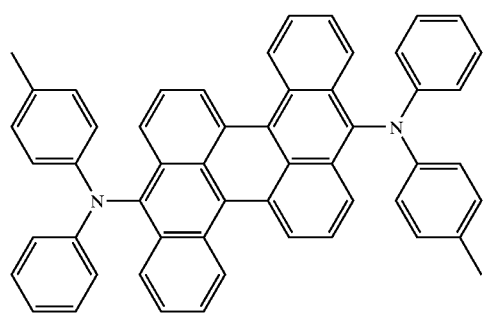
(188) 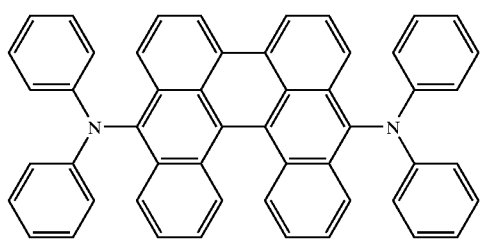

-continued
(189)
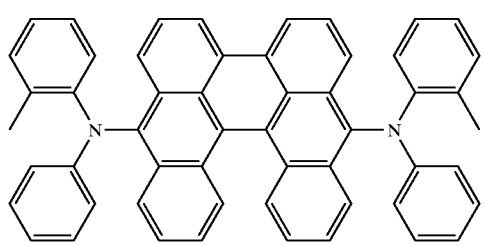
(190)
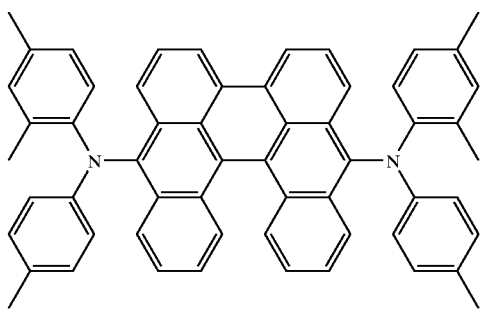
(191)
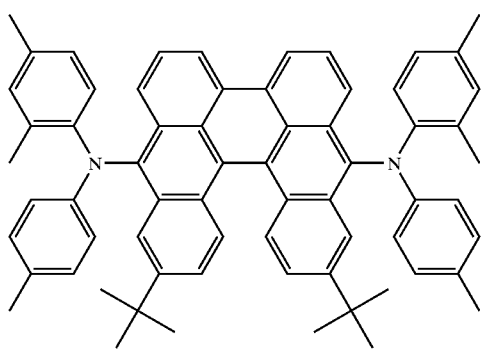
(192)
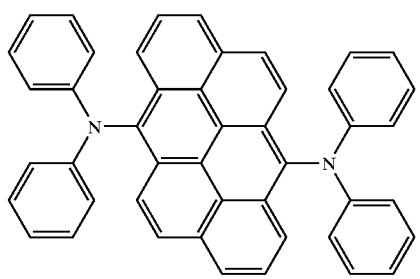
(193)
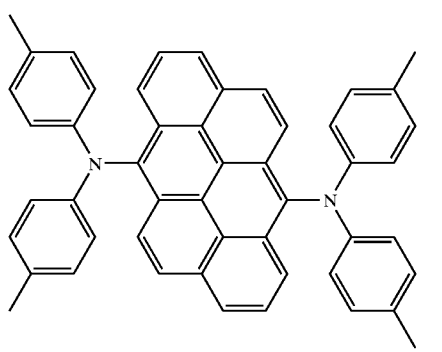
(194)
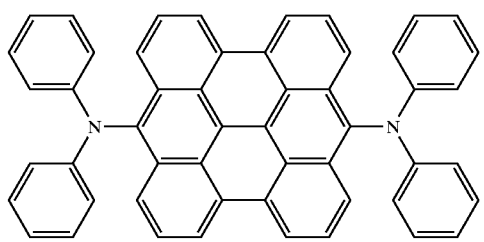
(195)
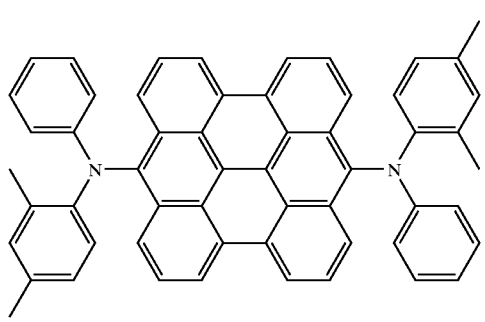
(196)
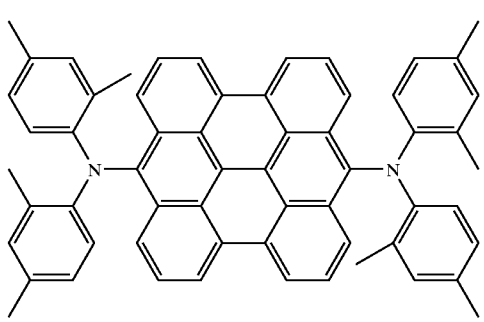
(197)
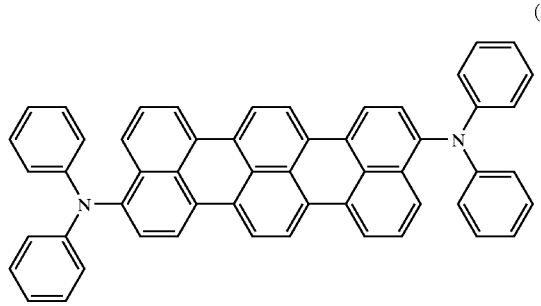
(198)
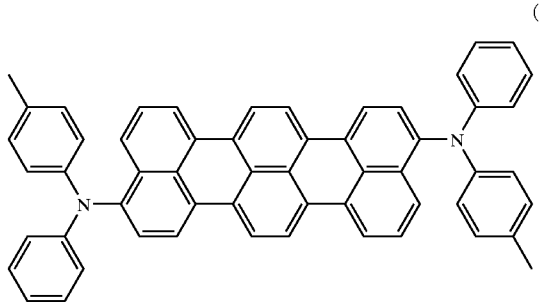

-continued
(199)
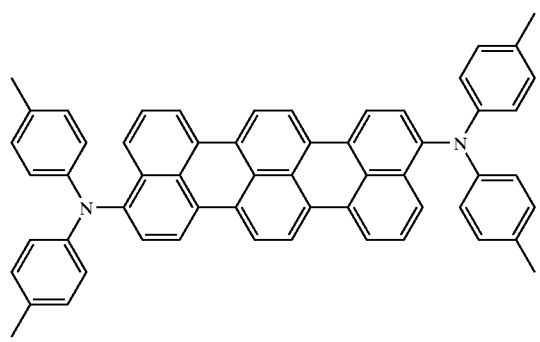
(200)
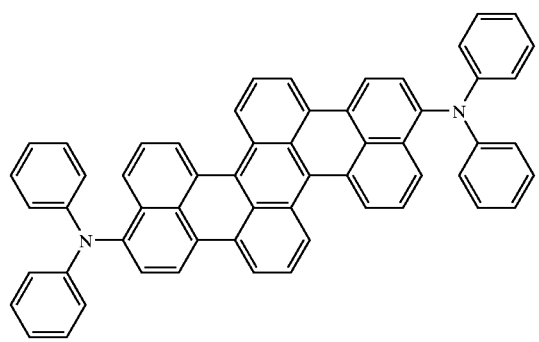
(201)
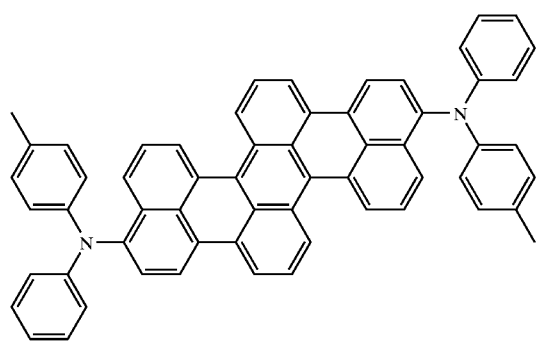
(202)
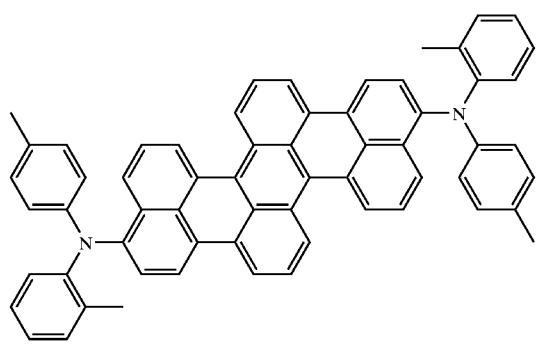
(203)
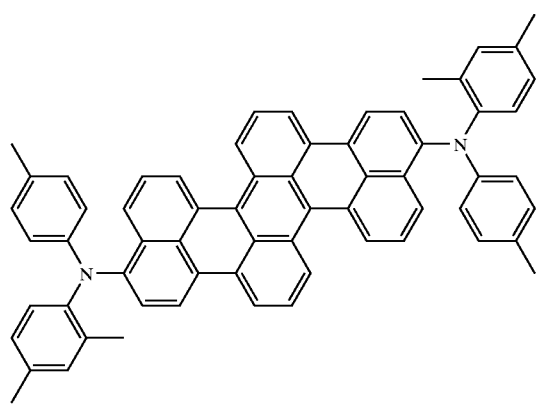
(204)
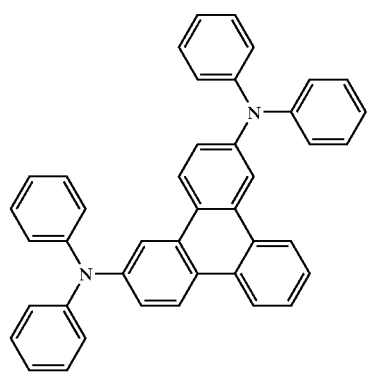
(205)
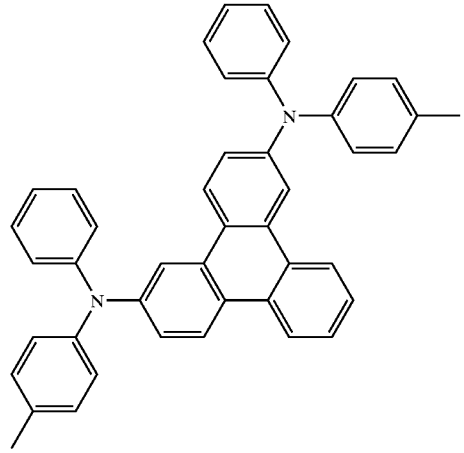
(206)
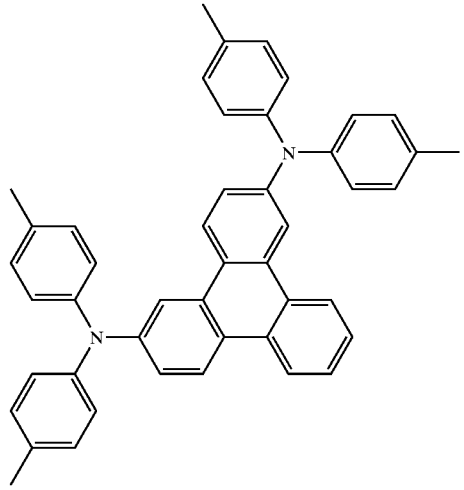

-continued
(207)
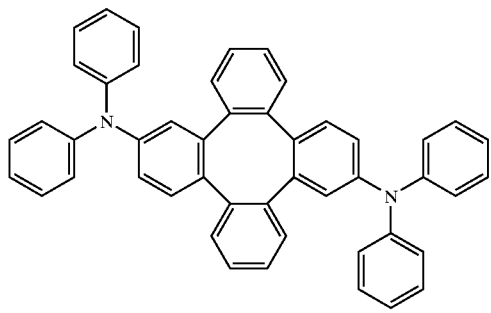
(208)
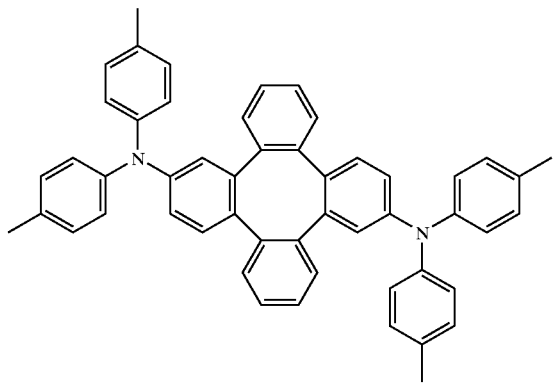
(209)
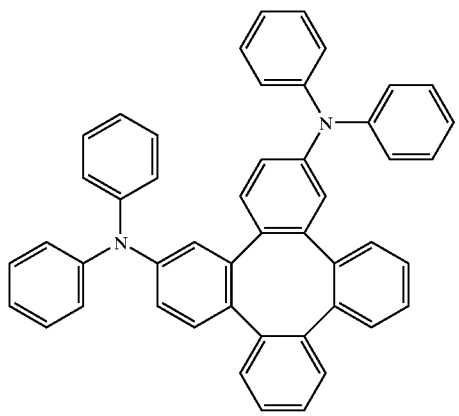
(210)
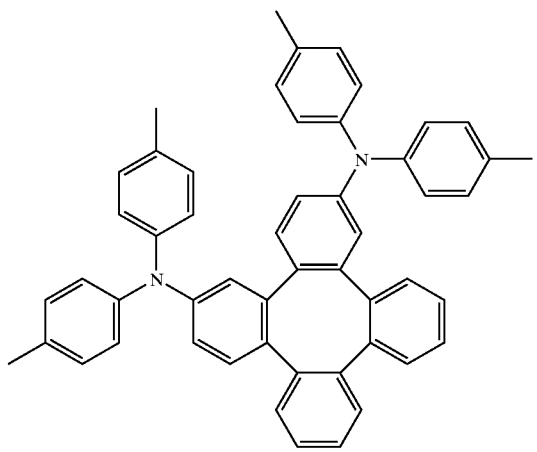
(211)
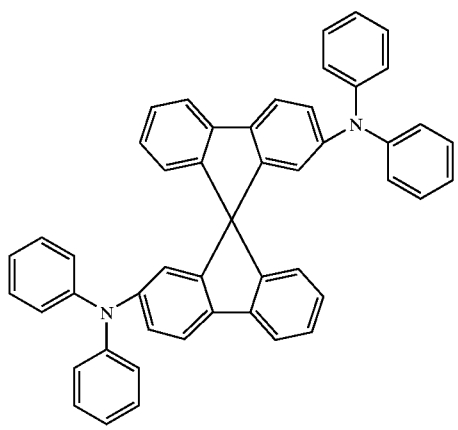
(212)
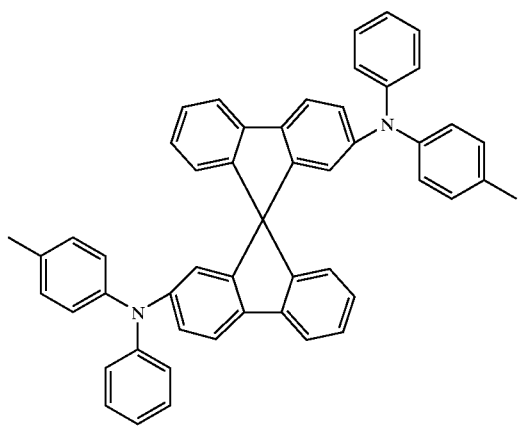

-continued
(213)
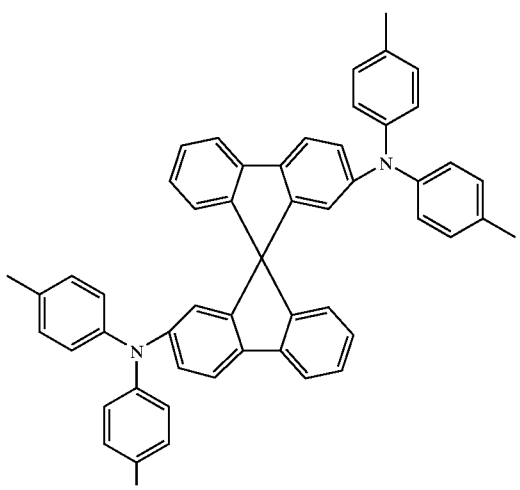
(214)
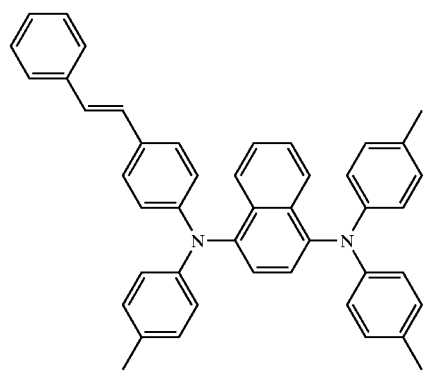
(215)
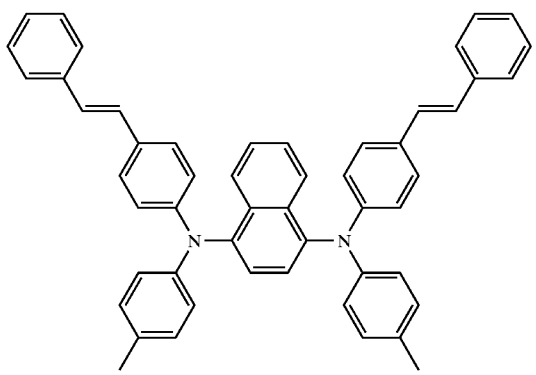
(216)
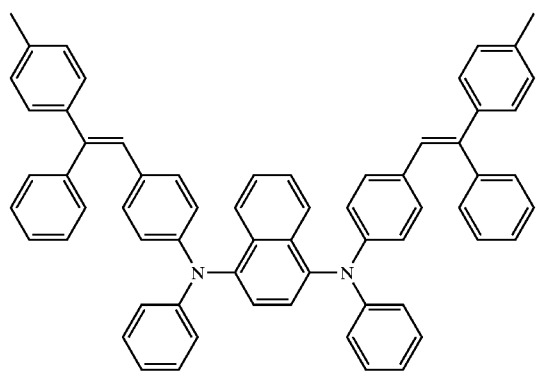
(217)
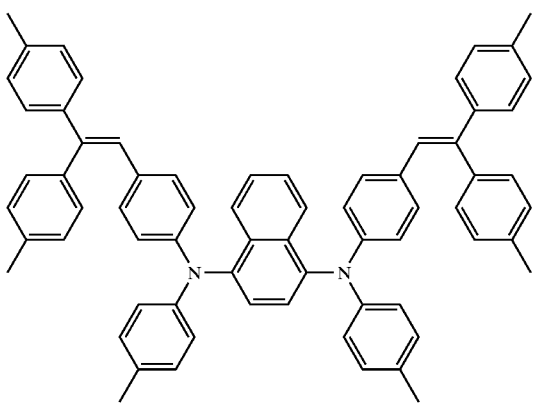
(218)
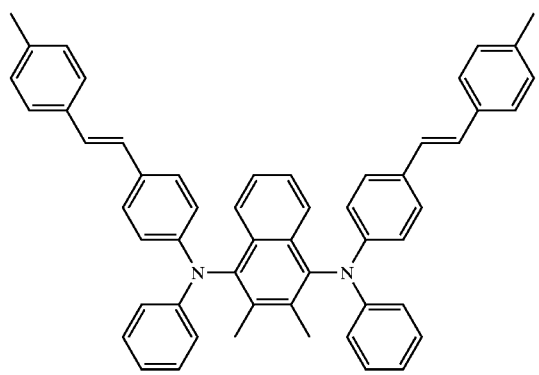

-continued
(219)
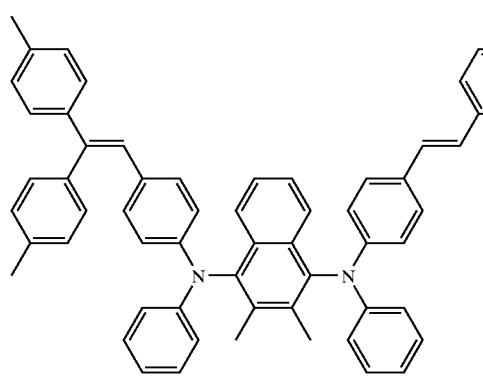
(220)
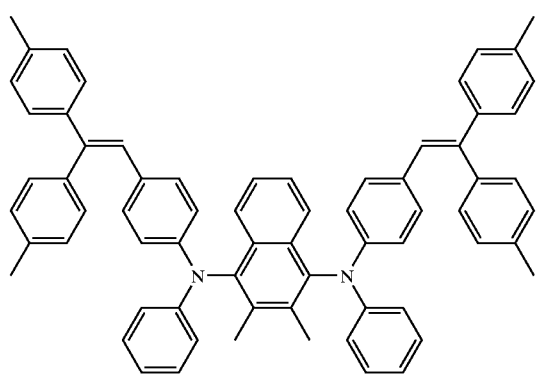
(221)
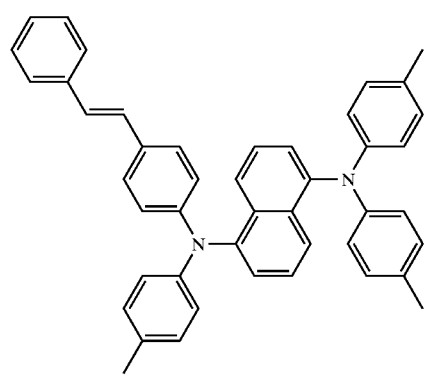
(222)
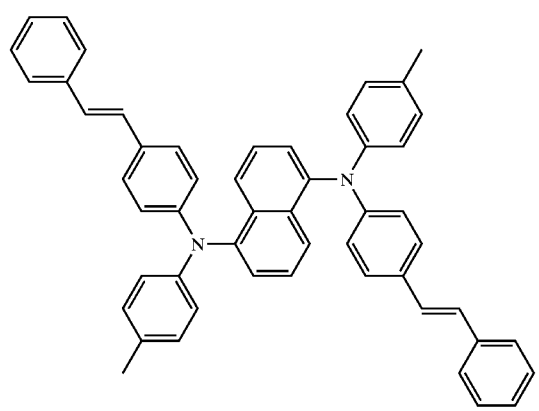
(223)
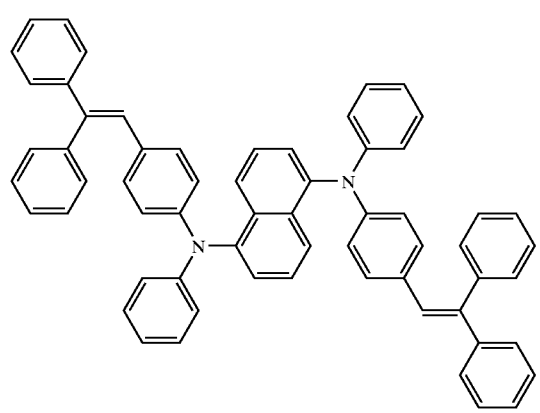
(224)
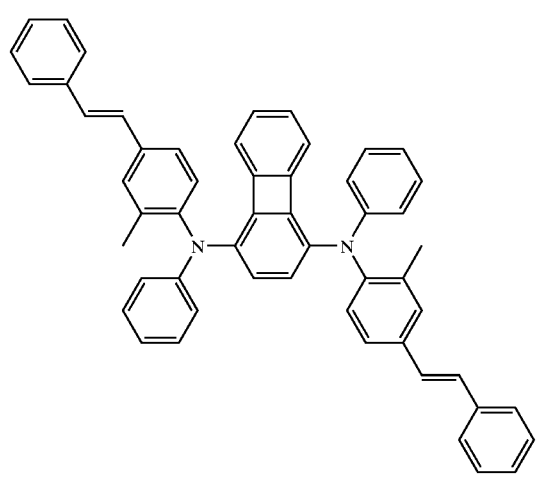

-continued
(225)
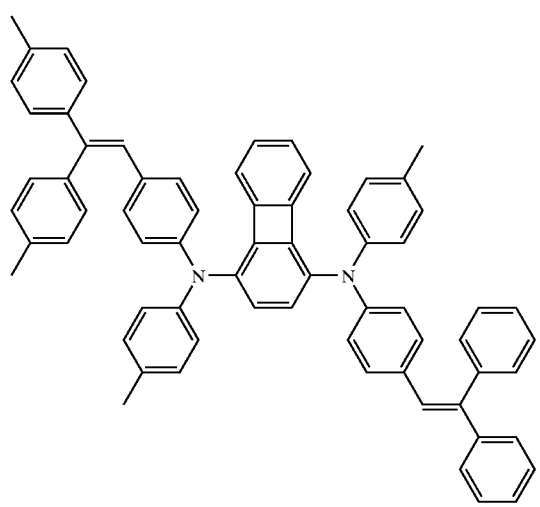
(226)
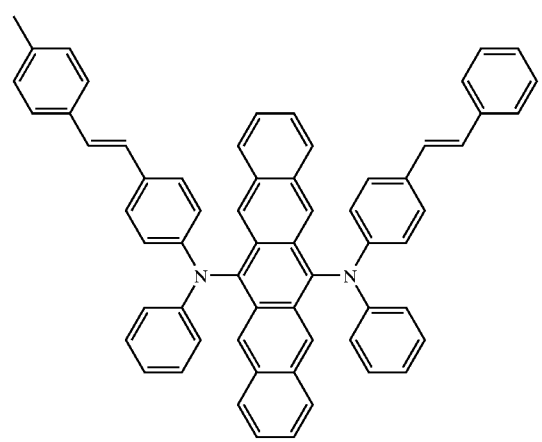
(227)
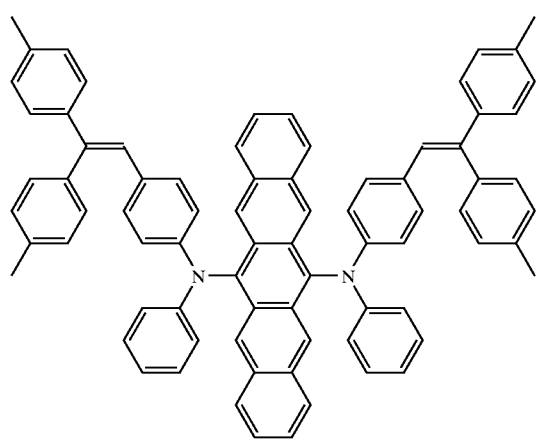
(228)
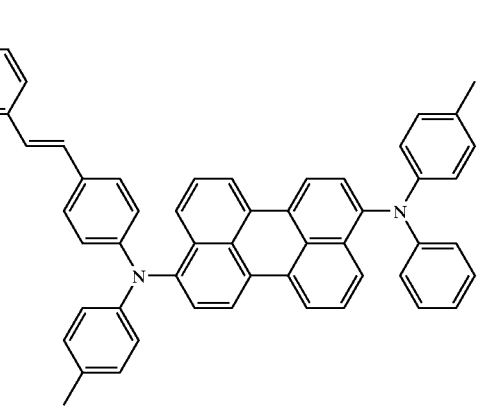
(229)
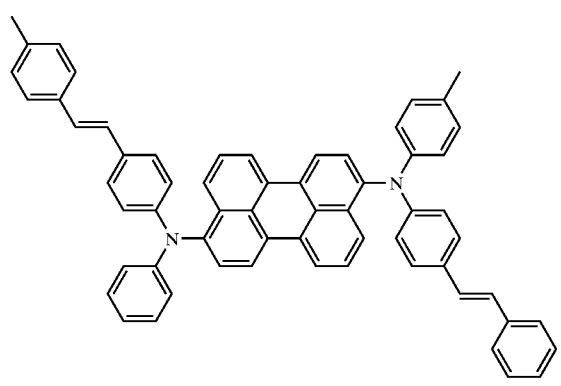
(230)
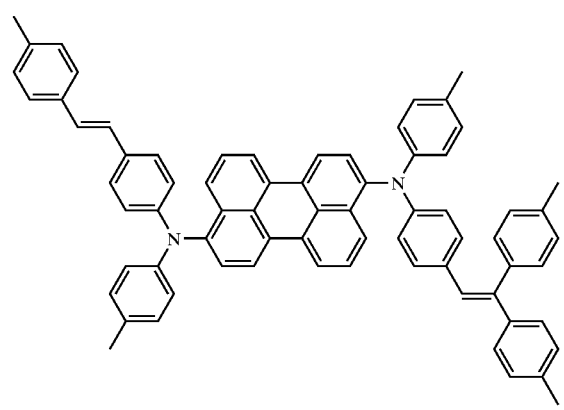

-continued
(231) (232)
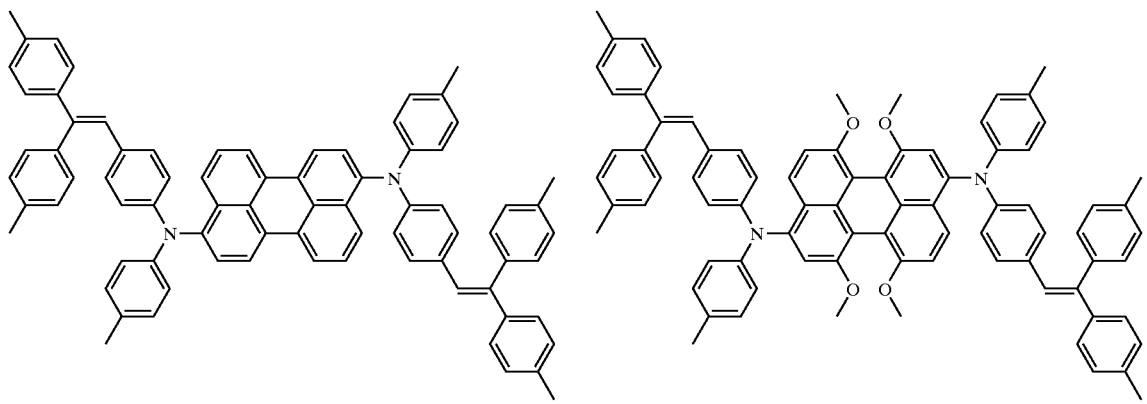
(233) (234)
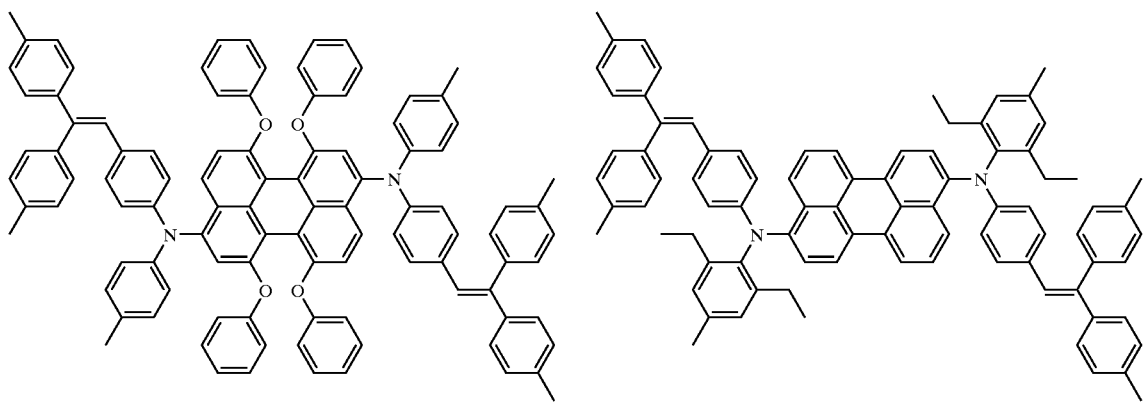
(235) (236)
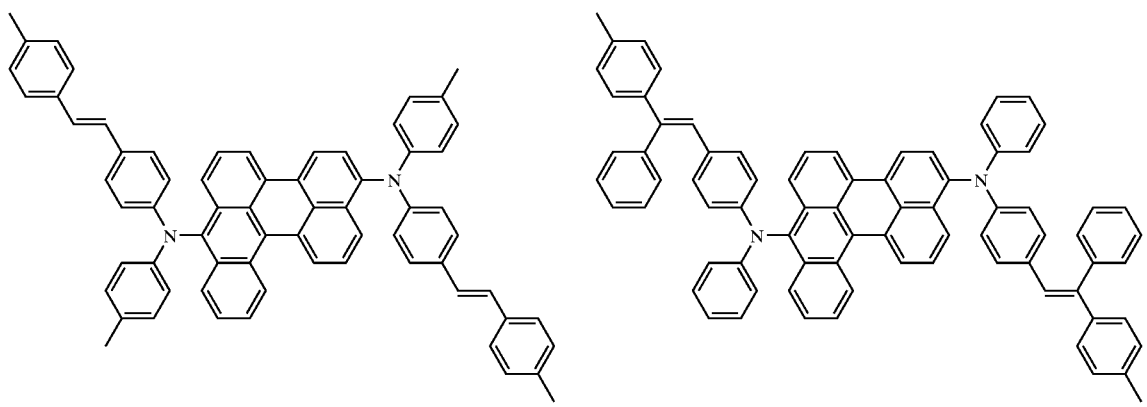

-continued
(237)
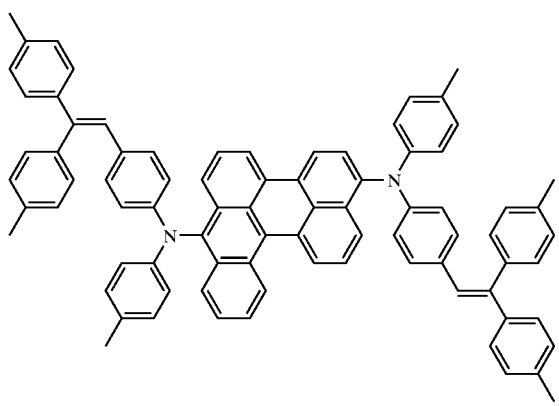
(238)
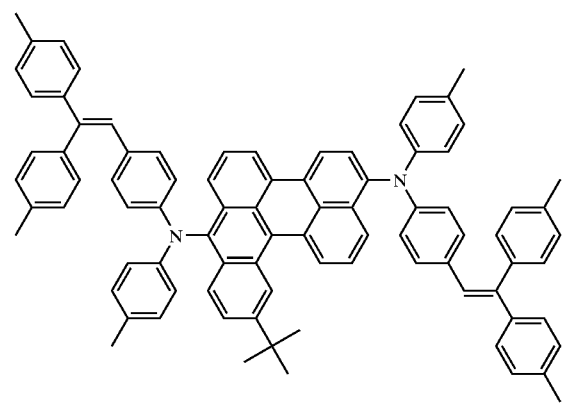
(239)
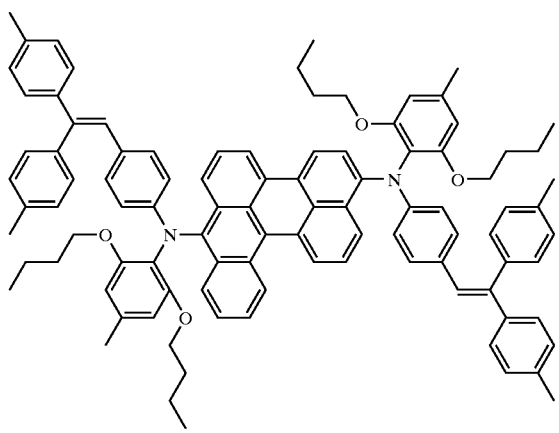
(240)
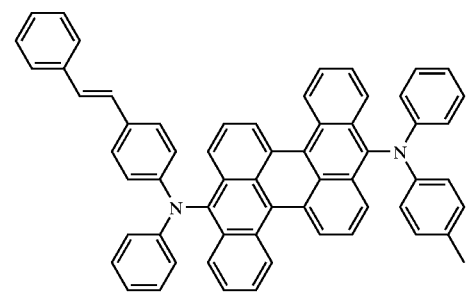
(241)
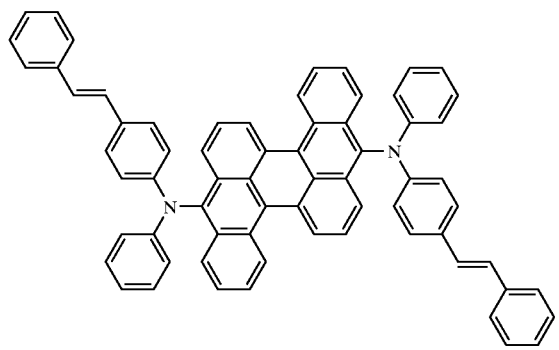
(242)
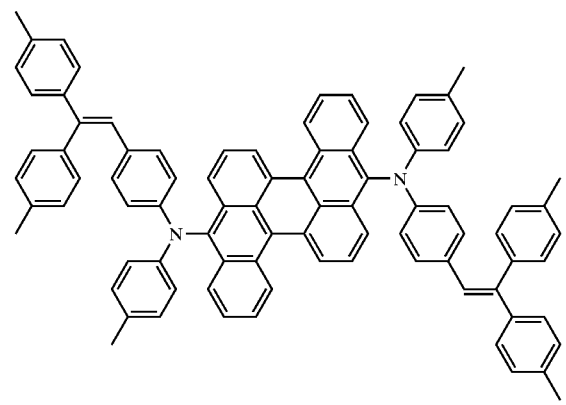
(243)
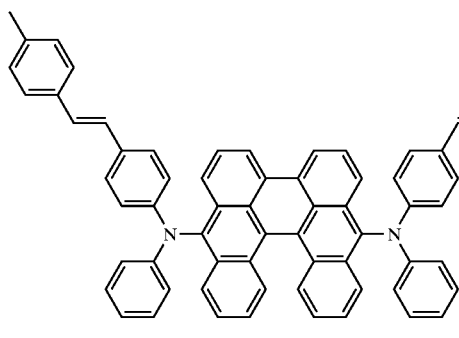
(244)
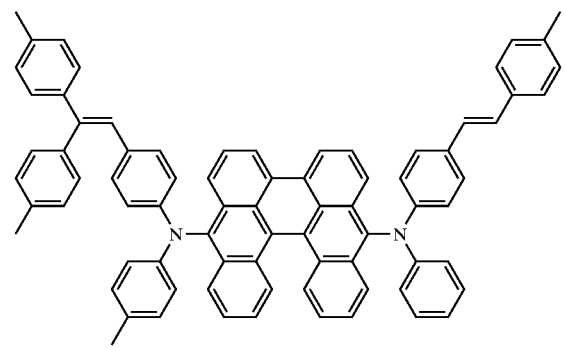

-continued
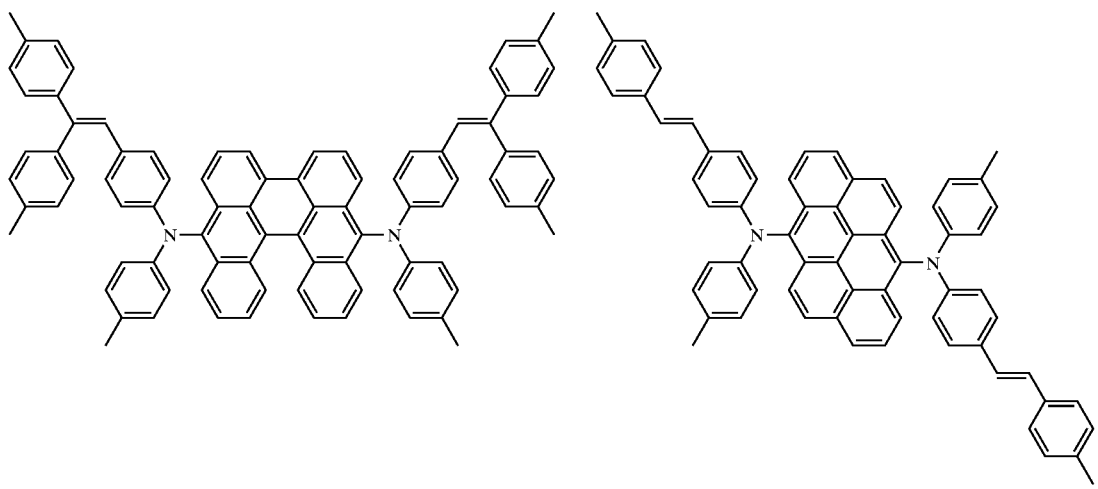
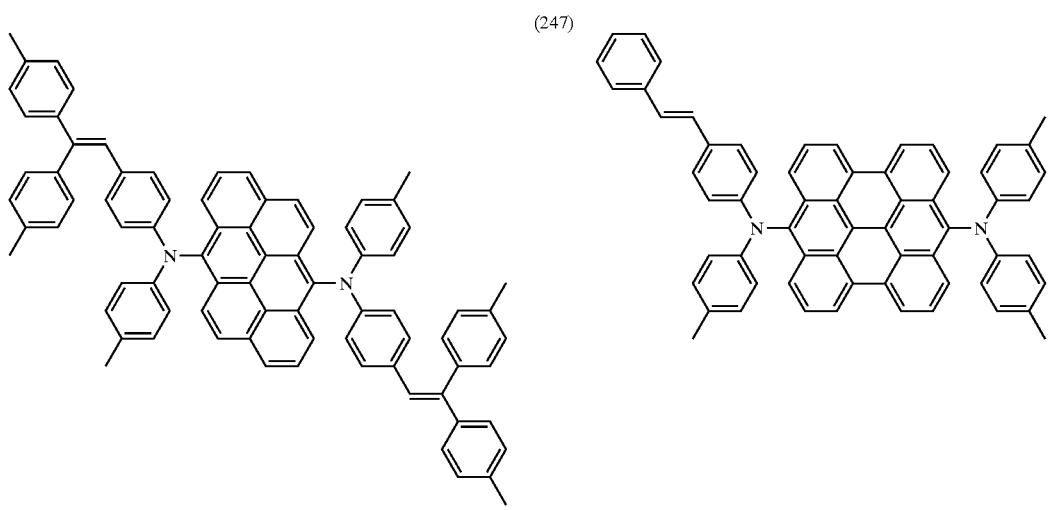
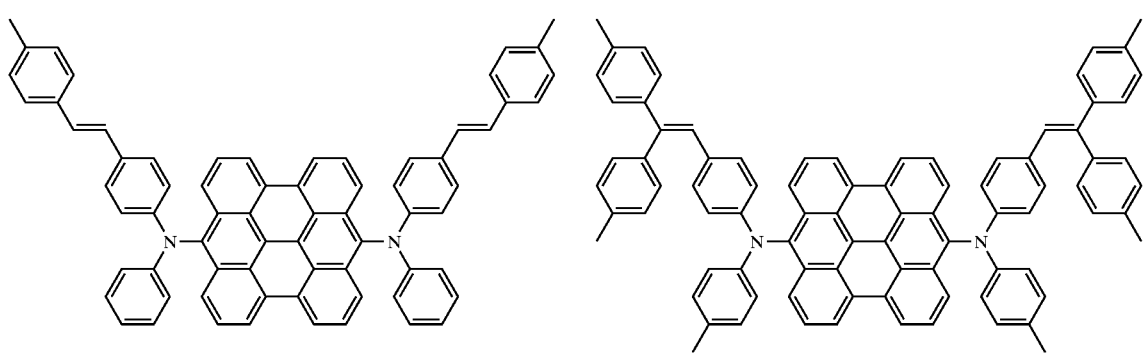

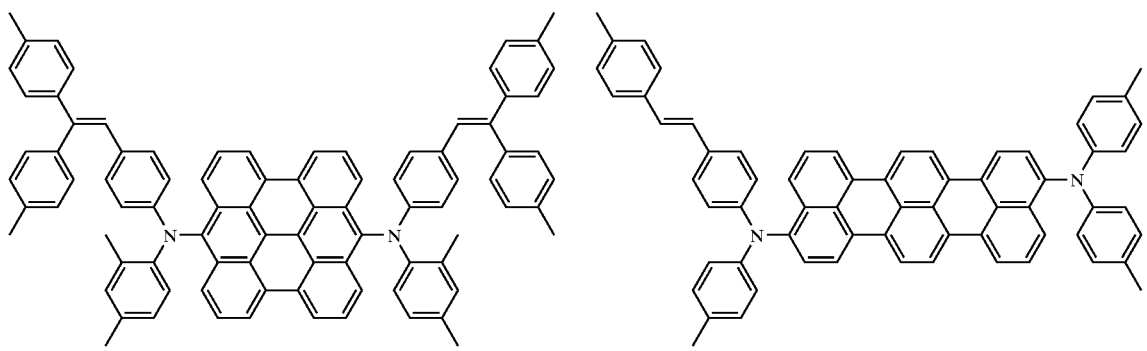
(251)
(252)
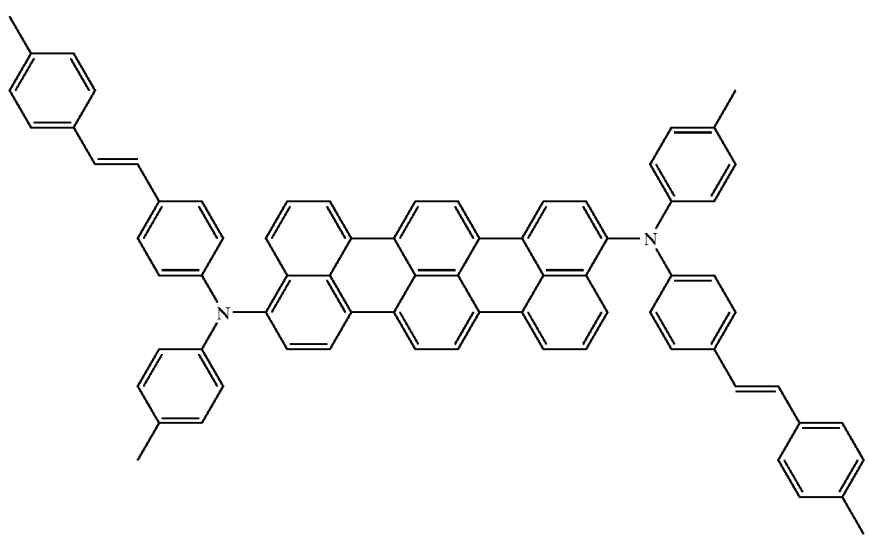
(253)
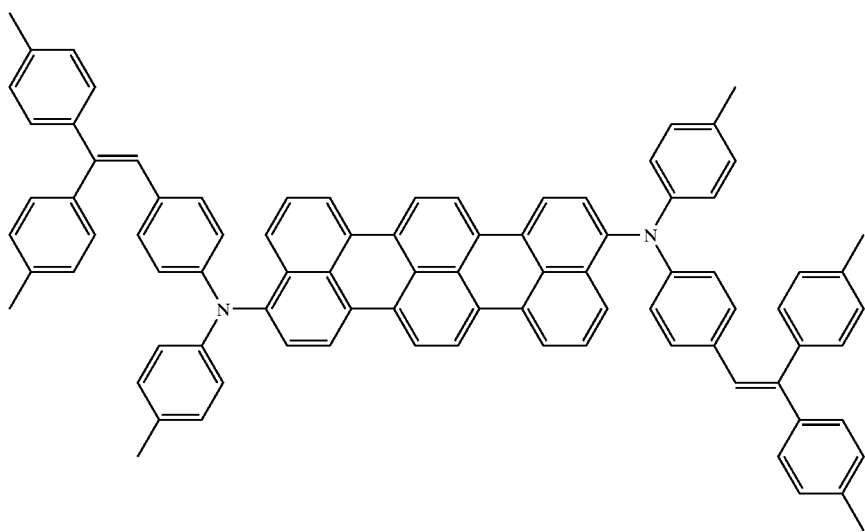
(254)

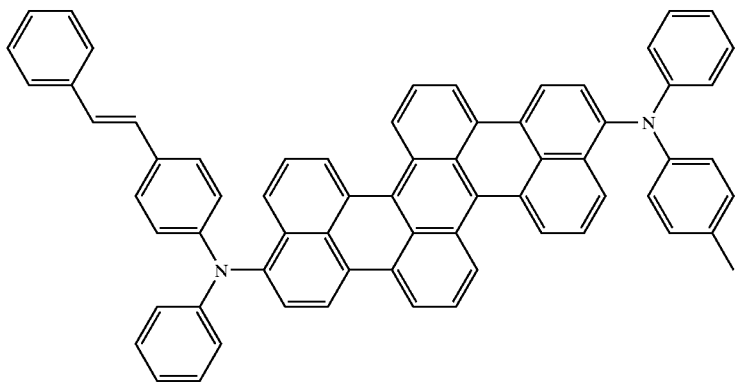
(255)
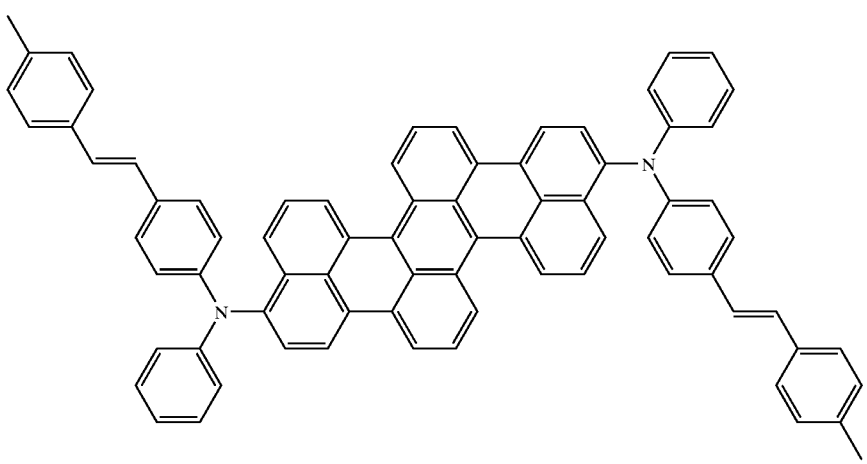
(256)
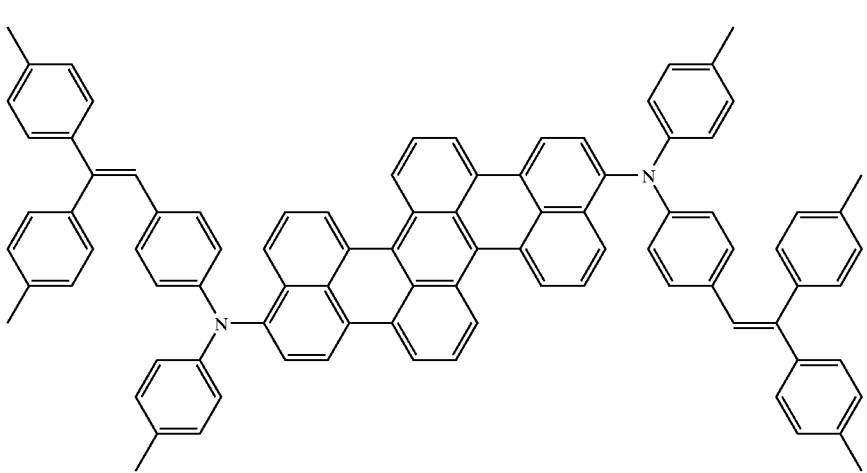
(257)

-continued
(258)
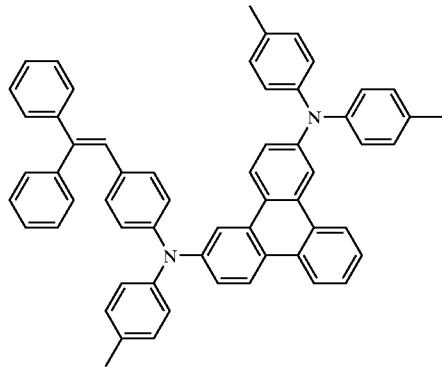
(259)
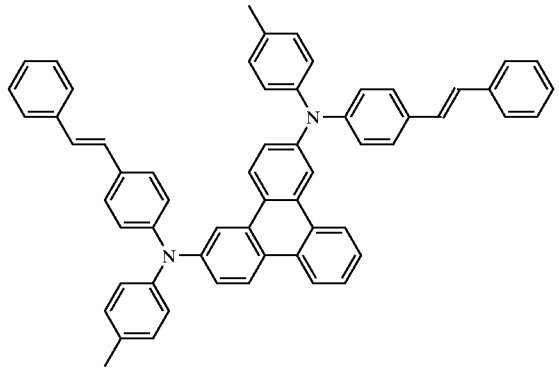
(260)
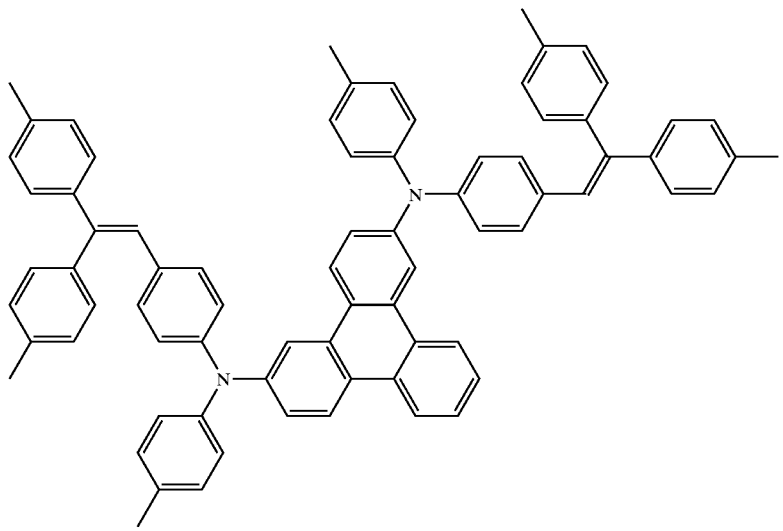
(261)
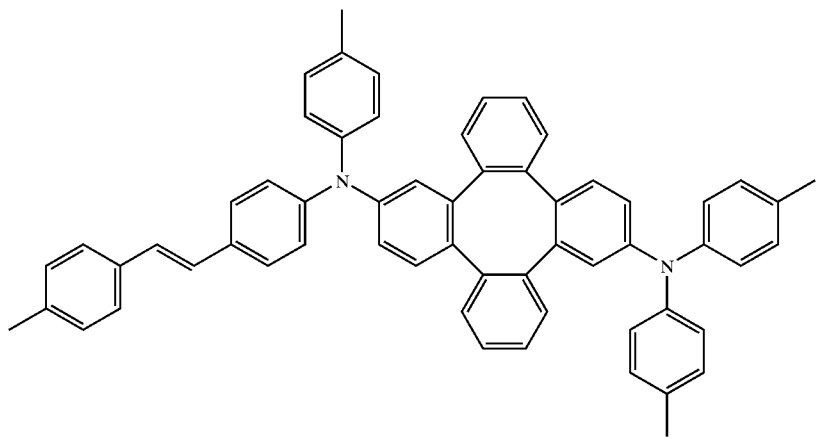

(262)
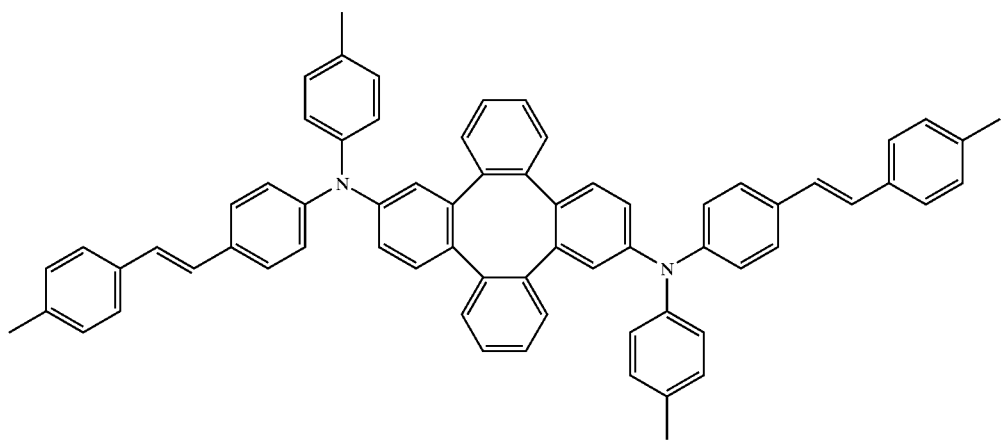
(263)
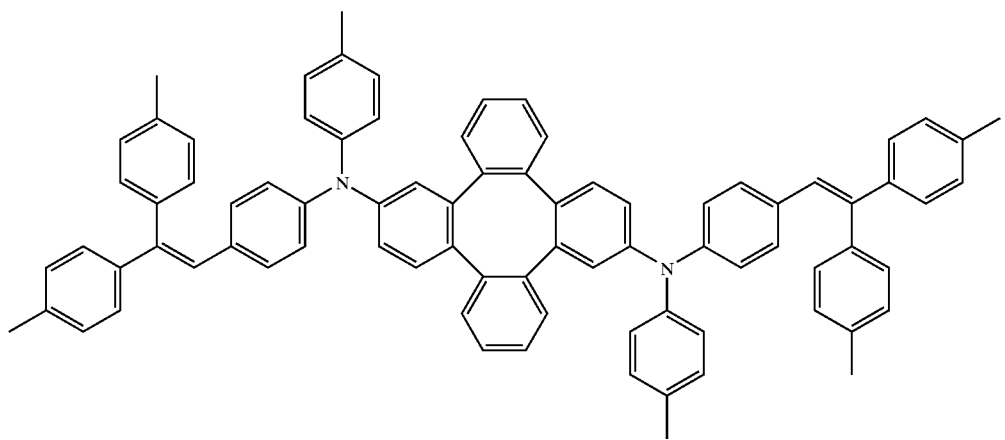
(264)
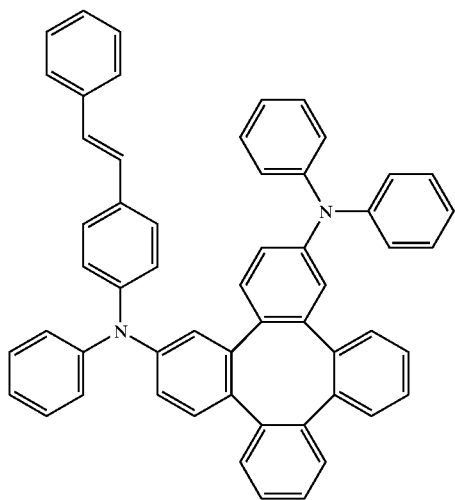
(265)
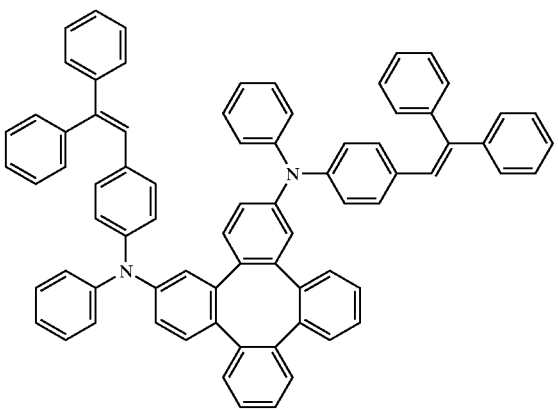

(266)
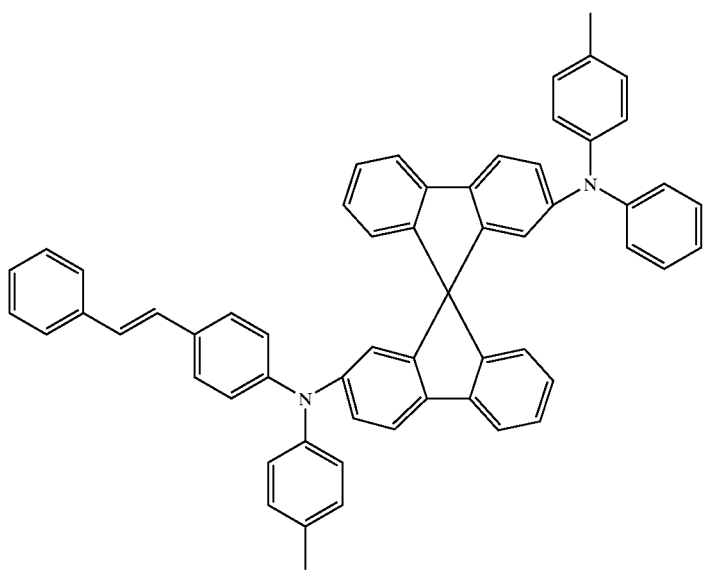
(267)
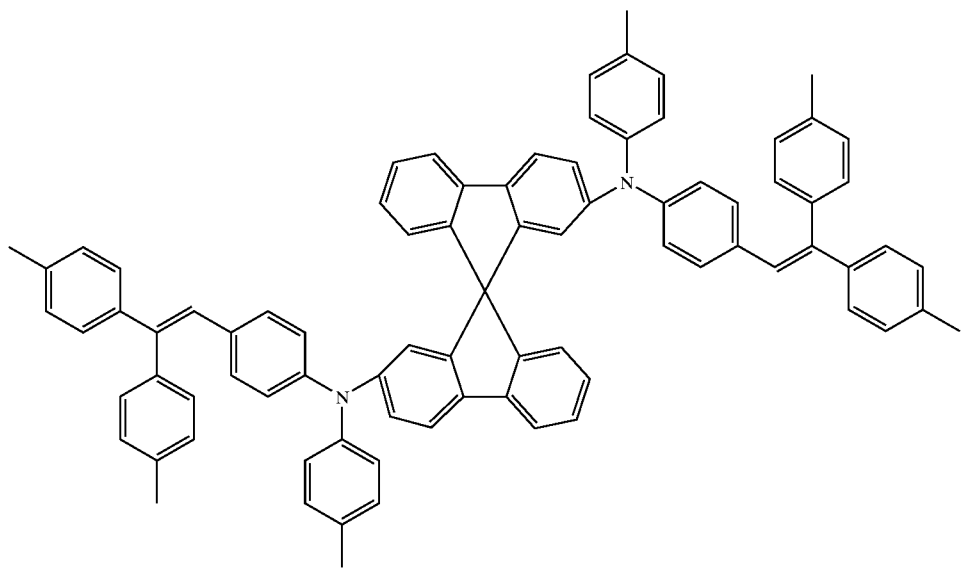
(268)
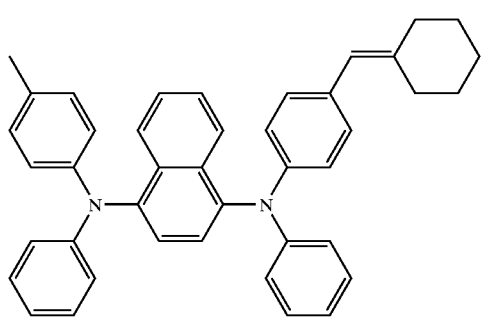
(269)
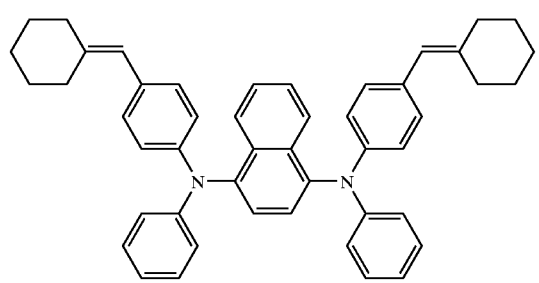

(270) 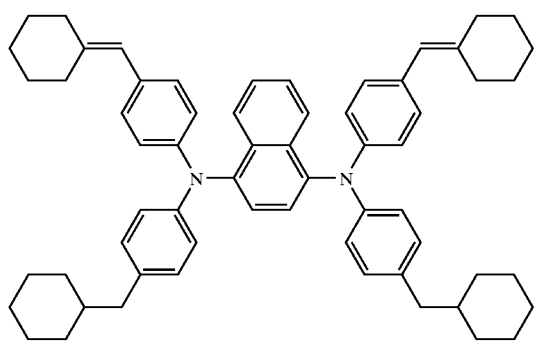
(271) 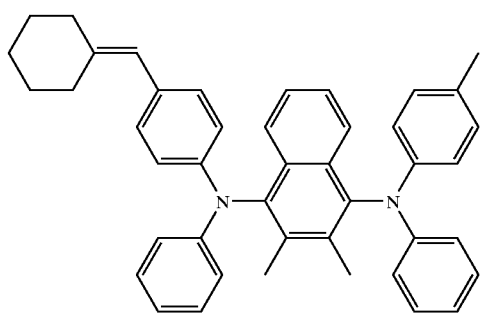
(272) 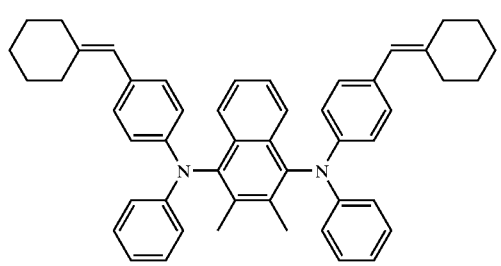
(273) 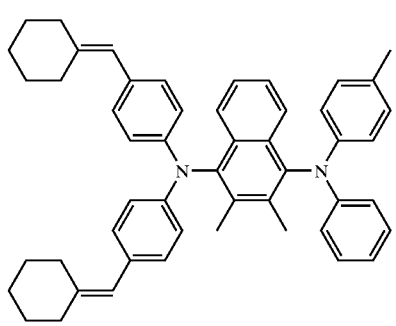
(274) 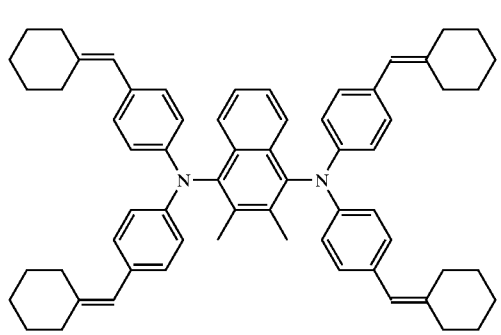
(275) 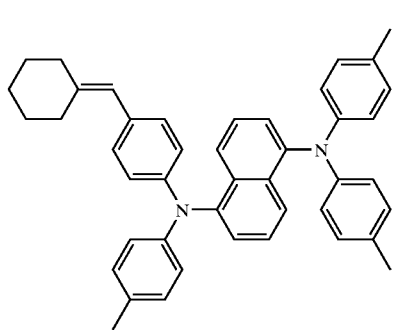
(276) 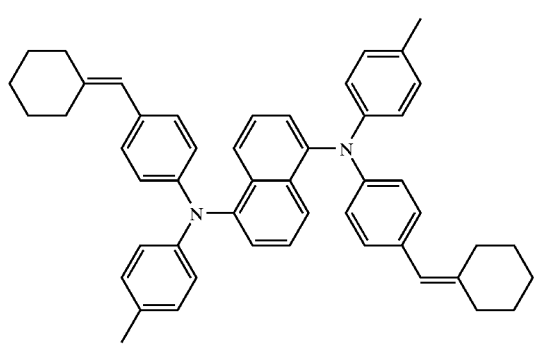
(277) 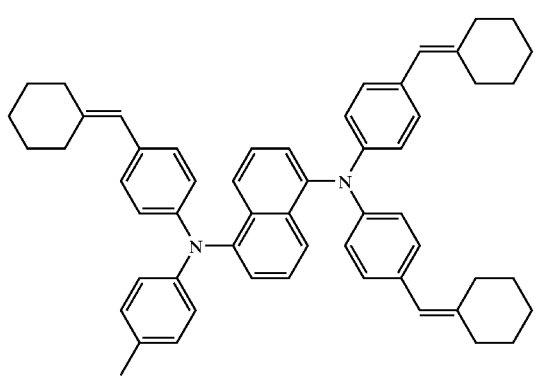

-continued
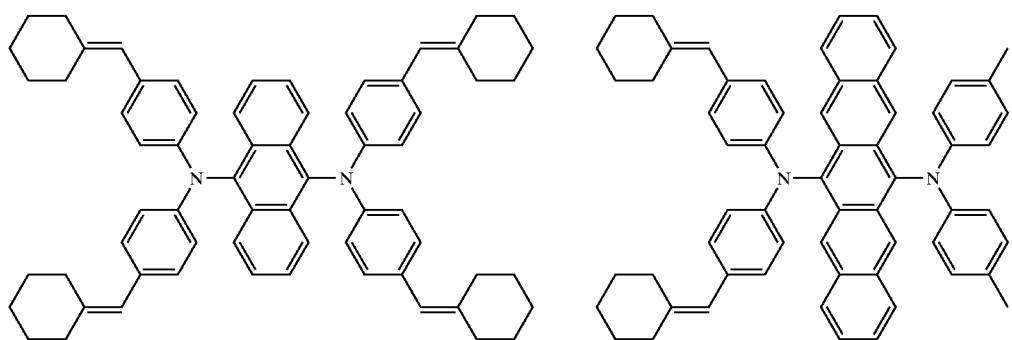
(278) (279)
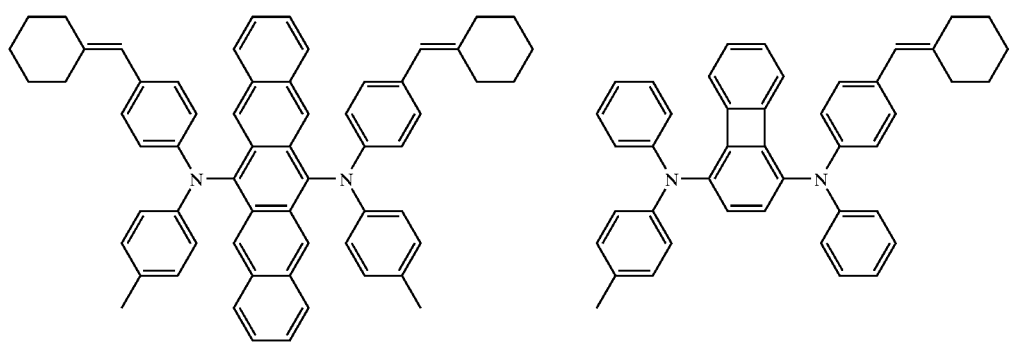
(280) (281)
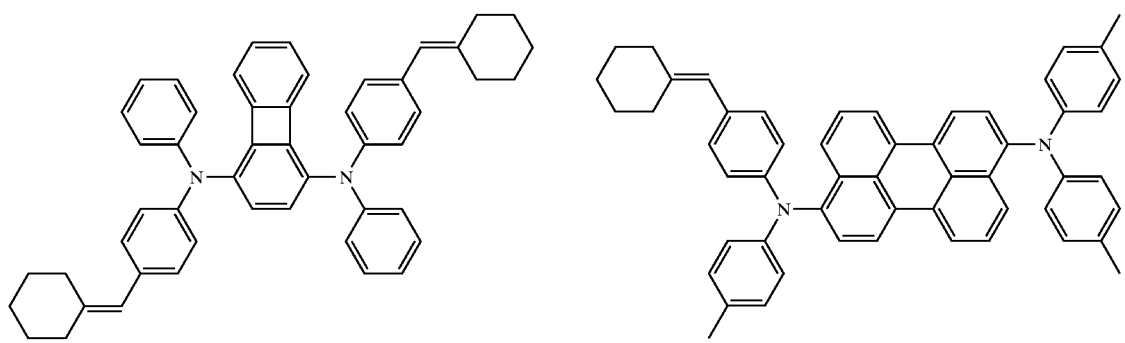
(282) (283)
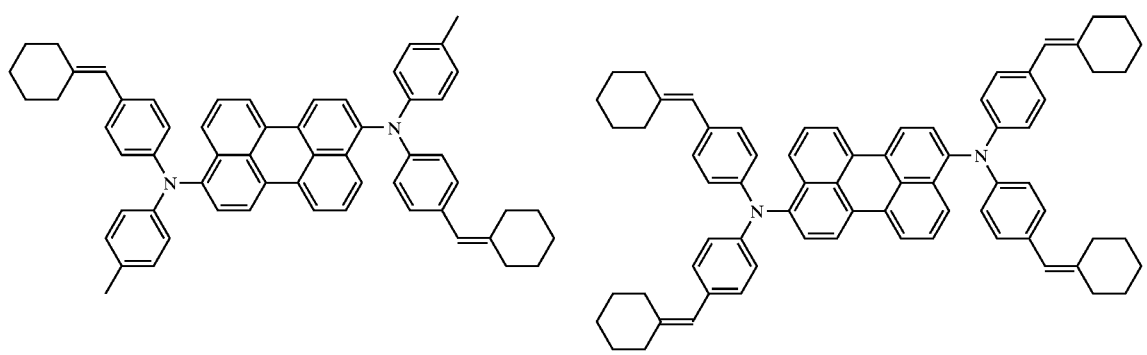
(284) (285)

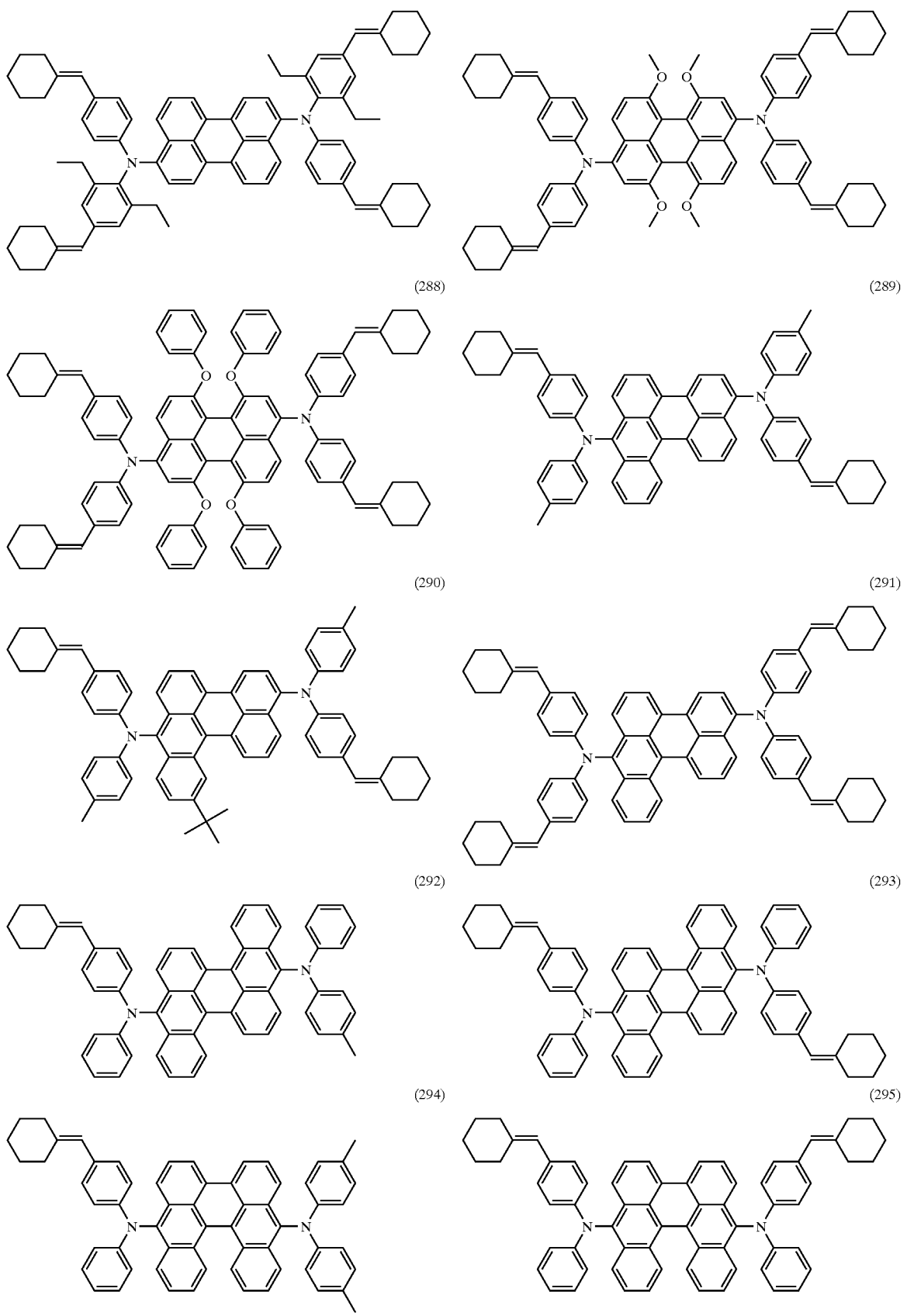

-continued
(296)
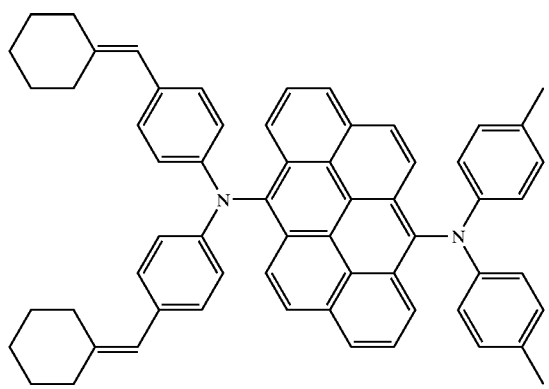
(297)
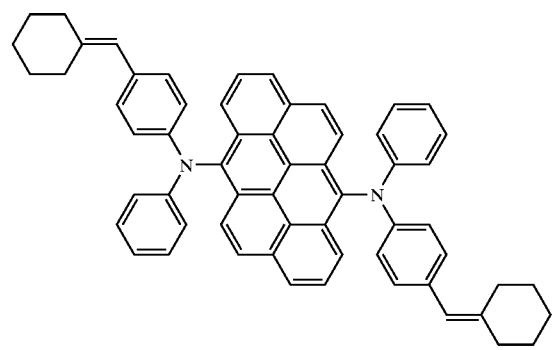
(298)
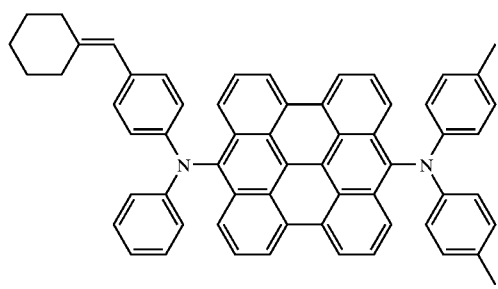
(299)
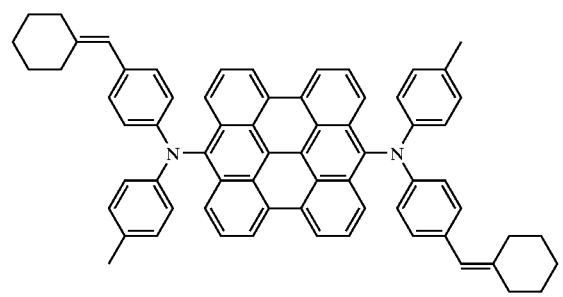
(300)
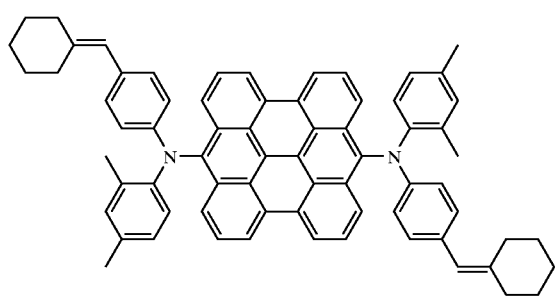
(301)
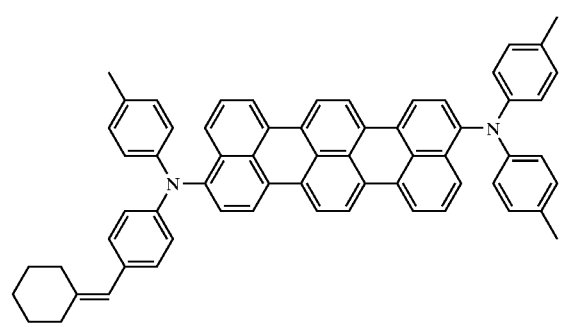
(302)
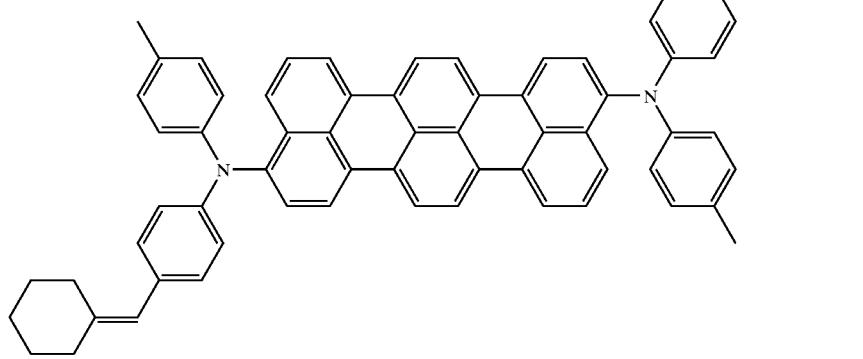

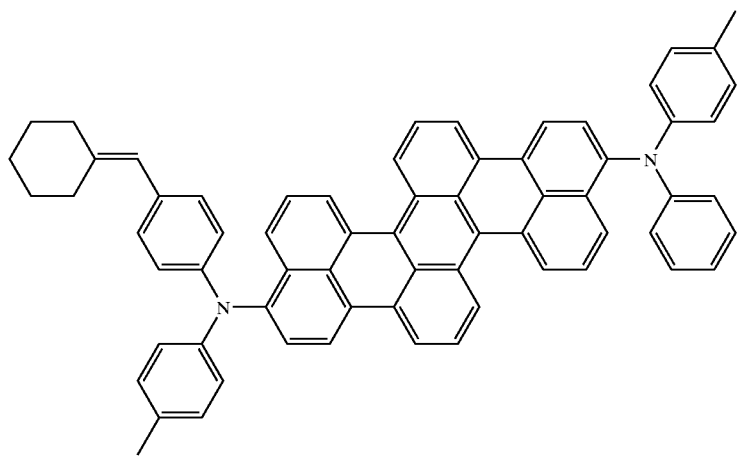
(303)
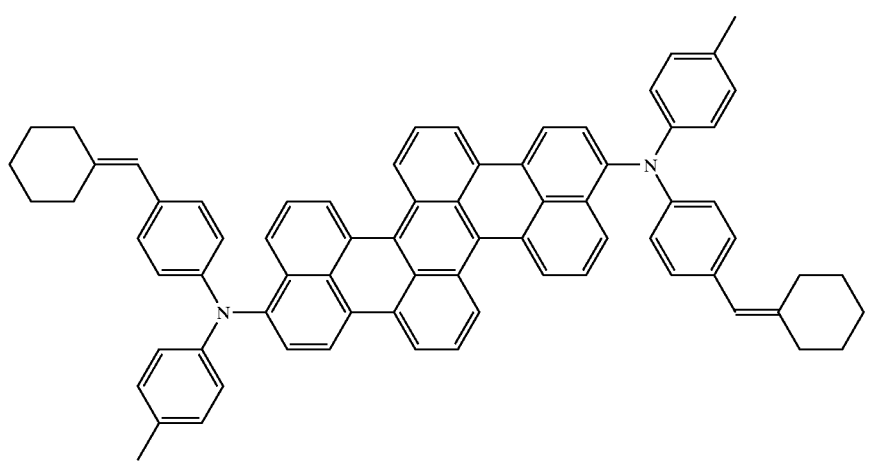
(304)
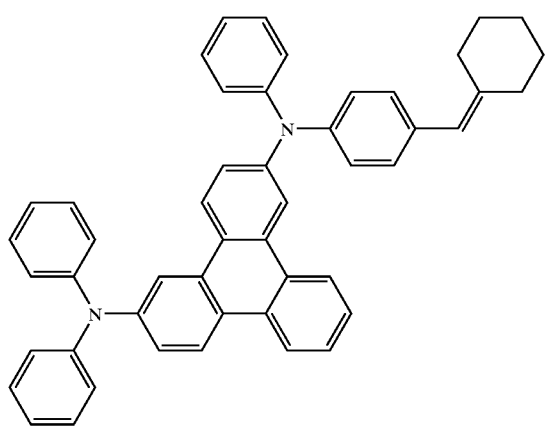
(305)
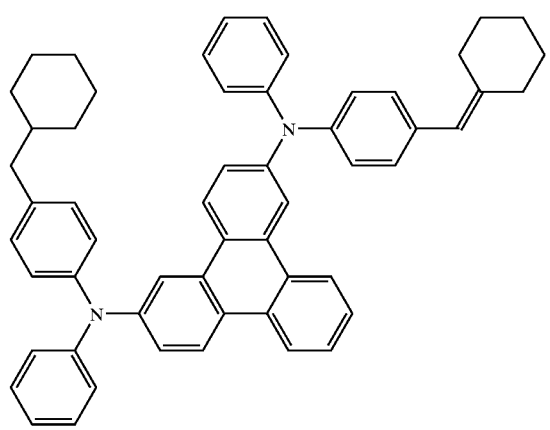
(306)

-continued
(307)
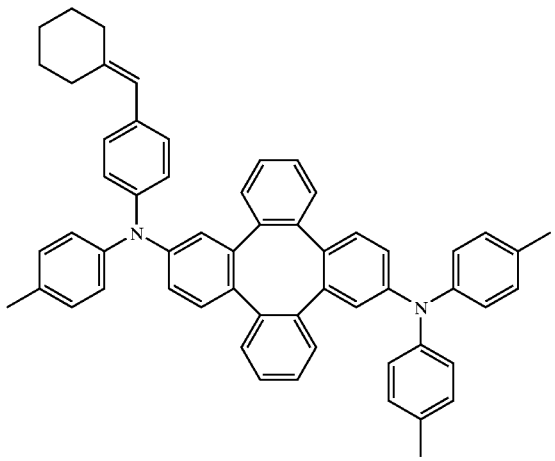
(308)
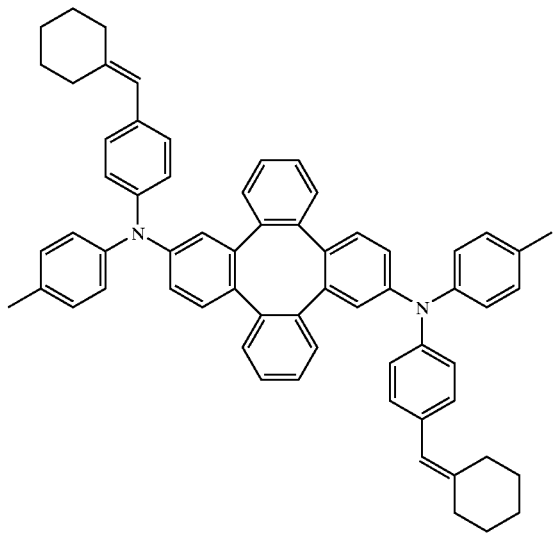
(309)
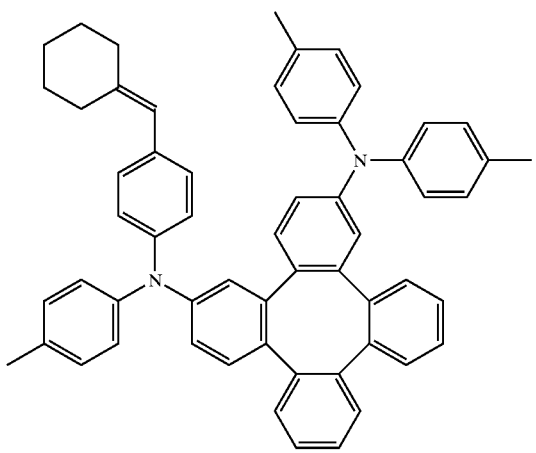
(310)
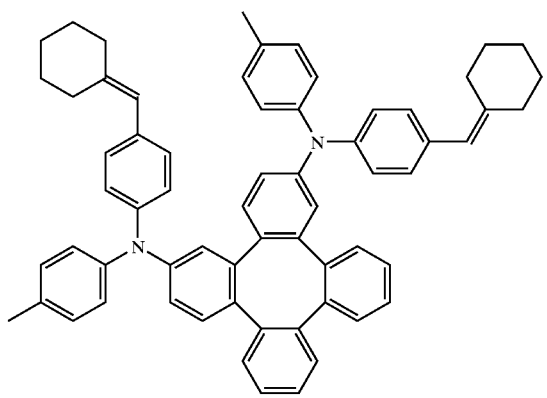
(311)
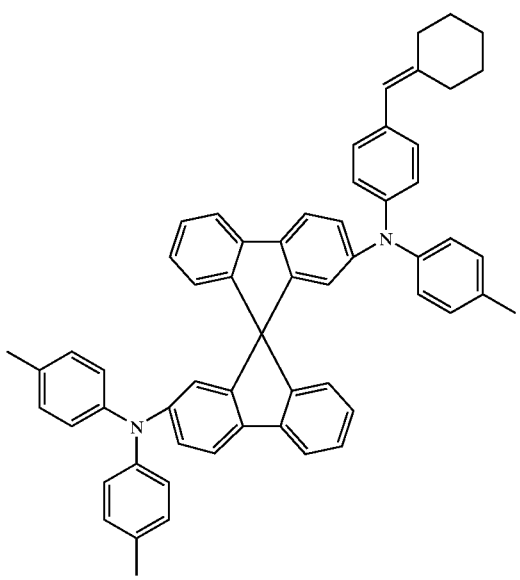
(312)
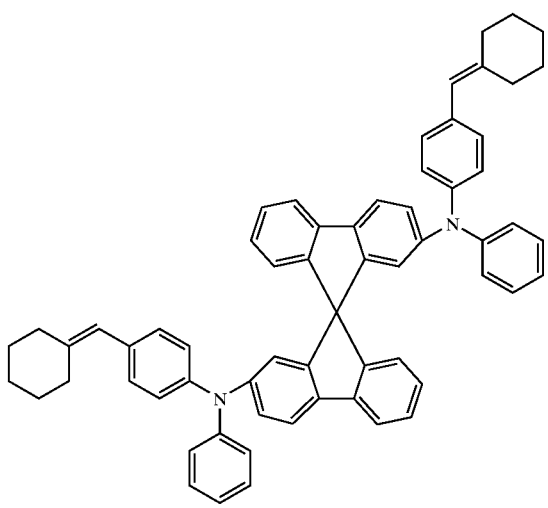

(313)
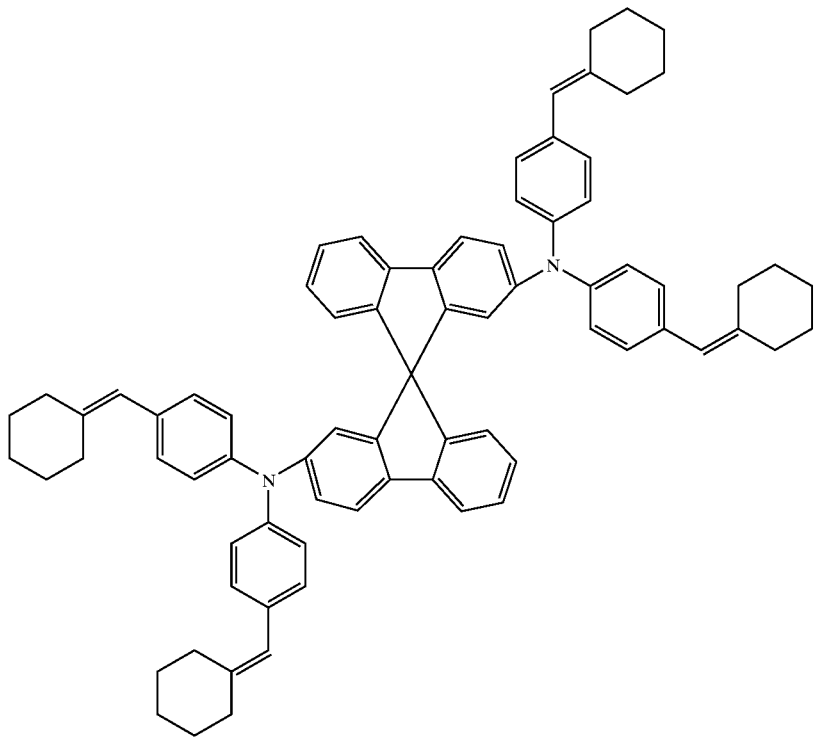
(314)
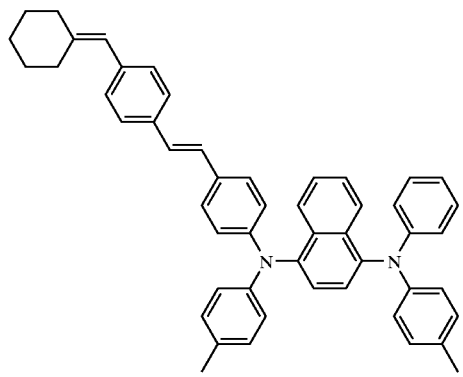
(315)
(316)
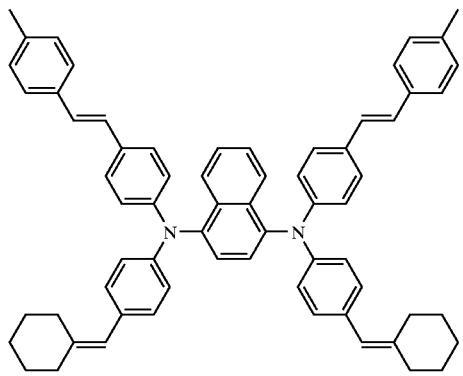
(317)
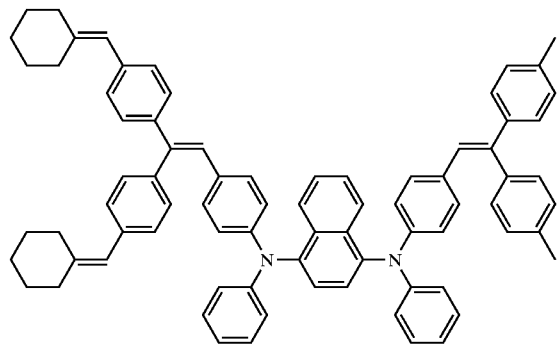

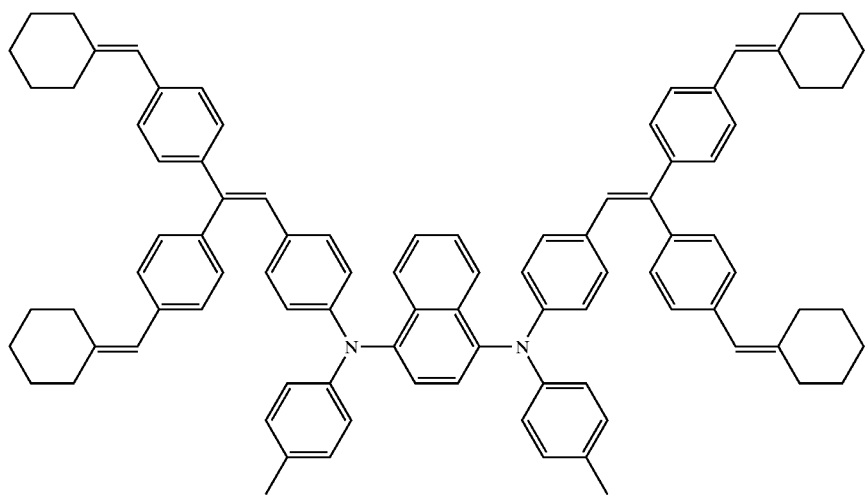
(318)
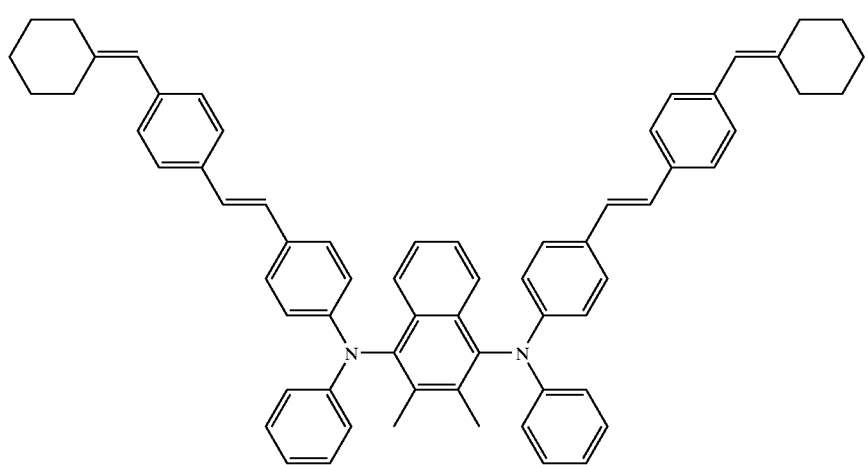
(319)
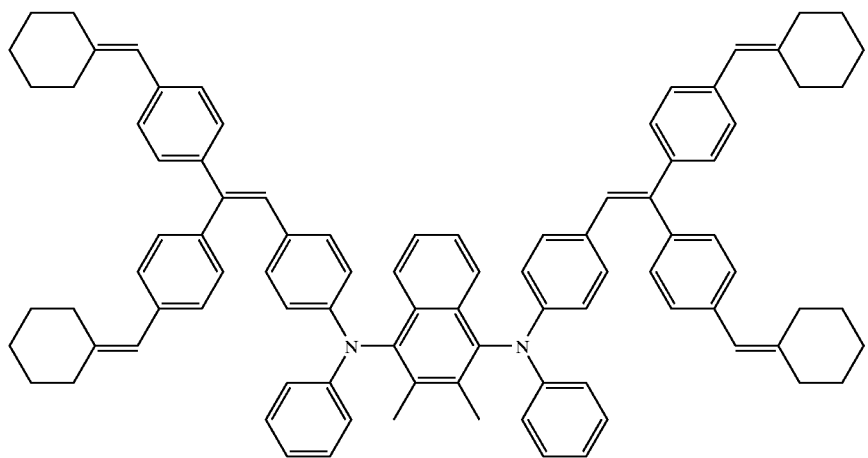
(320)

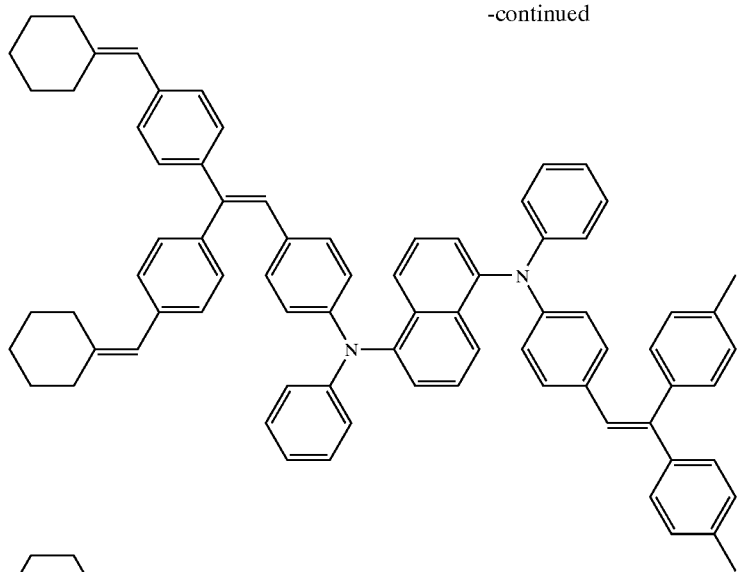
(321)
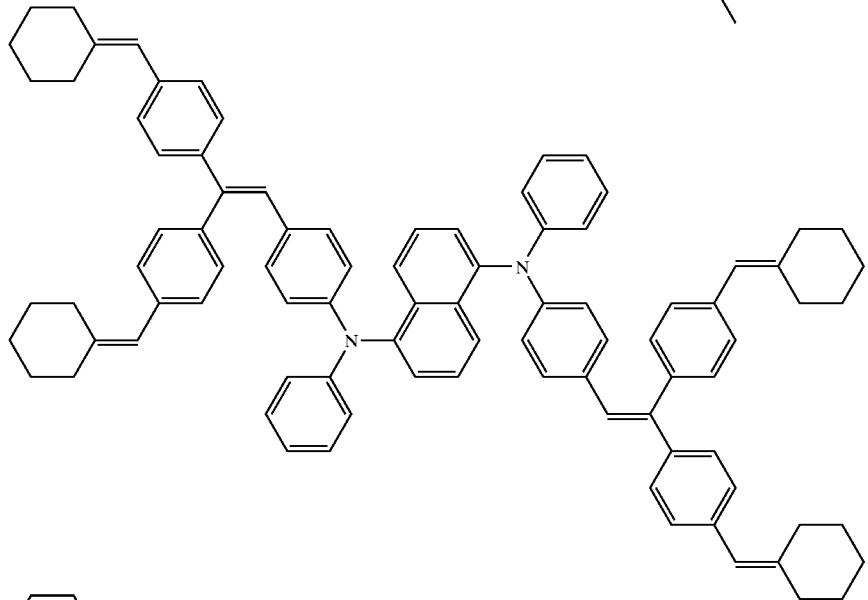
(322)
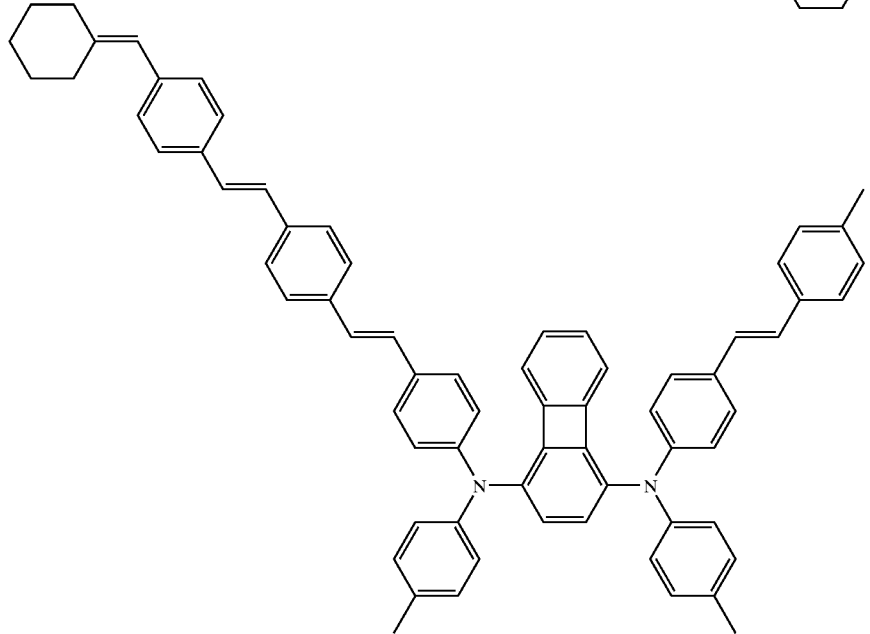
(323)

(324)
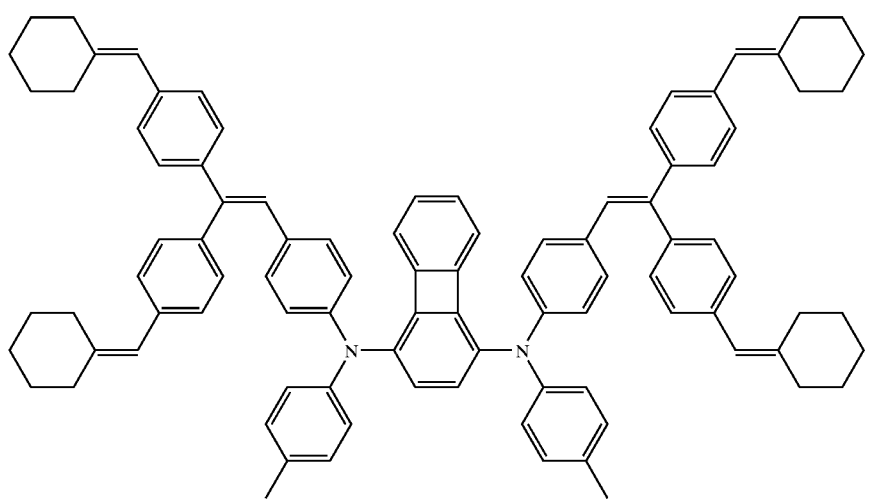
(325)
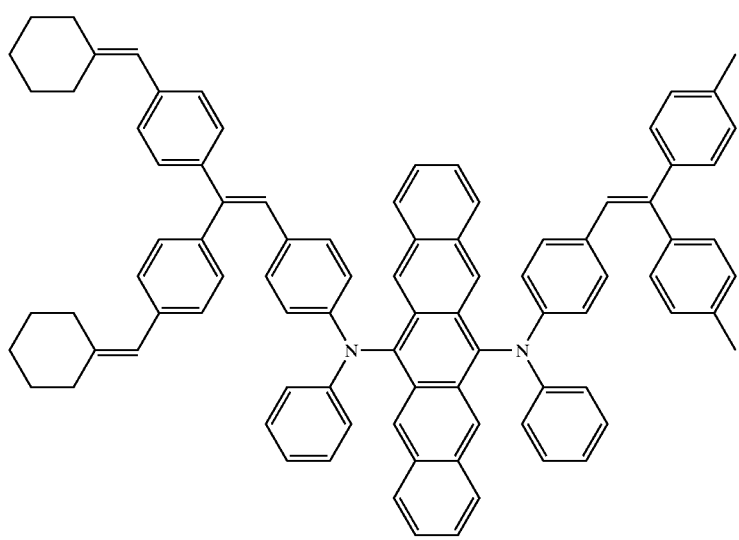
(326)
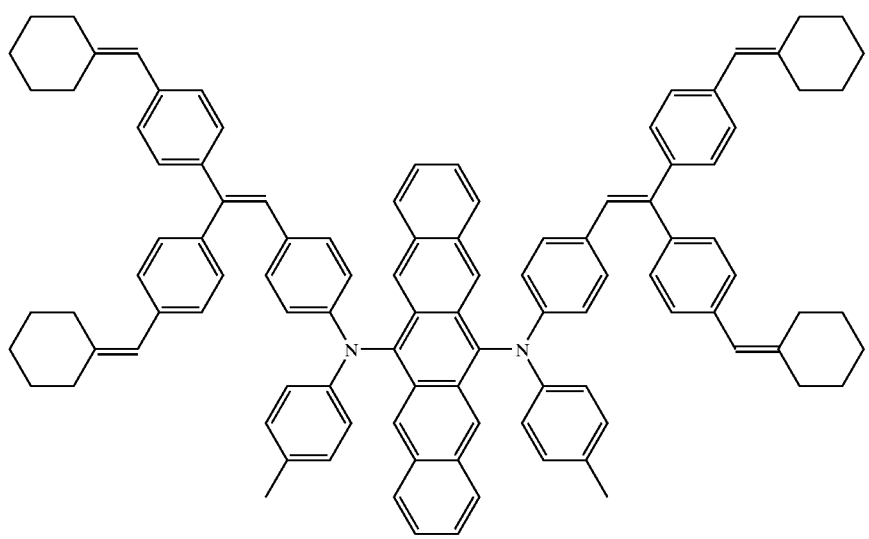

-continued
(327)
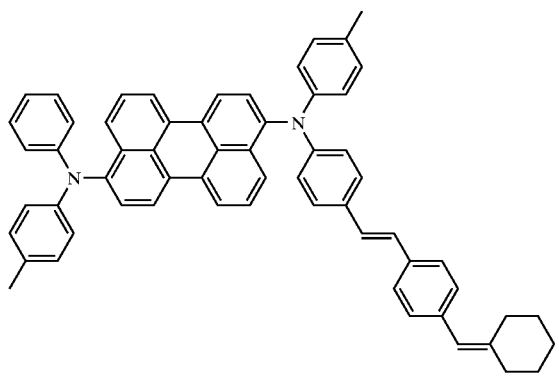
(328)
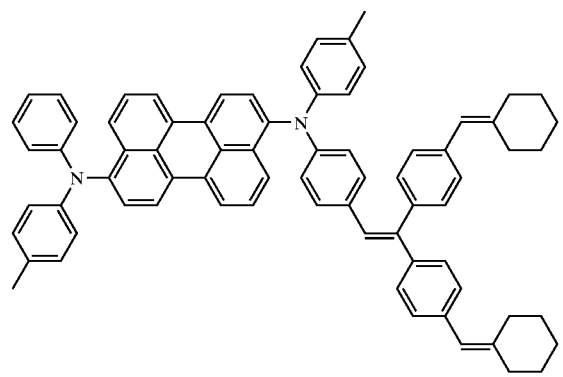
(329)
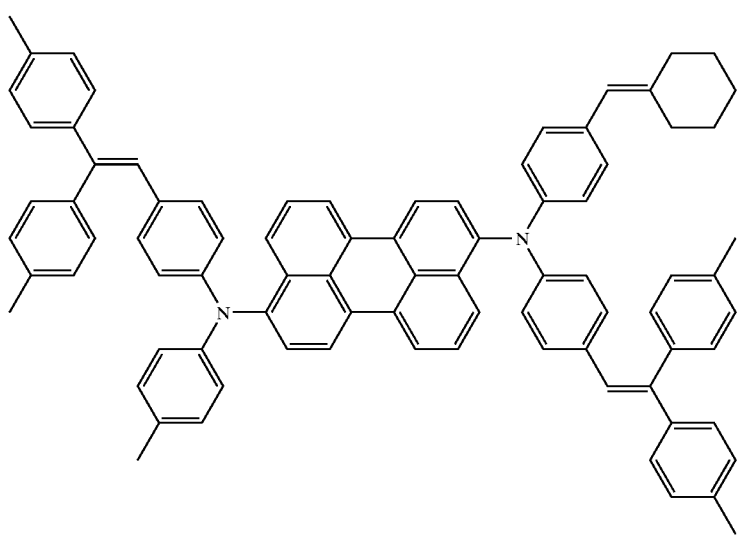
(330)
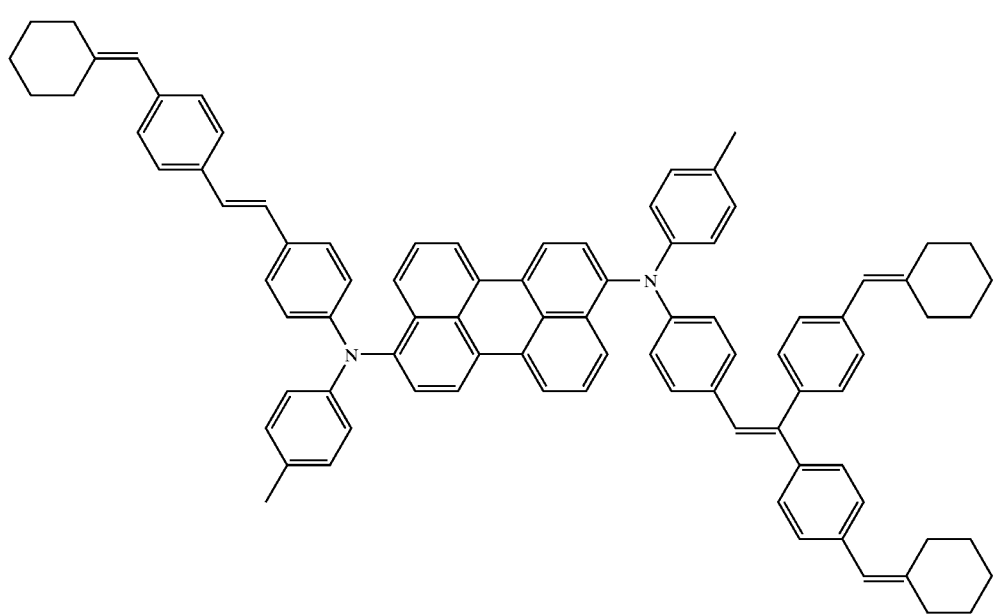

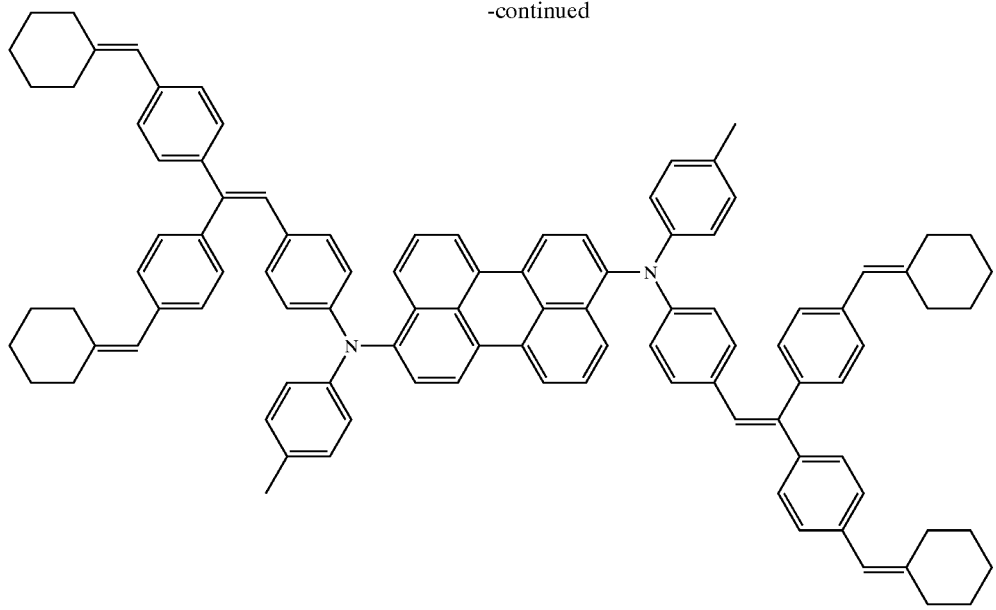
(331)
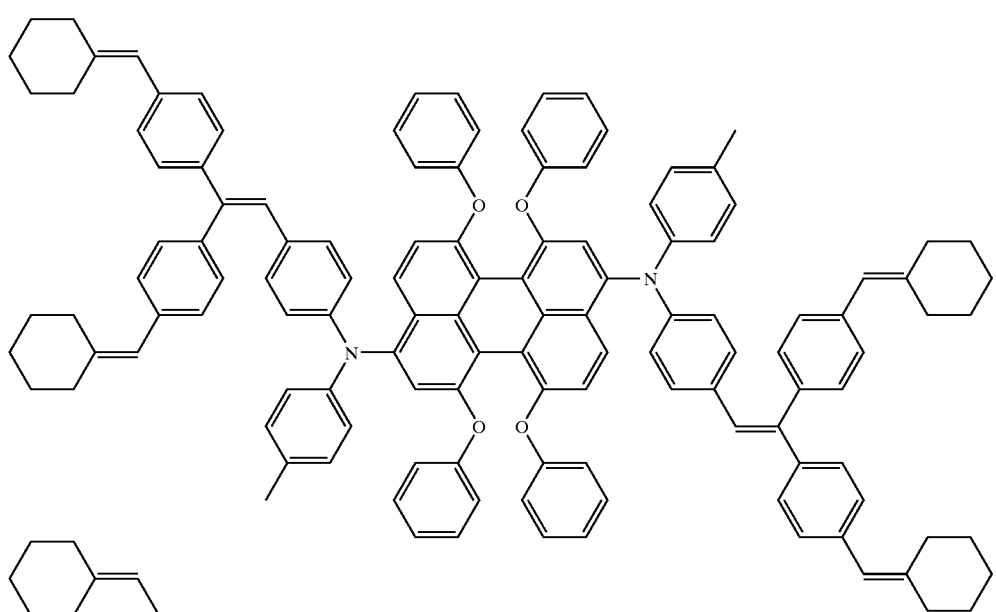
(332)
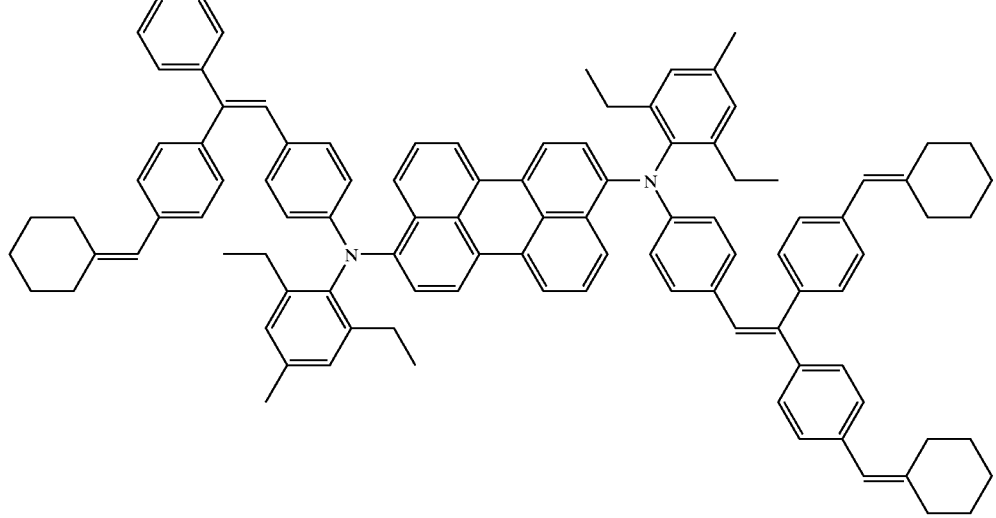
(333)

-continued
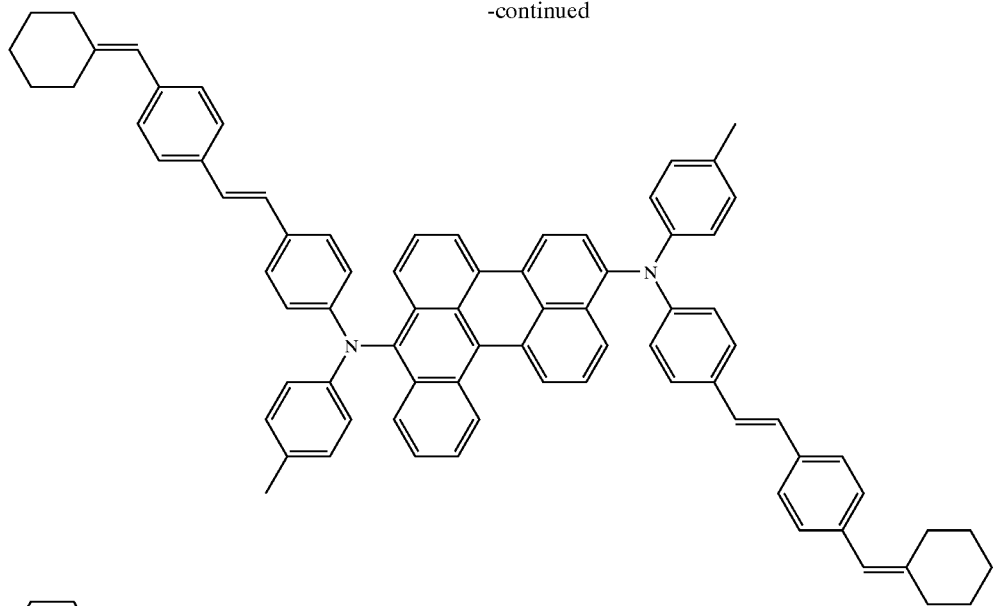
(334)
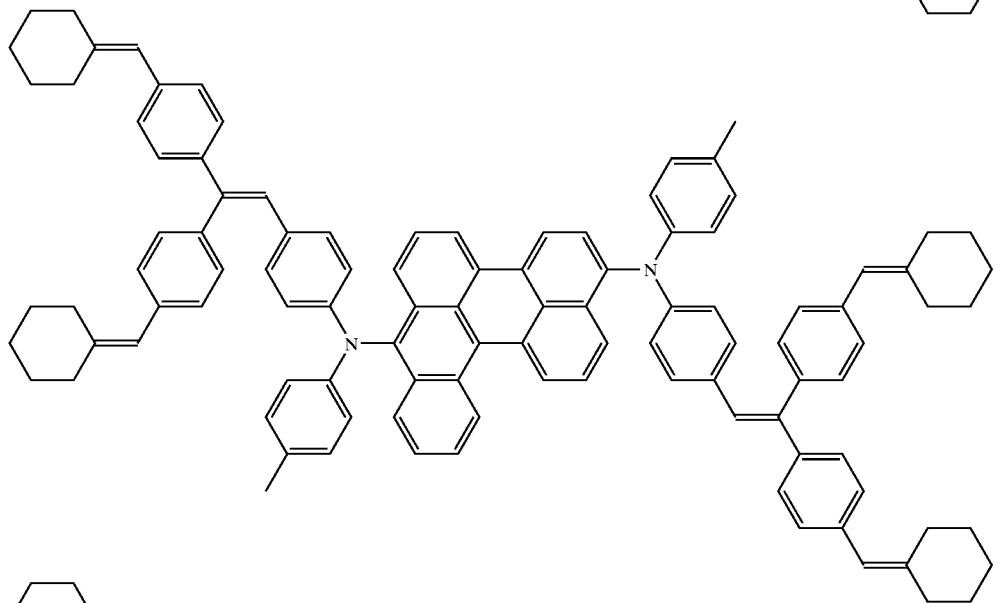
(335)
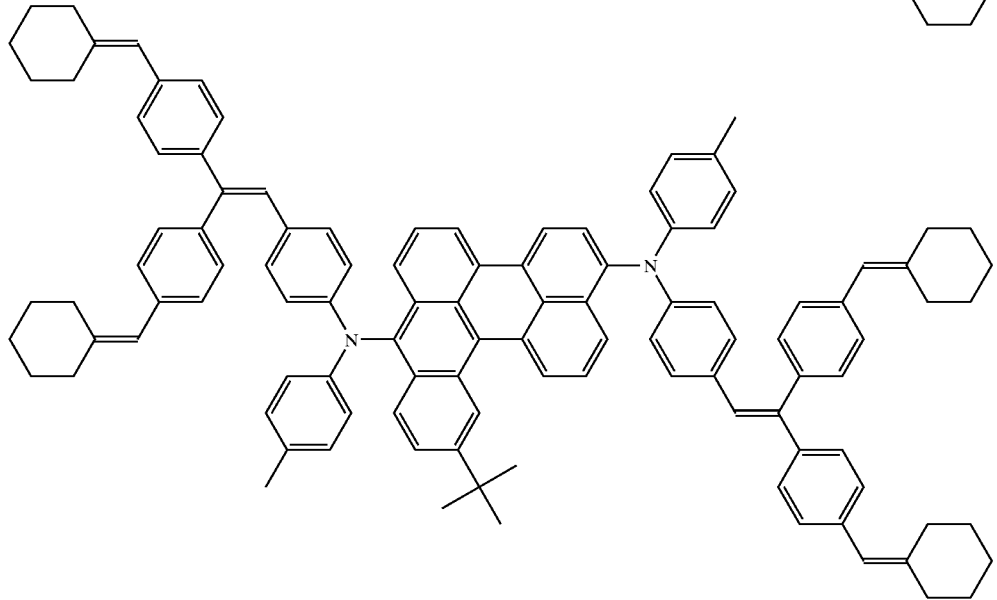
(336)

(337)
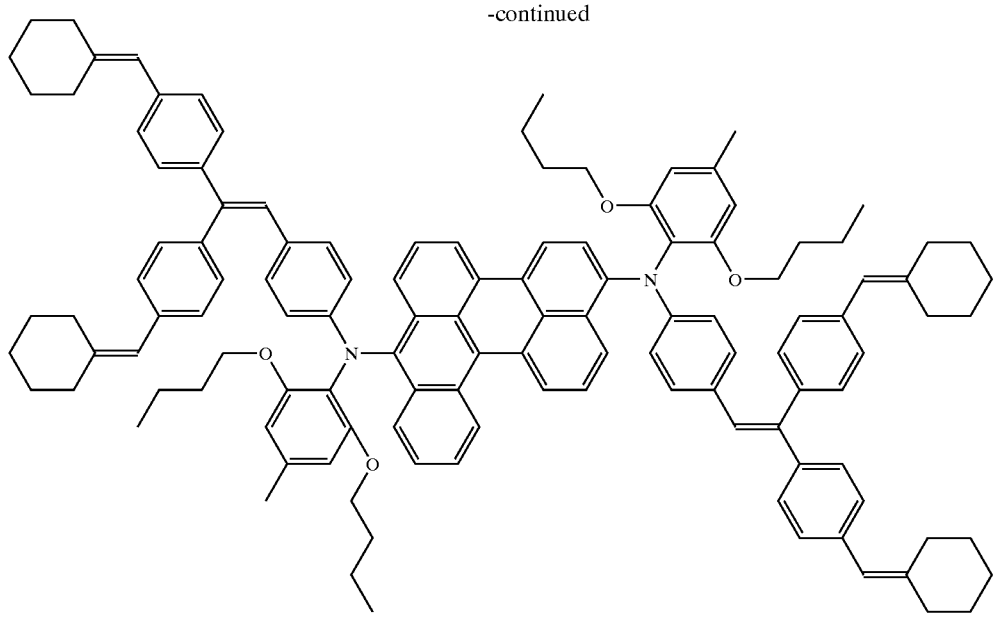
(338)
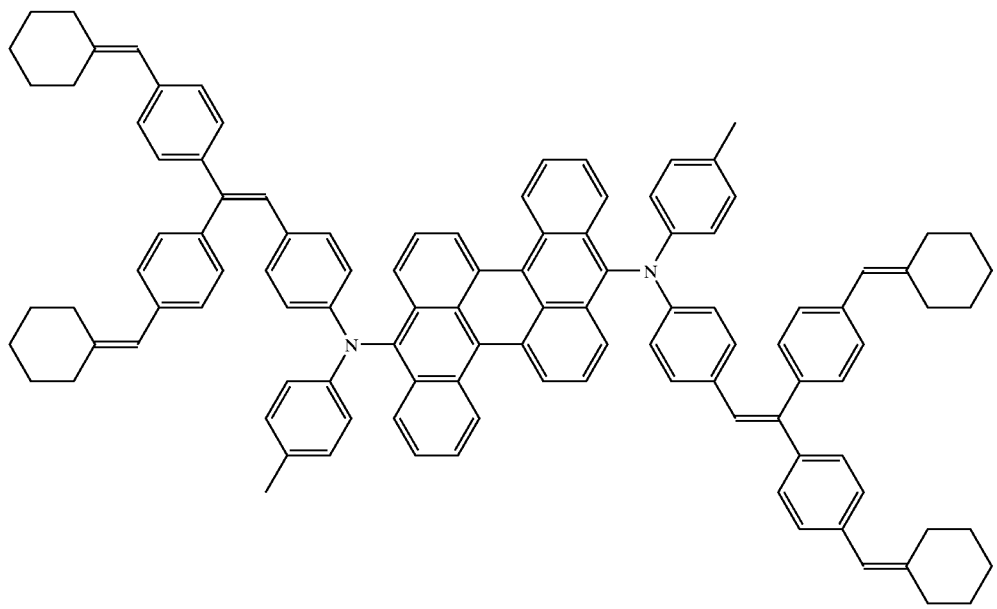
(339)
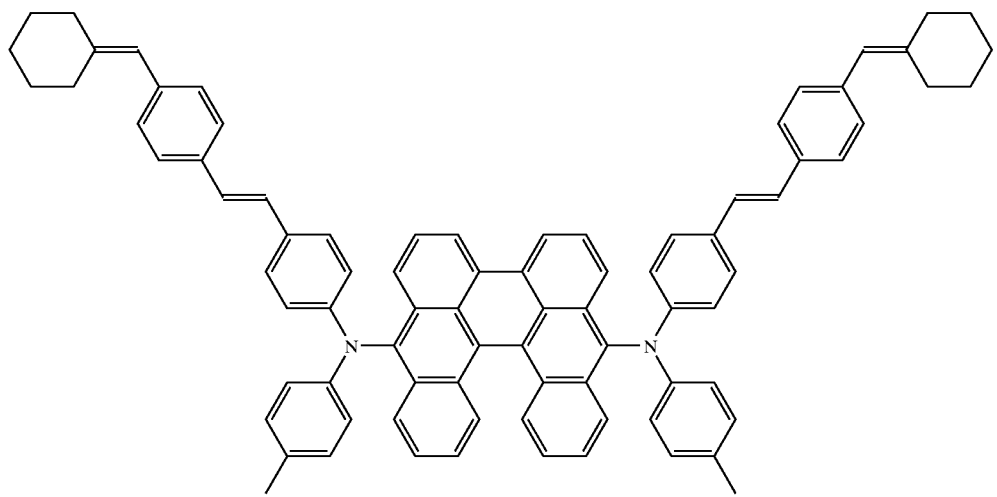

-continued
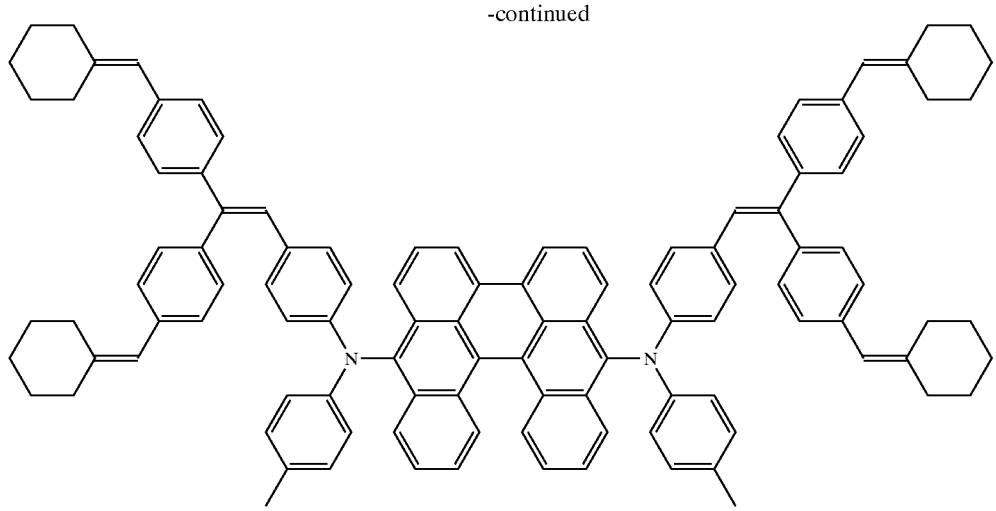
(340)
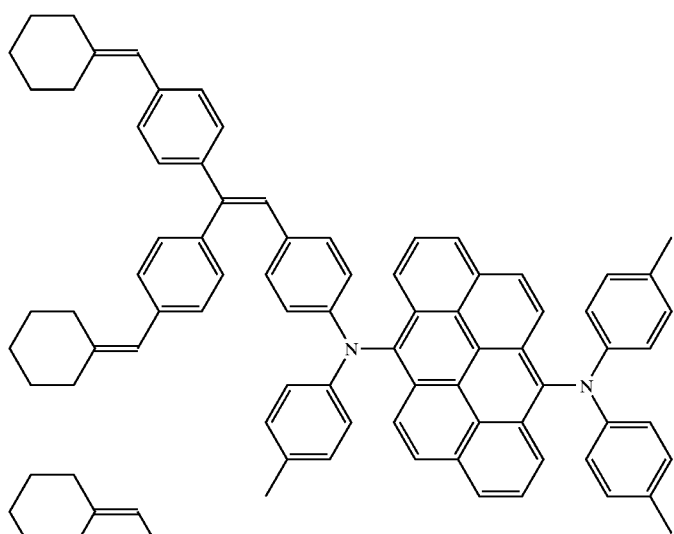
(341)
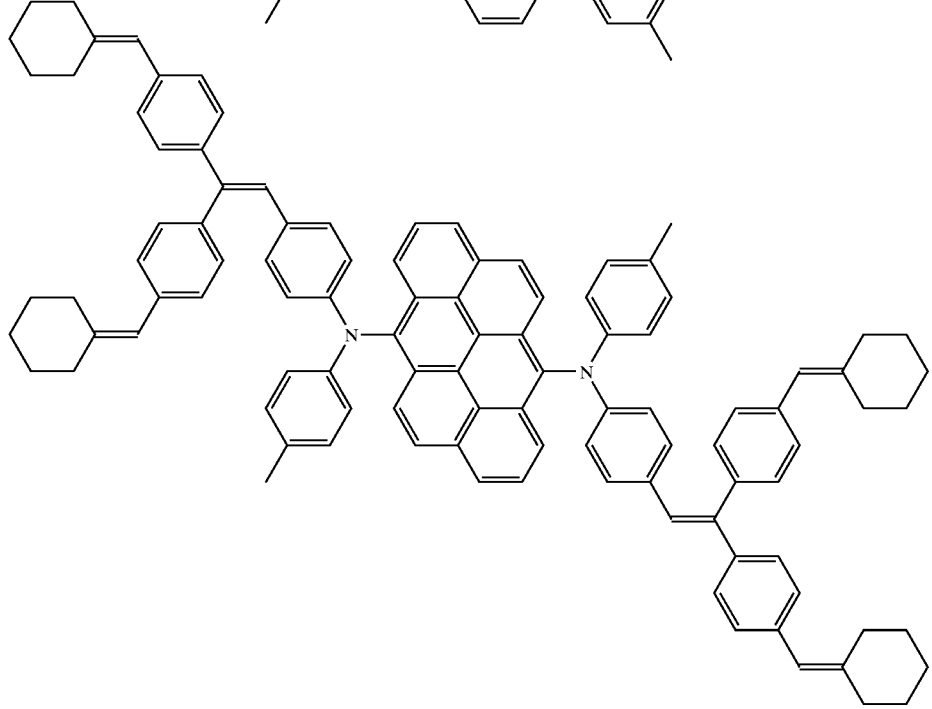
(342)

-continued
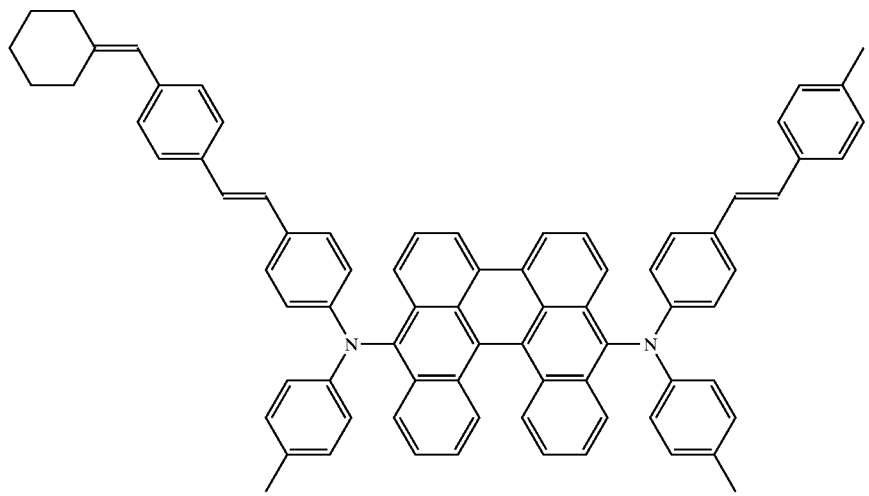
(343)
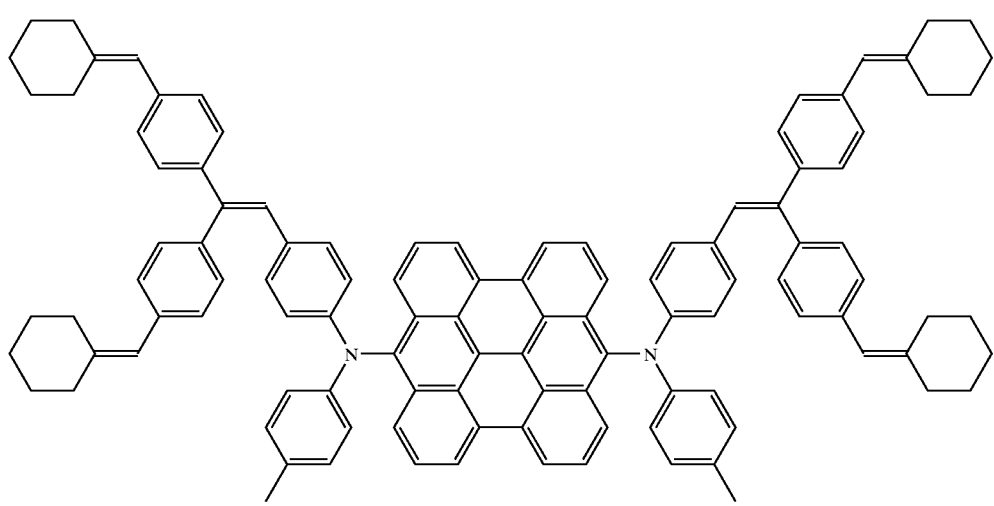
(344)
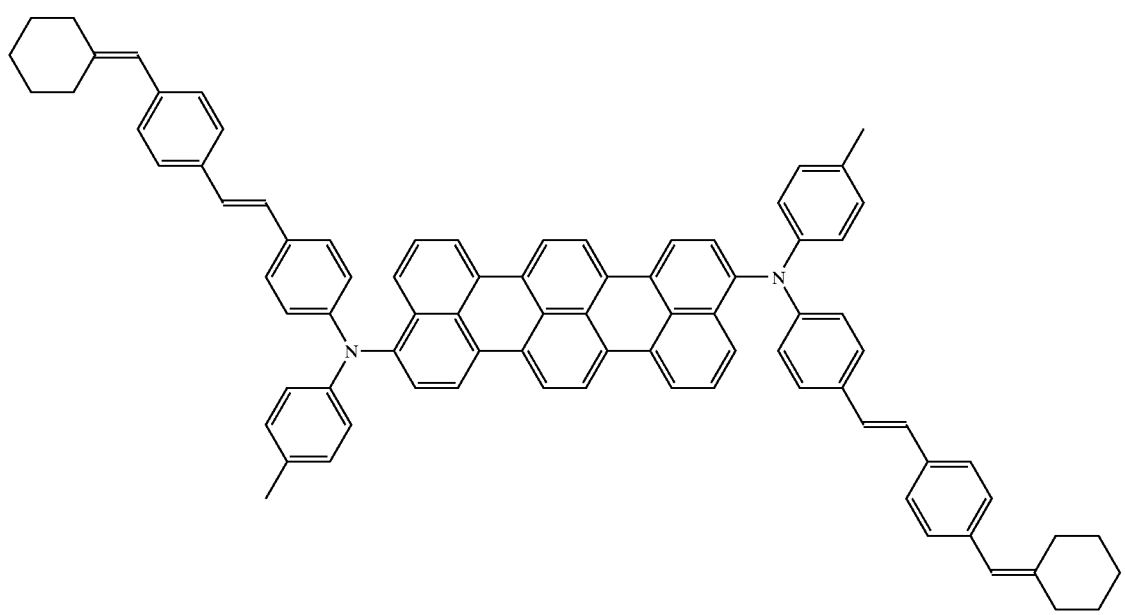
(345)

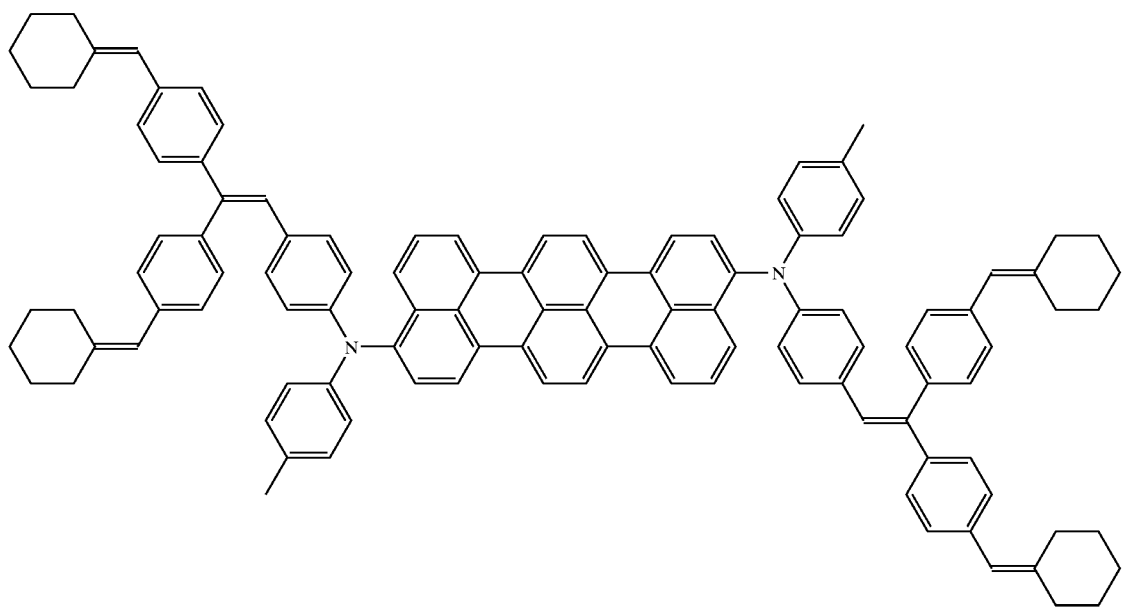
(346)
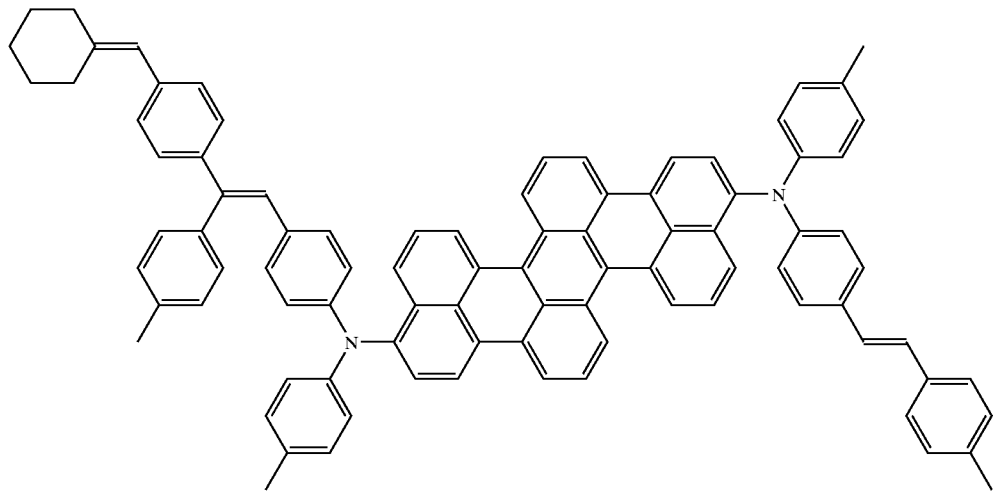
(347)
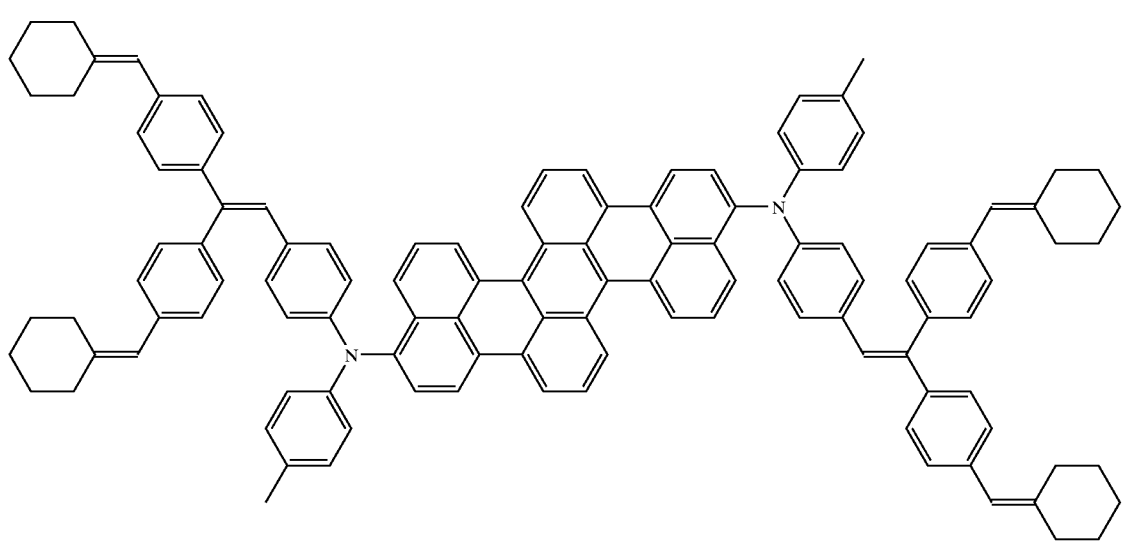
(348)

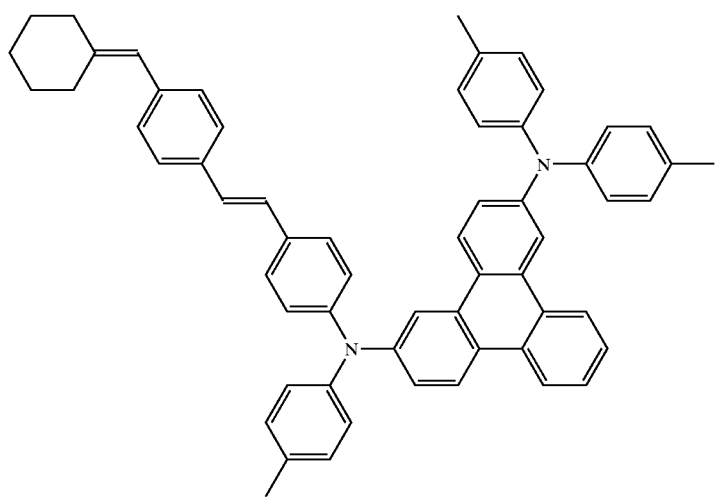
(349)
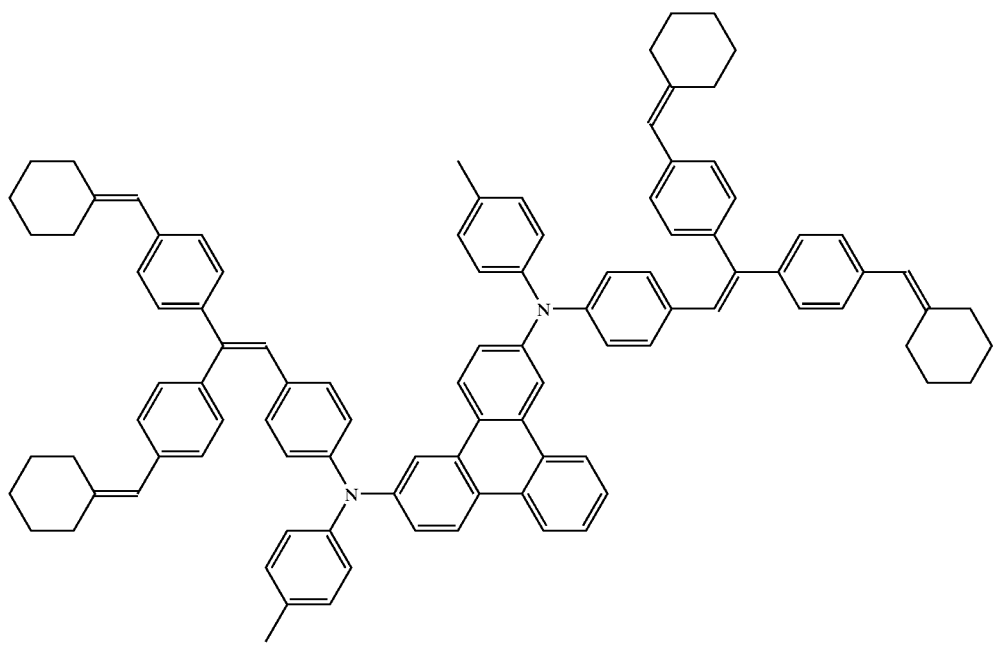
(350)
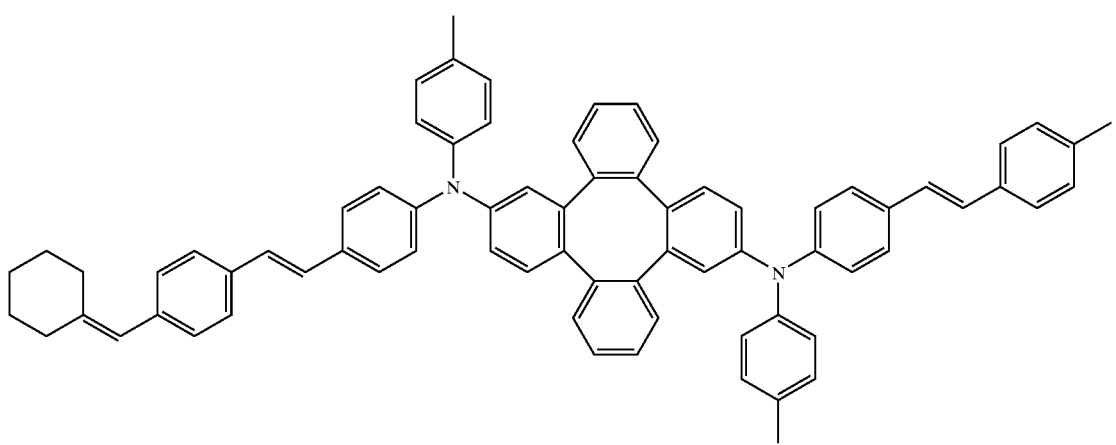
(351)

(352)
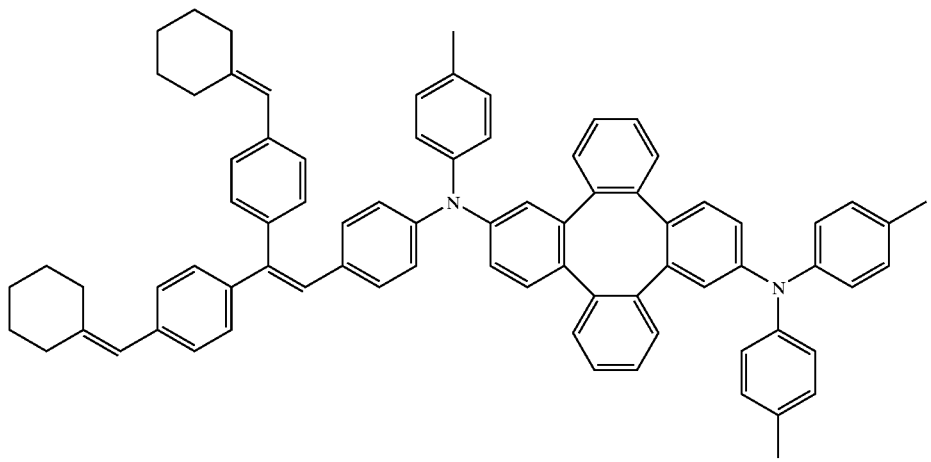
(353)
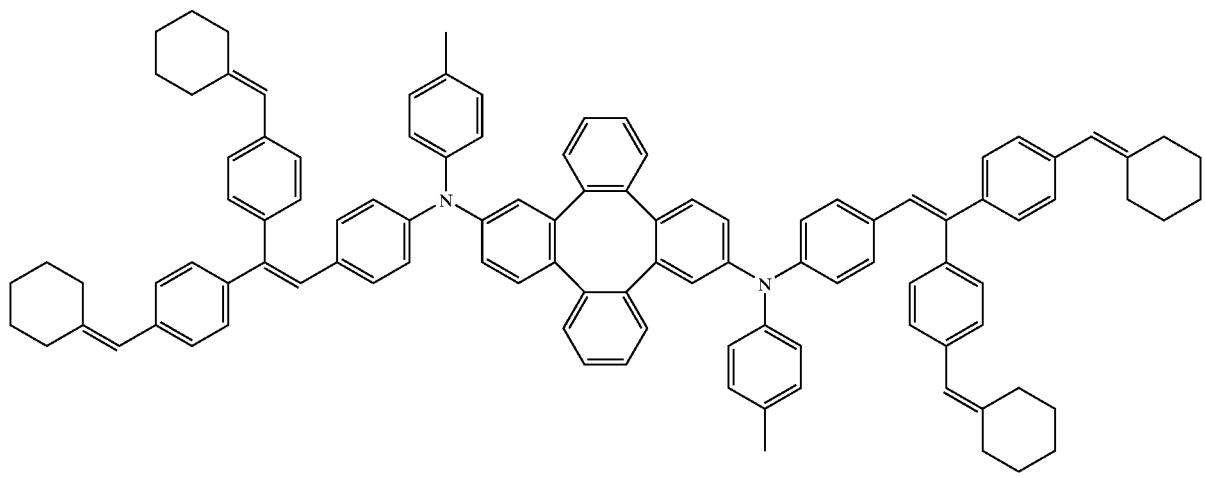
(354)
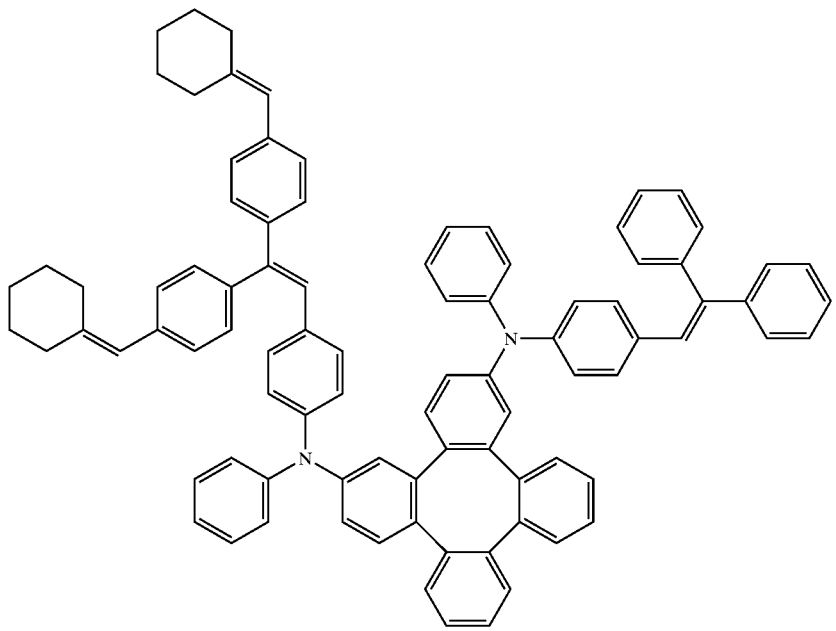

(355)
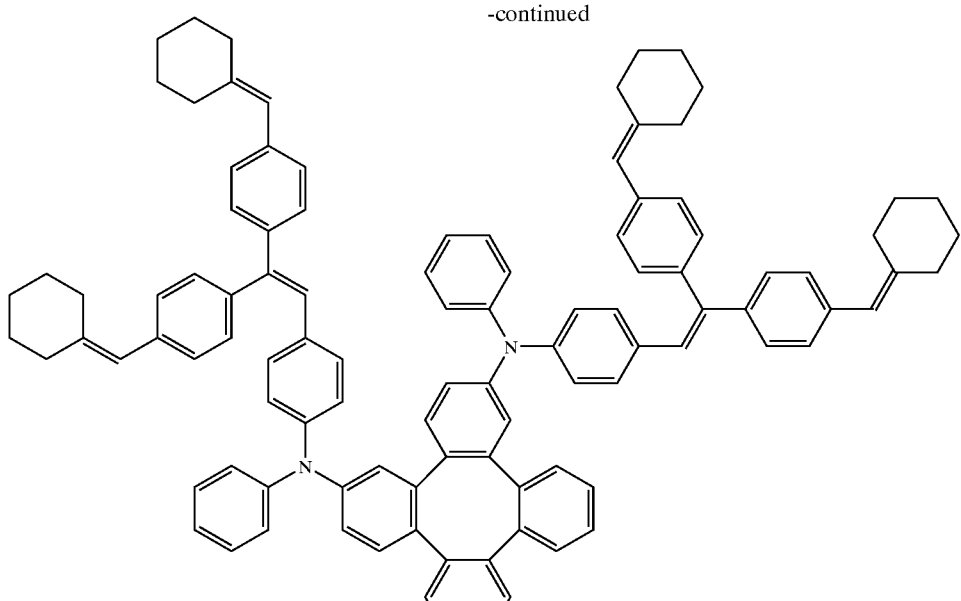
(356)
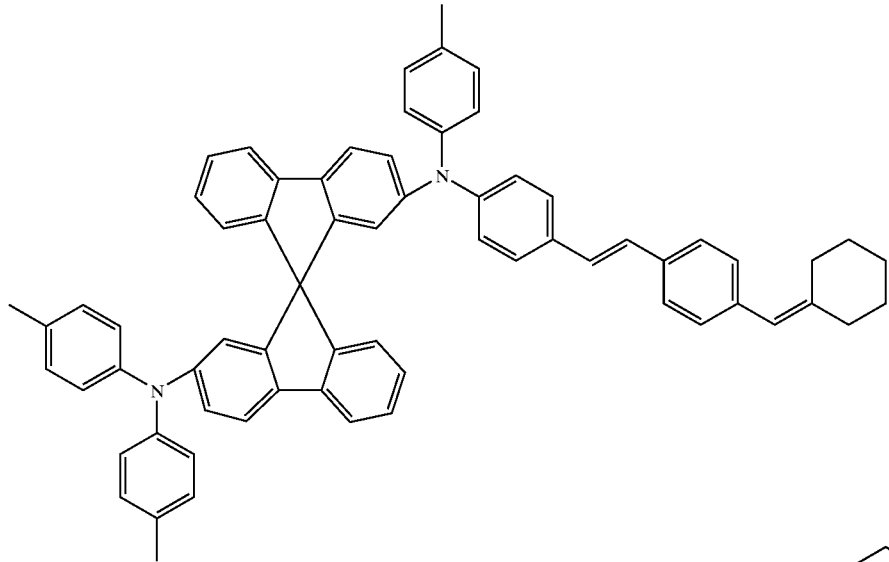
(357)
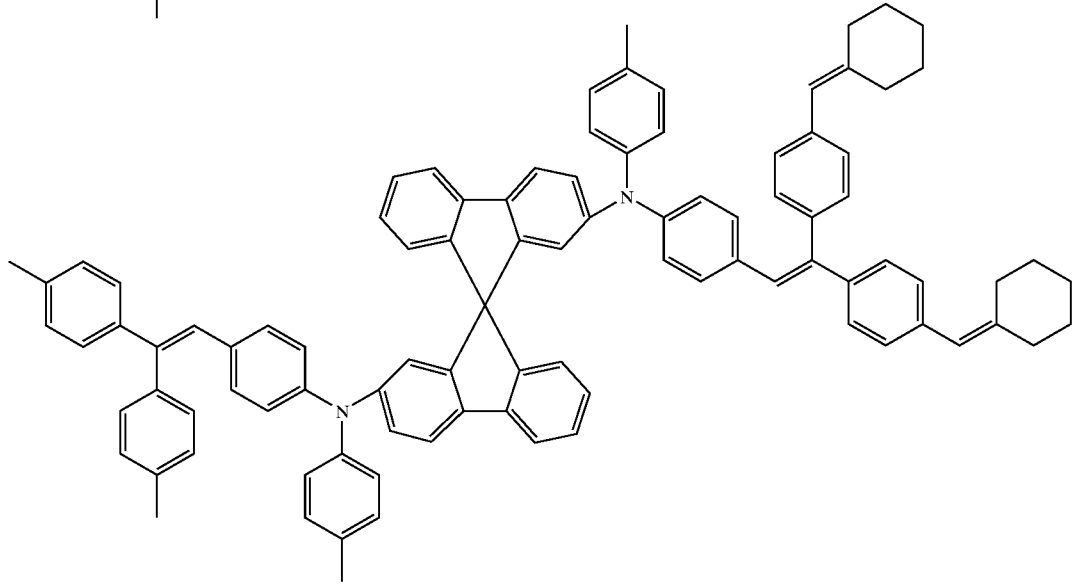

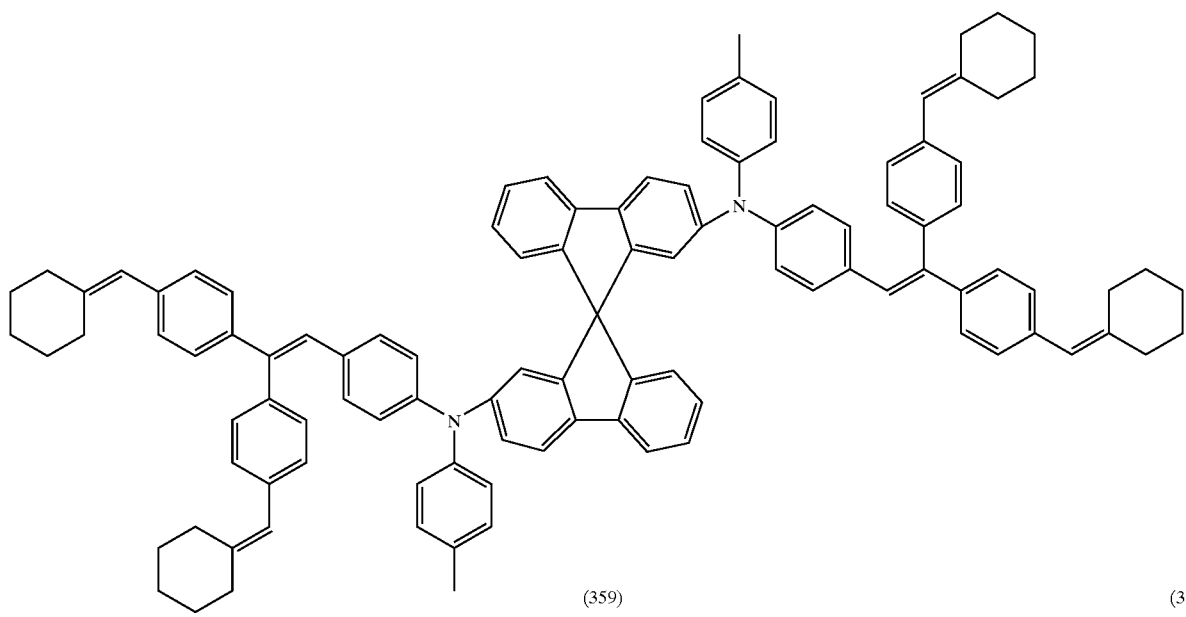
(358)
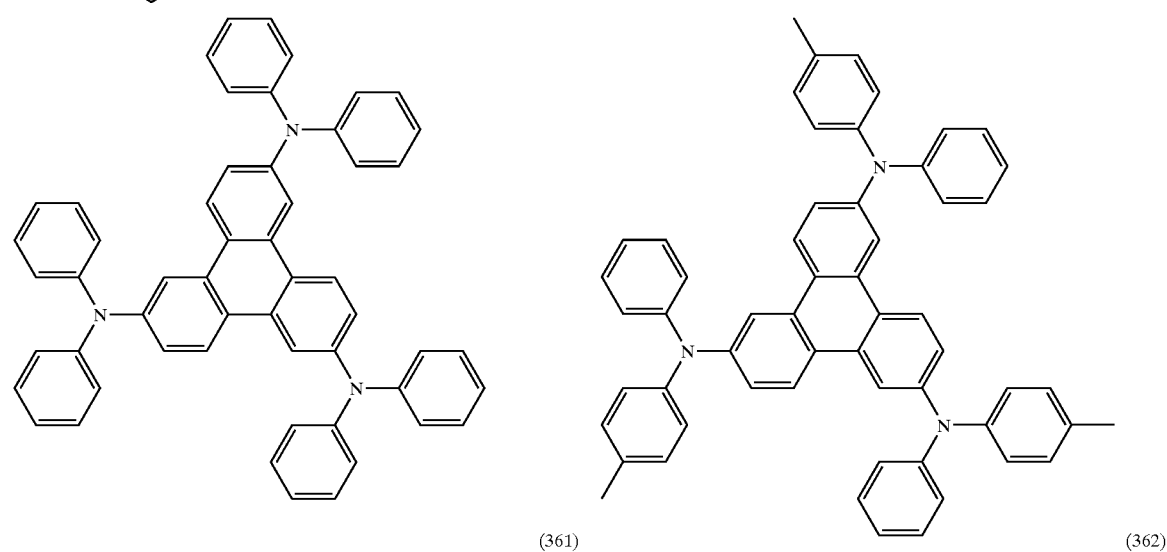
(359) (360)
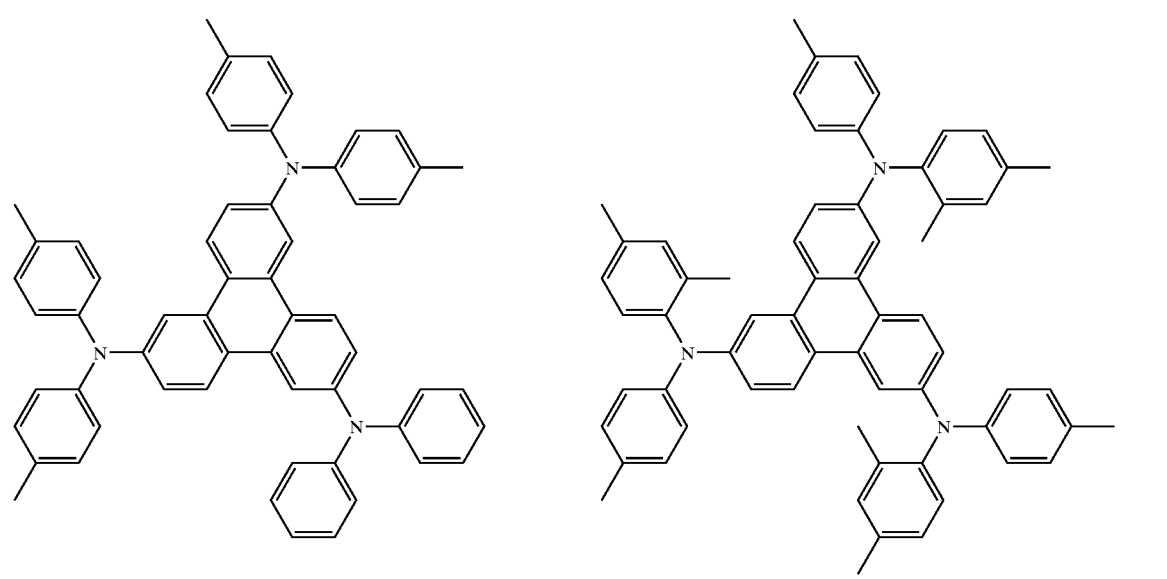
(361) (362)

-continued
(363)
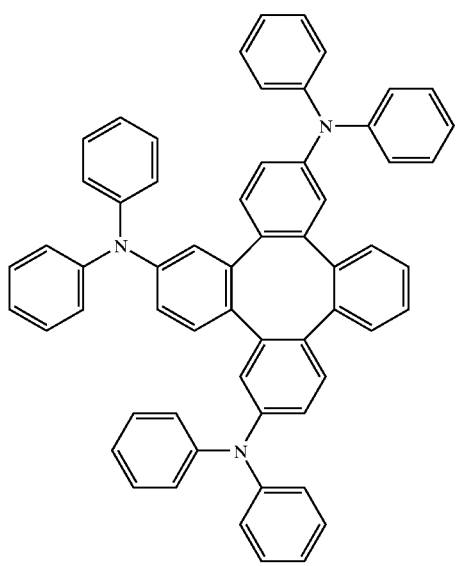
(364)
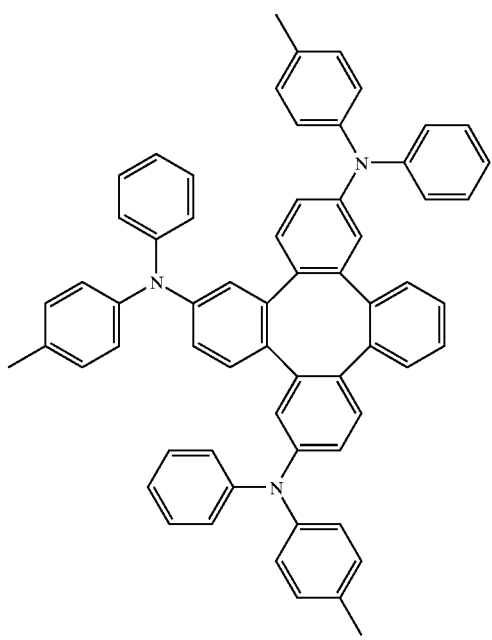
(365)
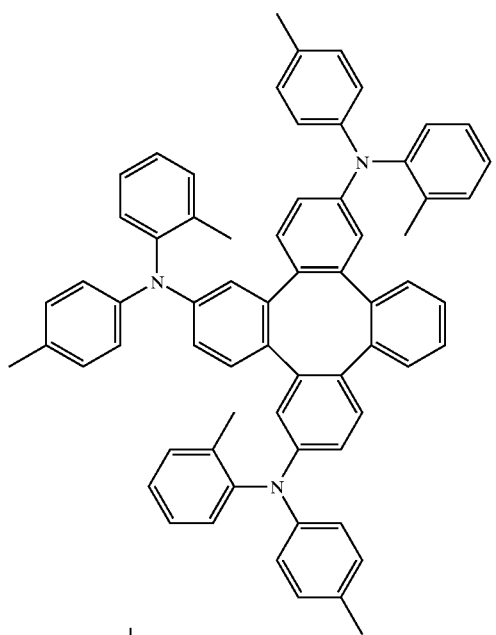
(366)
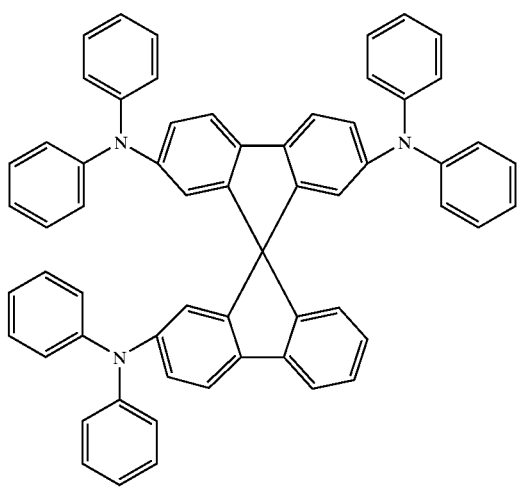
(367)
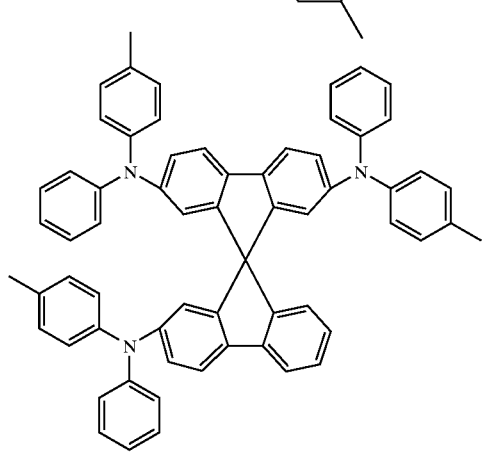
(368)
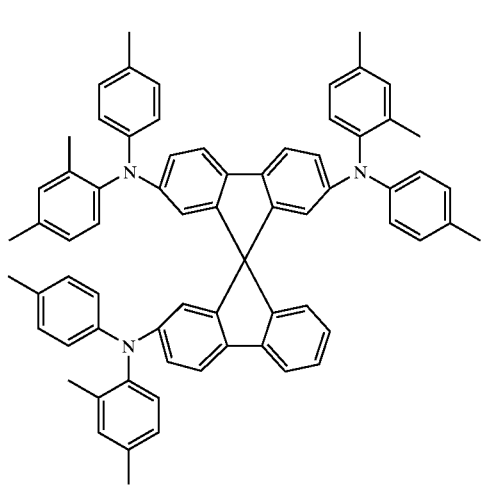

(369)
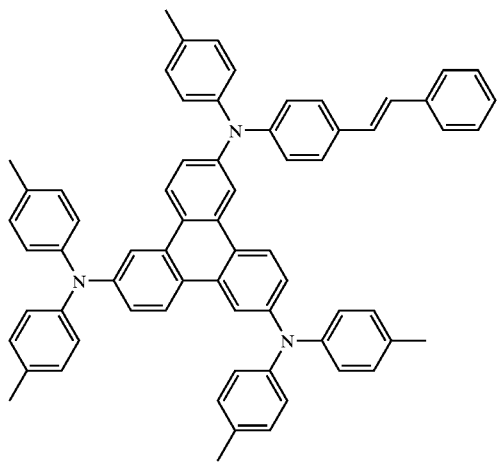
(370)
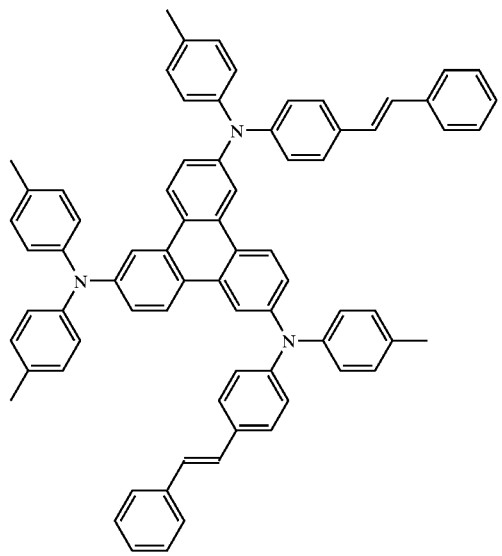
(371)
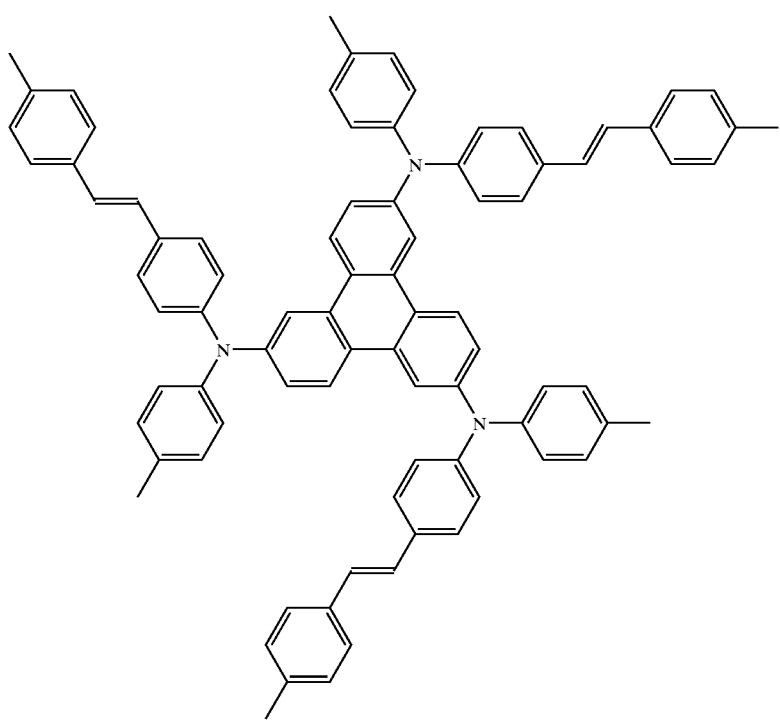

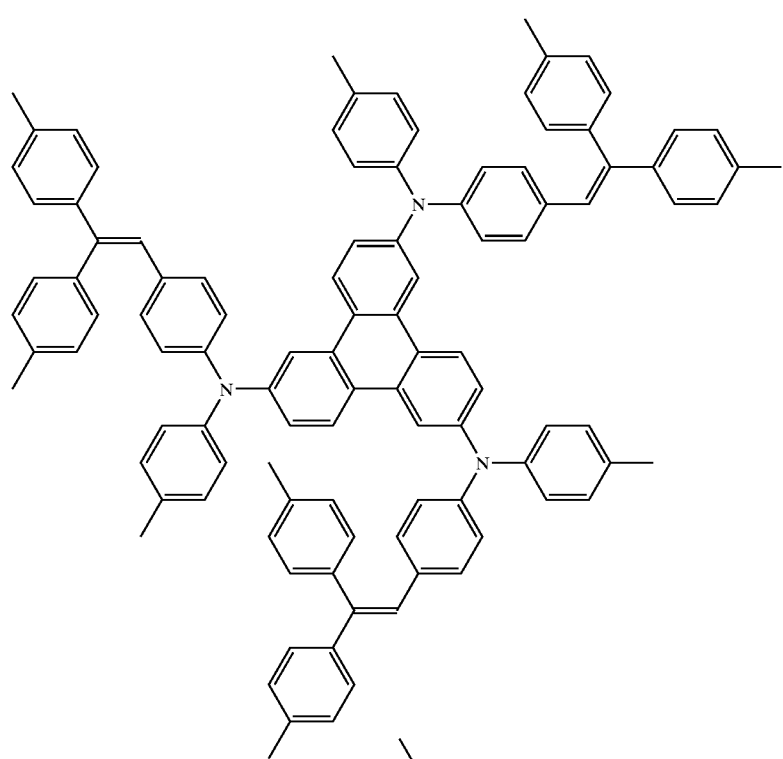
(372)
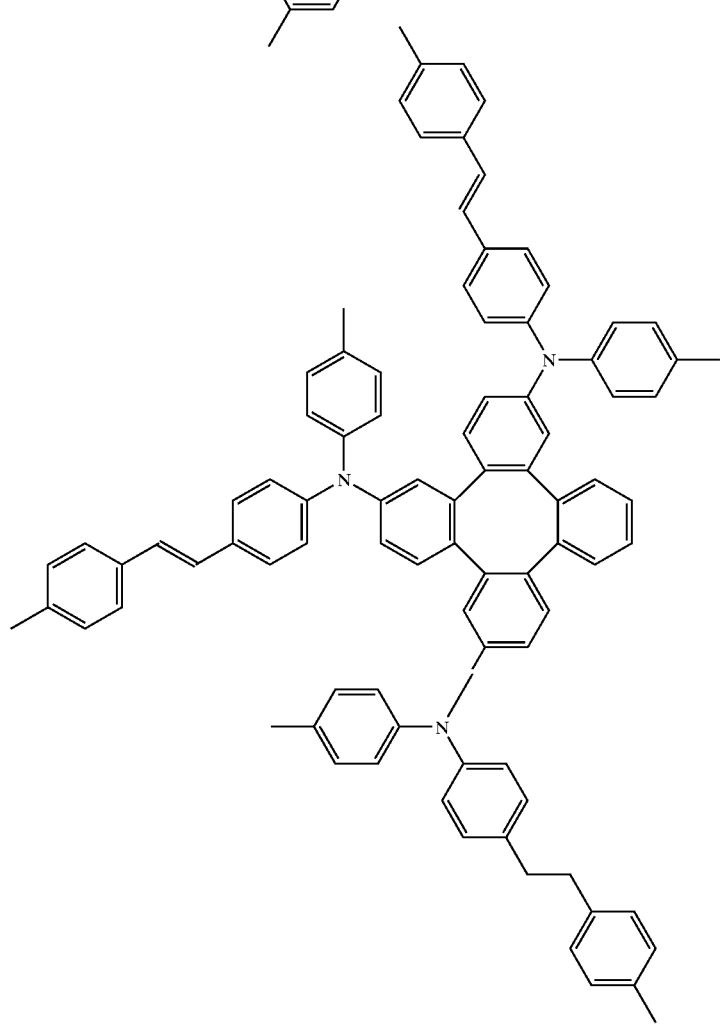
(373)

(374)
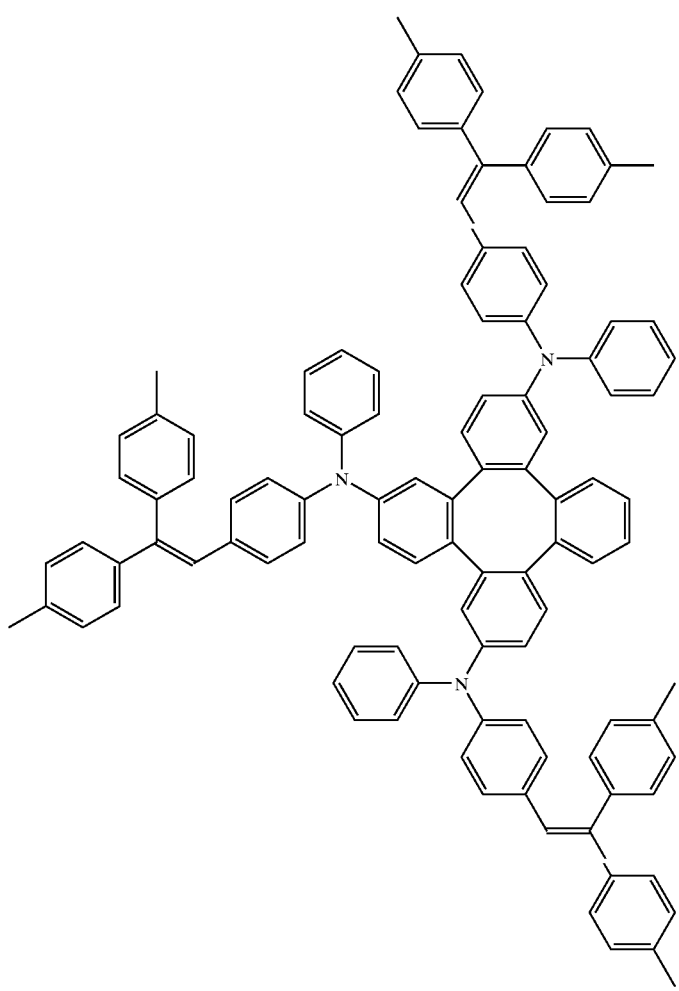
(375)
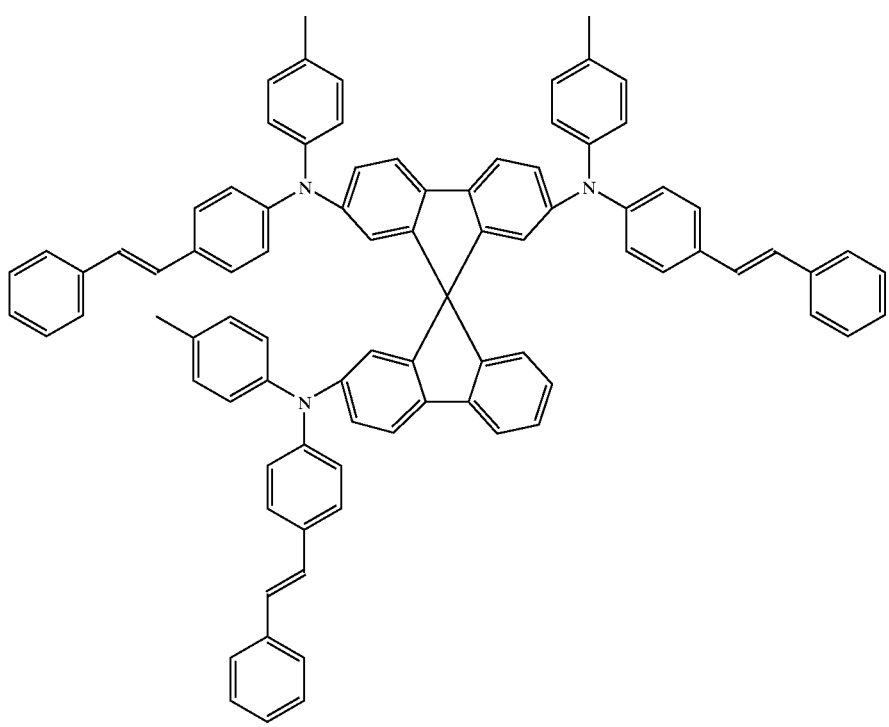

-continued
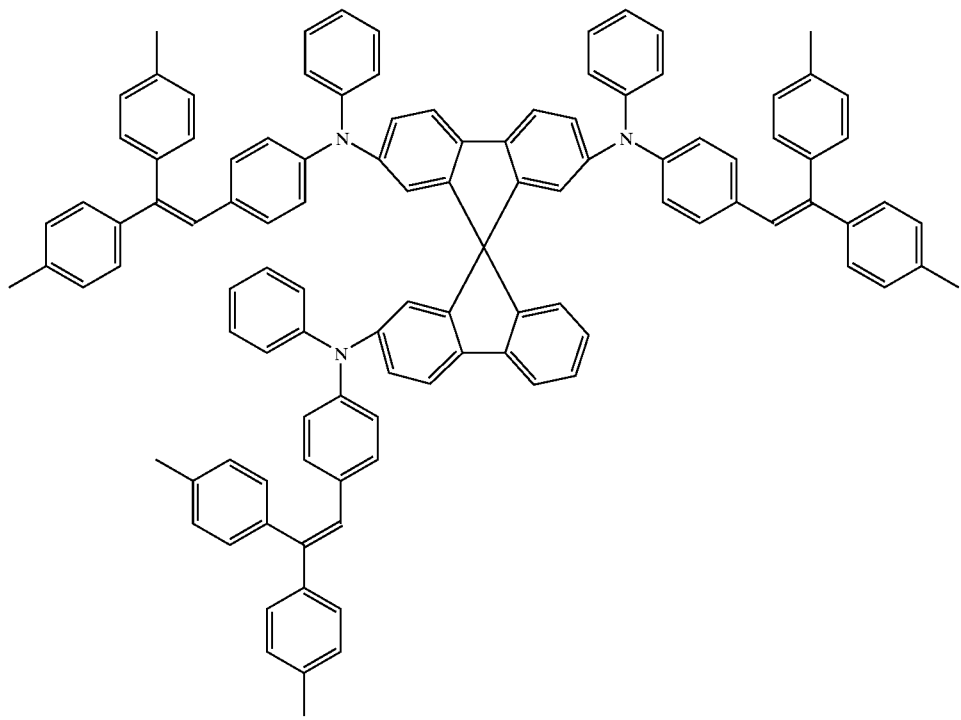
(376)
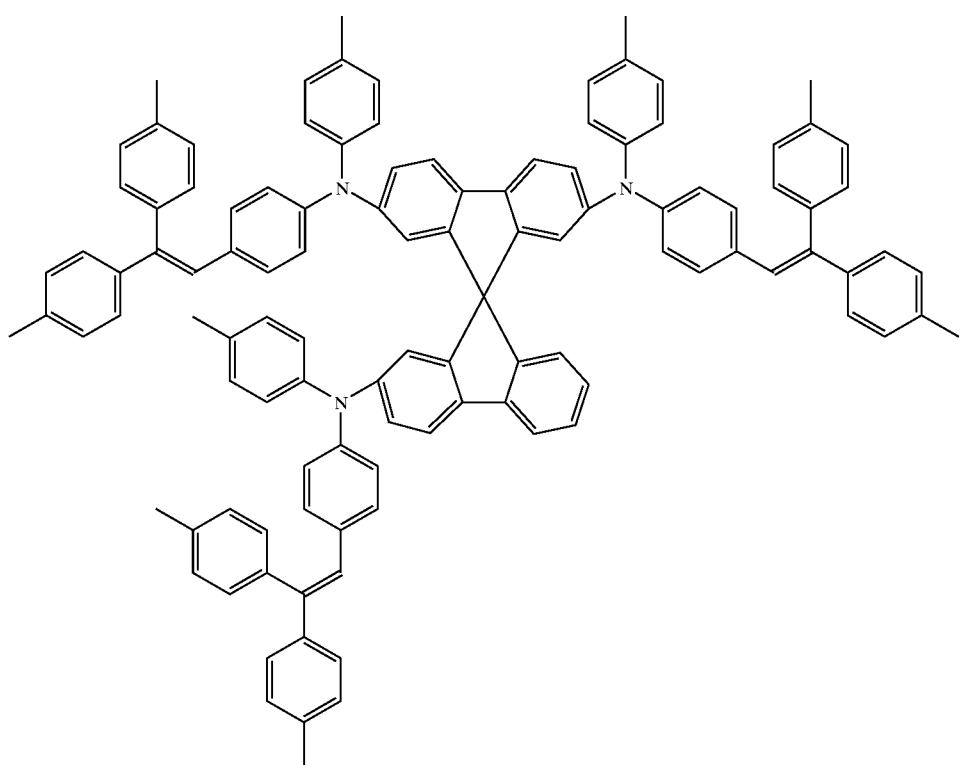
(377)

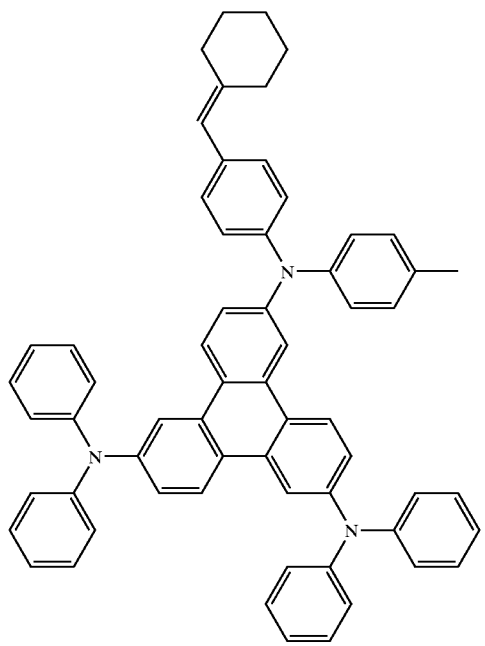
(378)
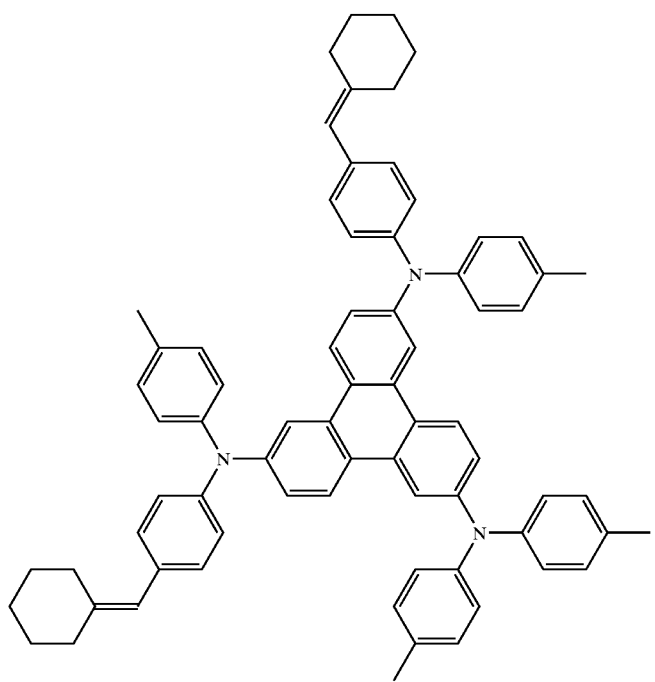
(379)

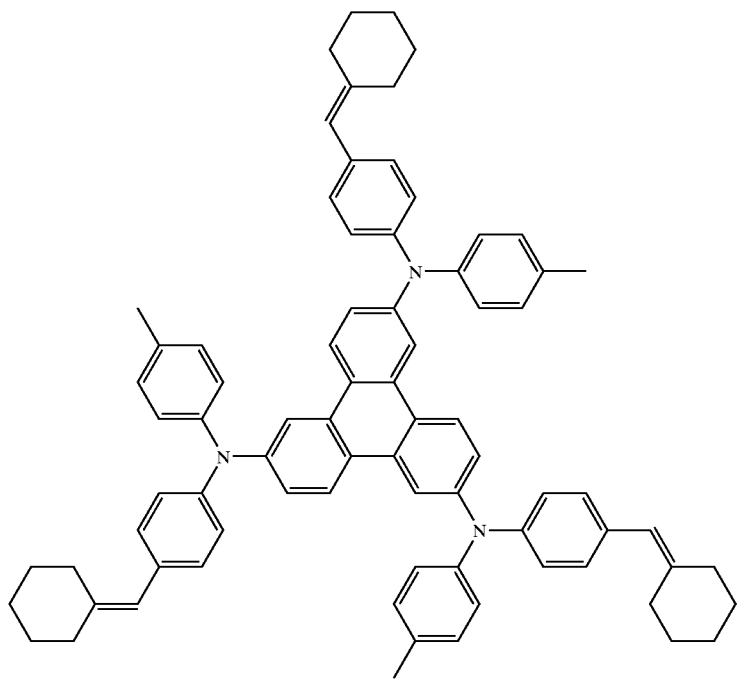
(380)
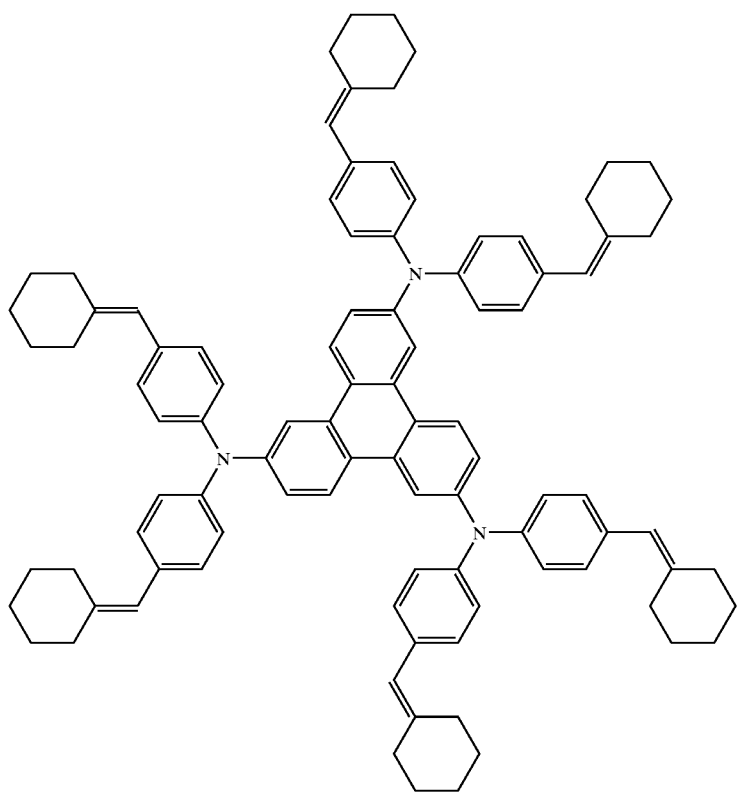
(381)

-continued
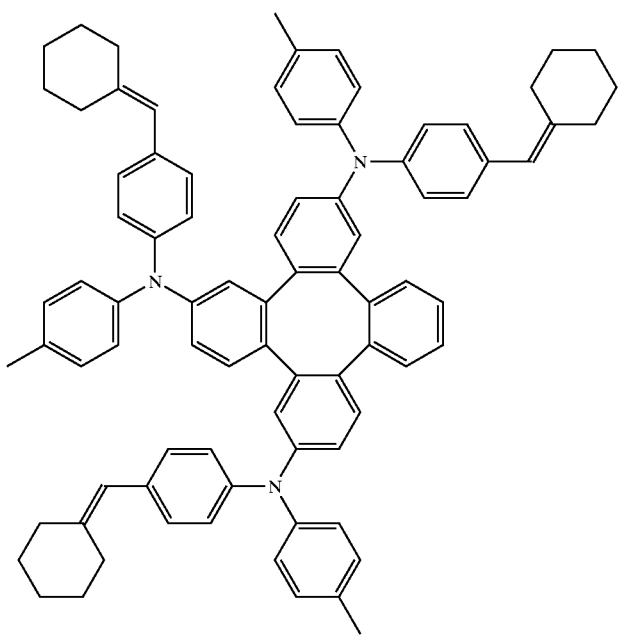
(382)
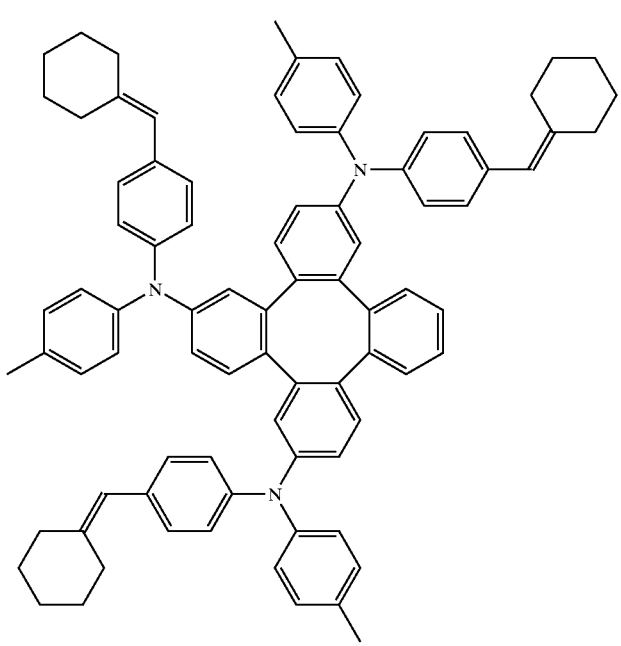
(383)

(384)
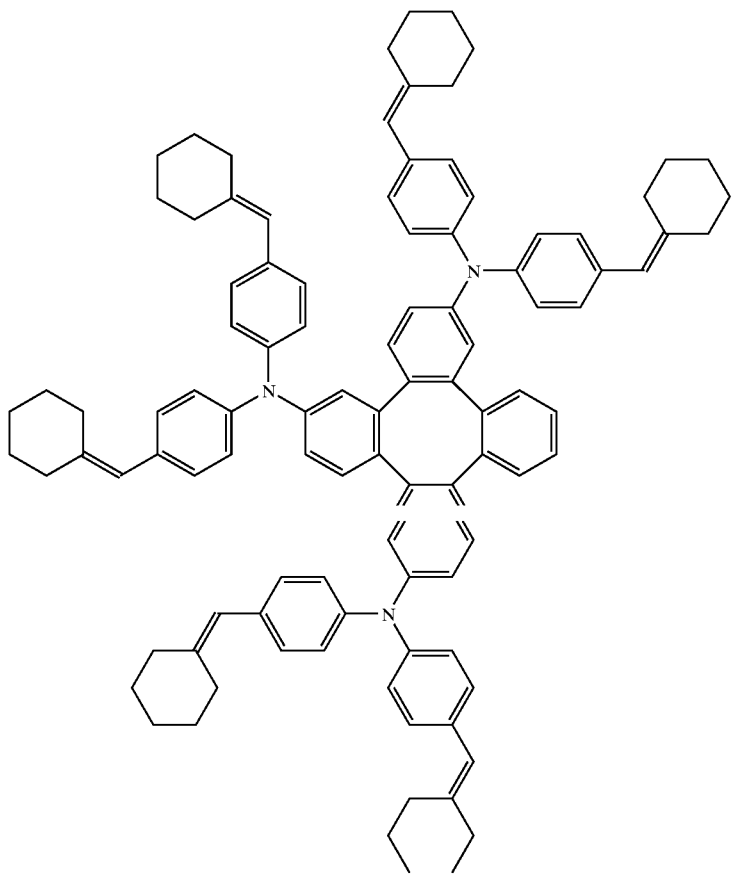
(385)
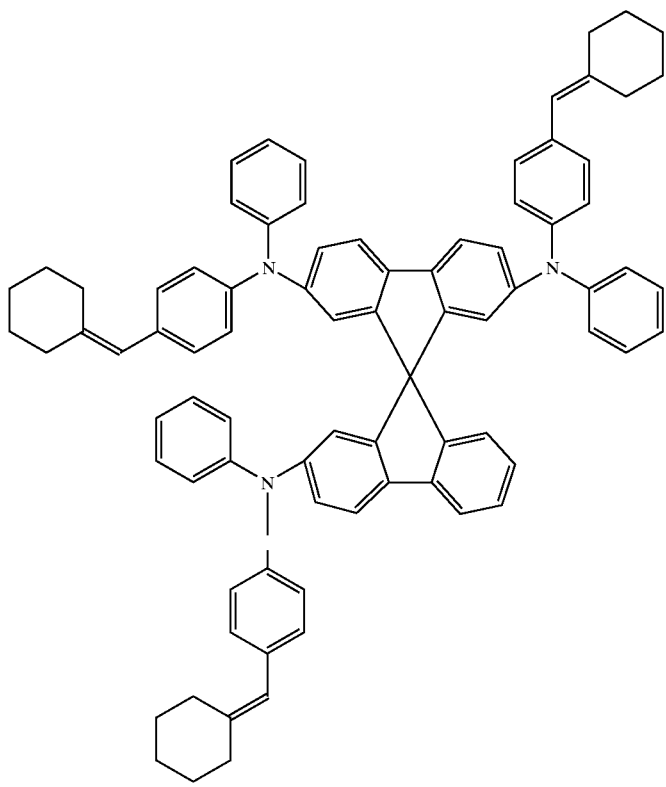

(386)
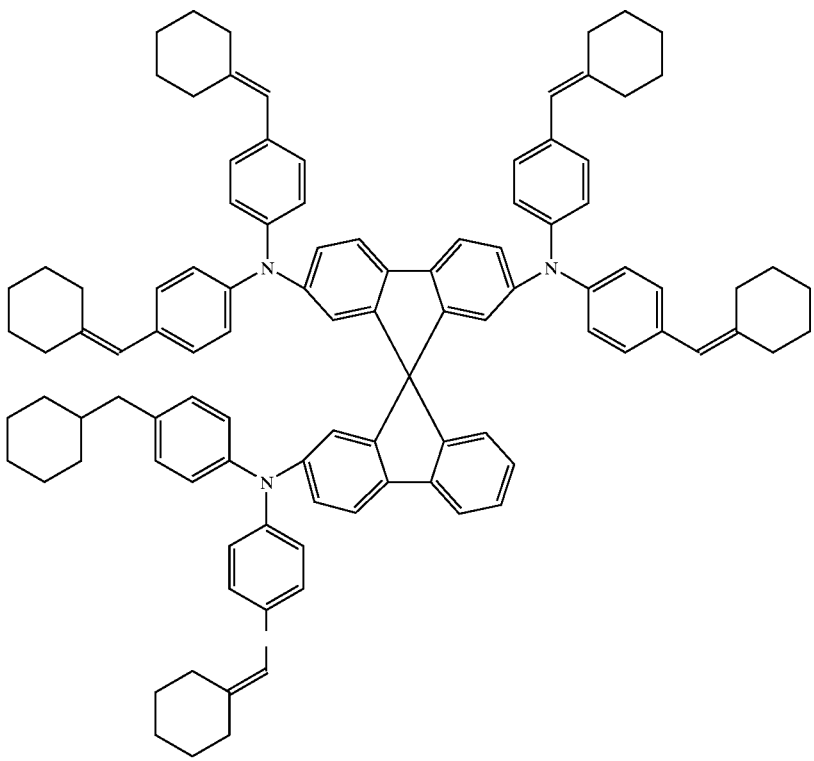
(387)
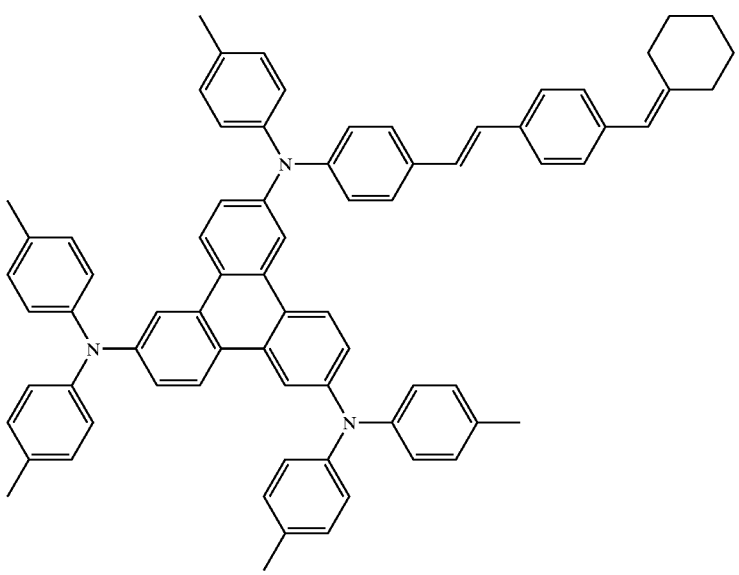

(388)
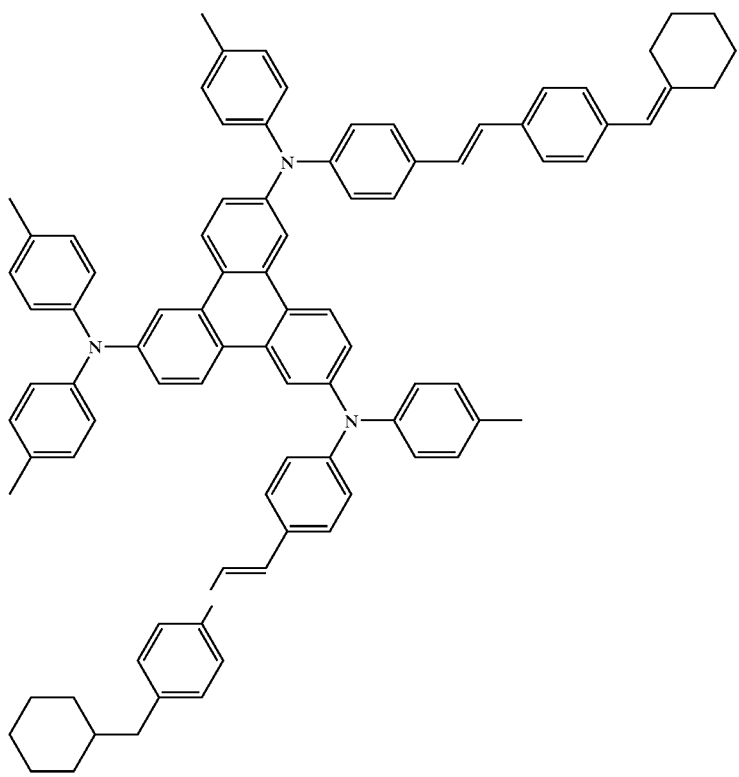
(389)
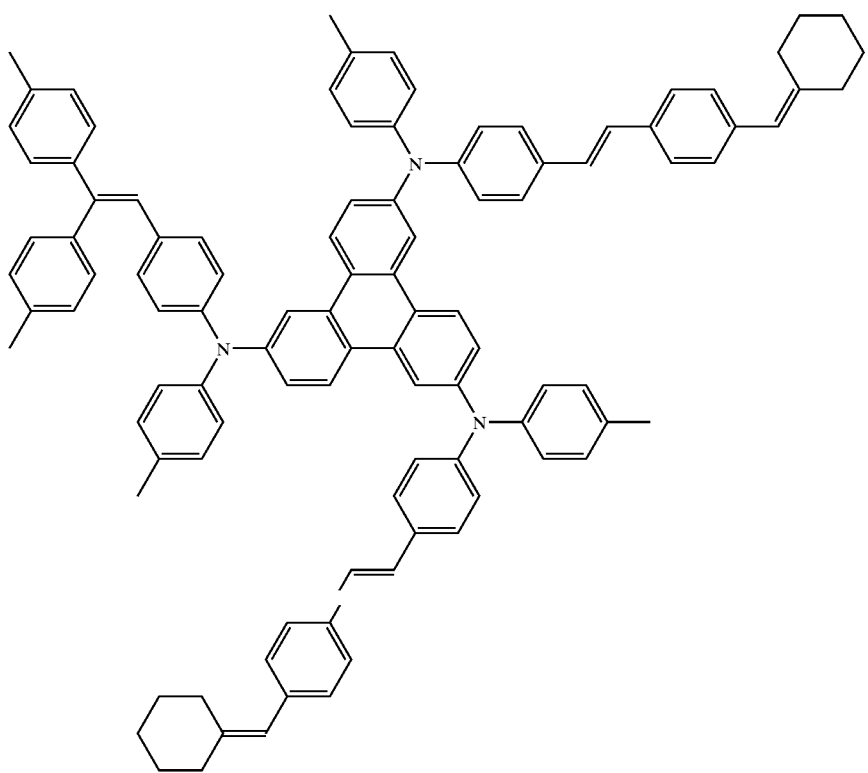

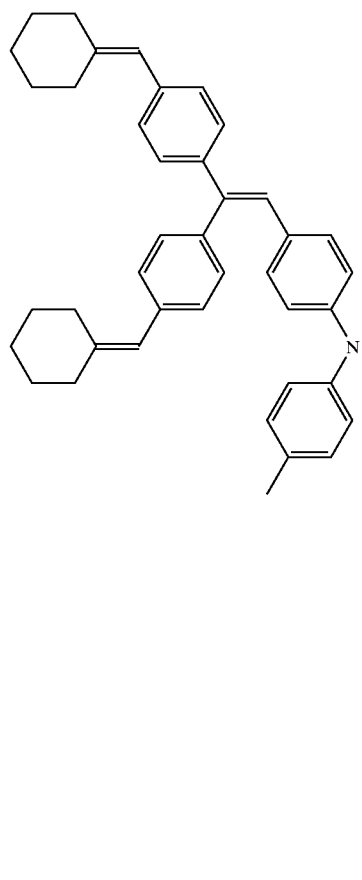
(390)
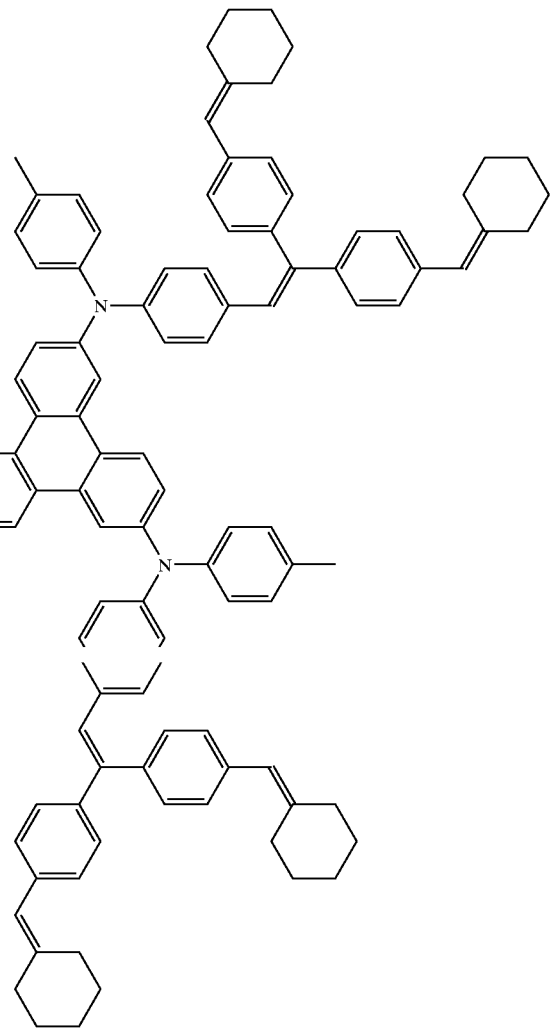
(391)
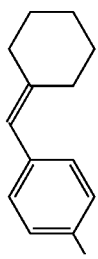

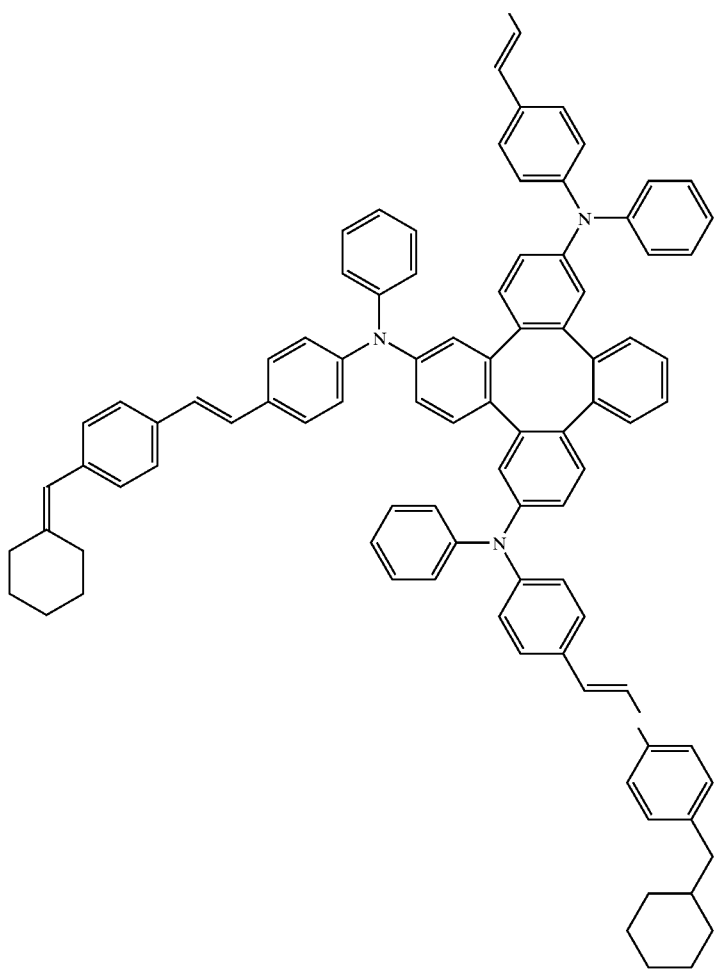
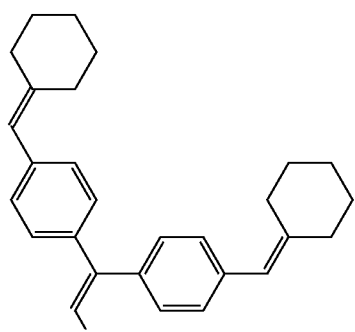
(392)

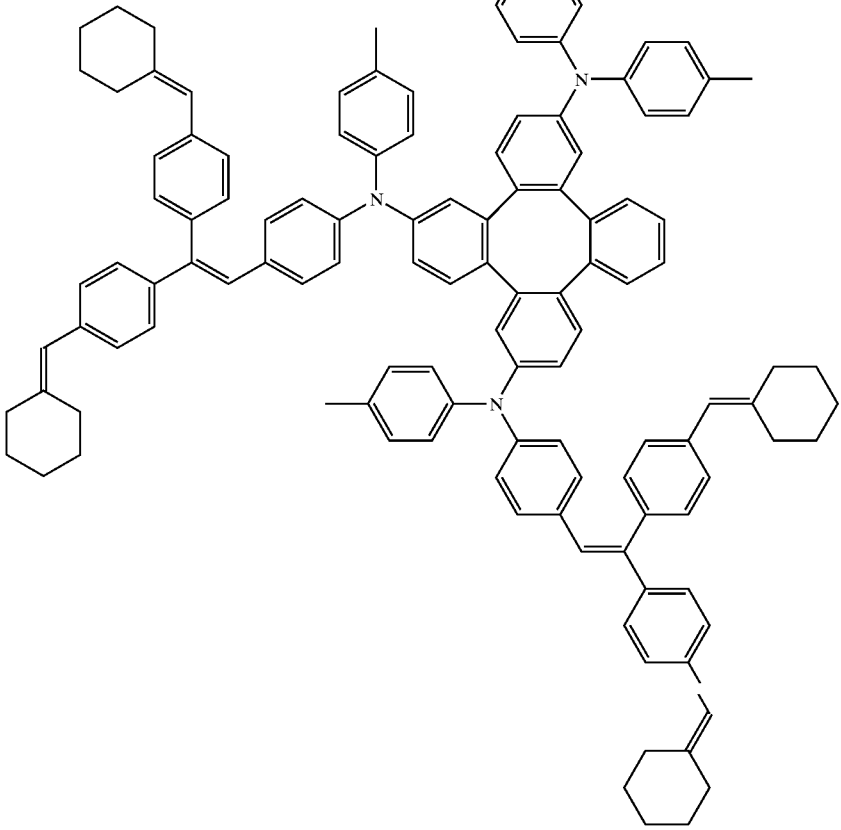
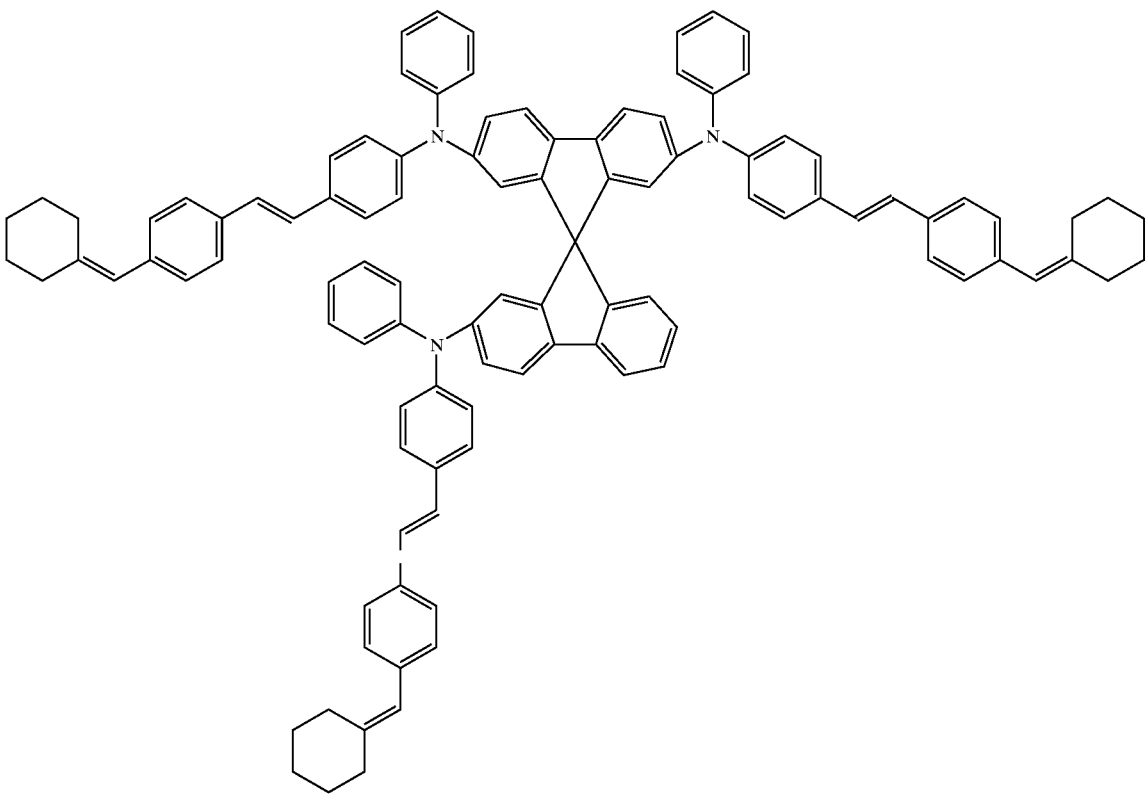
(393)

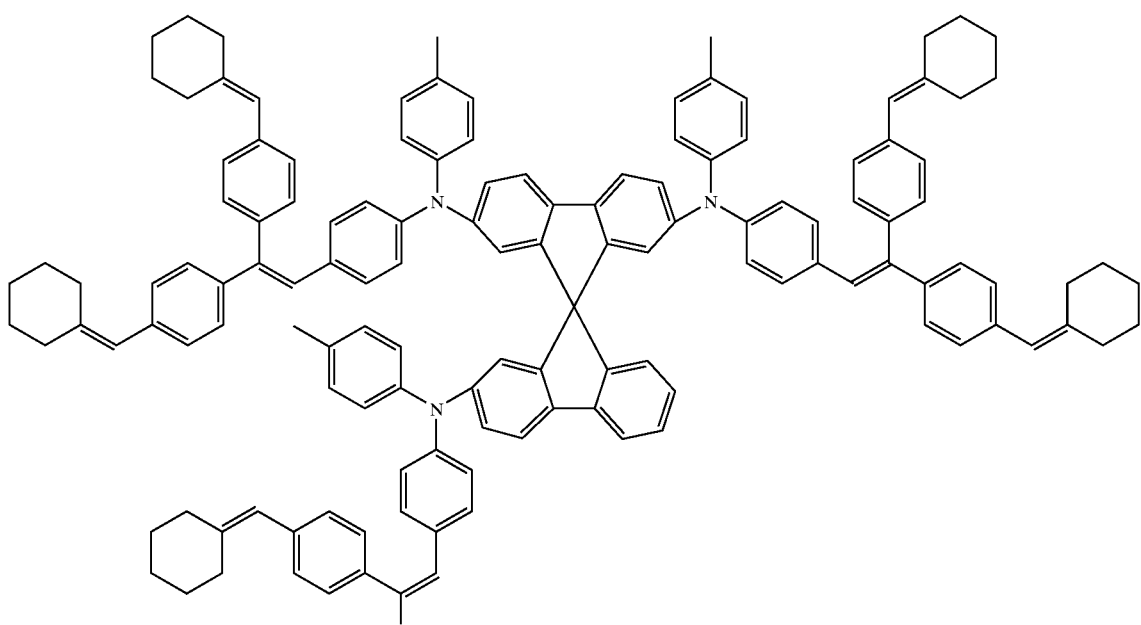
(394)
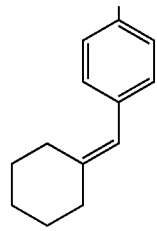
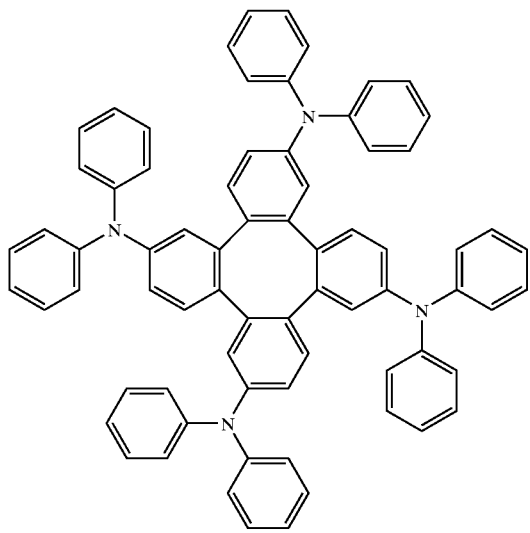
(395)
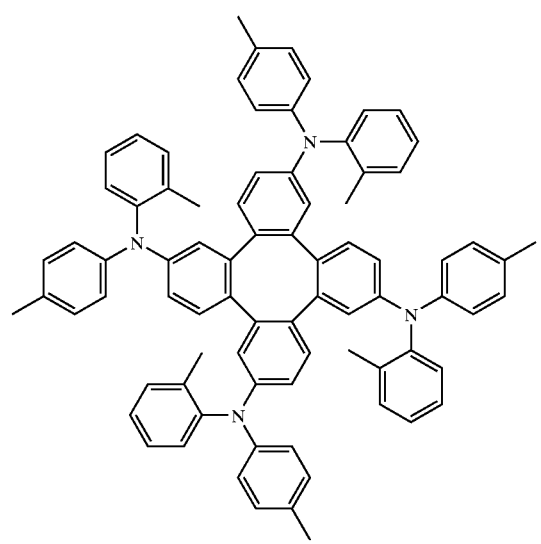
(396)

(397)
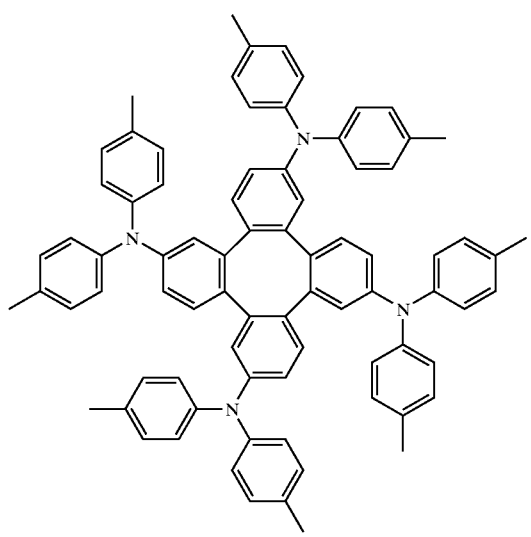
(398)
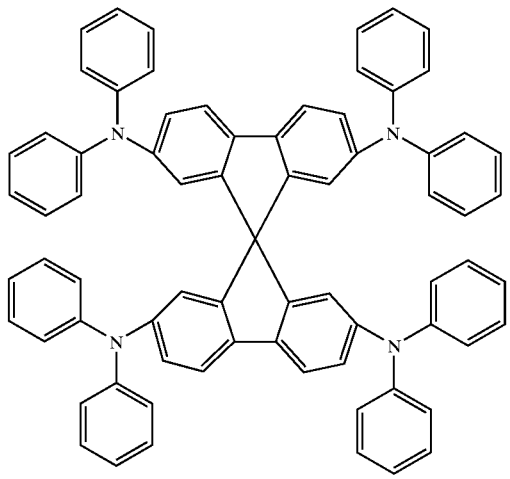
(399)
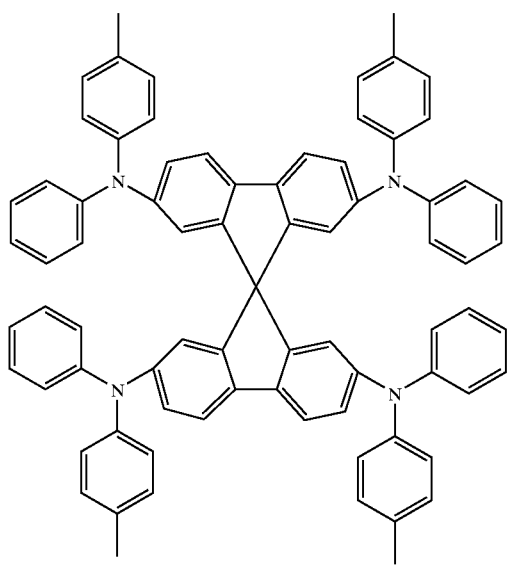
(400)
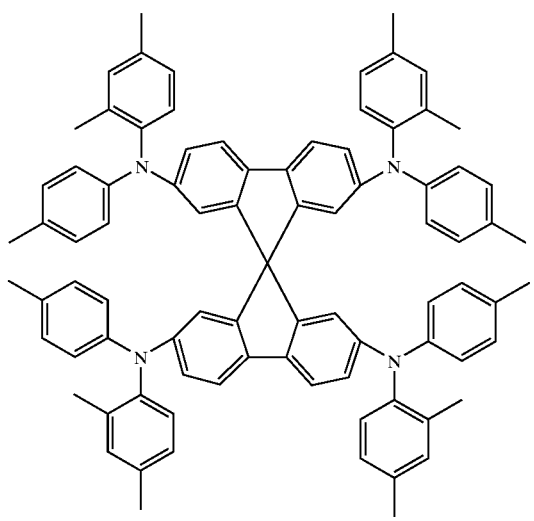
(401)
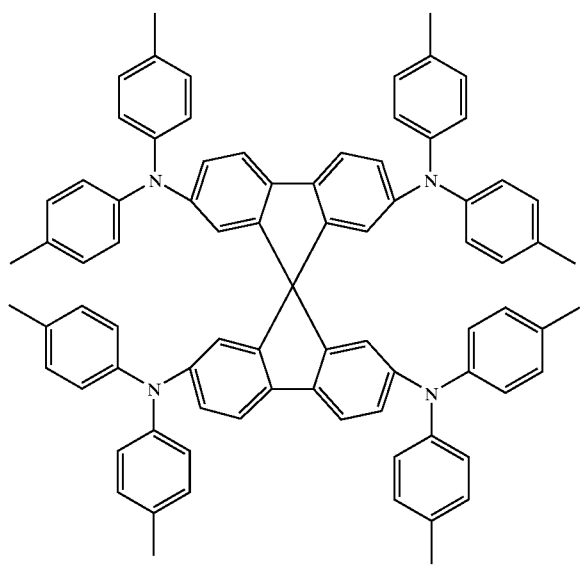

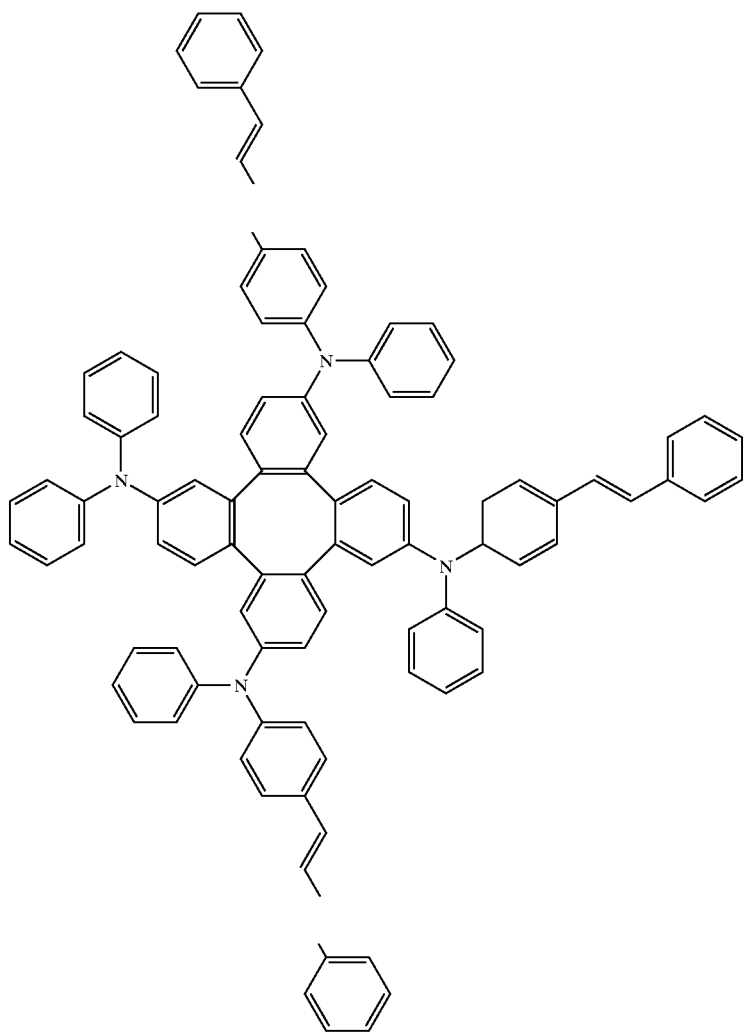
(402)
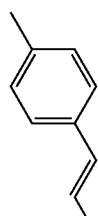
(403)

-continued
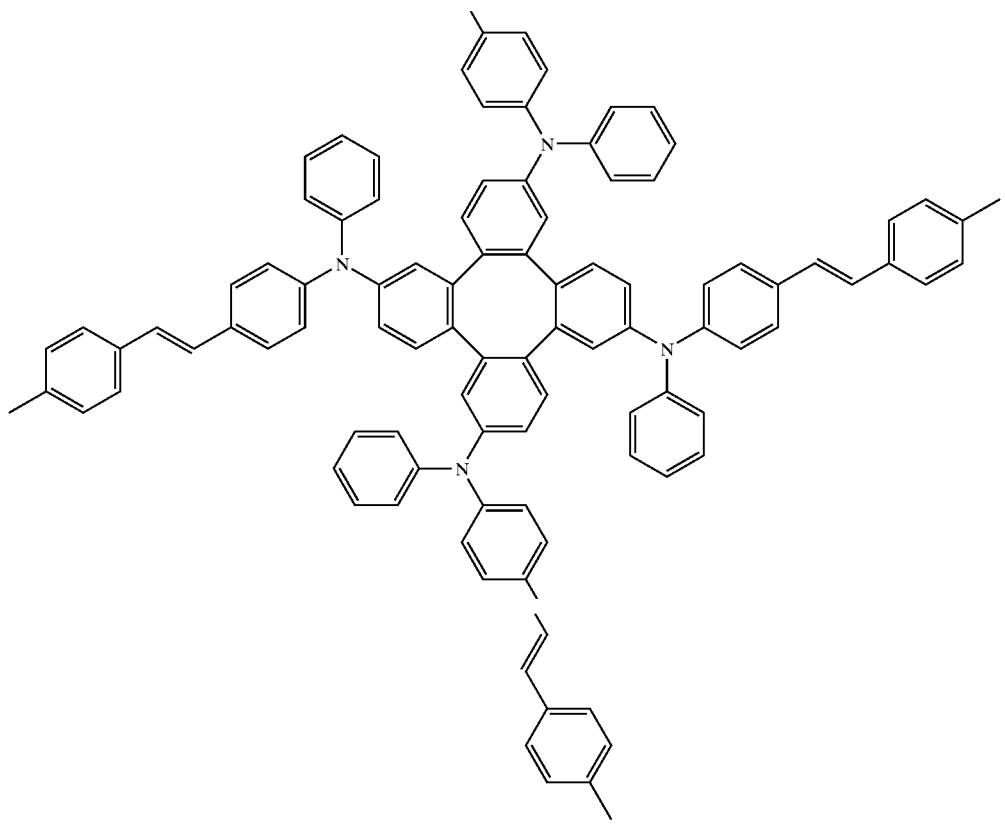
(404)
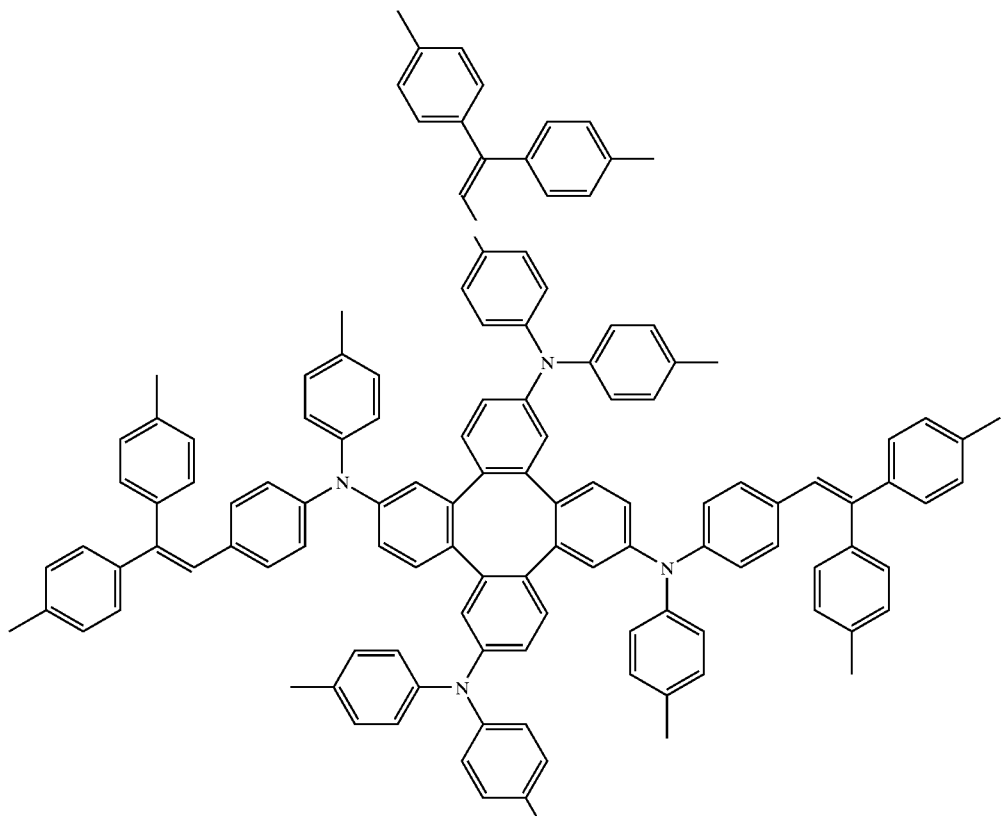

-continued
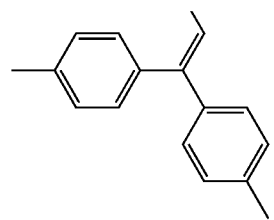
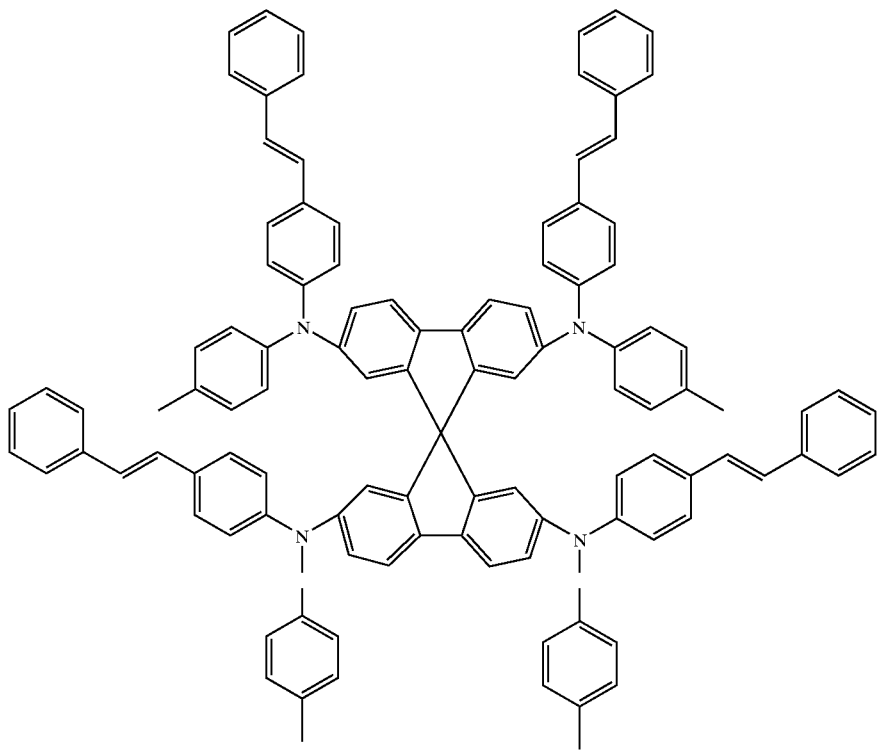
(405)
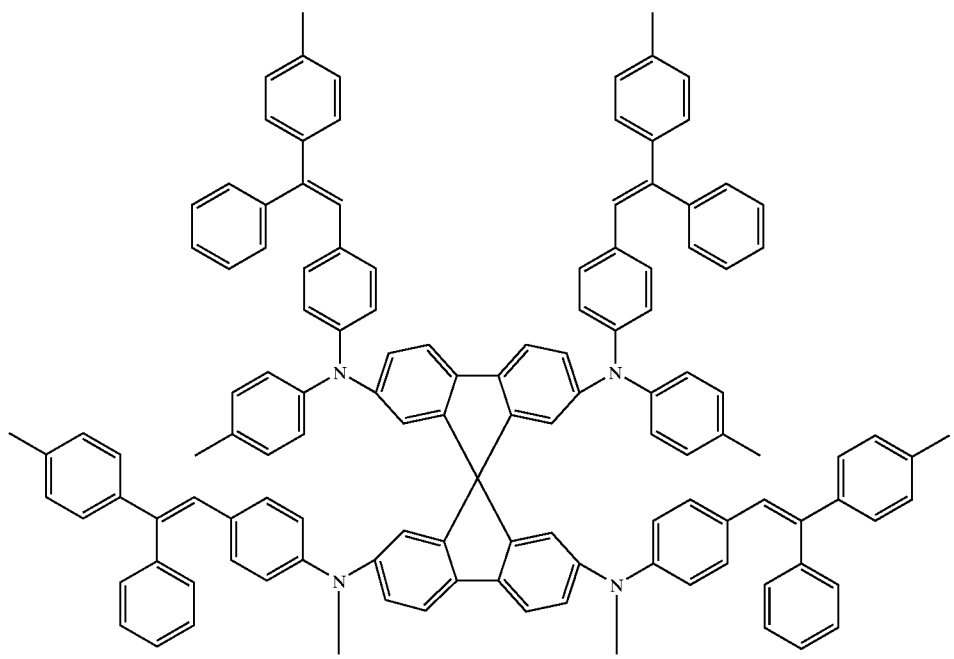
(406)

-continued
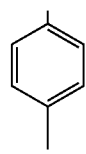 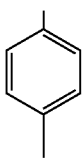
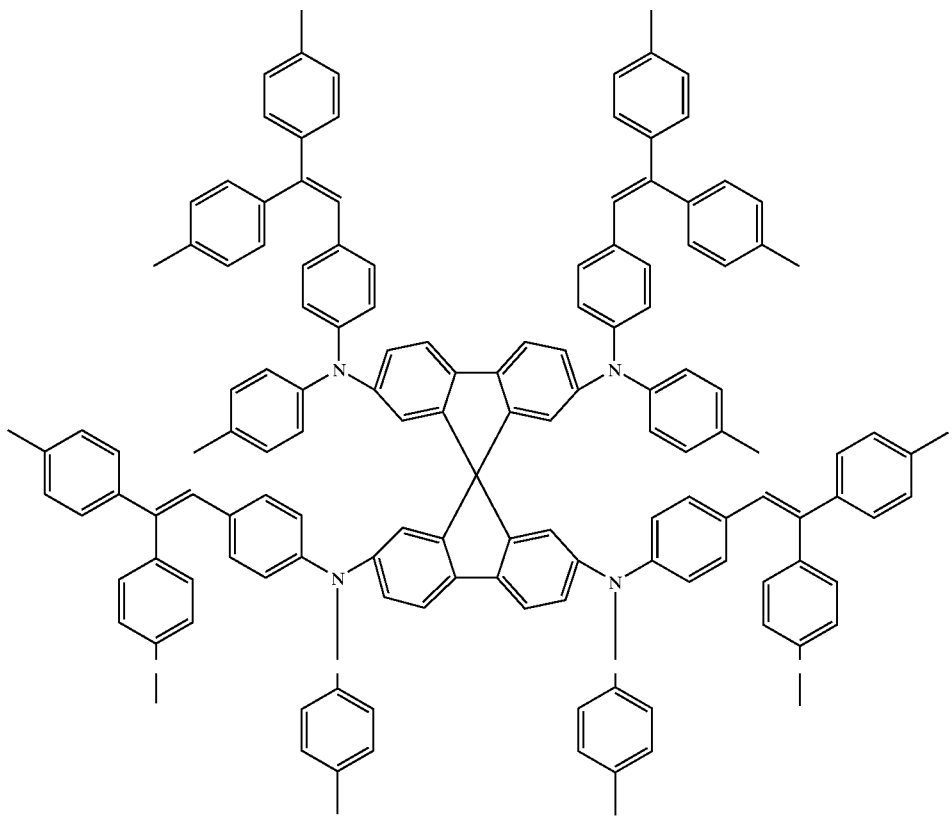
(407)
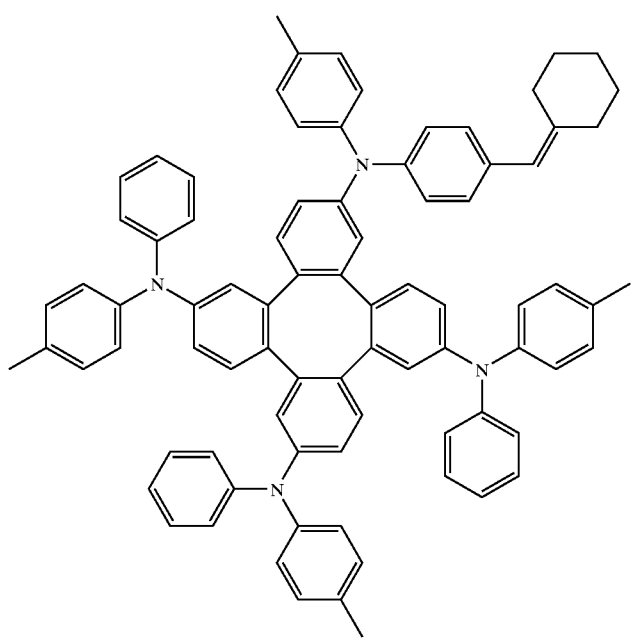
(408)

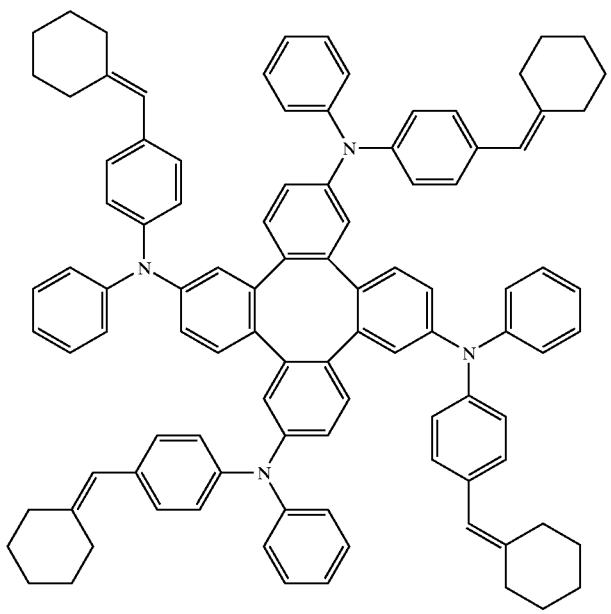
(409)
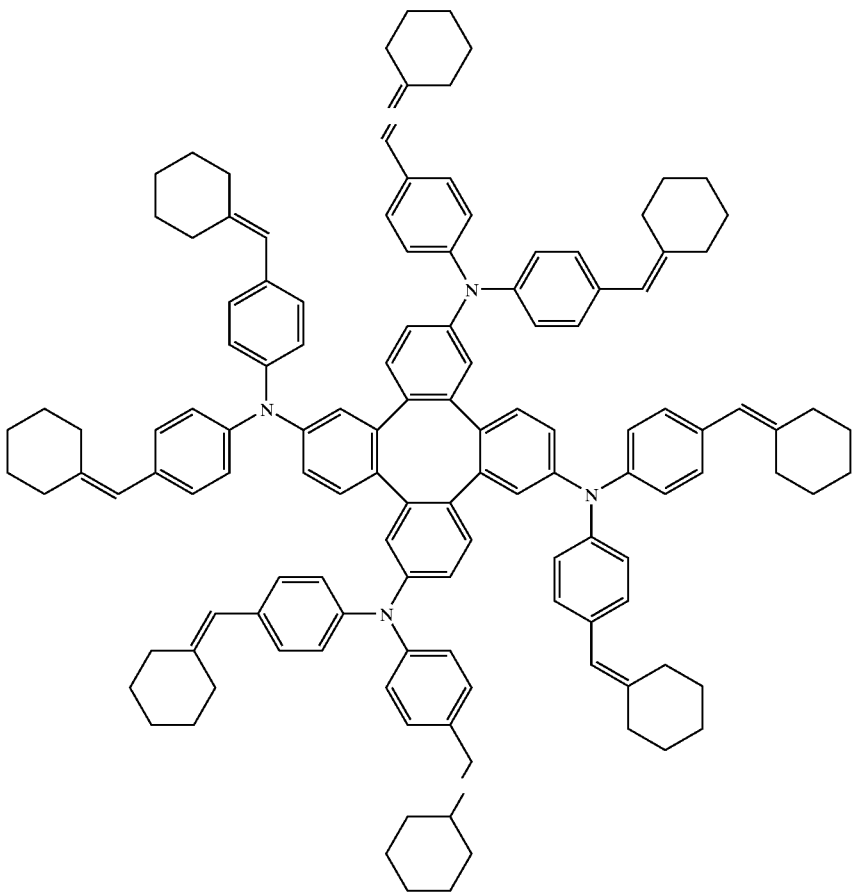
(410)

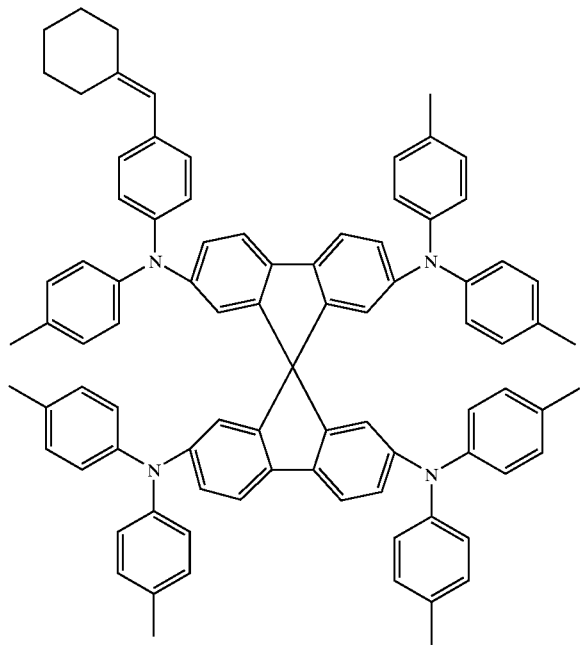
(411)
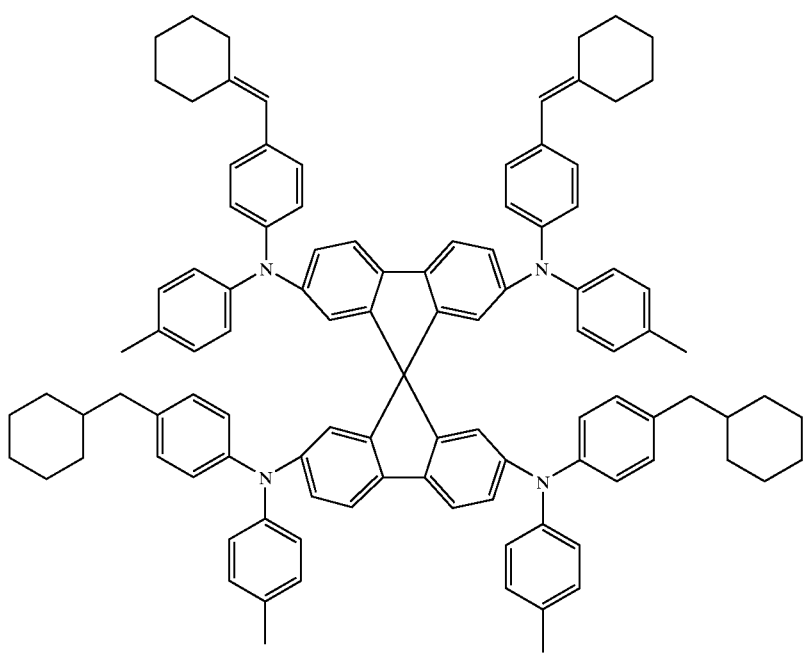
(412)

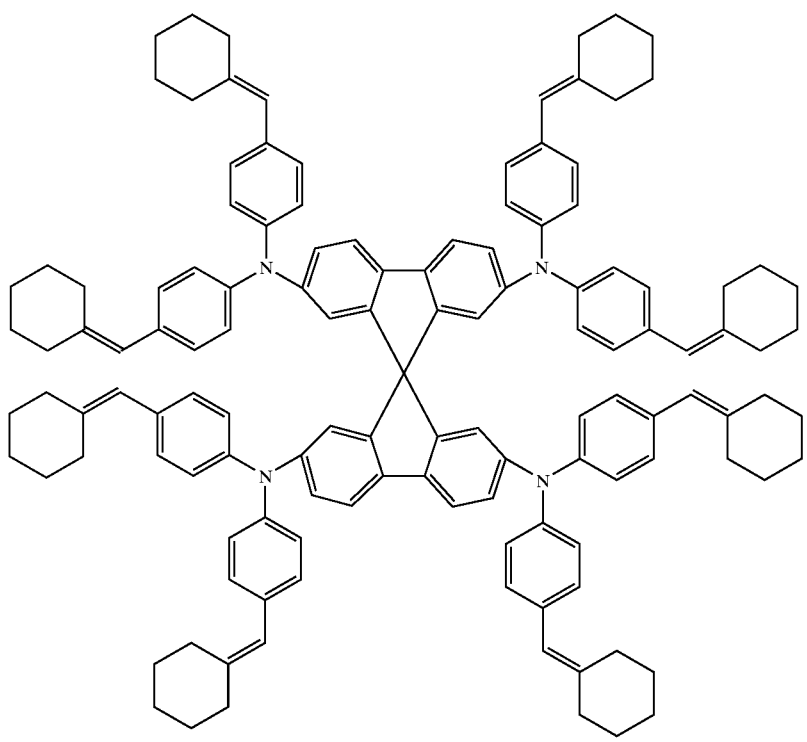
(413)
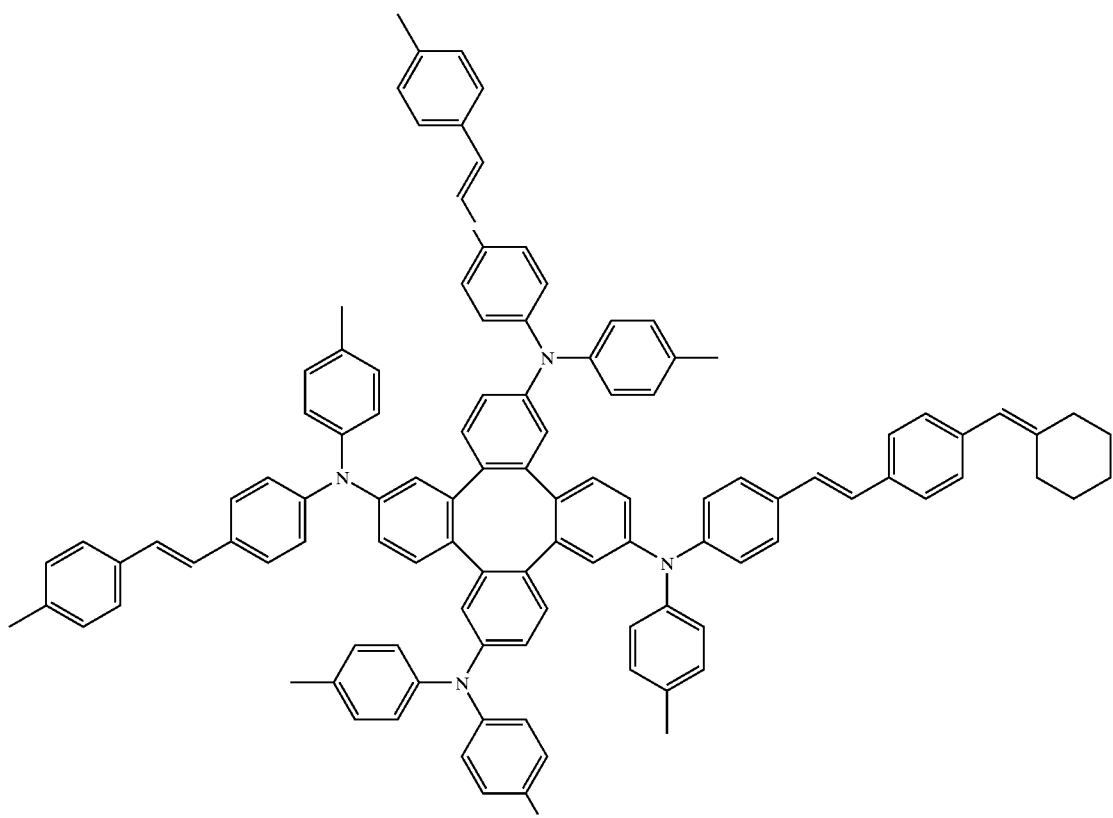
(414)

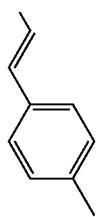
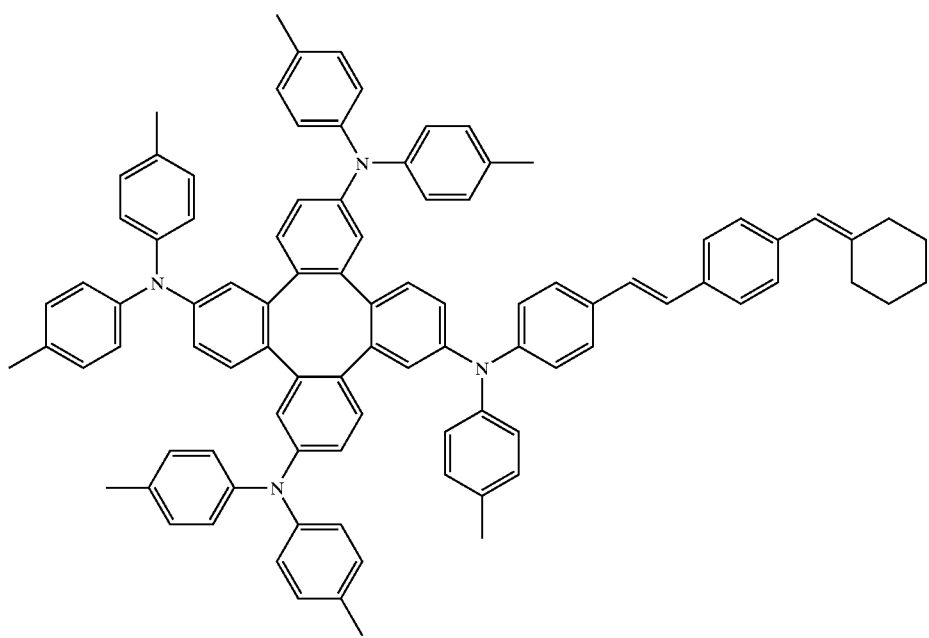
(415)
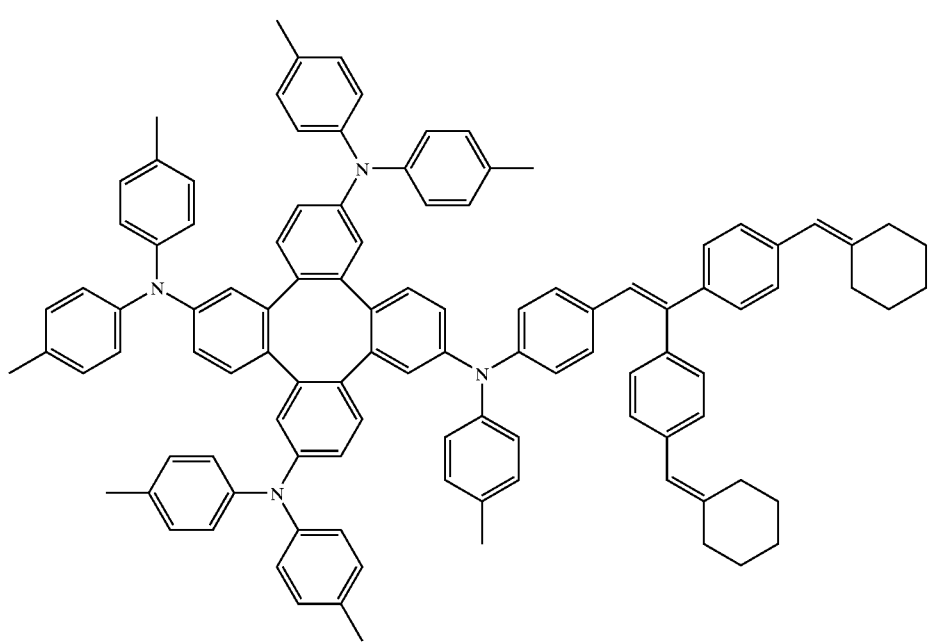
(416)

(417)
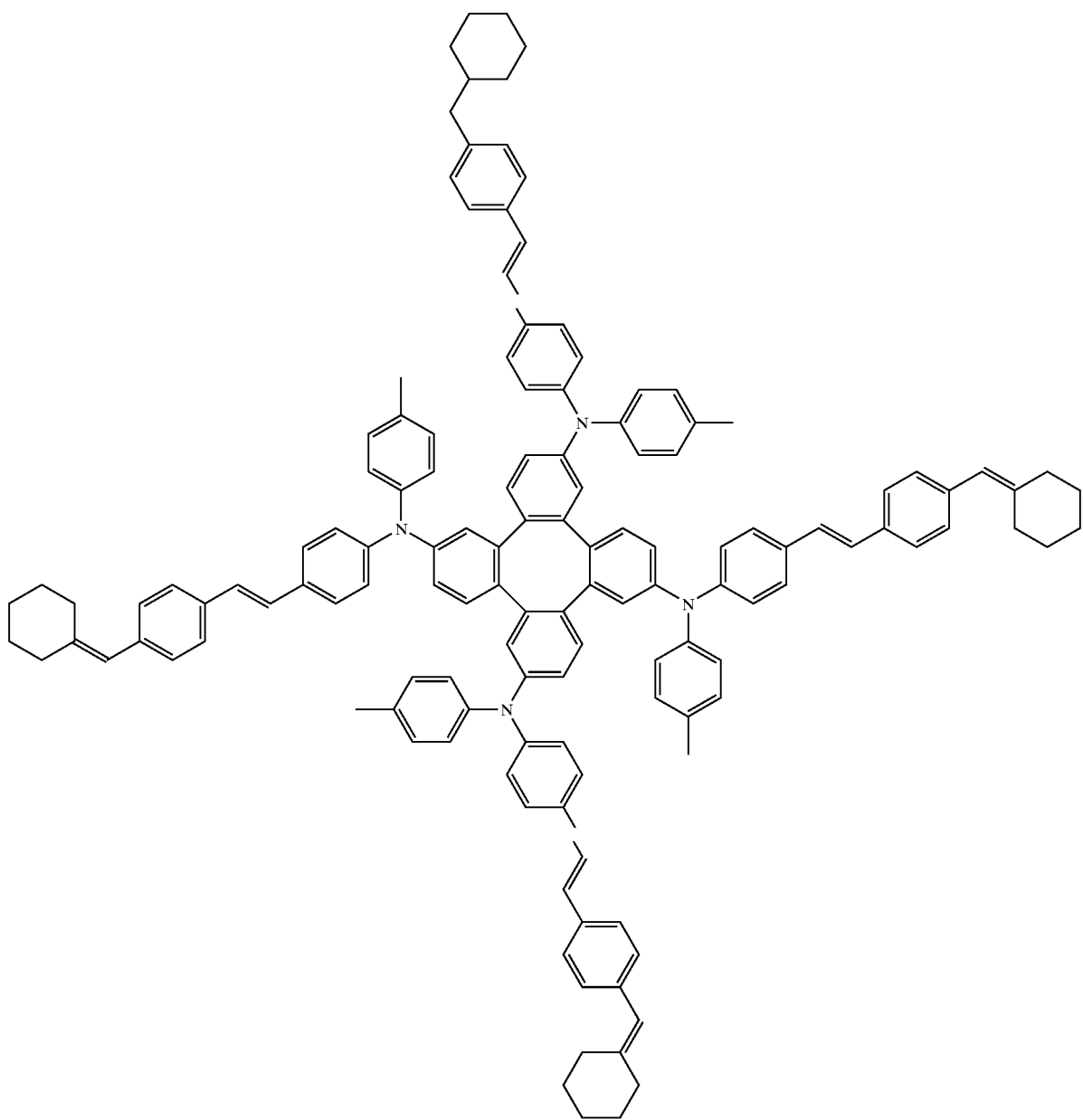
(418)
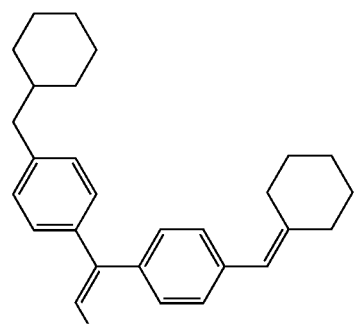

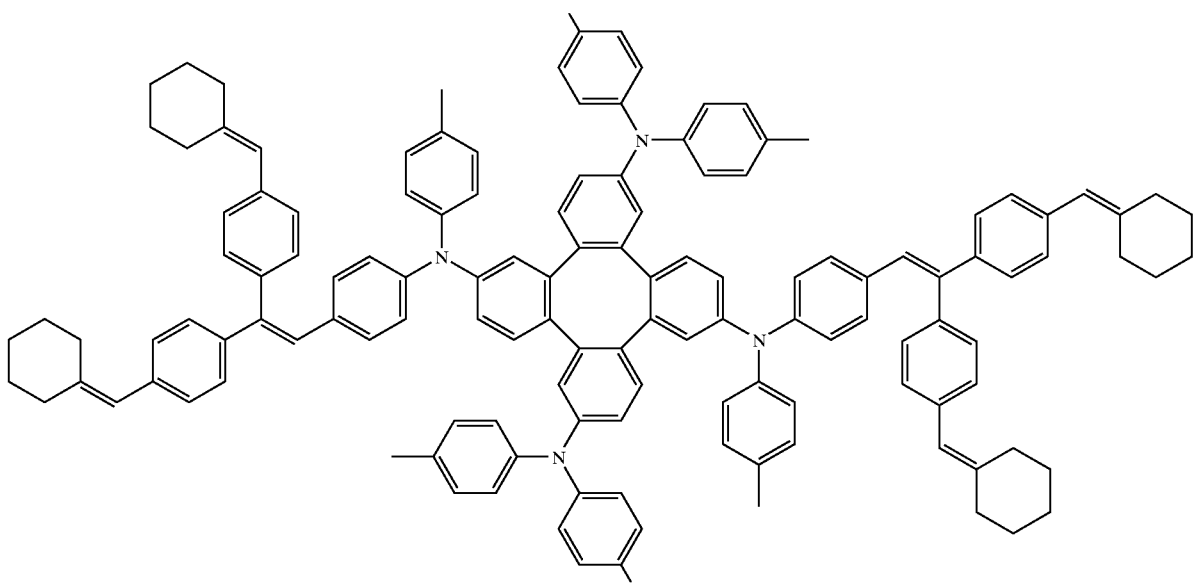
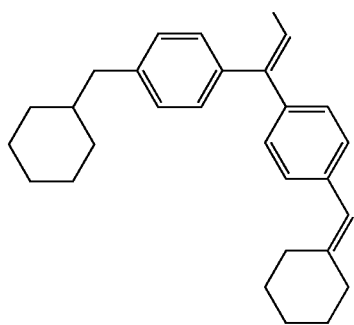
(419)
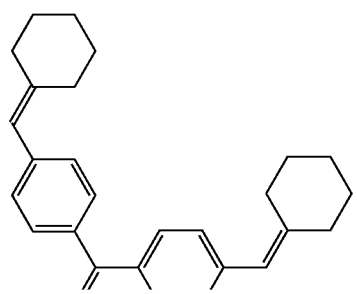

-continued
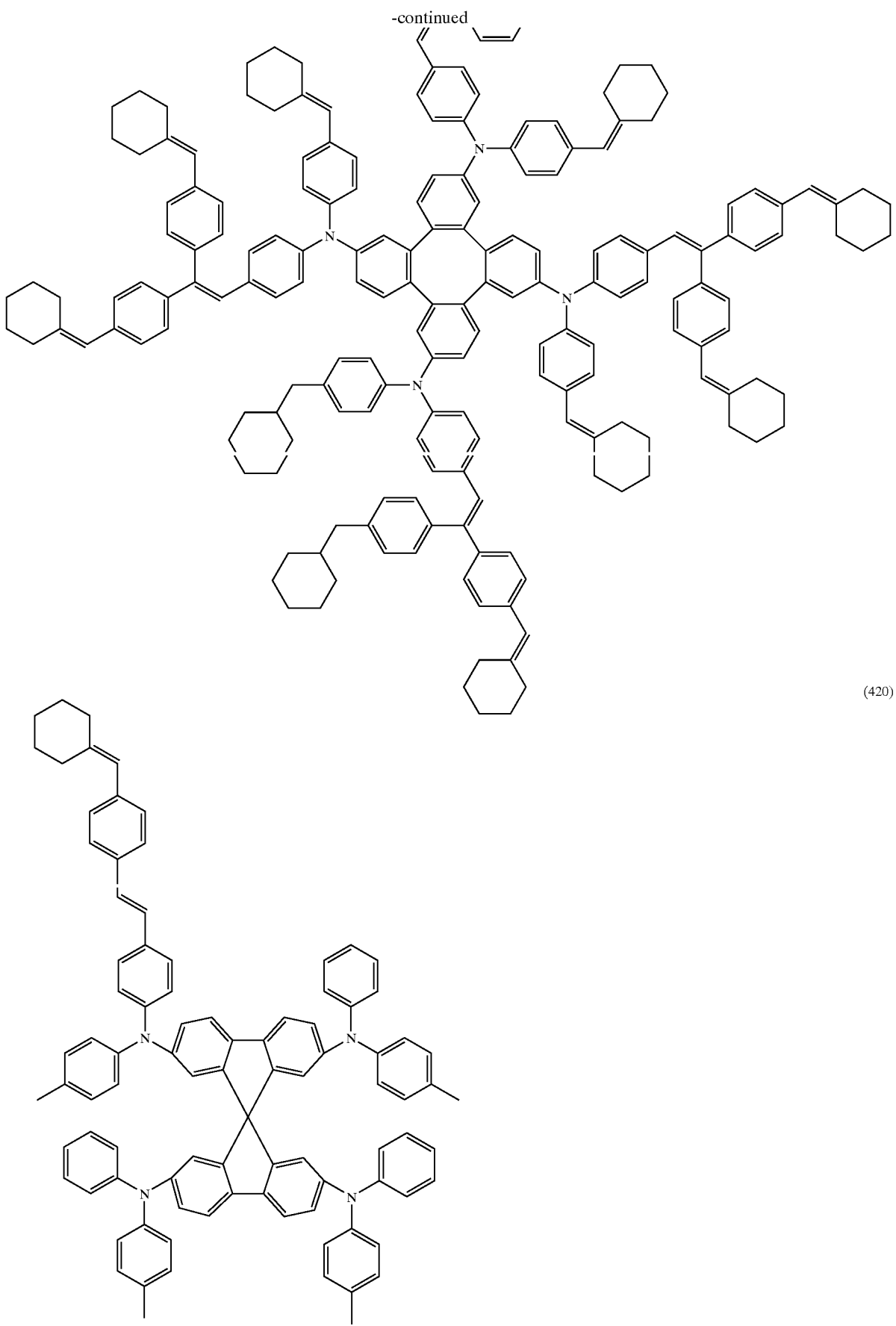
(420)

-continued
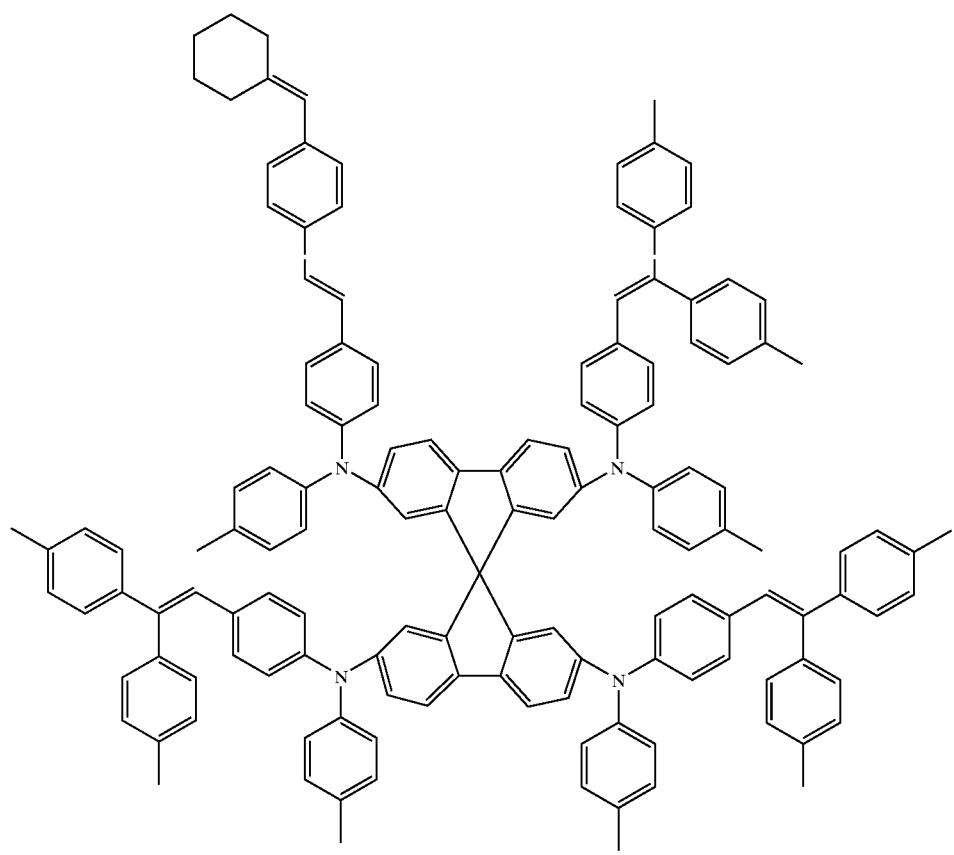
(421)
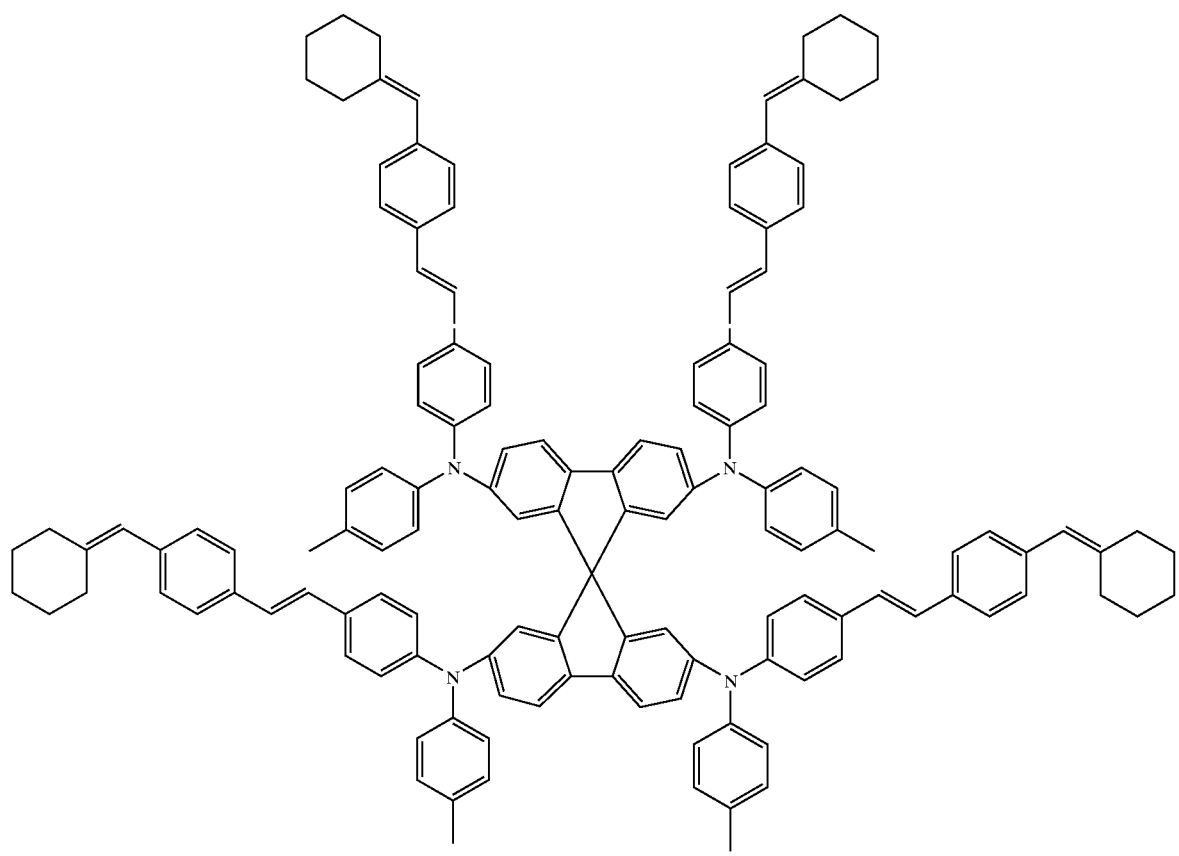
(422)

(423)

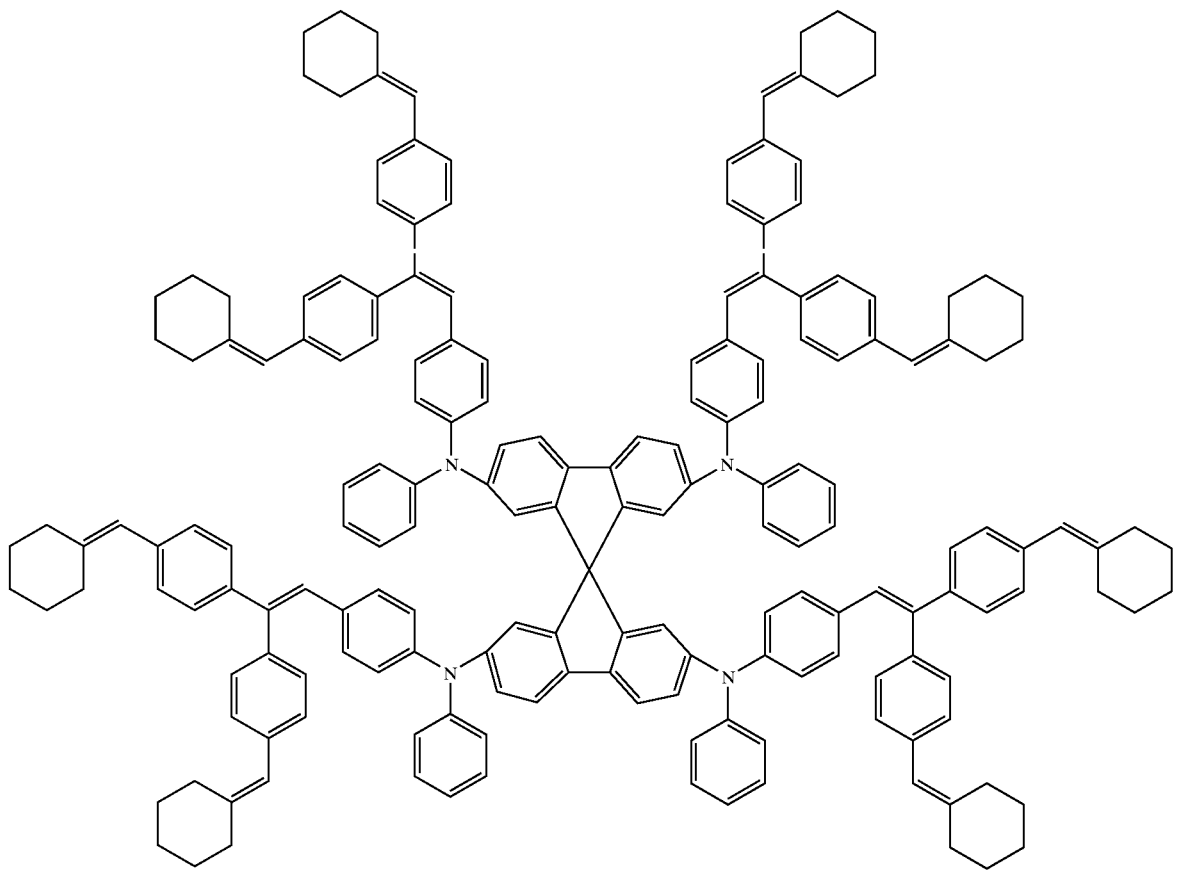

Typical examples of available materials for the source electrode, 12, the drain electrode 13, and the gate electrode 14 may include, but not limited to, an indium thin oxide alloy (ITO), an thin oxide (NESA), and a variety of metals and alloys, for example, gold, silver, platinum, copper, indium, aluminum, magnesium, a magnesium-indium alloy, a magnesium-aluminum alloy, an aluminum-lithium alloy, an aluminum-scandium-lithium alloy, and a magnesium-silver alloy, as well as electrically conductive organic materials such as conductive polymers.

Typical examples of available materials for the insulating layer 16 serving as the gate insulating layer may include, but not limited to, inorganic insulating materials such as $SiO_2$, $SiN_x$, alumina as well as insulating polymers.

Second Embodiment

Figure 2:
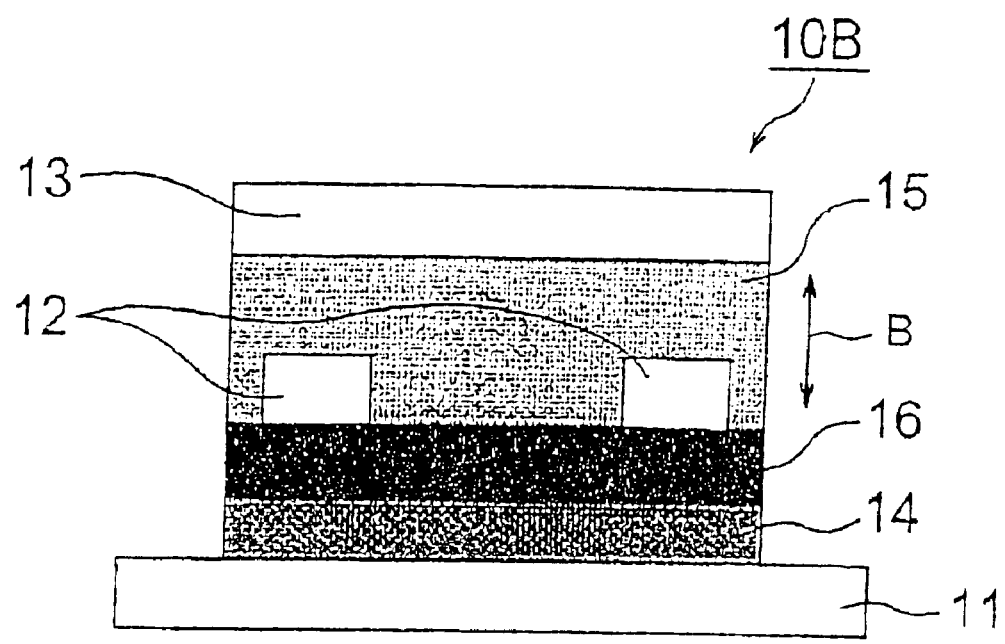
FIG. 2 is a fragmentary cross sectional elevation view of another organic thin film transistor in a second embodiment of the present invention.

A second embodiment according to the present invention will be described in detail with reference to the drawing. FIG. 2 is a fragmentary cross sectional elevation view of another organic thin film transistor in the second embodiment of the present invention. An organic thin film transistor 10B is a field effect transistor. The organic thin film transistor 10B is fabricated over a substrate 11. A gate electrode 14 is formed on the substrate 11. An insulating layer 16 is formed on the gate electrode 14. The insulating layer 16 serves as a gate insulating layer. Source electrodes 12 are formed on the insulating layer 16, wherein the source electrodes 12 are separated from each other in a horizontal direction parallel to a surface of the substrate 11. The source electrodes 12 are also separated from the gate electrode 14 by the insulating layer 16. An organic thin film 15 is formed on the insulating layer 16 and the source electrodes 12, so that the source electrodes 12 are completely buried in the organic thin film 15. A drain electrode 13 is formed on the organic thin film 15, so that the drain electrode 13 is separated from the source electrodes 12 by the organic thin film 15 in a vertical direction to the interfaces of the organic thin film 15. The organic thin film 15 is in contact with both the source and drain electrodes 12 and 13.

Parts of the organic thin film 15 are vertically extending channel regions for flowing a source-drain current between the source and drain electrodes 12 and 13. This source-drain current is controlled by a voltage applied to the gate electrode 14 for enabling the organic thin film transistor to exhibit ON/OFF operations. The source-drain current is realized by the move of free electrons and holes in a vertical direction represented by arrow mark "B" vertical to the interfaces of the organic thin film 15.

The organic thin film 15 of this embodiment may comprise the same organic material as in the above-described first embodiment. Duplicate descriptions will thus be omitted. Typical examples of available materials for the source electrode, 12, the drain electrode 13, and the gate electrode 14 may include, but not limited to, an indium thin oxide alloy (ITO), an thin oxide (NESA), and a variety of metals and alloys, for example, gold, silver, platinum, copper, indium, aluminum, magnesium, a magnesium-indium alloy, a magnesium-aluminum alloy, an aluminum-lithium alloy, an aluminum-scandium-lithium alloy, and a magnesium-silver alloy, as well as electrically conductive organic materials such as conductive polymers. Typical examples of available materials for the insulating layer 16 serving as the gate insulating layer may include, but not limited to, inorganic insulating materials such as $SiO_2$, $SiN_x$, alumina as well as insulating polymers.

Third Embodiment

Figure 3:
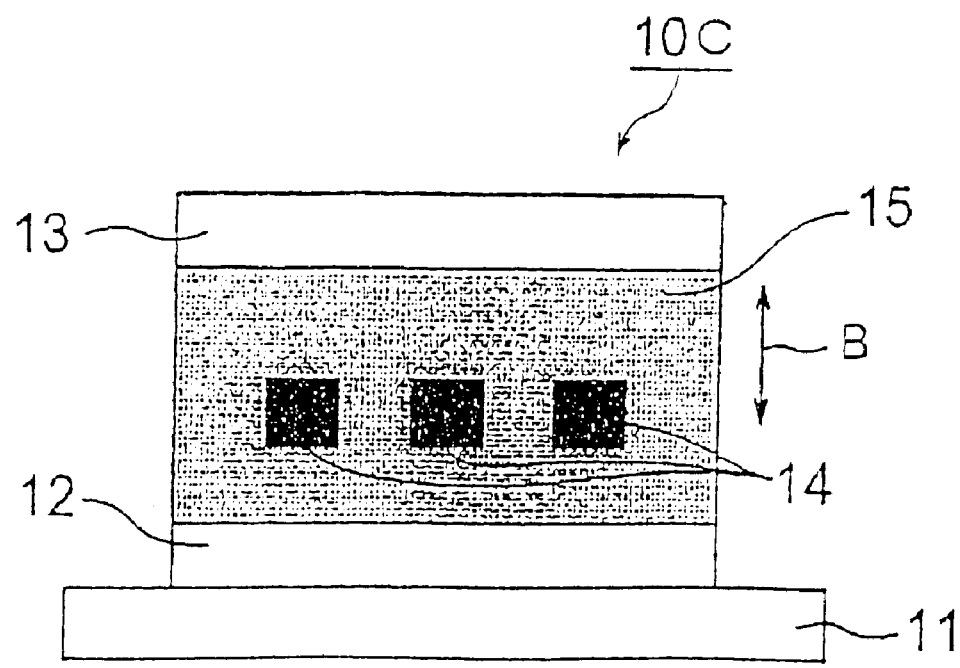
FIG. 3 is a fragmentary cross sectional elevation view of still another organic thin film transistor in a third embodiment of the present invention.

A third embodiment according to the present invention will be described in detail with reference to the drawing. FIG. 3 is a fragmentary cross sectional elevation view of still another organic thin film transistor in the third embodiment of the present invention. An organic thin film transistor 10C is a static induction transistor. The organic thin film transistor 10C is fabricated over a substrate 11. A source electrode 12 is formed on the substrate 11. An organic thin film 15 is formed on the source electrode 12. A drain electrode 13 is formed on the organic thin film 15. A set of plural gate electrodes 14 is formed within the organic thin film 15, so that the plural gate electrodes 14 are separated by the organic thin film 15 from the source electrode 12 and the drain electrode 13 in a vertical direction to the interfaces of the organic thin film 15. The plural gate electrodes 14 are also separated from each other by the organic thin film 15 in a horizontal direction parallel to the interfaces of the organic thin film 15. The plural gate electrodes 14 extend in parallel to each other and in a horizontal direction perpendicular to another horizontal direction, along which the plural gate electrodes 14 are aligned. The organic thin film 15 is in contact with both the source and drain electrodes 12 and 13.

Parts of the organic thin film 15 between the source and drain electrodes 12 and 13 are vertically extending channel regions for flowing a source-drain current between the source and drain electrodes 12 and 13. This source-drain current is controlled by a voltage applied to the above-described set of the plural gate electrodes 14 for enabling the organic thin film transistor to exhibit ON/OFF operations. The source-drain current is realized by the move of free electrons and holes in a vertical direction represented by arrow mark "B" vertical to the interfaces of the organic thin film 15.

The organic thin film 15 of this embodiment may comprise the same organic material as in the above-described first embodiment. Duplicate descriptions will thus be omitted. Typical examples of available materials for the source electrode, 12, the drain electrode 13, and the gate electrode 14 may include, but not limited to, an indium thin oxide alloy (ITO), an thin oxide (NESA), and a variety of metals and alloys, for example, gold, silver, platinum, copper, indium, aluminum, magnesium, a magnesium-indium alloy, a magnesium-aluminum alloy, an aluminum-lithium alloy, an aluminum-scandium-lithium alloy, and a magnesium-silver alloy, as well as electrically conductive organic materials such as conductive polymers. Typical examples of available materials for the insulating layer 16 serving as the gate insulating layer may include, but not limited to, inorganic insulating materials such as $SiO_2$, $SiN_x$, alumina as well as insulating polymers.

In the above-described first to third embodiments, any kinds of donor dopant may be available, provided that the donor dopant is capable of providing an electron or electrons to the organic compound molecule of the organic thin film 15. Preferable examples of the donor dopant may include, but not limited to metals such as lithium, sodium, cesium, potassium, and magnesium as well as inorganic metal compounds such as lithium fluoride and lithium oxide. Also, any kinds of acceptor dopant may be available, provided that the acceptor dopant is capable of providing a hole or holes to the organic compound molecule of the organic thin film 15. Preferable examples of the acceptor dopant may include, but not limited to Lewis acids such as boron trifluoride, and tris(4-bromophenyl)aluminum hexachloroantimonate (TBPAH).

In the above-described first to third embodiments, there is no particular limitation to any available methods for forming the above-described respective layers of the above-described thin film transistors 10A, 10B and 10C. Any known film formation methods such as vacuum evaporation method and spin coating method are available for forming the respective layers of the thin film transistor.

The respective organic thin films 15 of the above-described organic thin film transistors 10A, 10B and 10C in the above first to third embodiments may be formed by any available methods, for example, application methods such as a dipping method, a spin coating method, a casting method, a bar coat method, and a roll coat method as well as a vacuum evaporation method and a molecular beam epitaxy method.

There is no particular limitation to the thickness of the respective organic thin films 15 of the above-described organic thin film transistors 10A, 10B and 10C. If, however, the thickness of the organic thin film 15 is extremely thin, then this may allow undesired formation of defects such as pin holes in the organic thin film is. If the thickness of the organic thin film 15 is extremely thick, then this increases a channel length or a necessary voltage level applied to the gate electrode, thereby reducing the driving speed or the response speed, and also thereby dropping the ON/OFF ratio, particularly, in case of the structures shown in FIGS. 1B and 1C. In order to avoid the above-described problems, it may be preferable that the thickness of the organic thin film 15 is ranged from a few nanometers to approximately 1 micrometer, for example.

The substrate 11 is to support the structure of the organic thin film transistor. The substrate 11 may comprise any one of available substrates for providing a sufficient mechanical support to the organic thin film transistor. For example, glass substrates and plastic substrates may be usable. If any other supporting structure is provided for supporting the structure of the organic thin film transistor, then the substrate 11 may optionally be provided. Namely, it may be possible that no substrate is provided.

EXAMPLE 1

The organic thin film transistor 10A shown in FIG. 1 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Gold layers having a thickness of 150 nanometers were formed by a selective deposition using a metal mask, thereby to form source and drain electrodes 12 and 13 over the gate insulating film 16, wherein the source and drain electrodes 12 and 13 are distanced from each other by a distance of 25 micrometers. The used mask was removed. Further, another mask was formed. The compound represented by the above formula (1) was deposited by a selective vacuum evaporation method to form an organic thin film 15 having a thickness of 150 nanometers over the gate insulating film 16 between the source and drain electrodes 12 and 13 as well as over parts of the source and drain electrodes 12 and 13. As a result, an organic thin film transistor 10A of the first embodiment and shown in FIG. 1 was obtained.

A gate voltage of −40V was applied to the gate electrode 14 of the organic thin film transistor 10A. It was confirmed that a measured ON/OFF ratio of source-drain current between the source and drain electrodes 12 and 13 was $5.1 \times 10^7$.

EXAMPLES 2–189

In Examples 2–189, the organic thin film transistors 10A were prepared in the same methods as described in Example 1, except that other compounds were used instead of the above compound (1) for the respective organic thin films 15. An ON/OFF ratio of source-drain current between the source and drain electrodes 12 and 13 was also measured in the same manner as in Example 1. The following Tables 1–7 show the respective numbers given to the above formulas representing the compounds as used and also show respective measured ON/OFF ratios of the source-drain currents in Examples 2–189.

TABLE 1

| Examples | Compound Nos. | ON/OFF ratios ($\times 10^7$) |
|---|---|---|
| 2 | 4 | 5.4 |
| 3 | 6 | 5.5 |
| 4 | 9 | 6.0 |
| 5 | 12 | 5.8 |
| 6 | 15 | 6.5 |
| 7 | 19 | 5.5 |
| 8 | 23 | 6.1 |
| 9 | 25 | 5.1 |
| 10 | 26 | 5.0 |
| 11 | 29 | 6.5 |
| 12 | 32 | 6.4 |
| 13 | 35 | 5.7 |
| 14 | 38 | 5.9 |
| 15 | 41 | 6.3 |
| 16 | 42 | 6.5 |
| 17 | 46 | 5.1 |
| 18 | 48 | 6.2 |
| 19 | 50 | 6.5 |
| 20 | 53 | 7.4 |
| 21 | 55 | 7.6 |
| 22 | 58 | 7.7 |
| 23 | 60 | 7.4 |
| 24 | 63 | 6.7 |
| 25 | 64 | 7.2 |
| 26 | 67 | 7.8 |
| 27 | 68 | 6.8 |
| 28 | 70 | 7.2 |
| 29 | 73 | 7.9 |
| 30 | 76 | 6.9 |

TABLE 2

| Examples | Compound Nos. | ON/OFF ratios ($\times 10^7$) |
|---|---|---|
| 31 | 78 | 6.8 |
| 32 | 82 | 7.6 |
| 33 | 83 | 7.4 |
| 34 | 87 | 7.5 |
| 35 | 89 | 7.0 |
| 36 | 93 | 6.8 |
| 37 | 94 | 7.7 |
| 38 | 96 | 7.4 |
| 39 | 97 | 7.6 |
| 40 | 101 | 6.5 |
| 41 | 102 | 7.4 |
| 42 | 104 | 7.7 |
| 43 | 105 | 7.3 |

TABLE 2-continued

| Examples | Compound Nos. | ON/OFF ratios ($\times 10^7$) |
|---|---|---|
| 44 | 108 | 7.1 |
| 45 | 110 | 8.0 |
| 46 | 111 | 7.6 |
| 47 | 114 | 7.0 |
| 48 | 116 | 7.4 |
| 49 | 117 | 7.7 |
| 50 | 120 | 7.0 |
| 51 | 123 | 8.6 |
| 52 | 125 | 8.8 |
| 53 | 126 | 8.2 |
| 54 | 129 | 8.4 |
| 55 | 130 | 8.5 |
| 56 | 132 | 8.3 |
| 57 | 134 | 8.2 |
| 58 | 136 | 8.4 |
| 59 | 138 | 8.0 |
| 60 | 140 | 8.3 |

TABLE 3

| Examples | Compound Nos. | ON/OFF ratios ($\times 10^7$) |
|---|---|---|
| 61 | 144 | 8.7 |
| 62 | 146 | 8.6 |
| 63 | 148 | 8.3 |
| 64 | 150 | 8.8 |
| 65 | 152 | 8.1 |
| 66 | 156 | 8.2 |
| 67 | 158 | 7.5 |
| 68 | 161 | 6.5 |
| 69 | 166 | 7.7 |
| 70 | 168 | 7.7 |
| 71 | 170 | 6.6 |
| 72 | 173 | 6.7 |
| 73 | 175 | 7.8 |
| 74 | 178 | 7.9 |
| 75 | 180 | 6.9 |
| 76 | 182 | 7.0 |
| 77 | 183 | 7.7 |
| 78 | 184 | 6.7 |
| 79 | 185 | 6.9 |
| 80 | 187 | 6.9 |
| 81 | 189 | 6.8 |
| 82 | 193 | 7.2 |
| 83 | 196 | 7.4 |
| 84 | 197 | 7.9 |
| 85 | 203 | 7.4 |
| 86 | 205 | 7.4 |
| 87 | 208 | 7.5 |
| 88 | 209 | 7.9 |
| 89 | 213 | 7.8 |
| 90 | 214 | 8.6 |

TABLE 4

| Examples | Compound Nos. | ON/OFF ratios ($\times 10^7$) |
|---|---|---|
| 91 | 217 | 8.5 |
| 92 | 219 | 8.0 |
| 93 | 222 | 8.7 |
| 94 | 225 | 8.8 |
| 95 | 226 | 8.6 |
| 96 | 228 | 8.5 |
| 97 | 231 | 8.7 |
| 98 | 233 | 8.0 |
| 99 | 234 | 8.3 |
| 100 | 235 | 8.6 |
| 101 | 237 | 8.6 |
| 102 | 238 | 8.4 |
| 103 | 239 | 8.8 |
| 104 | 241 | 8.9 |
| 105 | 244 | 8.6 |

TABLE 4-continued

| Examples | Compound Nos. | ON/OFF ratios (×10⁷) |
|---|---|---|
| 106 | 247 | 8.8 |
| 107 | 250 | 8.8 |
| 108 | 253 | 8.8 |
| 109 | 256 | 8.2 |
| 110 | 260 | 9.0 |
| 111 | 262 | 8.8 |
| 112 | 265 | 8.3 |
| 113 | 267 | 8.8 |
| 114 | 268 | 8.2 |
| 115 | 270 | 8.4 |
| 116 | 273 | 8.9 |
| 117 | 276 | 8.1 |
| 118 | 280 | 8.0 |
| 119 | 282 | 8.7 |
| 120 | 283 | 8.3 |

TABLE 5

| Examples | Compound Nos. | ON/OFF ratios (×10⁷) |
|---|---|---|
| 121 | 285 | 8.1 |
| 122 | 286 | 8.8 |
| 123 | 287 | 8.2 |
| 124 | 290 | 8.4 |
| 125 | 291 | 8.8 |
| 126 | 293 | 8.9 |
| 127 | 295 | 8.4 |
| 128 | 296 | 8.4 |
| 129 | 299 | 9.0 |
| 130 | 302 | 8.2 |
| 131 | 304 | 8.8 |
| 132 | 306 | 8.1 |
| 133 | 308 | 8.7 |
| 134 | 309 | 8.9 |
| 135 | 312 | 8.8 |
| 136 | 315 | 9.3 |
| 137 | 316 | 9.2 |
| 138 | 318 | 9.1 |
| 139 | 320 | 9.1 |
| 140 | 321 | 9.1 |
| 141 | 324 | 9.2 |
| 142 | 326 | 9.0 |
| 143 | 327 | 9.5 |
| 144 | 329 | 9.3 |
| 145 | 331 | 9.1 |
| 146 | 332 | 9.2 |
| 147 | 333 | 9.4 |
| 148 | 335 | 9.1 |
| 149 | 336 | 9.1 |
| 150 | 337 | 9.4 |

TABLE 6

| Examples | Compound Nos. | ON/OFF ratio (×10⁷) |
|---|---|---|
| 151 | 338 | 9.2 |
| 152 | 340 | 9.0 |
| 153 | 342 | 9.0 |
| 154 | 344 | 9.5 |
| 155 | 346 | 9.3 |
| 156 | 347 | 9.0 |
| 157 | 350 | 9.4 |
| 158 | 353 | 9.1 |
| 159 | 355 | 9.2 |
| 160 | 358 | 9.2 |
| 161 | 360 | 8.0 |
| 162 | 361 | 6.7 |
| 163 | 364 | 6.8 |
| 164 | 367 | 6.9 |
| 165 | 369 | 8.6 |
| 166 | 371 | 8.4 |
| 167 | 372 | 8.4 |

TABLE 6-continued

| Examples | Compound Nos. | ON/OFF ratio (×10⁷) |
|---|---|---|
| 168 | 374 | 8.9 |
| 169 | 377 | 9.0 |
| 170 | 379 | 8.0 |
| 171 | 380 | 8.5 |
| 172 | 382 | 8.3 |
| 173 | 385 | 8.6 |
| 174 | 387 | 9.1 |
| 175 | 390 | 9.1 |
| 176 | 392 | 9.1 |
| 177 | 394 | 9.1 |
| 178 | 397 | 6.8 |
| 179 | 401 | 6.9 |
| 180 | 403 | 8.0 |

TABLE 7

| Examples | Compound Nos. | ON/OFF ratios (×10⁷) |
|---|---|---|
| 181 | 404 | 8.1 |
| 182 | 405 | 8.2 |
| 183 | 407 | 8.8 |
| 184 | 409 | 8.6 |
| 185 | 412 | 8.4 |
| 186 | 413 | 8.6 |
| 187 | 416 | 9.3 |
| 188 | 418 | 9.3 |
| 189 | 423 | 9.3 |

EXAMPLE 190

The organic thin film transistor 10B shown in FIG. 2 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Gold layers having a thickness of 100 nanometers were formed by a selective deposition using a metal mask, thereby to form stripe-shaped source electrodes 12 over the gate insulating film 16, wherein the source electrodes 12 are distanced from each other. The used mask was removed.

The compound represented by the above formula (1) was deposited by a vacuum evaporation method to form an organic thin film 15 having a thickness of 300 nanometers over the gate insulating film 16 and the source electrodes 12. A gold layer was further deposited on the organic thin film 15 by a vacuum evaporation method, thereby to form a drain electrode 13 having a thickness of 200 nanometers on the organic thin film 15. As a result, an organic thin film transistor 10B of the second embodiment and shown in FIG. 2 was obtained.

A rectangle-shaped waveform voltage with a frequency of 1 kHz and a maximum voltage level of 8.5V was applied to the gate electrode 14 of the organic thin film transistor 10B, while a DC voltage of 10V was applied across the source and drain electrodes 12 and 13. A rising time of the source-drain current from turning ON of the organic thin film transistor 10B was measured, wherein the rising time was defined to be a time from 10% to 90% of a full variation of the source-drain current upon the turning ON of the organic thin film transistor 10B.

It was confirmed that the measured rising time of the source-drain current was less than 1 microsecond.

EXAMPLES 191–378

In Examples 191–378, the organic thin film transistors 10B were prepared in the same methods as described in Example 190, except that other compounds were used instead of the above compound (1) for the respective organic thin films 15. A rising time of the source-drain current was also measured in the same manner as in Example 190. The following Tables 8–14 show the respective numbers given to the above-described formulas representing the compounds as used and also show respective measured response times (rising times) of the source-drain currents in Examples 191–378.

It was confirmed that the measured rising times were less than 1 microsecond in Examples 191–378.

TABLE 8

| Examples | Compound Nos. | response times ($\mu$s) |
| --- | --- | --- |
| 191 | 4 | <1 |
| 192 | 6 | <1 |
| 193 | 9 | <1 |
| 194 | 12 | <1 |
| 195 | 15 | <1 |
| 196 | 19 | <1 |
| 197 | 23 | <1 |
| 198 | 25 | <1 |
| 199 | 26 | <1 |
| 200 | 29 | <1 |
| 201 | 32 | <1 |
| 202 | 35 | <1 |
| 203 | 38 | <1 |
| 204 | 41 | <1 |
| 205 | 42 | <1 |
| 206 | 46 | <1 |
| 207 | 48 | <1 |
| 208 | 50 | <1 |
| 209 | 53 | <1 |
| 210 | 55 | <1 |
| 211 | 58 | <1 |
| 212 | 60 | <1 |
| 213 | 63 | <1 |
| 214 | 64 | <1 |
| 215 | 67 | <1 |
| 216 | 68 | <1 |
| 217 | 70 | <1 |
| 218 | 73 | <1 |
| 219 | 76 | <1 |
| 220 | 78 | <1 |

TABLE 9

| Examples | Compound Nos. | response times ($\mu$s) |
| --- | --- | --- |
| 221 | 82 | <1 |
| 222 | 83 | <1 |
| 223 | 87 | <1 |
| 224 | 89 | <1 |
| 225 | 93 | <1 |
| 226 | 94 | <1 |
| 227 | 96 | <1 |
| 228 | 97 | <1 |
| 229 | 101 | <1 |
| 230 | 102 | <1 |
| 231 | 104 | <1 |
| 232 | 105 | <1 |
| 233 | 108 | <1 |
| 234 | 110 | <1 |
| 235 | 111 | <1 |
| 236 | 114 | <1 |
| 237 | 116 | <1 |
| 238 | 117 | <1 |
| 239 | 120 | <1 |
| 240 | 123 | <1 |
| 241 | 125 | <1 |
| 242 | 126 | <1 |
| 243 | 129 | <1 |
| 244 | 130 | <1 |
| 245 | 132 | <1 |
| 246 | 134 | <1 |
| 247 | 136 | <1 |
| 248 | 138 | <1 |
| 249 | 140 | <1 |
| 250 | 144 | <1 |

TABLE 10

| Examples | Compound Nos. | response times ($\mu$s) |
| --- | --- | --- |
| 251 | 146 | <1 |
| 252 | 148 | <1 |
| 253 | 150 | <1 |
| 254 | 152 | <1 |
| 255 | 156 | <1 |
| 256 | 158 | <1 |
| 257 | 161 | <1 |
| 258 | 166 | <1 |
| 259 | 168 | <1 |
| 260 | 170 | <1 |
| 261 | 173 | <1 |
| 262 | 175 | <1 |
| 263 | 178 | <1 |
| 264 | 180 | <1 |
| 265 | 182 | <1 |
| 266 | 183 | <1 |
| 267 | 184 | <1 |
| 268 | 185 | <1 |
| 269 | 187 | <1 |
| 270 | 189 | <1 |
| 271 | 193 | <1 |
| 272 | 196 | <1 |
| 273 | 197 | <1 |
| 274 | 203 | <1 |
| 275 | 205 | <1 |
| 276 | 208 | <1 |
| 277 | 209 | <1 |
| 278 | 213 | <1 |
| 279 | 214 | <1 |
| 280 | 217 | <1 |

TABLE 11

| Examples | Compound Nos. | response times ($\mu$s) |
| --- | --- | --- |
| 281 | 219 | <1 |
| 282 | 222 | <1 |
| 283 | 225 | <1 |
| 284 | 226 | <1 |
| 285 | 228 | <1 |
| 286 | 231 | <1 |
| 287 | 233 | <1 |
| 288 | 234 | <1 |
| 289 | 235 | <1 |
| 290 | 237 | <1 |
| 291 | 238 | <1 |
| 292 | 239 | <1 |
| 293 | 241 | <1 |
| 294 | 244 | <1 |
| 295 | 247 | <1 |
| 296 | 250 | <1 |
| 297 | 253 | <1 |
| 298 | 256 | <1 |
| 299 | 260 | <1 |
| 300 | 262 | <1 |
| 301 | 265 | <1 |
| 302 | 267 | <1 |
| 303 | 268 | <1 |

TABLE 11-continued

| Examples | Compound Nos. | response times (µs) |
|---|---|---|
| 304 | 270 | <1 |
| 305 | 273 | <1 |
| 306 | 276 | <1 |
| 307 | 280 | <1 |
| 308 | 282 | <1 |
| 309 | 283 | <1 |
| 310 | 285 | <1 |

TABLE 12

| Examples | Compound Nos. | response times (µs) |
|---|---|---|
| 311 | 286 | <1 |
| 312 | 287 | <1 |
| 313 | 290 | <1 |
| 314 | 291 | <1 |
| 315 | 293 | <1 |
| 316 | 295 | <1 |
| 317 | 296 | <1 |
| 318 | 299 | <1 |
| 319 | 302 | <1 |
| 320 | 304 | <1 |
| 321 | 306 | <1 |
| 322 | 308 | <1 |
| 323 | 309 | <1 |
| 324 | 312 | <1 |
| 325 | 315 | <1 |
| 326 | 316 | <1 |
| 327 | 318 | <1 |
| 328 | 320 | <1 |
| 329 | 321 | <1 |
| 330 | 324 | <1 |
| 331 | 326 | <1 |
| 332 | 327 | <1 |
| 333 | 329 | <1 |
| 334 | 331 | <1 |
| 335 | 332 | <1 |
| 336 | 333 | <1 |
| 337 | 335 | <1 |
| 338 | 336 | <1 |
| 339 | 337 | <1 |
| 340 | 338 | <1 |

TABLE 13

| Examples | Compound Nos. | response times (µs) |
|---|---|---|
| 341 | 340 | <1 |
| 342 | 342 | <1 |
| 343 | 344 | <1 |
| 344 | 346 | <1 |
| 345 | 347 | <1 |
| 346 | 350 | <1 |
| 347 | 353 | <1 |
| 348 | 355 | <1 |
| 349 | 358 | <1 |
| 350 | 360 | <1 |
| 351 | 361 | <1 |
| 352 | 364 | <1 |
| 353 | 367 | <1 |
| 354 | 369 | <1 |
| 355 | 371 | <1 |
| 356 | 372 | <1 |
| 357 | 374 | <1 |
| 358 | 377 | <1 |
| 359 | 379 | <1 |
| 360 | 380 | <1 |
| 361 | 382 | <1 |
| 362 | 385 | <1 |
| 363 | 387 | <1 |
| 364 | 390 | <1 |
| 365 | 392 | <1 |

TABLE 13-continued

| Examples | Compound Nos. | response times (µs) |
|---|---|---|
| 366 | 394 | <1 |
| 367 | 397 | <1 |
| 368 | 401 | <1 |
| 369 | 403 | <1 |
| 370 | 404 | <1 |

TABLE 14

| Examples | Compound Nos. | response times (µs) |
|---|---|---|
| 371 | 405 | <1 |
| 372 | 407 | <1 |
| 373 | 409 | <1 |
| 374 | 412 | <1 |
| 375 | 413 | <1 |
| 376 | 416 | <1 |
| 377 | 418 | <1 |
| 378 | 423 | <1 |

EXAMPLE 379

The organic thin film transistor 10C shown in FIG. 3 was prepared as follows. A gold layer having a thickness of 200 nanometers was deposited on a substrate 11 by a vacuum evaporation method, thereby to form a source electrode 12 on the substrate 11. The compound represented by the above formula (1) was deposited at a thickness of 100 nanometers over the source electrode 12. Aluminum layers having a thickness of 80 nanometers were formed by a selective deposition using a metal mask, thereby to form a set of plural gate electrodes 14 which are aligned at a distance 200 from each other. Each of the plural gate electrodes 14 is stripe-shaped and has a width of 100 micrometers. The used mask was removed. Further, the compound represented by the above formula (1) was deposited at 150 nanometers over the plural gate electrodes 14 by a vacuum evaporation method to form an organic thin film 15 having a total thickness of 250 nanometers, so that the organic thin film 15 completely buries the gate electrodes 14. A gold layer having a thickness of 200 nanometers was deposited on the organic thin film 15 by a vacuum evaporation method to form a drain electrode 13 on the organic thin film 15. As a result, an organic thin film transistor 10C of the third embodiment and shown in FIG. 3 was obtained.

A rectangle-shaped waveform voltage with a frequency of 1 kHz and a maximum voltage level of 8.5V was applied to the gate electrodes 14 of the organic thin film transistor 10C, while a DC voltage of 10V was applied across the source and drain electrodes 12 and 13. A rising time of the source-drain current from turning ON of the organic thin film transistor 10C was measured, wherein the rising time was defined to be a time from 10% to 90% of a full variation of the source-drain current upon the turning ON of the organic thin film transistor 10C.

It was confirmed that the measured rising time of the source-drain current was less than 1 microsecond.

EXAMPLES 380–567

In Examples 380–567, the organic thin film transistors 10C were prepared in the same methods as described in Example 379, except that other compounds were used instead of the above compound (1) for the respective organic thin films 15. A rising time of the source-drain current was also measured in the same manner as in Example 379. The following Tables 15–21 show the respective numbers given to the above-described formulas representing the compounds as used and also show respective measured response times (rising times) of the source-drain currents in Examples 380–567.

It was confirmed that the measured response times (rising times) were less than 1 microsecond in Examples 380–567.

TABLE 15

| Examples | Compound Nos. | response times ($\mu$s) |
|---|---|---|
| 380 | 4 | <1 |
| 381 | 6 | <1 |
| 382 | 9 | <1 |
| 383 | 12 | <1 |
| 384 | 15 | <1 |
| 385 | 19 | <1 |
| 386 | 23 | <1 |
| 387 | 25 | <1 |
| 388 | 26 | <1 |
| 389 | 29 | <1 |
| 390 | 32 | <1 |
| 391 | 35 | <1 |
| 392 | 38 | <1 |
| 393 | 41 | <1 |
| 394 | 42 | <1 |
| 395 | 46 | <1 |
| 396 | 48 | <1 |
| 397 | 50 | <1 |
| 398 | 53 | <1 |
| 399 | 55 | <1 |
| 400 | 58 | <1 |
| 401 | 60 | <1 |
| 402 | 63 | <1 |
| 403 | 64 | <1 |
| 404 | 67 | <1 |
| 405 | 68 | <1 |
| 406 | 70 | <1 |
| 407 | 73 | <1 |
| 408 | 76 | <1 |
| 409 | 78 | <1 |
| 410 | 82 | <1 |

TABLE 16

| Examples | Compound Nos. | response times ($\mu$s) |
|---|---|---|
| 411 | 83 | <1 |
| 412 | 87 | <1 |
| 413 | 89 | <1 |
| 414 | 93 | <1 |
| 415 | 94 | <1 |
| 416 | 96 | <1 |
| 417 | 97 | <1 |
| 418 | 101 | <1 |
| 419 | 102 | <1 |
| 420 | 104 | <1 |
| 421 | 105 | <1 |
| 422 | 108 | <1 |
| 423 | 110 | <1 |
| 424 | 111 | <1 |
| 425 | 114 | <1 |
| 426 | 116 | <1 |
| 427 | 117 | <1 |
| 428 | 120 | <1 |
| 429 | 123 | <1 |
| 430 | 125 | <1 |
| 431 | 126 | <1 |
| 432 | 129 | <1 |
| 433 | 130 | <1 |
| 434 | 132 | <1 |
| 435 | 134 | <1 |
| 436 | 136 | <1 |
| 437 | 138 | <1 |
| 438 | 140 | <1 |
| 439 | 144 | <1 |
| 440 | 146 | <1 |

TABLE 17

| Examples | Compound Nos. | response times ($\mu$s) |
|---|---|---|
| 441 | 148 | <1 |
| 442 | 150 | <1 |
| 443 | 152 | <1 |
| 444 | 156 | <1 |
| 445 | 158 | <1 |
| 446 | 161 | <1 |
| 447 | 166 | <1 |
| 448 | 168 | <1 |
| 449 | 170 | <1 |
| 450 | 173 | <1 |
| 451 | 175 | <1 |
| 452 | 178 | <1 |
| 453 | 180 | <1 |
| 454 | 182 | <1 |
| 455 | 183 | <1 |
| 456 | 184 | <1 |
| 457 | 185 | <1 |
| 458 | 187 | <1 |
| 459 | 189 | <1 |
| 460 | 193 | <1 |
| 461 | 196 | <1 |
| 462 | 197 | <1 |
| 463 | 203 | <1 |
| 464 | 205 | <1 |
| 465 | 208 | <1 |
| 466 | 209 | <1 |
| 467 | 213 | <1 |
| 468 | 214 | <1 |
| 469 | 217 | <1 |
| 470 | 219 | <1 |

TABLE 18

| Examples | Compound Nos. | response times ($\mu$s) |
|---|---|---|
| 471 | 222 | <1 |
| 472 | 225 | <1 |
| 473 | 226 | <1 |
| 474 | 228 | <1 |
| 475 | 231 | <1 |
| 476 | 233 | <1 |
| 477 | 234 | <1 |
| 478 | 235 | <1 |
| 479 | 237 | <1 |
| 480 | 238 | <1 |
| 481 | 239 | <1 |
| 482 | 241 | <1 |
| 483 | 244 | <1 |
| 484 | 247 | <1 |
| 485 | 250 | <1 |
| 486 | 253 | <1 |
| 487 | 256 | <1 |
| 488 | 260 | <1 |
| 489 | 262 | <1 |
| 490 | 265 | <1 |
| 491 | 267 | <1 |
| 492 | 268 | <1 |
| 493 | 270 | <1 |
| 494 | 273 | <1 |
| 495 | 276 | <1 |
| 496 | 280 | <1 |
| 497 | 282 | <1 |
| 498 | 283 | <1 |

TABLE 18-continued

| Examples | Compound Nos. | response times ($\mu$s) |
|---|---|---|
| 499 | 285 | <1 |
| 500 | 286 | <1 |

TABLE 19

| Examples | Compound Nos. | response times ($\mu$s) |
|---|---|---|
| 501 | 287 | <1 |
| 502 | 290 | <1 |
| 503 | 291 | <1 |
| 504 | 293 | <1 |
| 505 | 295 | <1 |
| 506 | 296 | <1 |
| 507 | 299 | <1 |
| 508 | 302 | <1 |
| 509 | 304 | <1 |
| 510 | 306 | <1 |
| 511 | 308 | <1 |
| 512 | 309 | <1 |
| 513 | 312 | <1 |
| 514 | 315 | <1 |
| 515 | 316 | <1 |
| 516 | 318 | <1 |
| 517 | 320 | <1 |
| 518 | 321 | <1 |
| 519 | 324 | <1 |
| 520 | 326 | <1 |
| 521 | 327 | <1 |
| 522 | 329 | <1 |
| 523 | 331 | <1 |
| 524 | 332 | <1 |
| 525 | 333 | <1 |
| 526 | 335 | <1 |
| 527 | 336 | <1 |
| 528 | 337 | <1 |
| 529 | 338 | <1 |
| 530 | 340 | <1 |

TABLE 20

| Examples | Compound Nos. | response times ($\mu$s) |
|---|---|---|
| 531 | 342 | <1 |
| 532 | 344 | <1 |
| 533 | 346 | <1 |
| 534 | 347 | <1 |
| 535 | 350 | <1 |
| 536 | 353 | <1 |
| 537 | 355 | <1 |
| 538 | 358 | <1 |
| 539 | 360 | <1 |
| 540 | 361 | <1 |
| 541 | 364 | <1 |
| 542 | 367 | <1 |
| 543 | 369 | <1 |
| 544 | 371 | <1 |
| 545 | 372 | <1 |
| 546 | 374 | <1 |
| 547 | 377 | <1 |
| 548 | 379 | <1 |
| 549 | 380 | <1 |
| 550 | 382 | <1 |
| 551 | 385 | <1 |
| 552 | 387 | <1 |
| 553 | 390 | <1 |
| 554 | 392 | <1 |
| 555 | 394 | <1 |
| 556 | 397 | <1 |
| 557 | 401 | <1 |
| 558 | 403 | <1 |

TABLE 20-continued

| Examples | Compound Nos. | response times ($\mu$s) |
|---|---|---|
| 559 | 404 | <1 |
| 560 | 405 | <1 |

TABLE 21

| Examples | Compound Nos. | response times ($\mu$s) |
|---|---|---|
| 561 | 407 | <1 |
| 562 | 409 | <1 |
| 563 | 412 | <1 |
| 564 | 413 | <1 |
| 565 | 416 | <1 |
| 566 | 418 | <1 |
| 567 | 423 | <1 |

EXAMPLE 568

The organic thin film transistor 10A shown in FIG. 1 was prepared as follows. A chromium layer having a thickness of 100 nanometers was deposited on a substrate 11 by a vacuum evaporation method, thereby to form a gate electrode 14 on the substrate 11. An SiO$_2$ layer having a thickness of 300 nanometers was deposited on the gate electrode 14 by a sputtering method to form a gate insulating film 16 over the gate electrode 14. Copper layers having a thickness of 150 nanometers were formed by a selective deposition using a metal mask, thereby to form source and drain electrodes 12 and 13 over the gate insulating film 16, wherein the source and drain electrodes 12 and 13 are distanced from each other by a distance of 25 micrometers. The used mask was removed. The compound represented by the above-described formula (318) was deposited by a selective vacuum evaporation method using another metal mask to form an organic thin film 15 having a thickness of 150 nanometers over the gate insulating film 16 between the source and drain electrodes 12 and 13 as well as over parts of the source and drain electrodes 12 and 13. As a result, an organic thin film transistor 10A of the first embodiment and shown in FIG. 1 was obtained.

A gate voltage of −40V was applied to the gate electrode 14 of the organic thin film transistor 10A. It was confirmed that a measured ON/OFF ratio of source-drain current between the source and drain electrodes 12 and 13 was $7.3 \times 10^7$.

EXAMPLE 569

The organic thin film transistor 10B shown in FIG. 2 was prepared as follows. A chromium layer having a thickness of 100 nanometers was deposited on a substrate 11 by a vacuum evaporation method, thereby to form a gate electrode 14 on the substrate 11. An SiO$_2$ layer having a thickness of 300 nanometers was deposited on the gate electrode 14 by a sputtering method to form a gate insulating film 16 over the gate electrode 14. Copper layers having a thickness of 100 nanometers were formed by a selective deposition using a metal mask, thereby to form stripe-shaped source electrodes 12 over the gate insulating film 16, wherein the source electrodes 12 are distanced from each other. The used mask was removed.

The compound represented by the above-described formula (318) was deposited by a vacuum evaporation method to form an organic thin film 15 having a thickness of 300 nanometers over the gate insulating film 16 and the source electrodes 12. A copper layer was further deposited on the organic thin film 15 by a vacuum evaporation method, thereby to form a drain electrode 13 having a thickness of 200 nanometers on the organic thin film 15. As a result, an organic thin film transistor 10B of the second embodiment and shown in FIG. 2 was obtained.

A rectangle-shaped waveform voltage with a frequency of 1 kHz and a maximum voltage level of 8.5V was applied to the gate electrode 14 of the organic thin film transistor 10B, while a DC voltage of 10V was applied across the source and drain electrodes 12 and 13. A rising time of the source-drain current from turning ON of the organic thin film transistor 10B was measured, wherein the rising time was defined to be a time from 10% to 90% of a full variation of the source-drain current upon the turning ON of the organic thin film transistor 10B.

It was confirmed that the measured rising time of the source-drain current was less than 1 microsecond.

EXAMPLE 570

The organic thin film transistor 10C shown in FIG. 3 was prepared as follows. A copper layer having a thickness of 200 nanometers was deposited on a substrate 11 by a vacuum evaporation method, thereby to form a source electrode 12 on the substrate 11. The compound represented by the above-described formula (318) was deposited at a thickness of 100 nanometers over the source electrode 12. Aluminum layers having a thickness of 80 nanometers were formed on the film of the compound (318) by a selective deposition using a metal mask, thereby to form a set of plural gate electrodes 14 which are aligned at a distance 200 from each other. Each of the plural gate electrodes 14 is stripe-shaped and has a width of 100 micrometers. The used mask was removed. Further, the compound represented by the above-described formula (318) was deposited at 150 nanometers over the gate electrodes 14 by a vacuum evaporation method to form an organic thin film 15 having a total thickness of 250 nanometers, so that the organic thin film 15 completely buries the gate electrodes 14. A copper layer having a thickness of 200 nanometers was deposited on the organic thin film 15 by a vacuum evaporation method to form a drain electrode 13 on the organic thin film 15. As a result, an organic thin film transistor 10C of the third embodiment and shown in FIG. 3 was obtained.

A rectangle-shaped waveform voltage with a frequency of 1 kHz and a maximum voltage level of 8.5V was applied to the gate electrodes 14 of the organic thin film transistor 10C, while a DC voltage of 10V was applied across the source and drain electrodes 12 and 13. A rising time of the source-drain current from turning ON of the organic thin film transistor 10C was measured, wherein the rising time was defined to be a time from 10% to 90% of a full variation of the source-drain current upon the turning ON of the organic thin film transistor 10C.

It was confirmed that the measured rising time of the source-drain current was less than 1 microsecond.

EXAMPLE 571

The organic thin film transistor 10A shown in FIG. 1 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Indium thin oxide layers having a thickness of 150 nanometers were formed by a selective deposition using a metal mask, thereby to form source and drain electrodes 12 and 13 over the gate insulating film 16, wherein the source and drain electrodes 12 and 13 are distanced from each other by a distance of 25 micrometers. The used mask was removed. The compound represented by the above-described formula (318) was deposited by a selective vacuum evaporation method using another mask to form an organic thin film 15 having a thickness of 150 nanometers over the gate insulating film 16 between the source and drain electrodes 12 and 13 as well as over parts of the source and drain electrodes 12 and 13. As a result, an organic thin film transistor 10A of the first embodiment and shown in FIG. 1 was obtained.

A gate voltage of −40V was applied to the gate electrode 14 of the organic thin film transistor 10A. It was confirmed that a measured ON/OFF ratio of source-drain current between the source and drain electrodes 12 and 13 was $6.7 \times 10^7$.

EXAMPLE 572

The organic thin film transistor 10B shown in FIG. 2 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Indium thin oxide layers having a thickness of 100 nanometers were formed by a selective deposition using a metal mask, thereby to form stripe-shaped source electrodes 12 over the gate insulating film 16, wherein the source electrodes 12 are distanced from each other. The used mask was removed.

The compound represented by the above-described formula (318) was deposited by a vacuum evaporation method to form an organic thin film 15 having a thickness of 300 nanometers over the gate insulating film 16 and the source electrodes 12. An indium thin oxide layer was further deposited on the organic thin film 15 by a sputtering method, thereby to form a drain electrode 13 having a thickness of 200 nanometers on the organic thin film 15. As a result, an organic thin film transistor 10B of the second embodiment and shown in FIG. 2 was obtained.

A rectangle-shaped waveform voltage with a frequency of 1 kHz and a maximum voltage level of 8.5V was applied to the gate electrode 14 of the organic thin film transistor 10B, while a DC voltage of 10V was applied across the source and drain electrodes 12 and 13. A rising time of the source-drain current from turning ON of the organic thin film transistor 10B was measured, wherein the rising time was defined to be a time from 10% to 90% of a full variation of the source-drain current upon the turning ON of the organic thin film transistor 10B.

It was confirmed that the measured rising time of the source-drain current was less than 1 microsecond.

EXAMPLE 573

The organic thin film transistor 10C shown in FIG. 3 was prepared as follows, An indium tin oxide layer having a thickness of 1000 nanometers was deposited on a substrate 11 by a sputtering method, thereby to form a source electrode 12 on the substrate 11. The compound represented by the above-described formula (318) was deposited at a thickness of 100 nanometers over the source electrode 12. Aluminum layers having a thickness of 80 nanometers were formed on the film of the compound (318) by a selective deposition using a metal mask, thereby to form a set of plural gate electrodes 14 which are aligned at a distance 200 from each other. Each of the plural gate electrodes 14 is stripe-shaped and has a width of 100 micrometers, The used mask was removed. Further, the compound represented by the above-described formula (318) was deposited at 150 nanometers over the gate electrodes 14 by a vacuum evaporation method to form an organic thin film 15 having a total thickness of 250 nanometers, so that the organic thin film 15 completely buries the gate electrodes 14. An indium thin oxide layer having a thickness of 200 nanometers was deposited on the organic thin film 15 by a sputtering method to form a drain electrode 13 on the organic thin film 15. As a result, an organic thin film transistor 10C of the third embodiment and shown in FIG. 3 was obtained.

A rectangle-shaped waveform voltage with a frequency of 1 kHz and a maximum voltage level of 8.5V was applied to the gate electrodes 14 of the organic thin film transistor 10C, while a DC voltage of 10V was applied across the source and drain electrodes 12 and 13. A rising time of the source-drain current from turning ON of the organic thin film transistor 10C was measured, wherein the rising time was defined to be a time from 10% to 90% of a full variation of the source-drain current upon the turning ON of the organic thin film transistor 10C.

It was confirmed that the measured rising time of the source-drain current was less than 1 microsecond.

EXAMPLE 574

The organic thin film transistor 10A shown in FIG. 1 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Magnesium-silver alloy layers having a thickness of 150 nanometers were formed by a selective deposition using a metal mask, thereby to form source and drain electrodes 12 and 13 over the gate insulating film 16, wherein the source and drain electrodes 12 and 13 are distanced from each other by a distance of 25 micrometers. The used mask was removed.

The compound represented by the above described formula (231) and cesium were deposited by a selective vacuum evaporation method using another mask to form a mixture layer including the compound and cesium at a weight ratio of 10:1 only over the source electrodes 12, wherein the mixture layer has a thickness of 20 nanometers. The used mask was removed. Further, the compound represented by the above-described formula (231) was deposited by the vacuum evaporation method to form an organic thin film 15 having a thickness of 150 nanometers over the gate insulating film 16 between the source and drain electrodes 12 and 13 as well as over parts of the source and drain electrodes 12 and 13. As a result, an organic thin film transistor 10A of the first embodiment and shown in FIG. 1 was obtained.

A gate voltage of 40V was applied to the gate electrode 14 of the organic thin film transistor 10A. It was confirmed that a measured ON/OFF ratio of source-drain current between the source and drain electrodes 12 and 13 was $5.7 \times 10^7$.

EXAMPLE 575

The organic thin film transistor 10B shown in FIG. 2 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Magnesium-silver alloy layers having a thickness of 100 nanometers were formed by a selective deposition using a metal mask, thereby to form stripe-shaped source electrodes 12 over the gate insulating film 16, wherein the source electrodes 12 are distanced from each other. The used mask was removed.

The compound represented by the above-described formula (231) and cesium were deposited by a vacuum evaporation method to form a mixture layer including the compound and cesium at a weight ratio of 10:1, wherein the mixture layer has a thickness of 20 nanometers. Further, the compound represented by the above-described formula (231) was deposited at 280 nanometers by the vacuum evaporation method to form an organic thin film 15 having a total thickness of 300 nanometers over the gate insulating film 16 and the source electrodes 12. A magnesium-silver alloy layer was further deposited on the organic thin film 15 by a vacuum evaporation method, thereby to form a drain electrode 13 having a thickness of 200 nanometers on the organic thin film 15. As a result, an organic thin film transistor 10B of the second embodiment and shown in FIG. 2 was obtained.

A rectangle-shaped waveform voltage with a frequency of 1 kHz and a maximum voltage level of 8.5V was applied to the gate electrode 14 of the organic thin film transistor 10B, while a DC voltage of 10V was applied across the source and drain electrodes 12 and 13. A rising time of the source-drain current from turning ON of the organic thin film transistor 10B was measured, wherein the rising time was defined to be a time from 10% to 90% of a fill variation of the source-drain current upon the turning ON of the organic thin film transistor 10B.

It was confirmed that the measured rising time of the source-drain current was less than 1 microsecond.

EXAMPLE 576

The organic thin film transistor 10C shown in FIG. 3 was prepared as follows. A magnesium-silver alloy layer having a thickness of 200 nanometers was deposited on a substrate 11 by a vacuum evaporation method, thereby to form a source electrode 12 on the substrate 11.

The compound represented by the above-described formula (231) and cesium were deposited by a vacuum evaporation method to form a mixture layer including the compound and cesium at a weight ratio of 10:1, wherein the mixture layer has a thickness of 20 nanometers. Further, the compound represented by the above-described formula (231) was deposited at 80 nanometers by the vacuum evaporation method. Aluminum layers having a thickness of 80 nanometers were formed on the film of the compound (231) by a selective deposition using a metal mask, thereby to form a set of plural gate electrodes 14 which are aligned at a distance 200 from each other. Each of the plural gate electrodes 14 is stripe-shaped and has a width of 100 micrometers. The used mask was removed. Further, the compound represented by the above-described formula (231) was deposited at 150 nanometers over the gate electrodes 14 by a vacuum evaporation method to form an organic thin film 15 having a total thickness of 250 nanometers, so that the organic thin film 15 completely buries the gate electrodes 14. A magnesium-silver alloy layer having a thickness of 200 nanometers was deposited on the organic thin film 15 by a vacuum evaporation method to form a drain electrode 13 on the organic thin film 15. As a result, an organic thin film transistor 10C of the third embodiment and shown in FIG. 3 was obtained.

A rectangle-shaped waveform voltage with a frequency of 1 kHz and a maximum voltage level of 8.5V was applied to the gate electrodes 14 of the organic thin film transistor 10C, while a DC voltage of 10V was applied across the source and drain electrodes 12 and 13. A rising time of the source-drain current from turning ON of the organic thin film transistor 10C was measured, wherein the rising time was defined to be a time from 10% to 90% of a full variation of the source-drain current upon the turning ON of the organic thin film transistor 10C.

It was confirmed that the measured rising time of the source-drain current was less than 1 microsecond.

EXAMPLE 577

The organic thin film transistor 10A shown in FIG. 1 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Gold layers having a thickness of 150 nanometers were formed by a selective deposition using a metal mask, thereby to form source and drain electrodes 12 and 13 over the gate insulating film 16, wherein the source and drain electrodes 12 and 13 are distanced from each other by a distance of 25 micrometers. The used mask was removed.

The compound represented by the above-described formula (215) and boron trifluoride were deposited by a selective vacuum evaporation method using another mask to form a mixture layer including the compound and boron trifluoride at a weight ratio of 10:1 only over the source electrodes 12, wherein the mixture layer has a thickness of 20 nanometers. The used mask was removed. Further, the compound represented by the above-described formula (215) was deposited by the vacuum evaporation method to form an organic thin film 15 having a thickness of 150 nanometers over the gate insulating film 16 between the source and drain electrodes 12 and 13 as well as over parts of the source and drain electrodes 12 and 13. As a result, an organic thin film transistor 10A of the first embodiment and shown in FIG. 1 was obtained.

A gate voltage of −40V was applied to the gate electrode 14 of the organic thin film transistor 10A. It was confirmed that a measured ON/OFF ratio of source-drain current between the source and drain electrodes 12 and 13 was $59 \times 10^7$.

EXAMPLE 578

The organic thin film transistor 10B shown in FIG. 2 was prepared as follows. A chromium layer having a thickness of 100 nanometers was deposited on a substrate 11 by a vacuum evaporation method, thereby to form a gate electrode 14 on the substrate 11. An $SiO_2$ layer having a thickness of 300 nanometers was deposited on the gate electrode 14 by a sputtering method to form a gate insulating film 16 over the gate electrode 14. Gold layers having a thickness of 100 nanometers were formed by a selective deposition using a metal mask, thereby to form stripe-shaped source electrodes 12 over the gate insulating film 16, wherein the source electrodes 12 are distanced from each other. The used mask was removed.

The compound represented by the above-described formula (215) and boron trifluoride were deposited by a vacuum evaporation method to form a mixture layer including the compound and boron trifluoride at a weight ratio of 10:1, wherein the mixture layer has a thickness of 20 nanometers. Further, the compound represented by the above-described formula (215) was deposited at 280 nanometers by the vacuum evaporation method to form an organic thin film 15 having a total thickness of 300 nanometers over the gate insulating film 16 and the source electrodes 12. A gold layer was further deposited on the organic thin film 15 by a vacuum evaporation method, thereby to form a drain electrode 13 having a thickness of 200 nanometers on the organic thin film 15. As a result, an organic thin film transistor 10B of the second embodiment and shown in FIG. 2 was obtained.

A rectangle-shaped waveform voltage with a frequency of 1 kHz and a maximum voltage level of 8.5V was applied to the gate electrode 14 of the organic thin film transistor 10B, while a DC voltage of 10V was applied across the source and drain electrodes 12 and 13. A rising time of the source-drain current from turning ON of the organic thin film transistor 10B was measured, wherein the rising time was defined to be a time from 10% to 90% of a full variation of the source-drain current upon the turning ON of the organic thin film transistor 10B.

It was confirmed that the measured rising time of the source-drain current was less than 1 microsecond.

EXAMPLE 579

The organic thin film transistor 10C shown in FIG. 3 was prepared as follows. A gold layer having a thickness of 200 nanometers was deposited on a substrate 11 by a vacuum evaporation method, thereby to form a source electrode 12 on the substrate 11.

The compound represented by the above-described formula (215) and boron trifluoride were deposited by a selective vacuum evaporation method to form a mixture layer including the compound and boron trifluoride at a weight ratio of 10:1, wherein the mixture layer has a thickness of 20 nanometers. Further, the compound represented by the above-described formula (215) was deposited at 80 nanometers by the vacuum evaporation method. Aluminum layers having a thickness of 80 nanometers were formed on the film of the compound (215) by a selective deposition using a metal mask, thereby to form a set of plural gate electrodes 14 which are aligned at a distance 200 from each other. Each of the plural gate electrodes 14 is stripe-shaped and has a width of 100 micrometers. The used mask was removed. Further, the compound represented by the above-described formula (215) was deposited at 150 nanometers over the gate electrodes 14 by a vacuum evaporation method to form an organic thin film 15 having a total thickness of 250 nanometers, so that the organic thin film 15 completely buries the gate electrodes 14. A gold layer having a thickness of 200 nanometers was deposited on the organic thin film 15 by a vacuum evaporation method to form a drain electrode 13 on the organic thin film 15. As a result, an organic thin film transistor 10C of the third embodiment and shown in FIG. 3 was obtained.

A rectangle-shaped waveform voltage with a frequency of 1 kHz and a maximum voltage level of 8.5V was applied to the gate electrodes 14 of the organic thin film transistor 10C, while a DC voltage of 10V was applied across the source and drain electrodes 12 and 13. A rising time of the source-drain current from turning ON of the organic thin film transistor 10C was measured, wherein the rising time was defined to be a time from 10% to 90% of a full variation of the source-drain current upon the turning ON of the organic thin film transistor 10C.

It was confirmed that the measured rising time of the source-drain current was less than 1 microsecond.

The present invention may be applicable to a variety of organic thin film transistor, including not only the above described typical embodiments shown in FIGS. 1, 2 and 3 but also other organic thin film transistors different in structure from the above described typical embodiments. The above Examples 1–579 demonstrated that the organic thin film transistors, which have the organic thin films including the compound represented by the general formula [A] solely or in mixture with other materials, exhibited high speed performances and high ON/OFF ratios.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. An organic thin film transistor including:

an organic thin film;

first and second electrodes being in contact with said organic thin film, and said first and second electrodes being separated from each other; and a third electrode being separated from said first and second electrodes, and said third electrode receiving an application of a control voltage which controls a current flowing from one of said first and second electrodes to the other, wherein said organic thin film includes at least a compound represented by the following general formula [A]:

  [A]

where each of $Ar^1$ and $Ar^2$ is selected independently from unsubstituted or substituted aromatic hydrocarbon groups having 6 to 20 carbon atoms and from unsubstituted or substituted aromatic heterocyclic groups having 6 to 20 carbon atoms; and X is selected from unsubstituted or substituted condensed aromatic hydrocarbon groups and having 6 to 34 carbon atoms, and said condensed aromatic hydrocarbon groups are monovalent, divalent, trivalent or tetravalent groups; and n is the natural number in the range of 1–4.

2. The organic thin film transistor as claimed in claim 1, wherein two of substituents of $Ar^1$ and $Ar^2$ are bonded in the form of ring.

3. The organic thin film transistor as claimed in claim 1, wherein said organic thin film consists of said compound.

4. The organic thin film transistor as claimed in claim 1, wherein said organic thin film consists of a mixture including said compound.

5. The organic thin film transistor as claimed in claim 1, wherein said X is selected from a substituted or unsubstituted naphthalene, a substituted or unsubstituted biphenylene, a substituted or unsubstituted perylene, a substituted or unsubstituted pentacene, a substituted or unsubstituted benzo[a]perylene, a substituted or unsubstituted dibenzo[a,j]perylene, a substituted or unsubstituted dibenzo[a,o]perylene, a substituted or unsubstituted bisanthrene, a substituted or unsubstituted terylene, and a substituted or unsubstituted tetrabenzo[de,hi,op,st]pentacene, and n is 1 or 2.

6. The organic thin film transistor as claimed in claim 5, wherein at least one of diarylamino groups represented by [—N $Ar^1Ar^2$] includes a substituted or unsubstituted styryl group as a substituent of $Ar^1$.

7. The organic thin film transistor as claimed in claim 5, wherein said compound includes at least one cyclohexylidenemethine group as a substituent of $Ar^1$ and $Ar^2$.

8. The organic thin film transistor as claimed in claim 5, wherein at least one of diarylamino groups represented by [—N $Ar^1Ar^2$] includes a substituted styryl group as a substituent of $Ar^1$, and said substituted styryl group includes a cyclohexylidenemethine group as a substituent thereof.

9. The organic thin film transistor as claimed in claim 1, wherein said X is a substituted or unsubstituted triphenylene, and n is 1–3.

10. The organic thin film transistor as claimed in claim 9, wherein at least one of diarylamino groups represented by [—N $Ar^1Ar^2$] includes a substituted or unsubstituted styryl group as a substituent of $Ar^1$.

11. The organic thin film transistor as claimed in claim 9, wherein said compound includes at least one cyclohexylidenemethine group as a substituent of $Ar^1$ and $Ar^2$.

12. The organic thin film transistor as claimed in claim 9, wherein at least one of diarylamino groups represented by [—N $Ar^1Ar^2$] includes a substituted styryl group as a substituent of $Ar^1$, and said substituted styryl group includes a cyclohexylidenemethine group as a substituent thereof.

13. The organic thin film transistor as claimed in claim 1, wherein said X is at least one of a substituted or unsubstituted tetraphenylene and a substituted or unsubstituted 9,9'-spirobifluorene, and n is 1–4.

14. The organic thin film transistor as claimed in claim 13, wherein at least one of diarylamino groups represented by [—N $Ar^1Ar^2$] includes a substituted or unsubstituted styryl group as a substituent of $Ar^1$.

15. The organic thin film transistor as claimed in claim 13, wherein said compound includes at least one cyclohexylidenemethine group as a substituent of $Ar^1$ and $Ar^2$.

16. The organic thin film transistor as claimed in claim 9, wherein at least one of diarylamino groups represented by [—N $Ar^1Ar^2$] includes a substituted styryl group as a substituent of $Ar^1$, and said substituted styryl group includes a cyclohexylidenemethine group as a substituent thereof.

17. The organic thin film transistor as claimed in claim 1, wherein a moving direction of carriers between said first and second electrodes substantially corresponds to a thickness direction of said organic thin film.

18. The organic thin film transistor as claimed in claim 1, wherein a moving direction of carriers between said first and second electrodes is substantially parallel to an interface of said organic thin film.

19. The organic thin film transistor as claimed in claim 1, wherein one of donor dopants and acceptor dopants is doped into at least one of interfaces of said organic thin film to said first, second and third electrodes.

20. The organic thin film transistor as claimed in claim 19, wherein said donor dopants are selected from metal elements and inorganic metal compounds.

21. The organic thin film transistor as claimed in claim 19, wherein said acceptor dopants are selected from Lewis acids.

* * * * *